US007211345B2

(12) United States Patent
Hampden-Smith et al.

(10) Patent No.: US 7,211,345 B2
(45) Date of Patent: May 1, 2007

(54) MEMBRANE ELECTRODE ASSEMBLIES FOR USE IN FUEL CELLS

(75) Inventors: Mark J. Hampden-Smith, Albuquerque, NM (US); Toivo T. Kodas, Albuquerque, NM (US); Plamen Atanassov, Albuquerque, NM (US); Klaus Kunze, Albuquerque, NM (US); Paul Napolitano, Albuquerque, NM (US); Rimple Bhatia, Placitas, NM (US); David E. Dericotte, Albuquerque, NM (US); Paolina Atanassova, Albuquerque, NM (US)

(73) Assignee: Cabot Corporation, Boston, MA (US)

( * ) Notice: Subject to any disclaimer, the term of this patent is extended or adjusted under 35 U.S.C. 154(b) by 235 days.

(21) Appl. No.: 10/213,001

(22) Filed: Aug. 5, 2002

(65) Prior Publication Data

US 2003/0064265 A1 Apr. 3, 2003

Related U.S. Application Data

(63) Continuation of application No. 09/815,380, filed on Mar. 22, 2001, which is a continuation-in-part of application No. 09/589,710, filed on Jun. 8, 2000, now Pat. No. 6,753,108, which is a continuation-in-part of application No. 09/532,917, filed on Mar. 22, 2000, now Pat. No. 6,660,680, which is a continuation-in-part of application No. 09/141,397, filed on Aug. 27, 1998, now Pat. No. 6,103,393, which is a continuation-in-part of application No. 09/028,029, filed on Feb. 24, 1998, now abandoned, and a continuation-in-part of application No. 09/030,057, filed on Feb. 24, 1998, now Pat. No. 6,338,809, and a continuation-in-part of application No. 09/028,277, filed on Feb. 24, 1998, now Pat. No. 6,277,169.

(51) Int. Cl.
*H01M 8/10* (2006.01)

(52) U.S. Cl. .............................. 429/30; 429/33; 429/40; 429/41; 429/44

(58) Field of Classification Search ................ 429/30, 429/33, 40, 41, 44
See application file for complete search history.

(56) References Cited

U.S. PATENT DOCUMENTS

| | | | |
|---|---|---|---|
| 3,803,708 A | 4/1974 | Wada et al. ................. 29/620 |
| 3,816,097 A | 6/1974 | Daiga ........................ 75/252 |
| 3,956,014 A | 5/1976 | Landsman et al. ............ 136/86 |
| 3,961,987 A | 6/1976 | Mund et al. ................. 136/86 |
| 3,964,933 A | 6/1976 | Fung et al. ................ 136/121 |
| 4,007,107 A | 2/1977 | Johnson ..................... 204/290 |
| 4,031,292 A | 6/1977 | Hervert ...................... 429/40 |
| 4,039,409 A | 8/1977 | LaConti et al. ............ 204/129 |
| 4,052,336 A | 10/1977 | Van Montfoort et al. ... 252/447 |
| 4,113,921 A | 9/1978 | Goldstein et al. ............ 429/27 |
| 4,130,506 A | 12/1978 | Collier et al. ............... 252/438 |
| 4,136,059 A | 1/1979 | Jalan et al. ................. 252/447 |
| 4,140,817 A | 2/1979 | Brown ........................ 427/96 |
| 4,172,733 A | 10/1979 | Moritsu et al. ............ 106/1.15 |
| 4,185,145 A | 1/1980 | Breault ....................... 429/34 |
| 4,214,970 A | 7/1980 | Spaziante et al. ........... 204/265 |
| 4,263,376 A | 4/1981 | Blurton ....................... 429/42 |
| 4,266,977 A | 5/1981 | Steiger ....................... 106/43 |
| 4,383,010 A | 5/1983 | Spaepen ..................... 429/42 |
| 4,391,844 A | 7/1983 | Baczek et al. ............... 427/44 |
| 4,395,279 A | 7/1983 | Houck ........................ 75/255 |
| 4,444,852 A | 4/1984 | Liu et al. .................... 429/29 |
| 4,469,808 A * | 9/1984 | Korach ....................... 502/101 |
| 4,476,002 A | 10/1984 | Howard et al. ............. 204/283 |
| 4,482,641 A | 11/1984 | Wennerberg ............... 502/182 |
| 4,524,114 A | 6/1985 | Samuels et al. ............. 429/42 |
| 4,569,924 A | 2/1986 | Ozin et al. .................. 502/184 |
| 4,652,537 A | 3/1987 | Tamura et al. ................ 502/5 |
| 4,752,456 A | 6/1988 | Yoda et al. ................. 423/291 |
| 4,781,995 A | 11/1988 | Giner ......................... 429/13 |
| 4,787,964 A | 11/1988 | Gordon et al. ............. 204/282 |
| 4,822,410 A | 4/1989 | Matovich .................... 75/345 |
| 4,970,128 A | 11/1990 | Itoh et al. ................... 429/42 |
| 4,970,189 A | 11/1990 | Tachibana ................... 502/183 |
| 5,032,242 A | 7/1991 | Knudsen et al. ......... 204/157.41 |
| 5,068,161 A | 11/1991 | Keck et al. .................. 429/44 |
| 5,120,699 A | 6/1992 | Weiss et al. ................ 502/185 |
| 5,318,797 A | 6/1994 | Matijevic et al. ......... 427/213.31 |
| 5,338,330 A | 8/1994 | Polizzotti et al. ............ 75/228 |
| 5,374,598 A | 12/1994 | Stonehart et al. ........... 502/185 |
| 5,421,854 A | 6/1995 | Kodas et al. ................ 75/355 |
| 5,429,657 A | 7/1995 | Glicksman et al. .......... 75/351 |
| 5,432,022 A | 7/1995 | Cheiky ....................... 429/27 |
| 5,439,502 A | 8/1995 | Kodas et al. ................ 75/365 |
| 5,453,169 A | 9/1995 | Callstrom et al. ........... 204/242 |
| 5,501,915 A | 3/1996 | Hards et al. ................. 429/42 |
| 5,561,000 A | 10/1996 | Dirven et al. ................ 429/42 |
| 5,567,662 A | 10/1996 | Dunmead et al. ............ 501/87 |
| 5,589,300 A * | 12/1996 | Fauteux et al. ............. 429/223 |
| 5,766,788 A | 6/1998 | Inoue et al. ................. 429/42 |
| 5,767,036 A | 6/1998 | Freund et al. .............. 502/185 |

(Continued)

*Primary Examiner*—Bruce F. Bell
(74) *Attorney, Agent, or Firm*—Marsh Fischmann & Breyfogle LLP

(57) ABSTRACT

Electrocatalyst powders and methods for producing electrocatalyst powders, such as carbon composite electrocatalyst powders. The powders have a well-controlled microstructure and morphology. The method includes forming the particles from an aerosol of precursors by heating the aerosol to a relatively low temperature, such as not greater than about 400° C.

17 Claims, 57 Drawing Sheets

U.S. PATENT DOCUMENTS

| | | |
|---|---|---|
| 5,783,325 A | 7/1998 | Cabasso et al. ............... 429/42 |
| 5,843,519 A | 12/1998 | Tada ......................... 427/115 |
| 5,876,867 A | 3/1999 | Itoh et al. .................... 429/44 |
| 5,879,828 A * | 3/1999 | Debe et al. ................... 429/41 |
| 5,900,386 A | 5/1999 | Freund et al. .............. 502/330 |
| 5,972,525 A | 10/1999 | Mori et al. ................. 428/632 |
| 5,993,988 A | 11/1999 | Ohara et al. .................. 429/40 |
| 6,103,393 A | 8/2000 | Kodas et al. ............... 428/570 |
| 6,153,327 A | 11/2000 | Dearnaley et al. ........... 429/40 |
| 6,165,247 A | 12/2000 | Kodas et al. ................. 75/331 |
| 6,660,680 B1 | 12/2003 | Hampden-Smith et al. . 502/180 |
| 2002/0107140 A1 | 8/2002 | Hampden-Smith et al. . 502/185 |
| 2002/0189400 A1 | 12/2002 | Kodas et al. ................. 75/243 |
| 2002/0192540 A1 | 12/2002 | Kodas et al. ................. 429/44 |
| 2003/0006517 A1 | 1/2003 | Kodas et al. ................. 264/12 |
| 2003/0013606 A1 | 1/2003 | Hampden-Smith et al. . 502/180 |
| 2003/0054218 A1 | 3/2003 | Hampden-Smith et al. ... 429/27 |
| 2003/0118884 A1 | 6/2003 | Hampden-Smith et al. ... 429/30 |
| 2003/0181321 A1 | 9/2003 | Hampden-Smith et al. . 502/180 |
| 2003/0198849 A1* | 10/2003 | Hampden-Smith et al. ... 429/30 |
| 2004/0072683 A1* | 4/2004 | Kodas et al. ............... 502/224 |

* cited by examiner

MEMBRANE ELECTRODE ASSEMBLIES FOR USE IN FUEL CELLS

BACKGROUND OF THE INVENTION

This application is a continuation application of U.S. patent application Ser. No. 09/815,380 filed on Mar. 22, 2001, which is a continuation-in-part of U.S. patent application Ser. No.09/589,710 filed on Jun. 8, 2000, now U.S. Pat. No. 6,753,108, which is a continuation-in-part of U.S. patent application Ser. No. 09/532,917 filed on Mar. 22, 2000, now U.S. Pat. No. 6,660,680, which is a continuation-in-part application of U.S. patent application Ser. No. 09/141,397, filed on Aug. 27, 1998, now U.S. Pat. No. 6,103,393, which in turn is a continuation-in-part application of U.S. patent application Ser. No. 09/028,029, now abandoned, Ser. No. 09/028,277, now U.S. Pat. Nos. 6,277,169 and 09/030,057, now U.S. Pat. No. 6,338,809, each filed on Feb. 24, 1998.

STATEMENT REGARDING FEDERALLY FUNDED RESEARCH

This invention was made with United States Government support under Cooperative Agreement No. 70NANB8H4045 awarded by the National Institute for Standards and Technology (NIST).

FIELD OF THE INVENTION

The present invention relates to particulate materials such as electrocatalyst powders for the fabrication of energy devices and to methods for producing such powders, as well as products and devices incorporating the powders. The powders are preferably produced by spray conversion of precursors to the particulate materials.

DESCRIPTION OF RELATED ART

With the advent of portable and hand-held electronic devices and an increasing demand for electric automobiles due to the increased strain on non-renewable natural resources, there is a need for the rapid development of high performance, economical power systems. Such power systems require improved devices for energy storage using batteries and energy generation using fuel cells.

Batteries can be divided into primary (non-rechargeable) and secondary (rechargeable) batteries. Common types of primary batteries include metal-air batteries such as Zn-air, Li-air and Al-air, alkaline batteries and lithium batteries. Common types of secondary batteries include nickel-cadmium, nickel metal hydride and lithium ion batteries.

One type of metal-air battery which offers many competitive advantages is the zinc-air battery, which relies upon the redox couples of oxygen and zinc. Zinc-air batteries operate by adsorbing oxygen from the surrounding air and reducing the oxygen using an oxygen reduction catalyst at the cathode, referred to as the air electrode. As the oxygen is reduced, zinc metal is oxidized. The reactions of a zinc-air alkaline battery during discharge are:

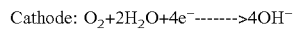
Cathode: $O_2 + 2H_2O + 4e^- \longrightarrow 4OH^-$

Anode: $2Zn \longrightarrow 2Zn^{2+} + 4e^-$

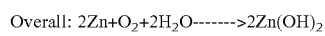
Overall: $2Zn + O_2 + 2H_2O \longrightarrow 2Zn(OH)_2$

Typically, the air electrodes are alternatively stacked with the zinc electrodes and are packaged in a container that is open to the air. When the battery cell discharges, oxygen is reduced to $O^{2-}$ at the cathode while zinc metal is oxidized to $Zn^{2+}$ at the anode. Since Zn can be electrodeposited from aqueous electrolytes to replenish the anode, zinc-air batteries can be secondary batteries as well as primary batteries.

Among the advantages of secondary zinc-air batteries over other rechargeable battery systems are safety, long run time and light weight. The batteries contain no toxic materials and operate at one atmosphere of pressure. They can operate as long as 10 to 14 hours, compared to 2 to 4 hours for most rechargeable lithium-ion batteries and can be stored for long periods of time without losing their charge. The light weight of zinc-air batteries leads to good power density (power per unit of weight or volume), which is ideal for portable applications.

The two major problems associated with secondary zinc-air batteries, however, are limited total power and poor rechargeability/cycle lifetime. Increased power is becoming a major area of attention for battery manufacturers trying to meet the increased demands of modern electronics. Current zinc-air batteries can deliver from about 200 to 450 W/kg which may enable the batteries to be used in certain low-power laptops and other portable devices that have relatively low power requirements. Most laptops and other portable electronic devices, however, require batteries that are able to provide a level of power that is higher than the capabilities of current zinc-air batteries. The main reason for the low power of zinc-air batteries is believed to be related to the inefficiency of the catalytic reaction to reduce oxygen in the air electrodes. Poor accessibility of the catalyst and the local microstructural environment around the catalyst and adjoining carbon reduces the efficiency of the oxygen reduction. See, for example, P. N. Ross et al., *Journal of the Electrochemical Society*, Vol. 131, pg. 1742 (1984).

Rechargeability is also a problem with zinc-air batteries. The batteries have a short cycle life, degrading significantly in performance after about 200 recharging cycles or less. The short cycle life of zinc-air batteries is also believed to be related to the catalyst used in the air electrodes. Specifically, it is believed that corrosion of the carbon used for the electrocatalyst in these systems leads to a loss in capacity and hence, a decreased discharge time.

Primary (non-rechargeable) alkaline zinc-air batteries are currently used to power hearing aids and other devices that require low current densities over long periods of time. Zinc-air hearing aid batteries also include an air cathode and a zinc-based anode. The electrocatalyst powder is formed into a layer for the air cathode which catalytically converts oxygen in the air into hydroxide ion. The hydroxide ion is then transported in an alkaline electrolyte through a separator to the anode where it reacts with zinc to form zincate $(Zn(OH)_4^{2-})$ ion and zinc ion $(Zn^{2+})$ and liberates electrons. Improved electrocatalyst powders at the air cathode would advantageously extend the life of such primary batteries.

In addition to improvements in energy storage, there is a need for improvements in environmentally friendly and economical energy production. Fuel cells are electrochemical devices which are capable of converting the energy of a chemical reaction into electrical energy without combustion and with virtually no pollution. Fuel cells are unlike batteries because fuel cells convert chemical energy to electrical energy as the chemical reactants are continuously delivered to the fuel cell. When the fuel cell is off, it has zero electrical potential. As a result, fuel cells are typically used to produce a continuous source of electrical energy and compete with other forms of continuous electrical energy production such as the combustion engine, nuclear power and coal-fired power stations. Different types of fuel cells are categorized by the electrolyte used in the fuel cell. The five main types of fuel cells are alkaline, molten carbonate, phosphoric acid, solid oxide and proton exchange membrane (PEM) or solid polymer fuel cells.

One of the critical requirements for these energy devices is the efficient catalytic conversion of the reactants to electrical energy. A significant obstacle to the wide-scale commercialization of such devices is the need for highly efficient electrocatalyst materials for this conversion process.

One example of a fuel cell utilizing electrocatalysts for the chemical reactions is a Proton Exchange Membrane Fuel Cell (PEMFC). PEMFC stack includes hundreds of membrane electrode assemblies (MEA's) each including a cathode and anode constructed from, for example, carbon cloth. The anode arid cathode sandwich a proton exchange membrane which has a catalyst layer on each side of the membrane. Power is generated when hydrogen is fed into the anode and oxygen (air) is fed into the cathode. In a reaction typically catalyzed by a platinum-based catalyst in the catalyst layer of the anode, the hydrogen ionizes to form protons and electrons. The protons are transported through the proton exchange membrane to a catalyst layer on the opposite side of the membrane (the cathode) where another catalyst, typically platinum or a platinum alloy, catalyzes the reaction of the protons with oxygen to form water. The reactions can be written as follows:

Anode: $2H_2 \longrightarrow 4H^+ + 4e^-$

Cathode: $4H^+ + 4e^- + O_2 \longrightarrow 2H_2O$

Overall: $2H_2 + O_2 \longrightarrow 2H_2O$

The electrons formed at the anode are routed to the cathode through an electrical circuit which provides the electrical power.

The critical issues that must be addressed for the successful commercialization of fuel cells are cell cost, cell performance and operating lifetime. For automotive applications improved power density is critical whereas for stationary applications higher voltage efficiencies are necessary. In terms of fuel cell cost, current fuel cell stacks employ MEA's that include platinum electrocatalysts with a loading of about 4 milligrams of platinum per square centimeter on each of the anode and cathode. At a typical cell performance of 0.42 watts per square centimeter, then about 19 grams of platinum per kilowatt is required (8 mg Pt per $cm^2$ over 0.42 watts per $cm^2$). Platinum metal is very expensive and a significant cost reduction in the electrocatalyst is necessary for these cells to become economically viable. However, reducing the amount of precious metal is not a suitable solution because there is also a strong demand for improved cell performance which relies on the presence of the platinum electrocatalyst.

The major technical challenge is improving the performance of the cathode with air as the oxidant. Platinum metal electrocatalysts for oxygen reduction are used in both alkaline and acid electrolyte media and are used in PEM fuel cells, alkaline fuel cells, hybrid fuel cells and others.

The conventional synthesis of electrocatalyst powders that include active species on a support material involves several steps. First, an appropriate high surface area catalyst support (e.g., alumina, titania, silica or carbon) is impregnated with a solution containing the precursor of the active species. Sufficient contact time is used for the adsorption of the active species precursor to occur and to achieve a uniform deposition of the precursor on the support surface. The catalyst is then dried to remove the solvent, for example at temperatures of 100° C. to 120° C. for about 2 to 12 hours. The catalyst is then heated to elevated temperatures, typically 400° C. to 600° C. in air, so that the precursor is converted to the active species. Typically, the oxide catalysts do not require further treatment.

The foregoing method generally results in poor control over the composition and microstructure of the composite powders. The morphology and surface area of the electrocatalyst powders are characteristics that have a critical impact on the performance of the catalyst. The morphology determines the packing density and the surface area determines the type and number of surface adsorption centers where the active species are formed during synthesis of the electrocatalyst. The inability to control the fundamental electrocatalyst powder characteristics is a major obstacle for the future development of energy storage and production devices.

Methods for preparing noble metal electrocatalyst materials are known in the art. U.S. Pat. No. 4,052,336 by VanMontfoort et al. discloses a process for preparing an active noble metal catalyst on a carbon carrier, such as palladium on carbon, by adsorbing a salt of the metal onto the carbon, forming an oxide or hydroxide from the metal salt and reducing the oxide or hydroxide to a metal. The carbon support comprises porous active carbon particles having a widely varying particle size of less than 1 μm up to 60 μm. The catalyst comprises from about 0.1 to about 15 percent by weight of the noble metal. It is disclosed that the noble metal is deposited on the carbon carrier in the form of very small crystallites which have a high degree of catalytic activity per gram of noble metal.

U.S. Pat. No. 4,136,059 by Jalan et al. discloses a method for the production of electrochemically active platinum particles for use in fuel cell electrodes. The particles are formed by mixing chloroplatinic acid and sodium dithionite in water to provide a colloidal dispersion which is absorbed onto a support material (e.g., carbon black).

U.S. Pat. No. 4,482,641 by Wennerberg discloses a high surface area porous active carbon matrix containing a uniform dispersion of a metal. The material is formed by spray drying a carbon precursor and a metal precursor to form particles and then pyrolyzing the spray dried particles under an inert gas and in the presence of an alkali metal hydroxide. A preferred heating method for the pyrolyzation step is to heat using microwave heating. It is disclosed that the metal crystals have a size from about 5 to 30 angstroms and are disposed on active carbon having a cage-like structure.

U.S. Pat. No. 4,569,924 by Ozin et al. discloses a carbon-metal catalyst having an active metal such as silver deposited on the carbon substrate in a zero-valent, small cluster form. The catalyst is produced by vaporizing the metal under low vapor pressure conditions in an organic liquid solvent such that the metal dissolves in the solvent. The solvent is then contacted with carbon so that the complex diffuses onto the surface of the carbon and into the pores of the carbon. The carbon particles have a metal loading of 0.1 to 15 weight percent.

U.S. Pat. No. 4,652,537 by Tamura et al. discloses a process for producing a catalyst useful for converting carbon monoxide into carbon dioxide. The process includes contacting activated carbon with an aqueous solution of chloroplatinic acid, reducing the absorbed chloroplatinic acid to platinum with a reducing agent and decomposing the excess reducing agent. The catalyst preferably contains at least about 6 milligrams of platinum per gram of activated carbon. The activated carbon particles have an average grain size of from about 0.4 to about 10 millimeters.

U.S. Pat. No. 4,970,128 by ltoh et al. discloses a supported platinum alloy electrocatalyst for an acid electrolyte fuel cell. The platinum alloy includes platinum, iron and copper. The electrocatalyst has better initial activity and lifetime than conventional platinum or other multi-component alloy electrocatalysts. U.S. Pat. No. 5,489,563 by Brand et al. discloses a platinum/cobalt/chromium catalytic alloy which is precipitated onto a carbon support from nitrate salts.

U.S. Pat. No. 4,970,189 by Tachibana discloses a porous, metal-containing carbon material which includes fine particles of a metal having an average particle size of 1 μm or less dispersed in a carbonaceous body. The method includes mixing a metal oxide with an organic, carbonizing and converting the oxide to metal particles. The catalyst includes from about 5 to 50 weight percent metal.

U.S. Pat. No. 5,068,161 by Keck et al. discloses an electrocatalytic material suitable for use in phosphoric acid fuel cells. The material includes an alloy of platinum with another element such as titanium, chromium, manganese, iron, cobalt, nickel, copper, gallium, zirconium or hafnium. The platinum alloy loading is 20 to 60 weight percent and the electrochemical area of the alloy is greater than about 35 $m^2/g$.

U.S. Pat. No. 5,120,699 by Weiss et al. discloses a catalyst containing from 0.01 to 5 weight percent platinum on a graphite support. The graphite support has a particle size distribution of from about 1 to 600 μm. The catalyst material has good longevity when used for hydrogenation reactions.

U.S. Pat. No. 5,453,169 by Callstrom et al. discloses an electrocatalytic material including glassy carbon which contains graphite crystals having a size of from about 1 to 20 nanometers.

U.S. Pat. No. 5,501,915 by Hards et al. discloses a porous electrode suitable for use in a solid polymer fuel cell which includes highly dispersed precious metal catalyst on particulate carbon which is impregnated with a proton conducting polymer.

The foregoing methods generally result in poor control over the composition and microstructure of the electrocatalytic materials, as well as poor control over the dispersibility and surface area of the active species on the carbon surface. Further, alloy compositions such as platinum/ruthenium used for oxygen reduction in a fuel cell are not made in a consistently reproducible fashion. The inability to control the fundamental powder characteristics is a major obstacle to the development of more efficient electrocatalyst materials.

It would be advantageous to provide a flexible production method capable of producing electrocatalyst powders which would enable control over the powder characteristics such as particle size, surface area and pore structure as well as the versatility to accommodate compositions which are either difficult or impossible to produce using existing production methods. It would be particularly advantageous if such powders could be produced in large quantities on a substantially continuous basis. It would also be advantageous to provide improved devices, such as batteries and fuel cells, having thin layers and improved properties.

DETAILED DESCRIPTION OF THE INVENTION

Figure 1:
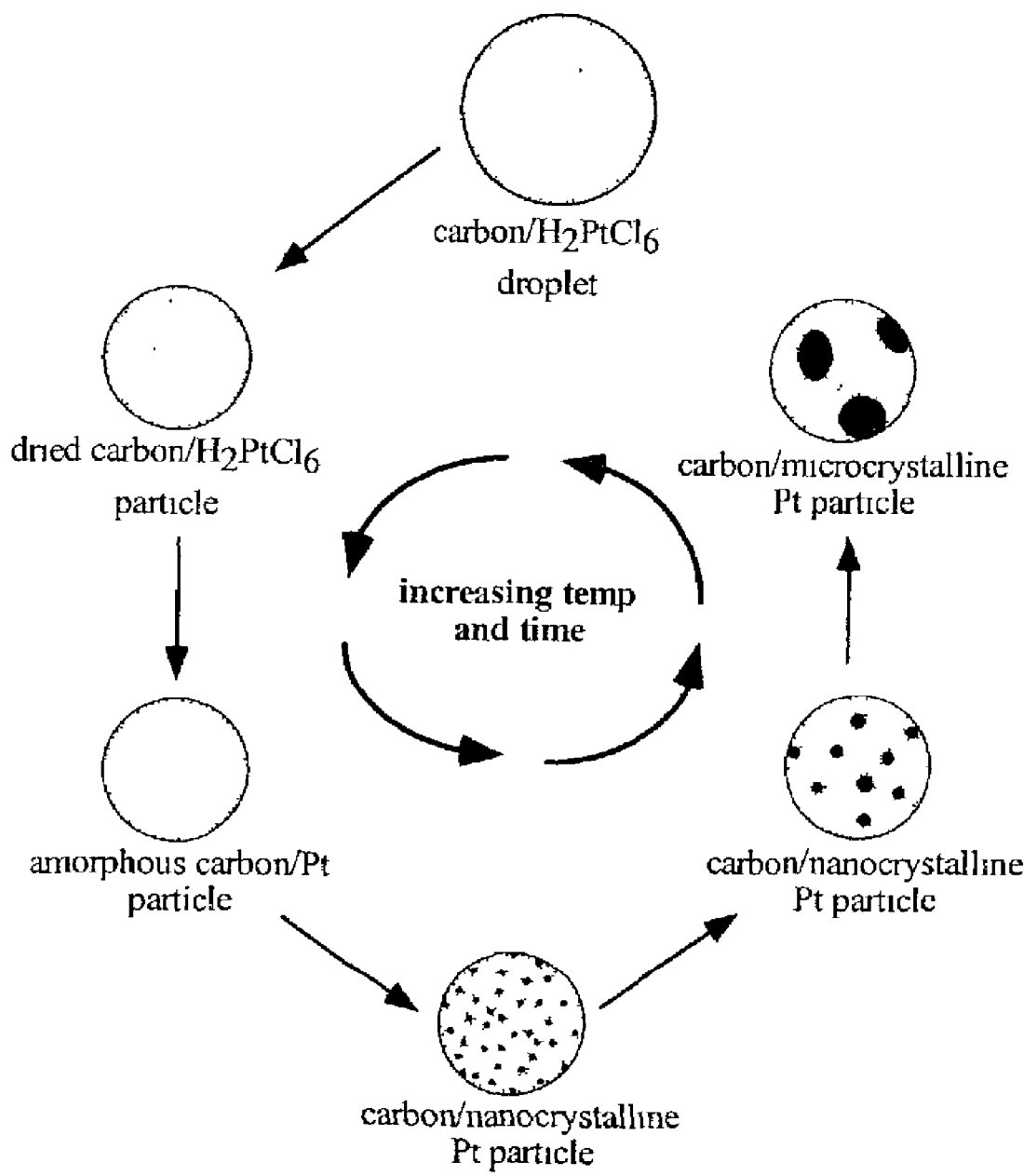
FIG. 1 illustrates the steps of electrocatalyst particle formation according to an embodiment of the present invention.

The present invention is generally directed to powders useful in the construction of energy devices, such as electrocatalyst powders useful in fuel cells and batteries, and to methods for producing the powders. One preferred embodiment of the present invention is directed to composite electrocatalyst powders that are useful in batteries and fuel cells for catalyzing chemical reactions. The present invention is also directed to novel devices fabricated using the powders. One example is a fuel cell, such as a PEM fuel cell. Another example is a primary metal-air battery that utilizes an air cathode to reduce oxygen. The materials according to the present invention can advantageously be formed into thin layers using direct write deposition techniques to form unique structures.

According to one embodiment, the present invention is directed to composite electrocatalyst particles. As used herein, composite electrocatalyst powders or particles are those that include within the individual particles at least a first active species phase, such as a metal or a metal oxide that is dispersed on a support phase, such as carbon or a metal oxide. The composite powders of the present invention are not mere physical admixtures of different particles, but are comprised of particles that include both an active species phase and a support phase. The compositions of the particle components can be varied independently and various combinations of carbons, metals, metal alloys, metal oxides, mixed metal oxides, organometallic compounds and their partial pyrolysis products can be produced as may be required for a particular application. One embodiment of the present invention is directed to composite electrocatalyst particles with two or more different materials as the active species. As an example, combinations of Ag and $MnO_x$ supported on carbon can be useful for some electrocatalytic applications. Other examples of multiple active species are mixtures of porphyrins, partially decomposed porphyrins, Co and CoO. Although carbon is a preferred material for the support phase, other materials such as metal oxides can also be useful for some electrocatalytic applications.

According to one embodiment of the present invention, the electrocatalyst powder includes composite metal-carbon electrocatalyst particles. The composite metal-carbon electrocatalyst particles include an active species of at least a first metal phase dispersed on a carbon support phase. The metal phase can include any metal and the particularly preferred metal will depend upon the application of the powder. The metal phase can be a metal alloy wherein a first metal is alloyed with one or more alloying elements. As used herein, the term metal alloy includes intermetallic compounds between two or more metals. The metal-carbon electrocatalyst powders can also include two or more metals dispersed on the support as separate phases.

Preferred metals for the electrocatalytically active species include the platinum group metals and noble metals, particularly Pt, Ag, Pd, Ru, Os and their alloys. The metal phase can also include a metal selected from the group Ni, Rh, Ir, Co, Cr, Mo, W, V, Nb, Al, Ta, Ti, Zr, Hf, Zn, Fe, Cu, Ga, In, Si, Ge, Sn, Y, La, lanthanide metals and combinations or alloys of these metals. Preferred metal alloys for use according to the present invention include alloys of Pt with other metals, such as Ru, Os, Cr, Ni, Mn and Co. Particularly preferred among these is Pt—Ru for use in hydrogen anodes and Pt—Cr—Co for use in oxygen cathodes.

Another preferred embodiment of the present invention is directed to metal oxide-carbon composite electrocatalyst particles which include an active metal oxide species dispersed on a carbon support. The metal oxide active species phase can be selected from the oxides of the transition metals, preferably those existing in oxides of variable oxidation states, and most preferably from those having an oxygen deficiency in their crystalline structure.

For example, the dispersed metal oxide can be an oxide of the metals Au, Ag, Pt, Pd, Ni, Co, Rh, Ru, Fe, Mn, Cr, Mo, Re, W, Ta, Nb, V, Hf, Zr, Ti or Al. A particularly preferred metal oxide according to the present invention is manganese oxide ($MnO_x$, where x is 1 to 2). The dispersed active phase can include a mixture of different oxides, solid solutions of two or more different metal oxides or double oxides. The metal oxides can be stoichiometric or non-stoichiometric and can be mixtures of oxides of one metal having different oxidation states. The metal oxides can also be amorphous.

For some applications such as secondary metal-air batteries, examples of electrocatalyst materials that can be used to catalyze the reduction and oxidation reactions according to the present invention include oxygen deficient metal oxides and metal oxides capable of undergoing reduction/oxidation reactions due to variations in the oxidation states of the metals contained in the metal oxide. Some compounds are multi-functional, providing numerous attributes in one compound. Such oxides do not necessarily have to be dispersed on a support phase.

For example, perovskite phase oxides can be used according to the present invention for electrocatalysts wherein the oxides provide electrocatalytic activity, a high surface area and electrical conductivity. Specific examples of such perovskite phase oxides include $La_{1-x}Sr_xFe_{0.6}Co_{0.4}O_3$ (where x is from 0 to 1) and $La_{1-x}Ca_xCoO_3$ (where x is from 0 to 1). One particularly preferred metal oxide electrocatalyst according to the present invention is an oxygen-deficient cobalt-nickel oxide, $Co_xNi_yO_z$, which is useful for electrodes in metal hydride batteries. Other metal oxides within this category include spinels of the general formula $AB_2O_4$ where A is selected from divalent metals such as Mg, Ca, Sr, Ba, Fe, Ru, Co, Ni, Cu, Pd, Pt, Eu, Sm, Sn, Zn, Cd, Hg or combinations thereof and B is selected from trivalent metals such as Co, Mn, Re, Al, Ga, In, Fe, Ru, Os, Cr, Mo, W, Y, Sc, lanthanide metals or combinations thereof. Other useful metal oxides include manganese oxides, nickel oxides, cobalt oxides, iron oxides, titanium oxides, zirconium oxides, zinc oxides, indium oxide, indium tin oxide, gallium oxides and metal gallates, ruthenium oxides and metal ruthenates, chromium, molybdenum and tungsten oxides, copper oxides and copper containing perovskite phase metal oxides, vanadium, niobium and tantalum oxides.

A further class of catalysts that can be useful according to the present invention are those derived from molecular compounds that are either dispersed on a support phase or that have no support phase. Examples of such materials are metal porphyrin complexes which catalyze the reduction of $O_2$ to $OH^-$ but are oxidized during the oxidation of $OH^-$. These species are suitable for primary batteries and fuel cells such as alkaline fuel cells. Included in this group are metal porphyrin complexes of Co, Fe, Zn, Ni, Cu, Pd, Pt, Sn, Mo, Mn, Os, Ir and Ru. Other metal ligand complexes can be active in these catalytic oxidation and reduction reactions and can be formed by the methods described herein. Such metal ligands can be selected from the class of N4-metal chelates, represented by porphyrins, tetraazaanulens, phtalocyanines and other chelating agents. In some cases the organic ligands are active in catalyzing reduction and oxidation reactions. In some cases the ligands are active when they remain intact, as might be the case for an intact porphyrin ring system, or they might be partially reacted during thermal processing to form a different species that could also be active in the catalytic reactions. An example is the reaction product derived from porphyrins or other organic compounds.

Carbon is required for the reduction of $O^2$ to $OH^-$ and is believed to be involved in the reduction of peroxide to hydroxide ion. Other carbon based active species include homo- and hetero- fullerene and carbon nanotube based materials.

With respect to the composite electrocatalyst particles of the present invention, the characteristics of the secondary support phase, the primary particles constituting the secondary support phase and the active species can be independently controlled to yield different performance characteristics for a particular application.

Powders of metals and metal alloys (including intermetallic compounds) are also useful for electrodes, particularly anodes in certain battery cells. Examples of such metal compounds include $LaNi_5$, La—Ni—Co—Al, Nd—Ce—Ni—Co—Al and V—Ti—Cr—Ni.

In addition to the electrocatalytic powders, other fine powders are useful for fabricating energy device components according to the present invention. Among these are the supporting materials, hydrophobic materials, electroconductive materials and insulator materials such as dielectrics for separating membranes. For example, metals such as silver (Ag) and nickel (Ni) are useful for the current collectors in battery cells.

According to one embodiment of the present invention, the particles, such as carbon particles or electrocatalyst particles, are polymer-modified by coating the particles with a polymer, for example a tetrafluoroethylene (TFE) fluorocarbon polymer such as TEFLON (E.I. duPont de Nemours, Wilmington, Del.) or a proton conducting polymer such as a sulfonated perfluorohydrocarbon polymer (e.g., NAFION, E.I. duPont de Nemours, Wilmington, Del.). Polymer-modified carbon particles can be used, for example, to form hydrophobic layers in an energy device, as is discussed below. The hydrophobicity can be controlled by controlling the ratio of TEFLON to carbon. For some applications, TEFLON can also be deposited on electrocatalyst particles to form polymer modified electrocatalyst particles.

The composite electrocatalyst powders discussed above include a secondary support phase, consisting of agglomerates of smaller primary particles such as carbon or metal oxide, which supports the active species. Two or more types of primary particles can be mixed to form the secondary support phase. As an example, two or more types of particulate carbon (e.g., amorphous and graphitic) can be combined to form the secondary support phase. The two types of particulate carbon can have different performance characteristics that combine to enhance the performance of the catalyst.

It is an advantage of the present invention that the composition of the electrocatalyst particles can be homogeneous. A degree of homogeneity in materials is often not obtainable by traditional forming methods such as liquid precipitation. However, it is also possible to intentionally provide compositional gradients within the electrocatalyst particles. For example, the active species concentration in a composite particle can be higher or lower at the surface of the support phase than near the center and gradients corresponding to compositional changes of 10 to 100 weight percent can be obtained. When the particles are deposited by direct-write deposition, discussed herein below, the particles retain their structural morphology and therefore the functionality of the compositional gradient can be exploited.

In addition, the electrocatalyst particles can have a high purity, thereby increasing the electrocatalytic activity. Many impurities in prior art electrocatalyst powders are derived from the precursors and from surfactants. The electrocatalyst particles of the present invention can advantageously have less than 1 atomic percent surface impurities, as measured by x-ray photoelectron spectroscopy (XPS).

The preferred form of carbon for crystalline supported active species are those which are amorphous. The preferred carbons for supported metals like Pt are carbons that are crystalline since Pt dispersion is favored by reduced carbon surfaces with substantially no surface hydroxyls. For supported $MnO_x$, it is also preferred to have a crystalline carbon support. Preferably, the crystallinity of the primary particles constituting the support phase is controlled through the selection of materials chosen for a specific application. Graphitic carbon is preferred for long term operational stability of fuel cells and batteries. Amorphous carbon is preferred when a smaller crystallite size is desired for the supported active species.

The overall density of the secondary support phase (i.e., the agglomerated primary particles) in the composite particles is related to the porosity of the support phase. It is preferred that the accessible (e.g., open) porosity in the composite electrocatalyst particles is from about 5 to 98 percent and more preferably is at least about 40 percent. The pore size distribution in the secondary support phase can also be controlled and the average pore size is preferably from about 10 to about 100 nanometers, such as from about 10 to 20 nanometers. High porosity is advantageous for rapid transport of species into and out of the secondary structures. Lower particle densities also allow easier suspension of the particles for printing techniques such as ink-jet deposition where suspension of particles for long periods is required. As an example, an aerogel carbon or metal oxide can have a density much lower than $1 \text{ g/cm}^3$.

Agglomeration of the electrocatalyst particles can affect the properties of the powder batch such as the ability to disperse the powder into liquids used to deposit the particles. It is therefore preferred that minimal agglomeration of the particles exist in the powder batch.

It is also an advantage of the present invention that the electrocatalyst particles are substantially spherical in shape. That is, the particles are preferably not jagged or irregular in shape. Spherical particles can advantageously be deposited using a variety of techniques, including direct write deposition, and can form layers that are thin and have a high packing density.

In addition, the composite electrocatalyst powders according to the present invention preferably have a surface area of at least about $10 \text{ m}^2/\text{g}$, more preferably at least about $25 \text{ m}^2/\text{g}$, more preferably at least about $90 \text{ m}^2/\text{g}$ and even more preferably at least about $600 \text{ m}^2/\text{g}$. Surface area is typically measured using the BET nitrogen adsorption method which is indicative of the surface area of the powder, including the internal surface area of accessible pores within the catalyst particles. High surface area combined with high dispersion of the active species generally leads to increased catalytic activity.

According to one embodiment of the present invention, the composite electrocatalyst particles preferably include a carbon support with at least about 1 weight percent active species, more preferably at least about 5 weight percent active species and even more preferably at least about 10 weight percent of the catalytically active species dispersed on the support surface. In one embodiment, the particles include from about 20 to about 40 weight percent of the active species phase. It has been found that such compositional levels give rise to the most advantageous electrocatalyst properties for many applications. However, the preferred level of the active species dispersed on the carbon support will depend upon the total surface area of the carbon, the type of active species and the application of the powder. A carbon support having a low surface area will require a lower percentage of active species on its surface to achieve a similar surface concentration of the active species compared to a support with higher surface area and higher active species loading.

It is preferred that the average size of the active species phase dispersed on the support phase is such that the particles include small single crystals or crystallite clusters, collectively referred to herein as clusters. According to one embodiment, the average active species cluster size is preferably not greater than about 10 nanometers, more preferably is not greater than about 5 nanometers and even more preferably is not greater than about 3 nanometers. In one embodiment, the average cluster size is from about 0.5 to 5 nanometers. According to another embodiment of the present invention, at least about 50 percent by number, more preferably at least about 60 percent by number and even more preferably at least about 70 percent by number of the active species clusters have a size of not greater than about 3 nanometers. Composite electrocatalyst powders having such small crystallite clusters advantageously have enhanced catalytic properties as compared to composite powders comprising an active species phase having larger clusters. The method of the present invention advantageously permits control over the crystallinity by controlling the reaction temperature and/or residence time.

When the active species includes a metal, the oxidation state of the metal in the metal phase is preferably close to zero, i.e., a pure metal. It is believed that higher oxidation states are detrimental to electrocatalyst powder activity. The method of the present invention advantageously enables good control over the oxidation state of the metal.

The electrocatalyst powders of the present invention preferably have a well-controlled particle size. According to one embodiment of the present invention, the volume average particle size is not greater than about 100 µm, preferably is not greater than about 20 µm and more preferably is not greater than about 10 µm. Further, it is preferred that the volume average particle size is at least about 0.3 µm, more preferably is at least about 0.5 µm and even more preferably is at least about 1 µm. As used herein, the average particle size is the median particle size ($d_{50}$). Powder batches having an average particle size within the preferred parameters disclosed herein enable the formation of thin electrocatalytic layers which are advantageous for producing unique energy devices such as batteries and fuel cells according to the present invention.

The particle size distributions of the secondary support phase, the primary particles, and the active species are important in determining catalytic performance and can be well controlled according to the present invention. Narrower particle size distributions are preferred for the secondary support phase to allow deposition of the particles through a narrow orifice without clogging and to enable the formation of thin layers. For example, it is preferred that at least about 50 volume percent of the particles have a size of not greater than about two times the volume average particle size and it is more preferred that at least about 75 volume percent of the particles have a size of not greater than about two times the volume average particle size. The particle size distribution can be bimodal or trimodal which can advantageously provide improved packing density.

The powders produced by the processes described herein, namely spray conversion, can include some agglomerates of spherical particles. Micrometer-sized particles often form soft agglomerates as a result of their high surface energy. Such soft agglomerates may be dispersed by treatments such as exposure to ultrasound in a liquid medium or sieving. The particle size distributions described herein are measured by mixing samples of the powders in a medium such as water with a surfactant and a short exposure to ultrasound through either an ultrasonic bath or horn. The ultrasonic horn supplies sufficient energy to disperse the soft agglomerates into the primary spherical particles. The primary particle size distribution is then measured by light scattering, such as in a MICROTRAC particle size analyzer (Honeywell Industrial Automation and Control, Fort Washington, Pa.). This provides a good measure of the useful dispersion characteristics of the powder because this simulates the dispersion of the particles in a liquid medium such as a paste or slurry that is used to deposit the particles in a device. Thus, the particle size referred to herein refers to the particle size after dispersion of soft agglomerates.

In one aspect, the present invention provides a method for preparing an electrocatalyst powder batch. A liquid precursor is converted to aerosol form and liquid from the droplets in the aerosol is then removed to permit formation of the desired particles in a dispersed state. Although the electrocatalyst powder batch is typically manufactured in a dry state, the powder may, after manufacture, be placed in a wet environment, such as in a paste or slurry.

The method for the production of the composite electrocatalyst powders according to the present invention, referred to herein as spray processing, spray conversion or spray pyrolysis, generally includes the steps of: providing a liquid precursor which includes a precursor to the support phase (e.g., carbon) and a precursor to the active species;

atomizing the precursor to form a suspension of liquid precursor droplets; and removing liquid from liquid precursor droplets to form the powder. For electrocatalysts that are not supported, the precursor to the support phase is not necessary. Typically, at least one component of the liquid precursor is chemically converted into a desired component of the powder. According to the present invention, the drying of the precursors and the conversion to a catalytically active species are advantageously combined in one step, where both the removal of the solvent and the conversion of a precursor to the active species occur essentially simultaneously. Combined with a short reaction time, this enables control over the distribution of the active species on the support, the oxidation state of the active species and the crystallinity of the active species. By varying reaction time, temperature, type of support material and type of precursors, the method of the present invention can produce catalyst morphologies and active species structures which yield improved catalytic performance.

More specifically, one important aspect of the method of the present invention is that the supported electrocatalyst particles are formed while the precursor to the active species phase is in intimate contact with the surface of the primary particles that constitute the support phase.

Another important aspect of the method in accordance with the present invention is that the active species precursor is rapidly reacted on the surface of the primary support particles. The reaction and formation of the active species occurs over a very short period of time such that the growth of large active species clusters is reduced and the migration of the active species clusters on the support surface is reduced. Preferably, the active species precursor is exposed to the elevated reaction temperature to form the active species for not more than about 600 seconds, more preferably not more than about 100 seconds and even more preferably not greater than about 10 seconds. The means by which the active species precursor is reacted is discussed in detail below.

Another unique aspect of spray processing according to the present invention is the simultaneous formation of a secondary support phase such as carbon. The secondary support phase forms as a result of the formation and drying of the droplets during spray processing and the characteristics of the primary support particles such as particle size, particle size distribution and surface area influence the properties of the support phase.

The spray processing methods for electrocatalyst production according to the present invention can be grouped by reference to several different attributes. These attributes include: vertical or horizontal system (with respect to main gas flow direction); type of atomizer (e.g., submerged ultrasonic, ultrasonic nozzle, two-fluid nozzle, single pressurized fluid); type of flow (e.g., laminar with no mixing, turbulent with no mixing, co-current of droplets and hot gas, countercurrent of droplets and gas or mixed flow); type of gas heating (e.g., hot system walls, hot gas introduction, combined hot gas and hot wall, plasma or flame); and type of powder collection system (e.g., cyclone, bag house, electrostatic or settling).

Spray processing according to one embodiment of the present invention starts with a precursor solution (e.g., colloidal carbon and $Pt(NH_3)_4(NO_3)_2$ for the production Pt/C electrocatalyst powder) that is atomized to form droplets. The droplets are passed through a heated zone in which the solvent evaporates and the precursors react to form the desired material, which is collected from the gas stream on a filter or with a cyclone. When the droplets are in the heated zone the precursors decompose and crystallize into the particulate product. The catalyst phase crystallite size can be controlled through control of the temperature of the hot zone and the residence time that the particles are in the hot zone.

For example, metal/carbon and metal oxide/carbon electrocatalyst powders can be prepared by starting with an aqueous-based precursor liquid consisting of colloidal carbon and a dissolved metal salt. The processing temperature of the precursor droplets can be controlled so the metal salt precursor decomposes leaving the carbon intact. A schematic illustrating the formation of a Pt/carbon electrocatalyst particle is illustrated in FIG. 1.

The first step in the process is the evaporation of the solvent (typically water) as the droplet is heated resulting in a particle of dried solids and metal salts. A number of methods to deliver heat to the particle are possible: horizontal hot-wall tubular reactors, spray drier and vertical tubular reactors can be used. Plasma, flame, laser and other reactors can be viewed as variations of these. As the particles experience either higher temperature or longer time at a specific temperature, the metal precursor decomposes. Using the spray conversion method of the present invention, the temperature and time that the particles experience can be controlled and therefore the degree of crystallinity and dispersion of the metal particles supported on the carbon can also be controlled.

The manner in which the precursor droplets are generated has significant influence over the characteristics of the final electrocatalyst powder as well as the rate of aerosol generation. The characteristics determined by the generator include the size and spread of the particle (droplet) size distribution (PSD) and the rate of atomization of a specific fluid. In extreme cases, some generators cannot atomize fluids with even moderate particle loadings or high viscosities Several atomization methods exist, each with advantages and disadvantages, for atomization of feed streams containing suspended particulates like carbon including: ultrasonic transducers (usually 1–3 MHz frequency); ultrasonic nozzles (10–150 KHz); two-fluid nozzles; and pressure atomizers, as well as others known in the art.

In one embodiment, scale-up of submerged ultrasonic transducers can be based on placing a large number of piezoelectrics in an array in a fluid. Scale-up of nozzle systems can be accomplished by either selecting a nozzle with a larger capacity or by increasing the number of units used in parallel. Typically, particles produced by nozzles are larger than those produced by ultrasonic atomizers. Particle size is also dependent on the gas flow rate. For a fixed liquid flow rate, an increased airflow decreases particle size and a decreased airflow increases particle size. It is difficult to change particle size without varying the liquid or airflow rates. However, two-fluid nozzles have the ability to process larger volumes of liquid per time than ultrasonic atomizers.

Two basic disc configurations, planar and point source, can be used to atomize fluids with submerged ultrasonic transducers. In planar source configurations, a thin film of liquid is distributed over the vibrating surface and standing waves are generated at nodes determined by several physical properties including oscillation frequency, fluid viscosity, surface tension and density. In the point source configuration, deeper fluid levels can be used because the ultrasonic energy is focused to a point some distance above the surface of the source. This concentration of energy creates a conical fountain from which the aerosol is generated. The droplets are produced at the tips of standing waves formed over the surface of the fountain and by cavitation processes. A carrier gas is swept past the fountain and the aerosol is entrained in the gas and delivered to other unit operations, such as size separation equipment (impactor) or a reactor (furnace). Disc-type transducers can typically operate at a higher frequency than ultrasonic nozzles and form particles with smaller median sizes. However, these types of atomizers have difficulty atomizing high viscosity fluids or fluids with high particle loading. A submerged ultrasonic transducer reactor system is illustrated in U.S. Pat. No. 6,103,393 by Kodas, et al., which is incorporated herein by reference in its entirety.

Ultrasonic spray nozzles have some advantages over single or two-fluid nozzles. The primary advantage is the low velocity of the spray leaving the nozzle and lack of associated gas flow. Ultrasonic nozzles use high frequency energy to atomize a fluid. High frequency vibrations are generated at the center of the nozzle by piezoelectric transducer crystals. The point where the transducers input the energy is a node where minimum lateral displacement is produced. The ends of the nozzle are at quarter-wavelength points, which are anti-nodes. The anti-nodes are where maximum lateral displacement occurs. The output end of the nozzle is much smaller than the input end. The lateral displacement is proportional to the relative mass of material at the anti-node. Since the atomizing end of the nozzle is much smaller than the rear housing of the nozzle, the vibration is amplified at the atomizing end. The nozzles are available in various orifice sizes and orifice diameters that allow the system to be scaled for various production capacities. In general, higher frequency nozzles are physically smaller, produce smaller droplets, and have a lower flow capacity than nozzles that operate at lower frequencies. The drawback to this system of scaling is that increasing the nozzle size increases the particle size. If a particular particle size is required, then the maximum production rate per nozzle is set. If desired production exceeds the nozzle's maximum production rate, additional nozzles or complete production units will be required to achieve desired production rates.

The shape of the atomizing surface determines the shape and spread of the spray pattern. Several types of atomizing nozzle surface shapes are available including conical, microspray and flat. The conical atomizing surface provides the greatest atomizing capability and has a large spray envelope. The flat atomizing surface provides almost as much flow as the conical but limits the overall diameter of the spray. The microspray atomizing surface is for very low flow rates where narrow spray patterns are needed. These nozzles are preferred for configurations where minimal gas flow is required in association with the droplets.

Particulate carbon suspensions that are often used for spray conversion production according to the present invention present several problems with atomization. Submerged ultrasonic atomizers re-circulate the suspension through the generation chamber and the suspension concentrates over time. Further, some fraction of the liquid atomizes without carrying the suspended colloid. Other problems encountered when using submerged ultrasonic transducers is the coating of the transducer discs with the particles over time. Finally, the generation rate of carbon suspensions is very low on submerged ultrasonic transducer discs. This is at least in part due to energy being absorbed or reflected by the suspended particles.

Submerged ultrasonic transducers are preferred for precursor compositions having a low particulate carbon content, such as less than 40 wt. %, more preferably less than 20 wt. % and even more preferably less than 10 wt. % carbon in the final electrocatalyst. They are also preferred for any material product that is formed from dissolved precursors as opposed to particulate precursors.

Both ultrasonic spray nozzles and submerged ultrasonic transducers have been used by the inventors to produce Pt/C electrocatalyst powders in accordance with the present invention. The reactor conditions (temperature and residence time) used to make the catalysts were essentially the same. The catalysts generated using both approaches had similar physical characteristics and electrochemical activity. The yields using ultrasonic spray nozzles transducers were typically 40% to 60% of theoretical production rates due to losses on the walls as a result of the large droplet sizes and settling. The ultrasonic nozzles (available from Sono-Tek) providing the smallest particle sizes (120 KHz) were utilized and provided production rates in the 1–2 gram per hour range. The nozzle is capable of higher atomization rates but increasing the liquid flow rate through the nozzle does not increase the production rate on horizontal tubular hot-wall reactors. The additional material merely ends up as a deposit on the furnace tube.

Several configurations for introducing the aerosol produced from the nozzle into a carrier gas stream were tested on horizontal, tubular hot-wall furnaces. Process yields were improved from 40% to 60% of theoretical production rates by varying in inlet geometry, carrier gas flow rate, and precursor flow rates. The majority of losses occur upon introducing the aerosol into the furnace. In contrast, the submerged ultrasonic systems with 9 transducers provided production rates of only about 1 to 0.4 grams per hour. The production rates described can be compared with those of a pure metal derived from a dissolved precursor for the same 9-transducer system, which is typically 10 grams per hour. The low production rates for the metal carbon precursor composition are due to the poor atomization of carbon suspensions with submerged ultrasonics.

Two-fluid nozzles are a common means of producing aerosol sprays and are used in many commercial applications typically in conjunction with spray drying processes. Large shearing forces that are generated when a low-velocity liquid stream encounters a high-velocity gas stream accomplish atomization. A direct result of this interaction is that the particle size characteristics of the aerosol are dependent on the flow rate of the gas. Thus, particle characteristics cannot be de-coupled from the carrier gas flow rate. The velocity of the particles as they leave the generation zone can be quite large which may lead to unwanted particle losses due to impaction. The aerosol also leaves the nozzle in a characteristic pattern, typically conical, and this may require that the dimension of the reactor be greater than some minimum value to prevent unwanted losses on the walls of the system.

Figure 2:
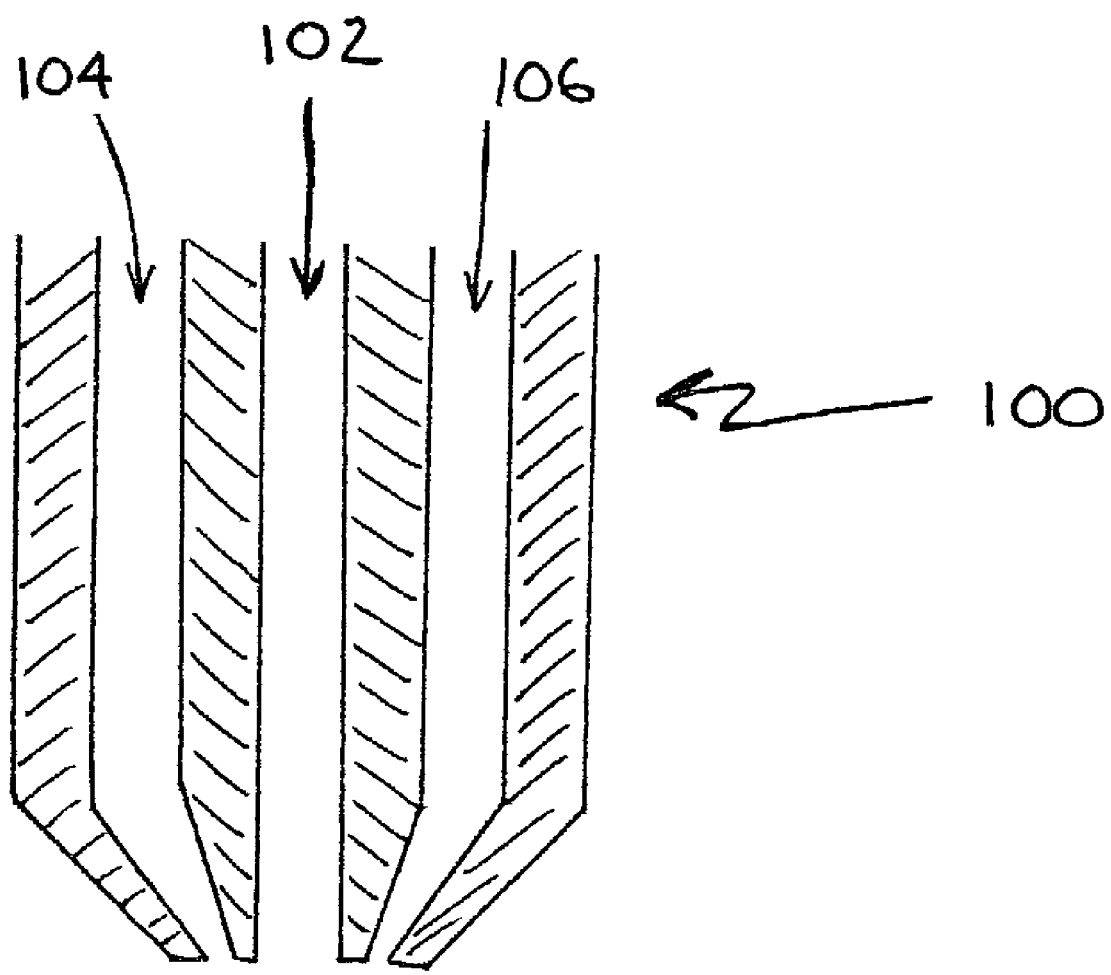
FIG. 2 illustrates a two-fluid nozzle that is useful for the production of electrocatalyst powders according to an embodiment of the present invention.

A two-fluid nozzle is illustrated in FIG. 2. The two fluid nozzle 100 includes a central aperture 102 for directing the liquid precursor into the chamber. Two outer apertures 104 and 106 direct a jet of air or other gas toward the liquid precursor stream as the liquid precursor is sprayed out of the central aperture 102. Atomization is accomplished by large shear forces that are generated when the low-velocity liquid stream encounters the high-velocity gas streams. The particle size characteristics of the aerosol are dependent on the flow rate of the gas.

Thus, a variety of atomization techniques for spray conversion processes are possible for electrocatalyst production and different versions are preferred for different feed streams and products.

A horizontal hot-wall tubular reactor allows the heating of a gas stream to a desired temperature. Energy is delivered to the system by maintaining a fixed boundary temperature at the wall of the reactor and the maximum temperature of the gas is the wall temperature. Heat transfer within a hot wall reactor must occur through the bulk of the gas. Buoyant forces that occur naturally in horizontal hot wall reactors aid this transfer. The mixing also helps to improve the radial homogeneity of the gas stream. Passive or acting mixing of the gas can also aid in increasing heat transfer.

Maximum temperatures and heating rates can be controlled independently of the inlet stream with small changes in residence time. The heating rate of the inlet stream can be controlled using a multi-zone furnace.

The preferred use of a horizontal hot-wall reactor according to the present invention is to produce product particles (secondary structures) with a size of less than about 5 micrometers where settling of particles is not a cause of significant losses. The disadvantage is the poor ability of submerged ultrasonic atomization to atomize particulate carbons. For this reason this approach is preferred for products with high metal loadings corresponding to low carbon contents where atomization is sufficient to enable economical production.

In one embodiment, for very low carbon loadings, a horizontal hot-wall reactor can be used in conjunction with submerged ultrasonic transducers. In another embodiment, the horizontal hot-wall reactor can be used with a two fluid nozzle atomizer. This approach is preferred for products with sizes less than 5 microns, because of the ability to atomize particulate carbons, and feed streams containing higher levels of carbon. The major disadvantage of this approach for particles less than 5 microns is the low aerosol loading (low mass of product per volume of gas) making this an expensive method for powder production.

A horizontal hot-wall reactor can also be used with ultrasonic nozzle (horn) atomization techniques. This approach allows atomization of particulate carbons. The major disadvantage is the large droplet size which leads to losses of materials on reactor walls and other surfaces making this an expensive method for powder production.

Spray conversion systems in the configuration of a spray drier are the preferred production method for large quantities of electrocatalyst according to the present invention. Most spray dryers, however, are unable to achieve the high temperatures needed for the reduction of platinum since maximum inlet temperatures are usually limited to about 600° F. (316° C.). Thus, it has not been proposed prior to the present invention to use such a spray conversion system for the production of electrocatalyst.

Atomizers useful with spray dryers include single-fluid and two-fluid nozzles and rotary wheel atomizers. The preferred method for spray drying the particulate carbon-containing precursors of the present invention is a two-fluid nozzle. Rotary wheel atomizers accumulate dried material at the edge requiring frequent cleaning and intermittent operation. Single-fluid nozzles can be used but require higher liquid flow rates to achieve the same particle size distribution.

Figure 3:
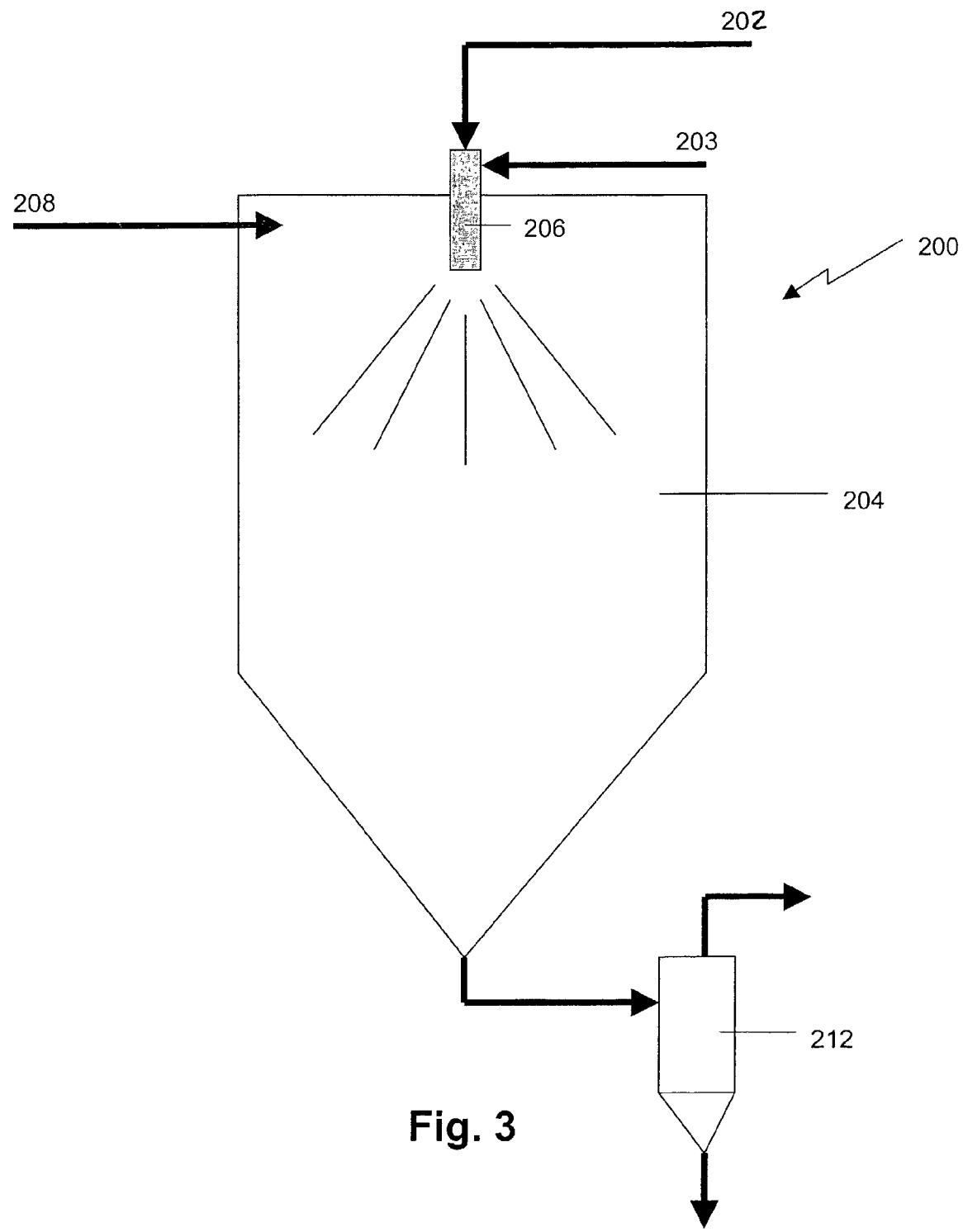
FIG. 3 illustrates a spray dryer that is useful for the production of electrocatalyst powders according to an embodiment of the present invention.

A co-current spray dryer system that is useful according to the present invention is schematically illustrated in FIG. 3. The spray dryer 200 includes a precursor feed line 202 for delivering liquid precursor to the drying chamber 204 and an atomizing gas line 203 for atomizing the liquid feed. The liquid precursor is dispersed into droplets through a spray nozzle 206, such as the two-fluid nozzle illustrated in FIG. 2. Drying air is introduced at the top of the chamber 204 through a hot gas inlet 208. The liquid droplets are dried and collected in a cyclone 212.

In the foregoing description of the basic components of a spray dryer, it should be noted that during spray drying the precursor mixture actually undergoes a chemical conversion. For example, a manganese precursor, such as potassium permanganate, is converted to manganese oxide. The final phase and oxidation state of manganese oxide are critical to the electrocatalytic activity of the resulting powder. Minor variations in reaction temperature and precursor composition can result in powders with different electrocatalytic activities.

It has been advantageously found according to the present invention that relatively low conversion temperatures can be used to obtain quality electrocatalyst powder. It is preferred that the reaction temperature is not greater than about 400° C., more preferably not greater than about 300° C. and even more preferably not greater than about 250° C. Further, it is preferred that the reaction temperature is at least about 100° C., preferably at least about 150° C. Increasing the reaction temperature to over 400° C. can remove excess surfactant which may remain on the powder and poison the oxide active sites. However, this is typically not necessary if the amount of surfactant in the precursor solution, if any, is low.

There are two general types of spray dryers: co-current and mixed flow. In a co-current spray dryer the hot gas is introduced from the top of the unit, where the droplets are generated with a two-fluid nozzle. The temperature a particle is exposed to in co-current dryers is at best that of the outlet. Typically, the outlet temperature is limited to about 200° C., although some designs allow higher temperatures. In addition, since the particles experience the lowest temperature in the beginning of the time-temperature curve and the highest at the end, the possibility of precursor surface diffusion and agglomeration is high and therefore the decomposition of the precursor is more difficult compared to that of a highly dispersed precursor.

A more preferred spray conversion system is based on a mixed flow spray dryer arrangement. The mixed-flow system introduces the hot gas at the top of the unit and the precursor droplets are generated near the bottom in an upward-directed fountain. This gives the particles increased residence time compared to the co-current configuration, as the particles are forced towards the top of the unit, then fall and flow with the gas back down. The temperature the particles experience is higher as compared to a co-current spray dryer. This is important, as most spray dryers are not capable of reaching the higher temperatures that are required for conversion of some of the precursor salts used.

These conditions are advantageous for electrocatalyst synthesis at lower platinum or platinum alloy loadings such as up to 50 wt. % Pt or Pt-based alloys on carbon. For mixed flow spray dryers the temperatures achieved can be high enough for the decomposition of Pt-based precursors (e.g., between 250° C. and 300° C.). The highest temperature in these spray dryers is the inlet temperature, and the outlet temperature is up to two times lower than the inlet temperature. Therefore, the electrocatalyst particles reach the highest temperature for relatively short time, which does not allow for significant precursor migration or surface diffusion. This spike of high temperature allows for fast conversion of the metal or metal oxide precursor followed by a "pseudo quench" since the spray dryer temperature quickly decreases after the temperature maximum is achieved. Thus the "spike" like temperature profile is advantageous for generation of highly dispersed metal or metal oxide clusters on the surface of electrocatalyst supports such as carbon. This is also preferred for other combinations of metal or metal oxide catalysts supported on various supports.

According to another embodiment of the present invention, a hybrid vertical hot-wall/hot-gas tubular reactor can be used. In the case of powders generated with a submerged ultrasonic transducer disk, particle settling is not a problem due to the low settling velocity of the micron-sized particles generated in this fashion. However, not all liquid precursors atomize well using an ultrasonic transducer disk, such as carbon colloidal carbon solutions. Therefore, a different atomization technique is preferred, such as an ultrasonic spray nozzle, or a two-fluid nozzle, which tend to produce larger droplets with sizes larger than about 5 to 10 micrometers. This requires such a vertical system to avoid settling losses.

Figure 4:
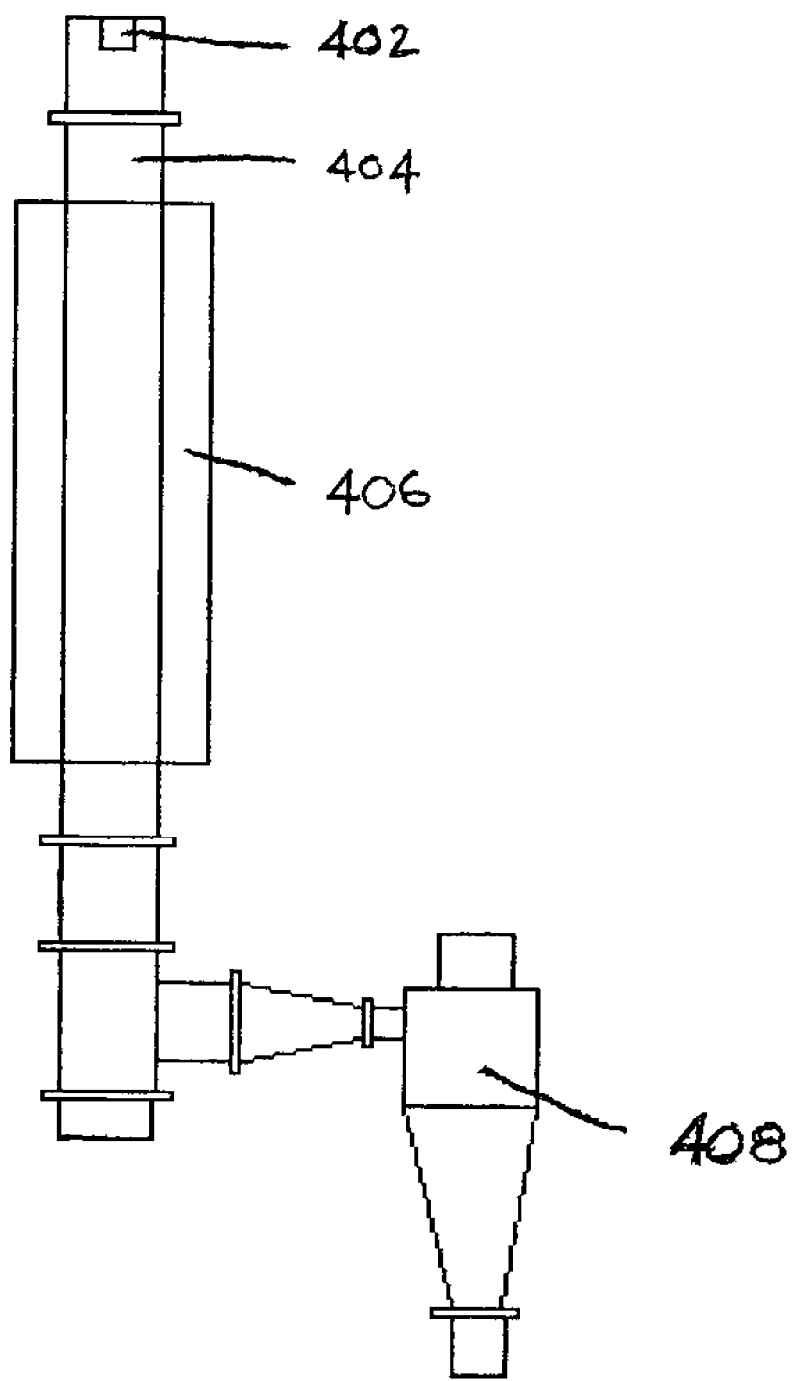
FIG. 4 illustrates a hybrid vertical reactor system that is useful for spray conversion to form particles according to an embodiment of the present invention.

The hybrid vertical system, illustrated in FIG. 4, takes advantage of both a high-temperature hot-wall system and a large capacity spray drying system that uses hot air introduction along with a larger nozzle to produce larger droplets that increase overall output. The preferred system also has increased radial size over a standard horizontal system. A longer furnace, with adequate power (typically three times the thermodynamic requirement) is needed to insure a proper time-temperature history. The system is preferentially operated up to sufficiently high temperature (up to 700° C.) to decompose most molecular precursors. A high-temperature resistant stainless steel is the preferred reaction tube. High-temperature gaskets with water-cooling are preferred. Once the high-temperature drying/reaction has taken place, a rapid cool-down or quench is preferred before powder collection occurs to minimize cluster growth. Another preferred aspect is the ability to use high-temperature gas (up to 700° C.) as drying/reaction means, independent of a hot wall. This high-temperature gas can provide any type of desired atmosphere, from reducing to oxidizing.

Referring to FIG. 4, a nozzle 402 delivers precursor into the top of the system, similar to a co-current spray dryer. A carrier gas is pre-heated to a controlled temperature of up to about 700° C. to 1000° C. and is then introduced at the top of the system, through a cylindrical dispersion 404 just below the nozzle 402. The hot carrier gas and the droplets then flow down through a vertical hot-wall reactor tube 406 where the wall temperature can be controlled. After it is dried and converted, the powder is then cooled and collected in a cyclone or filter bag 408. This configuration increases the production rate relative to all other spray conversion systems by allowing larger droplets (with higher settling velocities) to be generated, along with decreasing losses when compared with a horizontal system. This system provides an order of magnitude increase in production rate over horizontal systems with other techniques. Another advantage of a vertical system is the ability to tailor the time-temperature history of the aerosol to virtually any useful profile.

This hybrid system allows for operation in three modes. The first is as a hot wall tubular reactor. The second is co-current flow hot gas drying similar to a spray dryer. The third mode uses hot wall and hot gas. Hot or cold gas flows can be introduced before or after the furnace to maintain the desired particle temperature.

Operation with three types of nozzles in the hybrid system were compared: a large capacity 25 kHz nozzle (12.5 Lph max) with a conical spray pattern; a medium capacity 48 kHz nozzle (4.5 Lph max) with a flat cylindrical spray pattern; and a low capacity 120 kHz nozzle (1.3 Lph max) with a conical spray pattern.

Conical tip nozzles have a spray pattern that is too wide for tubular systems, and low frequency ultrasonic nozzles produce droplets too large to dry in sufficient time. The medium and large capacity nozzles (lower frequencies) generated droplets that were too large for complete evaporation even at reduced liquid throughputs. Using the small 120 kHz nozzle, complete liquid evaporation was achievable at liquid flow rates less than 0.8 Lph at maximum gas and wall temperatures. Thus, in one preferred embodiment, a flat, high frequency ultrasonic nozzle is used. This type of nozzle gives a fairly narrow, monomodal size distribution and relatively small droplets, which evaporate and convert to electrocatalyst.

Maximum precursor liquid flow rates were determined by studying the extent of evaporation. In contrast to other systems of similar size, the hybrid reactor furnace is capable of drying and converting up to 700 g/hr of 5 wt. % carbon suspended in water, depending on the nozzle and subsequent droplet size.

The results described here were done with an aqueous, 5 wt. % SHAWINIGAN BLACK solution. Runs with hot carrier gas and a 600° C. reactor wall temperature produced particles with surface areas up to 100 m$^2$/g while decreasing the reactor wall temperature to 400° C. brought the surface area down to approximately 55 m$^2$/g. Reducing the reactor wall temperature further to 200° C. produced surface areas of approximately 35 m$^2$/g.

The carbon processed on a vertical system at 400° C., with hot carrier gas and collected in the cyclone had a surface area of 36.5 m$^2$/g, while a carbon made at 400° C., with hot carrier gas and collected in the post-cyclone filter bag had a surface area of 72.0 m$^2$/g. This observation implies that a different collection efficiency of the cyclone versus the post-cyclone filter bag collection exists towards powders with different surface areas. Additionally, the conical nozzles lose a small amount to the gas introduction screens and the reactor tube walls.

Thus, the first step in the fabrication of the electrocatalyst particles according to the present invention is to form a liquid precursor to the particles. In the case of supported electrocatalyst powders, the liquid precursor includes a precursor to both the active species and the support phase. Proper selection of the precursors enables the production of particles having well-controlled chemical and physical properties.

For the production of metal-carbon composite electrocatalyst particles according to the present invention, the precursor solution includes at least one metal precursor. The metal precursor may be a substance in either a liquid or solid phase. Preferably, the metal precursor will be a metal-containing compound, such as a salt, dissolved in a liquid solvent of the liquid feed. For example, the precursor solution can include nitrates, chlorides, sulfates, hydroxides, or carboxylates of a metal. However, chloride salts may lead to detrimental catalytic properties over time. The metal precursor will undergo one or more chemical reactions when heated to convert to a metallic state and form the electrocatalyst particles of the present invention. It may be desirable to acidify the precursor solution to increase the solubility, such as by adding hydrochloric acid.

A preferred catalytically active metal according to one embodiment of the present invention is platinum (Pt). Preferred precursors for platinum metal according to the present invention include chloroplatinic acid ($H_2PtCl_6 \cdot xH_2O$), tetraamineplatinum (II) nitrate ($Pt(NH_3)_4(NO_3)_2$) and hydroxoplatinic acid ($H_2Pt(OH)_6$). Other platinum precursors include Pt-nitrates, Pt-amine nitrates, $Na_2PtCl_4$, and the like. Chloroplatinic acid is soluble in water and the solutions advantageously maintain a low viscosity. $H_2Pt(OH)_6$ is advantageous since it converts to platinum metal at relatively low temperatures.

According to another embodiment of the present invention, palladium is preferred as the catalytically active metal. Palladium precursors include inorganic Pd salts such as palladium (II) chloride ($PdCl_2$), palladium (II) nitrate ($Pd(NO_3)_2$), $H_2PdCl_4$, or $Na_2PdCl_4$. Complex Pd salts such as $Pd(NH_3)_4Cl_2$ or $Pd(NH_3)_2(OH)_2$, Pd-carboxylates, and the like are also useful.

Silver (Ag) is also useful as a catalytically active metal. For silver, inorganic salts can be used including Ag-nitrate ammine complexes, Ag-carboxylates and Ag-oxalate. Particularly preferred are silver carbonate ($Ag_2CO_3$), silver nitrate ($AgNO_3$) and silver acetate ($AgOOCCH_3$).

Other useful catalytically active metals include osmium (Os) and copper (Cu). For osmium, inorganic salts such as $OsCl_3$ can be used. For copper, copper (II) acetate (Cu (OOCH$_3$)$_2$), copper (II) chloride (CuCl$_2$), copper (II) nitrate (Cu(NO$_3$)$_2$), copper (II) perchlorate (Cu(ClO$_4$)$_2$) and copper carboxylates can be used.

For the production of metal oxide-containing electrocatalyst powders, including supported and unsupported metal oxides, a precursor to the metal oxide must be included in the precursor solution. For metal oxides, including oxides of Au, Ag, Pt, Pd, Ni, Co, Rh, Ru, Fe, Mn, Cr, Mo, Re, W, Ta, Nb, V, Hf, Zr, Ti or Al, inorganic salts including nitrates, chlorides, hydroxides, halides, sulfates, phosphates, carboxylates, oxylates and carbonates can be used as precursors. Oxides of the metals can also be used as a precursor to a metal oxide in the final powder.

Particularly preferred metal oxide precursors include: K$_2$Cr$_2$O$_7$, Cr carboxylates and chromium oxalate for chrome oxide; KMnO$_4$, Mn-nitrate, Mn-acetate, Mn-carboxylates, Mn-alkoxides and MnO$_2$ for manganese oxide; Na$_2$WO$_4$ and W$_2$O$_3$, for tungsten oxide; K$_2$MoO$_4$ and MoO$_2$ for molybdenum oxide; Co-amine complexes, Co-carboxylates and cobalt oxides for cobalt oxide; Ni-amine complexes, Ni-carboxylates and nickel oxides, for nickel oxide; and Cu-amine complexes, Cu-carboxylates and copper oxides for copper oxide.

According to one preferred embodiment of the present invention, the precursor to the metal or metal oxide is a cationic precursor. A cationic precursor is a precursor wherein the metal (e.g., Pt) is part of the cationic species of the precursor salt. For example, a preferred cationic precursor for platinum metal is tetraamineplatinum (II) nitrate.

For the production of composite powders having a carbon support phase, the precursor solution also includes at least one carbon precursor. The carbon precursor can be an organic precursor such as carboxylic acid, benzoic acid, polycarboxylic acids such as terephthalic, isophthalic, trimesic and trimellitic acids, or polynuclear carboxylic acids such as napthoic acid, or polynuclear polycarboxylic acids. Organic precursors can react by a mechanism such as:

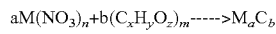

$$aM(NO_3)_n + b(C_xH_yO_z)_m \longrightarrow M_aC_b$$

The use of a liquid organic carbon precursor typically results in amorphous carbon, which is not desirable for most electrocatalyst applications. Preferably, the carbon support precursor is a dispersion of suspended carbon particles. The carbon particles can be suspended in water with additives, such as surfactants, to stabilize the suspension. The carbon particles used as the precursor are the primary particles which constitute the secondary support phase.

The primary carbon precursor particles preferably have a BET surface area of at least about 20 m$^2$/g, more preferably at least about 80 m$^2$/g, even more preferably at least about 250 m$^2$/g and most preferably at least about 1400 m$^2$/g. The surface area of the particulate carbon precursor strongly influences the surface area of the composite electrocatalyst powder, and therefore strongly influences the electrocatalytic activity of the composite powder.

The particulate carbon is small enough to be dispersed and suspended in the droplets generated from the liquid precursor. According to one embodiment, the particulate carbon preferably has an average size of from about 10 to about 100 nanometers, more preferably from about 20 to about 60 nanometers. However, carbon particulates having a size of up to about 25 micrometers can also be used. The carbon can be crystalline (graphitic), amorphous or a combination of different carbon types. The particles can also have a graphitic core with an amorphous surface or an amorphous core with a graphitic surface.

The surface characteristics of the primary particles making up the secondary support structures can be varied. It is preferred that the surfaces before processing to form the final particles allow dispersion of the precursor particles into the precursor liquid. After processing to form the secondary structures, it is preferred that the surfaces have a controlled surface chemistry. Oxidized carbon surfaces can expose hydroxyl, carboxyl, aldehyde, and otherfunctional groups which make the surface more hydrophilic. Reduced carbon surfaces terminate in hydrogen which promotes hydrophobicity. The ability to select the surface chemistry allows tailoring of the hydrophobicity of the surfaces, which in turn allows producing gradients in hydrophobicity within beds of deposited particles. Oxidized carbon surfaces also tend to be microetched, corresponding to higher surface areas while reduced carbon surfaces have lower surface areas. Oxidized carbon surfaces can be derivatized by reaction with various agents which allows coupling of various oxygen containing groups to the surface to further tailor the surface chemistry. This allows the addition of inorganic, organic, metal organic or organometallic compounds to the surface.

Among the convenient sources of dispersed carbon are commercially available carbon-based lubricants which are a suspension of fine carbon particles in an aqueous medium such as dispersed carbon black. Particularly preferred are acetylene carbon blacks having high chemical purity and good electrical conductivity. Examples of such carbon suspensions that are available commercially are GRAFO 1322 (Fuchs Lubricant, Co., Harvey, Ill.) which is a suspension of VULCAN XC-72 carbon black (Cabot Corp., Alpharetta, Ga.) having an average size of about 30 nanometers and a surface area of about 254 m$^2$/g. Also preferred are BLACKPEARLS 2000 (Cabot Corp., Alpharetta, Ga.) and KETJENBLACK (Akzo Nobel, Ltd., Amersfoort, Netherlands), each of which includes carbon having a specific surface area of from about 1300 to 1500 m$^2$/g. Another preferred class of carbon materials are activated carbons which have a degree of catalytic activity. Examples include NORIT NK (Cabot Corp., Alpharetta, Ga.) and PWA (Calgon Carbon Corp., Pittsburgh, Pa.) having an average particle size of about 20 micrometers and a surface area of about 820 m$^2$/g.

The precursors can be formed into an aerosol for spray processing by a number of methods, as is discussed above. The solids loading of carbon in the precursor solution should not be so high as to adversely affect aerosol generation.

A stable precursor suspension (carbon dispersion and metal salt) is necessary to ensure a homogeneous feedstock. A precursor that is unstable will settle in the feed reservoir during the course of the processing, resulting in droplets of varying composition, and ultimately affect the catalyst powder characteristics. In this case, a preferred mode of operation is one in which the suspension of carbon particles with molecular precursors to the metal, metal oxide or other catalytically active material is stirred to keep the particles from settling.

It is preferable to mechanically dissociate larger aggregates of the carbon powders by using, for example, a blade grinder or other type of high-speed blade mill. Thus, dispersing the carbon powder in water preferably includes: 1) if not already provided in suspension, wetting of the carbon black powder by mixing a limited amount of the dry powder with a wetting agent and a soft surfactant; 2) diluting the initial heavy suspension with the remaining water and a basic surfactant diluted in the water; and 3) breaking secondary agglomerates by sonification of the liquid suspension in an ultrasonic bath.

The precursor to the metal or metal oxide active species, for example potassium permanganate, is preferably dissolved separately in water and added in an appropriate amount to a carbon suspension, prior to breaking the secondary agglomerates. Adding the metal salt in this manner advantageously facilitates breaking the larger agglomerates and the mixing results in a less viscous slurry. After sonification, the slurries are stable for several months without any apparent sedimentation or separation of the components.

The reactor systems described above are not commonly used for spray processing wherein precursors to a material component are dried and reacted in one step. Nanometer-sized particles are difficult to produce in the presence of other particles while maintaining control of their dispersion on a support surface. Converting the precursors in a spray drier or similar apparatus is possible according to the present invention due to the use of precursors and additives that decompose at a temperature of not greater than about 400° C., preferably not greater than about 300° C. and even more preferably not greater than about 250° C.

Low thermal decomposition temperature precursors that are useful at such low reaction temperatures according to the present invention to form metals include carboxylates, hydroxides, halides, nitrates, metal-organic complexes, amine adducts, isonitrile compounds, Schiff base complexes, beta-diketonates, alkyls, phosphine complexes, phosphite complexes and carbonyl complexes of metals such as Ni, Ag, Pd, Pt, Rh, Sn, Cu, Au, Co, Ir, Ru and Os.

For metal oxides, useful low temperature precursors include oxocomplexes, alkoxides, amides, carboxylates, hydroxides, halides, nitrates, metal-organic complexes, amine adducts, isonitrile compounds, Schiff base complexes, beta-diketonates, alkyls, phosphine complexes, phosphite complexes and carbonyl complexes of metals such as Sc, Y, La, lanthanides, Ti, Zr, Hf, V, Nb, Ta, Cr, Mo, W, Mn, Re, Fe, Ru, Os, Co, Rh, Ir and Sn.

When a metal is the active species phase, additives to ensure reduction to the metal at a low temperature can advantageously be used and will generally be soluble reducing agents and may either reduce the dissolved complex before spraying or during spraying. Preferably, the reducing agent will not substantially reduce the precursor at room temperature, but will cause reduction at an elevated temperature between about 100° C. and 400° C. These reducing agents should also be water stable and any volatile species that form from the reduction should be capable of being removed from the system. Examples include boranes, borane adducts (e.g., trimethylamineborane, $BH_3NMe_3$), silane derivatives, e.g., $SiH_{(4-x)}R_x$ (where R=an organic group, aryl, alkyl, or functionalized alkyl or aryl group, polyether, alkyl carboxylate) borohydrides, e.g., $NaBH_4$, $NH_4BH_4$, $MBH_{(3-x)}R_x$ (where R=an organic group, aryl, alkyl, or functionalized alkyl or aryl group, polyether, alkyl carboxylate). Other reducing agents include alanes or tin hydrides.

According to a particularly preferred embodiment, a reducing agent for Pt metal is selected from the group consisting of primary alcohols (e.g., methanol and ethanol), secondary alcohols (e.g. isopropanol), tertiary alcohols (e.g., t-butanol), formic acid, formaldehyde, hydrazine and hydrazine salts. For example, an acidified solution of $H_2Pt(OH)_6$ in the presence of formic acid is stable at room temperature but is reduced to Pt metal at low reaction temperatures, such as about 100° C.

For a metal oxide as the active species phase, additives to ensure oxidation to the metal oxide at low temperature can also be used and will generally be soluble oxidizing agents and may either oxidize the dissolved complex before spraying or during spraying. Preferably, the oxidizing agent will not oxidize the precursor to the metal oxide at room temperature, but will cause reduction at elevated temperature between about 100° C. and 400° C. These species should also be water stable and form volatile species that can be removed from the system. Examples include amine oxides, e.g., trimethylamine-N-oxide ($Me_3NO$), oxidizing mineral acids such as nitric acid, sulfuric acid and aqua regia, oxidizing organic acids such as carboxylic acids, phosphine oxides hydrogen peroxide, ozone or sulfur oxides.

The precursor solution can include other additives such as surfactants, wetting agents, pH adjusters or the like. It is preferred to minimize the use of such additives, however, while maintaining good dispersion of the precursors. Excess surfactants, particularly high molecular weight surfactants, can remain on the electrocatalyst particle surface and degrade the catalytic activity if not fully removed.

Spray processing or spray pyrolysis is a valuable processing method because the particles are raised to a high temperature for a short period of time. The relatively high temperature achieves conversion of the molecular precursorto the final desired phase, but the short time ensures little surface diffusion that can cause agglomeration of the nanometer-sized active phase. Hence, the support phase is formed with well dispersed nanometer-sized active phase particles.

In many applications, the electrocatalyst powders and other powders are formed into a layer, often in combination with other materials as part of a device such as a fuel cell or battery. The method by which these materials are deposited has a strong influence on the characteristics of the deposited layer. In turn, the characteristics of the deposited layer also has a strong influence on the performance of the device. Layer characteristics that are important include average thickness, porosity, compositional homogeneity, nature of the interface with other layers, control over the gradient of composition within a layer and the hydrophobicity, hydrophilicity, wettability and accessible surface area.

The electrocatalyst powders of the present invention can be deposited onto device surfaces or substrates by a number of different deposition methods which involve the direct deposition of the dry powder such as dusting, electrophotographic or electrostatic precipitation. Other deposition methods involve liquid vehicles such as ink jet printing, syringe dispense, toner deposition, slurry deposition, paste-based methods and electrophoresis. In all these deposition methods, the powders according to the present invention have a number of advantages over the powders produced by other methods. For example, small, spherical, narrow size distribution particles are more easily dispersed in liquid vehicles, they remain dispersed for a longer period of time and allow printing of smoother and finer features compared to powders made by alternative methods.

The electrocatalyst powders according to the present invention exhibit a high catalytic activity and also have a morphology and microstructure, which enables them to be formed into layers by methods that are not useful with electrocatalyst powders having different characteristics. The high catalytic activity enables thinner layers of these materials to be deposited since a reduced mass of the electrocatalyst is required to achieve the same level of performance. However, it is also important that in the process of printing the layer, the performance advantages of the powders is retained in the layers, for example access to the porosity of the individual particles.

One way of depositing the powders of the present invention is to apply the powders to a substrate through the use of a thick-film paste. In the thick film process, a viscous paste that includes a functional particulate phase (e.g., a carbon composite powder) is screen printed onto a substrate. More particularly, a porous screen fabricated from stainless steel, polyester, nylon or similar inert material is stretched and attached to a rigid frame. A predetermined pattern is formed on the screen corresponding to the pattern to be printed. For example, a UV sensitive emulsion can be applied to the screen and exposed through a positive or negative image of the design pattern. The screen is then developed to remove portions of the emulsion in the pattern regions.

The screen is then affixed to a screen printing device and the thick film paste is deposited on top of the screen. The substrate to be printed is then positioned beneath the screen and the paste is forced through the screen and onto the substrate by a squeegee that traverses the screen. Thus, a pattern of traces and/or pads of the paste material is transferred to the substrate. The substrate with the paste applied in a predetermined pattern is then subjected to a drying and firing treatment to solidify and adhere the paste to the substrate.

Thick film pastes have a complex chemistry and generally include a functional phase, a binder phase and an organic vehicle phase. The functional phase include the electrocatalyst powders of the present invention. The binder phase can be, for example, a mixture of carbon, metal oxide or glass frit powders. PbO based glasses are commonly used as binders. The function of the binder phase is to control the sintering of the film and assist the adhesion of the functional phase to the substrate and/or assist in the sintering of the functional phase. Reactive compounds can also be included in the paste to promote adherence of the functional phase to the substrate.

Thick film pastes also include an organic vehicle phase that is a mixture of solvents, polymers, resins and other organics whose main function is to provide the appropriate rheology (flow properties) to the paste. The liquid solvent assists in mixing of the components into a homogenous paste and substantially evaporates upon application of the paste to the substrate. Usually the solvent is a volatile liquid such as methanol, ethanol, terpineol, butyl carbitol, butyl carbitol acetate, aliphatic alcohols, esters, acetone and the like. The other organic vehicle components can include thickeners (sometimes referred to as organic binders), stabilizing agents, surfactants, wetting agents and the like. Thickeners provide sufficient viscosity to the paste and also acts as a binding agent in the unfired state. Examples of thickeners include ethyl cellulose, polyvinyl acetates, resins such as acrylic resin, cellulose resin, polyester, polyamide and the like. The stabilizing agents reduce oxidation and degradation, stabilize the viscosity or buffer the pH of the paste. For example, triethanolamine is a common stabilizer. Wetting agents and surfactants are well known in the thick film paste art and can include triethanolamine and phosphate esters.

The different components of the thick film paste are mixed in the desired proportions in order to produce a substantially homogenous blend wherein the functional phase is well dispersed throughout the paste. Typically, the thick film paste will include from about 5 to about 95 weight percent such as from about 60 to 85 weight percent, of the functional phase, including the carbon composite powders of the present invention.

Examples of thick film pastes are disclosed in U.S. Pat. Nos: 4,172,733; 3,803,708; 4,140,817; and 3,816,097 all of which are incorporated herein by reference in their entirety.

Some applications of thick film pastes require higher tolerances than can be achieved using standard thick-film technology, as is described above. As a result, some thick film pastes have photo-imaging capability to enable the formation of lines and traces with decreased width and pitch (distance between lines). In this type of process, a photoactive thick film paste is applied to a substrate substantially as is described above. The paste can include, for example, a liquid vehicle such as polyvinyl alcohol, that is not cross-linked. The paste is then dried and exposed to ultraviolet light through a patterned photomask to polymerize the exposed portions of paste. The paste is then developed to remove unwanted portions of the paste. This technology permits higher density lines and features to be formed. The combination of the foregoing technology with the composite powders of the present invention permits the fabrication of devices with higher resolution and tolerances as compared to conventional technologies using conventional powders.

In addition, a laser can be used instead of ultraviolet light through a mask. The laser can be scanned over the surface in a pattern thereby replacing the need for a mask. The laser light is of sufficiently low intensity that it does not heat the glass or polymer above its softening point. The unirradiated regions of the paste can then be removed leaving a pattern. Likewise, conventional paste technology utilizes heating of the substrate to remove the vehicle from a paste and to fuse particles together or modify them in some other way. A laser can be used to locally heat a conventionally applied paste layer wherein the laser is scanned over the paste layer to form a pattern. The laser heating is confined to the paste layer and drives out the paste vehicle and heats the powder in the paste without appreciably heating the substrate. This allows heating of particles, delivered using pastes, without damaging a glass or even polymeric substrate.

According to one embodiment of the present invention, it is advantageous to print the layers containing the electrocatalyst powders of the present invention using a direct-write device (e.g., a printing method). There are a number of advantages of constructing an energy device such as a battery or fuel cell using printing methods. Printing methods en able the formation of layers that are thinner and with smaller feature sizes than those that can be produced by current manufacturing methods such as rolling and pressing. The thinner layers result in reduced mass and volume and therefore an increase in the volumetric and gravimetric energy density of the battery. The thin devices can be incorporated into unusual vehicles or be directly integrated with electronic devices to give compact self-contained operational systems.

Thinner layers can also facilitate faster transport of chemical species such as ions, electrons and gases due to the reduced diffusional distances. This can lead to improved battery or fuel cell performance where, for example, the diffusion of a chemical species is otherwise a rate-limiting factor. This is the case in metal-air batteries where the transport of $O_2$ or hydroxide ion in the air electrode can be rate limiting. Shorter diffusional distances and lower diffusional barriers will lead to a higher rate of drain for this type of device. The discharge rate can also be improved.

Printing methods can also facilitate better control over the construction of interfaces and layer compositions giving rise to tailored gradients in composition and layer surface morphology that facilitate chemical transport and electrochemical reactions.

Certain printing methods facilitate the construction of features with combined functionalities such that multiple layers may be combined into a single layer with multiple functionality that provides benefits in both performance and energy density.

Thus, the electrocatalyst particles and other materials such as polymer-modified particles, according to the present invention can advantageously be deposited using a direct-write tool. To be deposited using a direct-write tool, the particles must be carried in a liquid vehicle. The particles should remain well-dispersed in the liquid vehicle for extended periods of time and therefore the cartridge or reservoir into which the suspension is placed will have a long shelf-life. In some instances, substantially fully dense particles can be adequately dispersed and suspended. Depending upon the density of the particle compound, however, particles with a high density relative to the liquid in which they are dispersed and with a size in excess of about 0.5 µm cannot be suspended in a liquid that has a sufficiently low viscosity to be deposited using a direct-write tool, particularly an ink-jet device. In most cases, the apparent density of the particles must therefore be substantially lower than the theoretical density.

More specifically, it is desirable to maintain a substantially neutral buoyancy of the particles in the suspension while maintaining a relatively large physical size. The buoyancy is required for ink stability while the larger size maintains ink properties, such as viscosity, within useful ranges. Stated another way, it is desirable to provide particles having a low settling velocity but with a sufficiently large particle size. The settling velocity of the particles is proportional to the apparent density of the particle ($\rho_s$) minus the density of the liquid ($\rho_L$). Ideally, the fine particles will have an apparent density that is approximately equal to the density of the liquid, which is typically about 1 g/cm³ (i.e., the density of water). Since a compound such as an oxide has a theoretical density ($\rho_p$) in the range of from about 3 to about 7 g/cm³, it is preferable that the apparent density of such particles be a small percentage of the theoretical density. According to one embodiment, the particles have an apparent density that is not greater than about 50 percent of the particles theoretical density, more preferably not greater than about 20 percent of the theoretical density. Such particles would have small apparent sizes when measured by settling techniques, but larger sizes when measured by optical techniques.

In the case of electrocatalyst powders, especially carbon-based electrocatalyst powders, they are designed to have a high degree of porosity and therefore relatively low density. This aids in the suspendability of these powders in low viscosity, high powder loading inks.

Some electrocatalyst formulations may be comprised of material with a relatively high density. One preferred method for obtaining a reduced apparent density of the fine particles according to the present invention is to produce particles having either a hollow or a porous microstructure (or a combination thereof). Hollow electrocatalyst particles might include carbon, metal or metal oxide based materials where the surface area of these materials is high with a desire to maintain a relatively low apparent density. That is, one preferred particle morphology is a particle comprised of a dense shell having an inner radius and an outer radius. Preferably, the shell has a high density and is substantially impermeable. Assuming that air fills the interior of such a hollow particle, the equation representing the conditions for neutral buoyancy can be written:

$$r_2 = \left[\sqrt[3]{\frac{\rho_p}{\rho_p - 1}}\right] r_1$$

where:
$r_2$=outer radius
$r_1$=inner radius
$\rho_L$=1 (water)
$\rho_p$=theoretical density of the particle For example, if a hollow particle has an outer radius of 2 µm (4 µm diameter) and a density of 5 g/cm³, then the optimum average wall thickness would be about 0.15 µm for the particle to be neutrally buoyant in a liquid having a density of 1 g/cm³. According to one preferred embodiment, the hollow particles have an average wall thickness that is not greater than about 10 percent of the particle diameter, and more preferably not greater than about 5 percent of the particle diameter.

It will be appreciated that other particle morphologies can be utilized while maintaining an apparent density within the desired range. For example, the electrocatalyst particles can have a sufficient amount of porosity to yield a particle having an apparent density that is lower than the theoretical density. Open (surface) porosity can also decrease the apparent density if the surface tension of the liquid medium does not permit penetration of the surface pores by the liquid.

Thus, the fine particles according to the present invention have a low settling velocity in the liquid medium. The settling velocity according to Stokes Law is defined as:

$$V = \frac{D_{st}^2 (\rho_s - \rho_l) g}{18 \eta}$$

where

| | |
|---|---|
| $D_{st}$ = | Stokes diameter |
| $\eta$ = | fluid viscosity |
| $\rho_s$ = | apparent density of the particle |
| $\rho_l$ = | density of the liquid |
| V = | settling velocity |
| g = | acceleration due to gravity |

Preferably, the average settling velocity of the particles is sufficiently low such that the suspensions have a useful shelf-life without the necessity of frequent mixing. Thus, it is preferred that a large mass fraction of the particles, such as at least about 50 weight percent remains suspended in the liquid. The particles preferably have an average settling velocity that is not greater than 50 percent, more preferably not greater than 20 percent, of a theoretically dense particle of the same composition. Further, the particles can be completely redispersed after settling, such as by mixing, to provide the same particle size distribution in suspension as measured before settling.

In one embodiment, the electrocatalyst particles can include a hydrophilic compound, such as silica ($SiO_2$), hydrophilic carbon, another metal oxide or a surface modification agent/surfactant, to enhance the dispersion characteristics of the powder in the liquid, provided that such an additive does not interfere with the electrocatalytic properties of the particles. Preferably, the hydrophilic compound is found on at least a portion of the surface of the particle. As is discussed in more detail above, the powders according to the present invention are preferably produced utilizing a spray conversion technique, typically in the presence of water vapor. The presence of water vapor during formation of the particles can advantageously result in a hydroxylated particle surface. Such a hydroxylated surface provides further hydrophilicity of the particle, aids in the dispersion of the particles and reduces the number of particle agglomerates in the liquid suspension.

According to the present invention, more than one type of particle can be dispersed in a single liquid vehicle for deposition with a direct-write tool. The particles can be dispersed into the liquid vehicle by lightly mixing or, for example, by using ultrasound. For use in an ink-jet device, the viscosity of the suspension is preferably not greater than about 30 centipoise, more preferably not greater than about 20 centipoise. It is also important to control the surface tension of the liquid suspension and preferably the surface tension is from about 20 to 25 dynes/cm for an ink-jet device.

The solids loading of fine particles in the suspension is preferably as high as possible without adversely affecting the viscosity or other necessary properties of the direct-write composition. For example, the direct-write composition can have a particle loading of up to about 75 weight percent, such as from about 10 to about 50 weight percent.

The direct-write compositions are typically water-based, although other solvents or liquids may be used. Such compositions can include other chemicals including, but not limited to, surfactants, dispersion agents, defoamers, chelating agents, humectants and the like.

More specifically, ink-jet compositions generally include water and an alcohol. Organic solvent based systems can also be used and ink-jet print heads are often tailored for either organic or aqueous systems. Surfactants are also used to maintain the particles in suspension. Co-solvents, also known as humectants, are used to prevent the ink from crusting and clogging the orifice of the ink-jet head. Biocides can also be added to prevent bacterial growth over time. Examples of such ink-jet liquid vehicle compositions are disclosed in U.S. Pat. No. 5,853,470 by Martin et al.; U.S. Pat. No. 5,679,724 by Sacripante et al.; U.S. Pat. No.5,725,647 by Carlson et al.; U.S. Pat. No.4,877,451 by Winnik et al.; U.S. Pat. No. 5,837,045 by Johnson et al.; and U.S. Pat. No. 5,837,041 by Bean et al. Each of the foregoing U.S. patents is incorporated by reference herein in their entirety. The selection of such additives is based upon the desired properties of the composition, as is known to those skilled in the art. The fine particles are mixed with the liquid vehicle using a mill or, for example, an ultrasonic processor.

According to one embodiment of the present invention, the liquid vehicle into which the particles are dispersed includes soluble molecular precursors, such as metal precursors, that have a relatively low decomposition temperature. The molecular precursor is preferably a soluble inorganic compound that can be co-deposited with the powders and then thermally treated to form an essentially continuous phase filling any void space between particles. Low temperature decomposition precursors such as those described herein with respect to spray drying can be used. A preferred type of precursor compound are the alpha hydroxycarboxylate (glycolate) derivatives. Metal carboxylates are often advantageous in this respect for the formation of metal compounds. It will be appreciated that the molecular precursors will have a composition that is specific to the material being deposited. Ligands on the molecular precursors can act as a surfactant or the actual liquid vehicle.

In one embodiment, the molecular precursor forms essentially the same compound as the particles. In this embodiment, the particles in the liquid vehicle can advantageously catalyze the molecular precursor to form the desired compound. The addition of precursors with decomposition temperatures below about 300° C. allows the formation of functional features on a polymeric substrate, including polyamide, fluoro-polymers, epoxy laminates and other substrates. These molecular precursors are particularly useful when combined with hollow or porous particles because they contribute to higher densities when the deposited layer is sintered. That is, a portion of the final layer comes from the particles and a portion from the molecular precursor wherein the portion from the precursor fills in space between particles and thereby increases the solids fraction in the final structure.

The liquid vehicle can also include carriers to hold the particles together once the particles are deposited. Such a liquid vehicle would be advantageous when the particles are to be deposited and will not be sintered to adhere the particles to one another. The liquid vehicle could also include a polymer that, after deposition, would yield a polymer layer with particles dispersed throughout the polymer. Further, the liquid vehicle could also include a molecular species which can react with the dispersed particles to modify the properties of the particles.

Figure 5:
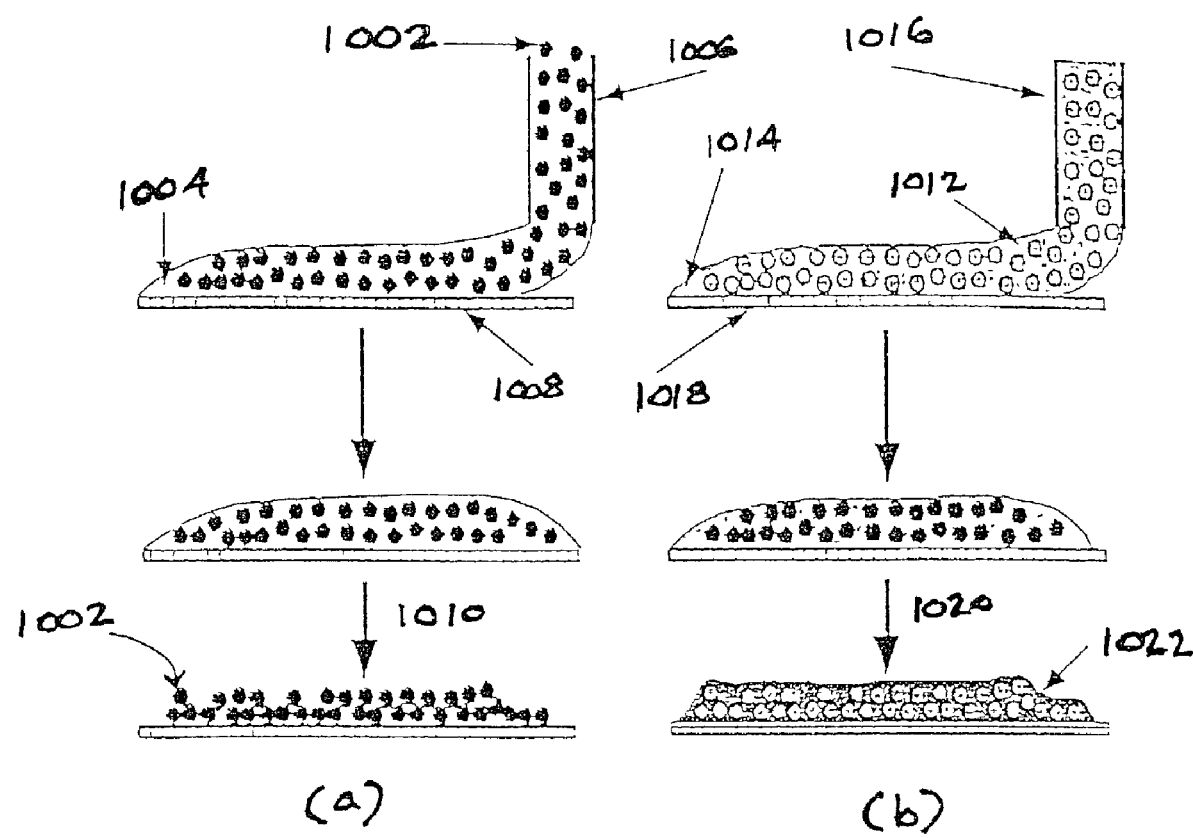
FIG. 5(a) and (b) illustrate direct-write deposition methods according to the present invention.

A direct-write deposition method according to the present invention is illustrated schematically in FIG. 5. In FIG. 5(a), a fine powder 1002 is dispersed in an organic vehicle 1004 including water and various organics to aid in the dispersion of the fine powder 1002. The direct-write tool 1006 ejects the suspension through an orifice and onto a substrate 1008. After deposition the substrate 1008 is thermally treated 1010 to remove the liquid vehicle 1004 including the organics and deposit a thin layer of fine particles 1002.

In the embodiment illustrated in FIG. 5(b), the particles 1012 are dispersed in a liquid vehicle 1014 which include water, organics and at least one molecular precursor to a compound or a metal. The liquid suspension including the particles 1012 and the precursor-containing liquid vehicle 1014 are deposited using a direct-write tool 1016 onto a substrate 1018. After deposition, the substrate 1018 is thermally treated 1020 to remove liquids and convert the precursors to their respective compound or metal. The resulting layer 1022 includes particles dispersed throughout a film of the compound or metal.

As used herein, a direct-write tool is a device that deposits a liquid or liquid suspension onto a surface by ejecting the liquid through an orifice toward the surface without the tool making substantial contact with the surface. The direct-write tool is preferably controllable over an x-y grid relative to the printed surface (i.e. either or both the substrate and device may move). One preferred direct-write tool according to the present invention is an ink-jet device. Other examples of direct-write tools include automated syringes, such as the MICROPEN tool, available from Ohmcraft, Inc., of Honeoye Falls, N.Y. and the DOTLINER dispense system (Manncorp, Huntingdon Valley, Pa.) which is capable of dispensing lines, dots and areas down to 200 μm or smaller at speeds of up to 10,000 dots/hour.

According to the present invention, the orifice of the direct-write tool can have a reduced diameter. This is a direct result of the particle characteristics discussed hereinabove. A reduced diameter will enable the formation of finer features.

One preferred direct-write tool according to the present invention is an ink-jet device. Ink-jet devices operate by generating droplets of ink and directing the droplets toward a surface. Ink-jet printing, when applied to the particulate suspensions in accordance with the present invention is a means for delivering controlled quantities of the compound to a variety of substrates.

The position of the ink-jet head is carefully controlled and can be highly automated so that discrete patterns of the ink can be applied to the surface. Ink-jet printers are capable of printing at a rate of 1000 drops per second or higher and can print linear features with good resolution at a rate of 10 cm/sec or more, up to about 1000 cm/sec. Each drop generated by the ink-jet head includes approximately 2 to 200 picoliters of the liquid that is delivered to the surface. For these and other reasons, ink-jet devices are a highly desirable means for depositing materials onto a surface.

Typically, an ink-jet device includes an ink-jet head with one or more orifices having a diameter of less than about 100 µm, such as from about 50 µm to 75 µm. Ink droplets are generated and are directed through the orifice toward the surface being printed. Ink-jet printers typically utilize a piezoelectric driven system to generate the droplets, although other variations are also used. Ink-jet devices are described in more detail in, for example, U.S. Pat. No. 4,627,875 by Kobayashi et al. and U.S. Pat. No. 5,329,293 by Liker, each of which is incorporated herein by reference in their entirety. However, such devices have primarily been used to deposit inks of soluble dyes.

Ideally, the droplet generated by the printer head is identical in composition to the bulk fluid. However, some filtration of suspensions may occur if the particles are too large to pass through the channels or onboard filters. The small particle size and reduced number of particle agglomerates according to the present invention reduces the amount of particles collected by the filter and can enable removal of the filter.

According to the present invention, it is possible to deposit gradient layers of material wherein the composition of the layer changes through the thickness of the layer. In order to deposit such layers, it is preferred to form the layer using multiple direct-write deposition steps wherein the composition of the suspension being deposited changes through the layer.

Utilizing the direct-write method of the present invention, it is also possible to form features and create device components on a non-planar surface, if required for a specific application or product geometry.

Other processes that can be utilized to fabricate the devices of the present invention include lasertransfer and guided optical deposition. In a lasertransfer method, a material that is to be deposited is placed onto a transfer substrate such as a glass disc or an organic polymer-based ribbon. The transfer substrate is then placed over the substrate upon which the material is to be deposited. A laser is then used to controllably transfer the material to the substrate from the transfer substrate.

Guided optical deposition is a technique wherein the materials or precursors to the materials are delivered through an optical fiber to the substrate in a controlled manner such that features on the substrate can be formed by controlling the position of the optical fiber relative to the substrate. Upon delivery of the material and or material precursor to the substrate, the material is heated if necessary to convert the material or otherwise modify the material properties. For example, the material can be heated in a localized manner by using a laser.

The particles can also be deposited electrophoretically or electrostatically. The particles are charged and are brought into contact with the substrate surface having localized portions of opposite charge. The layer is typically lacquered to adhere the particles to the substrate. Shadow masks can be used to produce the desired pattern on the substrate surface.

Patterns can also be formed by using an ink jet or small syringe to dispense sticky material onto a surface in a pattern. Powder is then transferred to the sticky regions. This transfer can be done is several ways. A sheet covered with powder can be applied to the surface with the sticky pattern. The powder sticks to the sticky pattern and does not stick to the rest of the surface. A nozzle can be used to transfer powder directly to the sticky regions.

Many methods for directly depositing materials onto surfaces require heating of the particles once deposited to sinter them together and densify the layer. The densification can be assisted by including a molecular precursor to a material in the liquid containing the particles. The particle/molecular precursor mixture can be directly written onto the surface using ink jet, micro-pen, and other liquid dispensing methods. This can be followed by heating in a furnace or heating using a localized energy source such as a laser. The heating converts the molecular precursor into the functional material contained in the particles thereby filling in the space between the particles with functional material.

A number of other methods may be employed to construct layers containing the electrocatalyst powders according to the present invention. For example, the powders can be deposited by doctor blading, slot die or curtain coater methods. In these methods, an ink or paste containing the electrocatalyst powder is applied to the surface using blade which is held at a specified height from the substrate. The thickness of the layer can be controlled down to several micrometers in thickness. For slot die and curtain coater methods, the ink or paste is dispensed through a small gap onto a substrate that may be moving on a web drive.

Roll pressing methods can also be used. Roll pressing methods involve mixing components including the electrocatalyst powder, binders and other property modifiers and feeding them through a roll mill to form a pressed film. Roll pressing is often done directly on other active parts of the energy device such as a nickel mesh current collector.

Electrostatic printing methods can be used wherein the electrocatalyst particles are charged with an electric charge, transferred to the drum of a roller, then transferred to a substrate which has the opposite electric charge to that of the particles. This transfer can be carried out in a fashion that results in a blanket layer over the entire substrate or in a patterned manner with the pattern determined by the distribution of the electrical charge on the substrate surface. Typically this method enables the transfer of layers one particle thick and therefore enables very good control over layer thickness for thin layers.

Gravure, rotogravure and intaglio printing methods can be used wherein an ink or paste containing the electrocatalyst powder is transferred to a sunken surface feature, often on a cylinder, that defines the pattern to be transferred to the substrate surface. The substrate is often a continuous feed from a web drive. Relief and flexographic printing methods can also be used which are the reverse of Gravure printing in that a material, often in the form of a paste or ink, is transferred from a raised pattern on a surface, often a roller, to a substrate.

Lithographic printing methods can also be used. In lithographic printing methods, a photosensitive ink or paste is placed on the substrate and exposed to a source of illumination or electromagnetic radiation, generally UV light, wherein the exposed areas interact with this radiation to undergo a change. The change may result in creation of a soluble or insoluble feature depending on the reactivity of the paste and the desire for positive or negative lithography. After removal of the unwanted matter the patterned layer containing the electrocatalyst powder remains for further processing.

Laser transfer methods can be used in which the electrocatalyst containing material is dispersed on a tape or ribbon and a laser is used to transfer material from the underneath surface of the ribbon or tape to the surface of the desired substrate which is close proximity to the tape. Using this method, features can be built with controlled dimensions.

Spray deposition methods can also be used. In spray deposition methods, an ink containing the electrocatalyst powder is fed through a spray nozzle and atomized to form droplets which are directed to a surface where the electrocatalyst layer is to be deposited.

Thus, the electrocatalyst powders produced according to the present invention result in thinner and smoother powder layers when deposited by such liquid or dry powder based deposition methods. Smoother powder layers are the result of the smaller average particle size, spherical particle morphology and narrower particle size distribution compared to powders produced by other methods.

The present invention is also directed to devices including thin film primary and secondary batteries and in one embodiment is directed to thin film air cathodes for use in such batteries. The thin film air cathodes are particularly useful in metal-air batteries such as Zn/Air primary batteries and Zn/Air secondary batteries and novel batteries referred to herein as metal hydride/air (MH/Air) secondary batteries. The novel air cathode advantageously enables the reduction of oxygen ($O_2$) to hydroxyl ion ($OH^-$) and the transport of the $OH^-$ ions to the anode during discharge and transport $O_2$ to the liquid-solid interface during discharge. For this reason, the thin film air cathodes of the present invention are also referred to as bifunctional oxygen electrodes, since they combine both functions, namely oxygen reduction and oxygen evolution.

Metal-air batteries have the best potential for power density, peak power characteristics, voltaic efficiency and rate capability among all battery technologies. In addition, the components of a metal-air battery are very suitable for printing to produce a light-weight, thin battery. The high rate of discharge is also advantageous for portable devices that require frequent high current discharge with a background of low current continuous operation.

The metal-air batteries according to the present invention include multiple functional layers, two or more of which may be combined into a single multi-functional layer. The functional layers can include a membrane layer, current collector, hydrophobic layer, electrocatalyst layer, an electrolyte, separator and anode.

Figure 6:
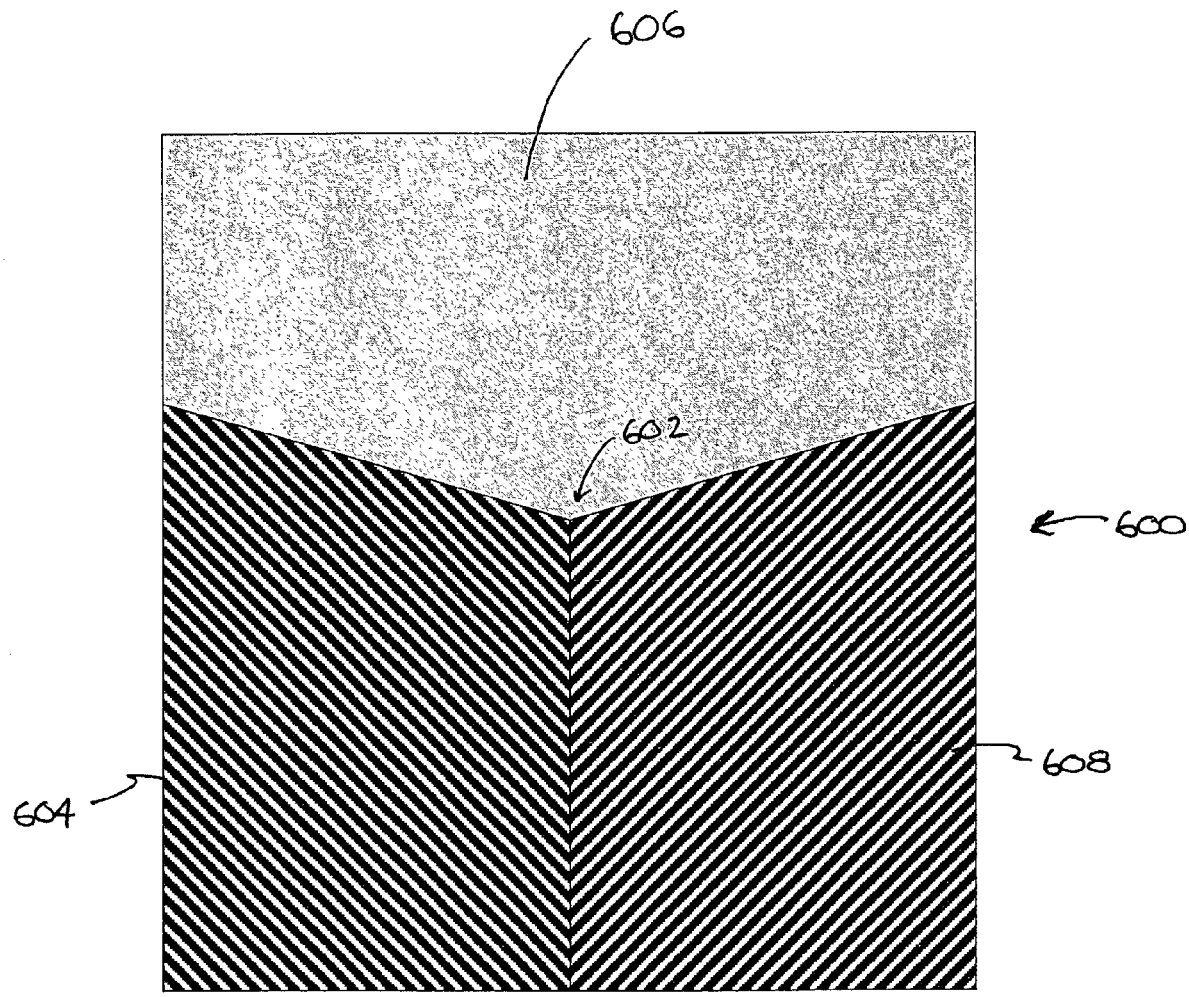
FIG. 6 illustrates the 3-phase boundary of an energy device such as a battery or fuel cell.

The main electrocatalytic processes in the air cathode of a metal/air battery, as well as in other devices such as a PEM fuel cell, take place in a 3-phase boundary (electrode/air/electrolyte), which is graphically illustrated in FIG. 6. The electrocatalyst for oxygen reduction must populate the zone of 3-phase contact 602 and be in electrical contact with the electrode (current collector) 604 and in diffusional contact with the electrolyte 606 and the air 608. To accomplish this, present metal air battery cathodes include a gas-diffusion layer, a catalytic layer and a current collection system. The gas-diffusion layer is characterized by high gas permeability and impermeability to aqueous solutions. The catalytic layer consists of a porous conductive matrix with a highly dispersed electrocatalyst to yield a distribution of hydrophobic pores for oxygen supply and hydrophilic pores for electrolyte exposure. The current collector is usually made from an inert metal mesh, such as nickel or nickel alloy mesh in intimate mechanical contact with the pressed matrix of highly dispersed carbon.

It is desirable to maximize the exposure of the active electrocatalytic sites to both air and the electrolyte. According to the present invention, a gradient of hydrophilic/hydrophobic properties across the catalytic layer in the zone of 3-phase contact can be utilized to enhance the properties of the device. Various embodiments of the air cathode according to the present invention will now be described with particular reference to FIGS. 7 to 13. It will be appreciated that the embodiments illustrated in FIGS. 7–13 are also applicable to other energy devices, such as PEM fuel cells.

Figure 7:
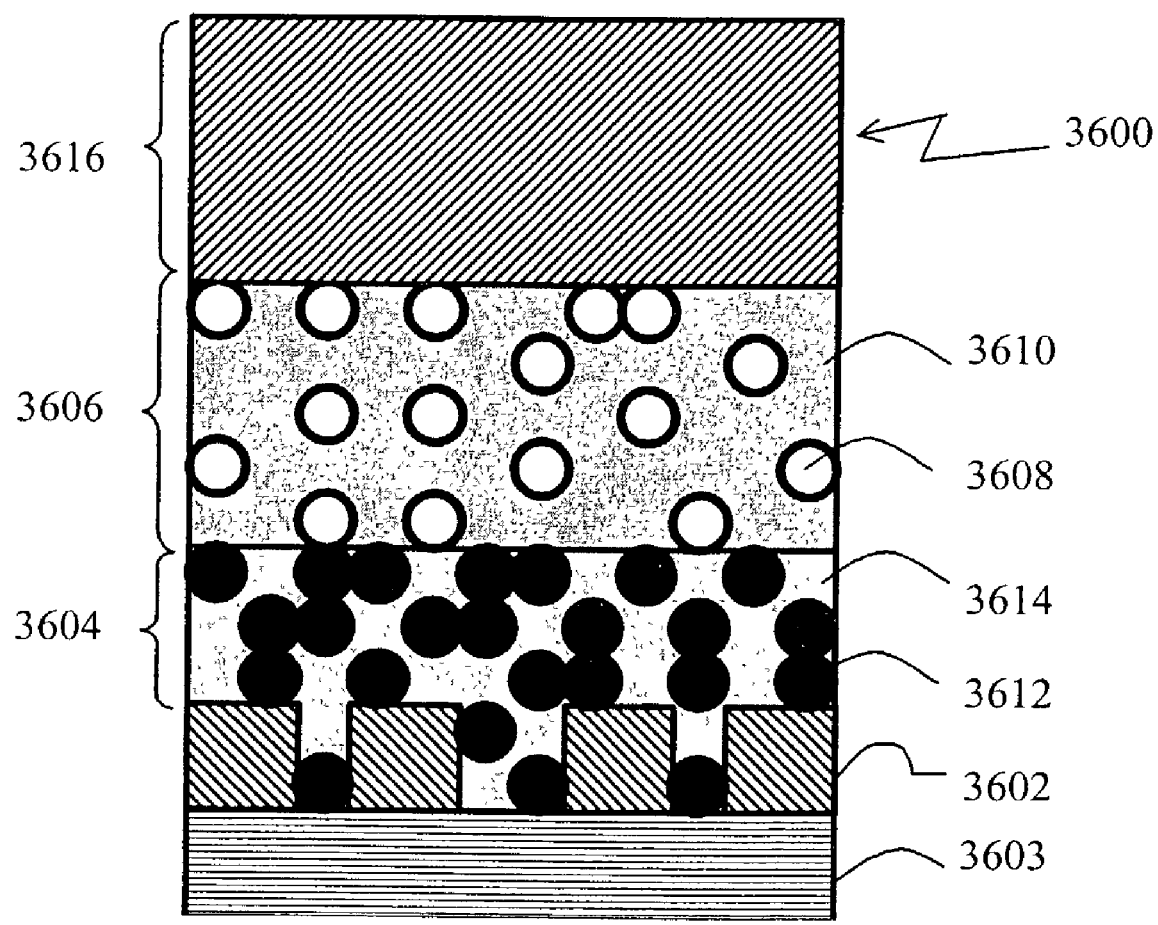
FIG. 7 illustrates an air cathode according to an embodiment of the present invention.

FIG. 7 illustrates an air cathode 3600 according to one embodiment of the present invention. The air cathode illustrated in FIG. 7 can advantageously utilize printing of the current collector 3602 and sequential printing of the electrocatalyst layer 3606 and carbon conductor layer 3604. The current collector 3602 is fabricated from a conductive metal such as nickel or silver and for many applications silver is preferred. The current collector 3602 can be deposited solely from metal precursors or from metal precursors combined with dispersed metal powders. The dispersed metal powders can be nanometer-sized particulate powders or can be high aspect ratio powders (e.g., fibers), such as fibers having an average length of 2 to 10 µm, which can provide good conductivity while being highly porous. The metal precursors should be capable of decomposing into the metal at relatively low temperatures, such as not greater than about 400° C., more preferably not greater than about 250° C. For example, silver metal precursors can be chosen from silver carboxylates and silver trifluoroacetate, which can also include silver nanoparticles. When silver nanoparticles are included in a silver trifluoroacetate precursor, the thermal decomposition temperature can be reduced from about 350° C. to about 250° C. If the material is subjected to a rapid thermal anneal or is laser processed, then it may be possible to utilize higher temperature precursors due to the short exposure time. A thermally insulating layer, such as a porous aerogel layer, can also be used as a-thermal insulator to reduce the thermal affects. Current collectors thinner than about 1 µm can be formed solely from the metal precursors and will not require incorporation of metal powder, while those thicker than 1 µm will typically require the use of a metal powder precursor.

The current collector 3602 must be deposited and processed at low temperatures onto a membrane gas diffusion layer 3603. The gas diffusion layer 3603 is typically fabricated from TEFLON. TEFLON is a tetrafluoroethylene (TFE) fluorocarbon polymer available from E. I. duPont deNemours, Wilmington, Del. Although the term TEFLON is used throughout the present specification for convenience, it is understood that other similar fluorocarbon polymers can be substituted for TEFLON.

The current collector is preferably fabricated using a direct-write deposition process. Advantageously, the current collector comprises a plurality of elongated strips having an average width of preferably not greater than about 100 µm, such as not greater than about 75 µm. It will be appreciated that the metal current collector can be fabricated by other methods, including sputtering, evaporation, photolithography, electroless plating, electroplating, doctor blade, screen printed or electrochemical deposition.

A gas diffusion layer 3603 which allows maximum permeation of oxygen and no permeability to aqueous solutions using hydrophobic pores is necessary as the pores of the gas diffusion layer need to be protected from flooding by the electrolyte. This layer can be a continuous TEFLON membrane or a pressed TEFLON modified carbon layer. For example, one preferred TEFLON layer is about 90 μm thick with a density of 2.26 cm³/g. The average pore size is about 23 nm, with a distribution of pores ranging from about 0.2 nm to 70 nm, corresponding to a porosity of about 10% and a surface area of 7.3 m²/g.

In case of the TEFLON modified carbon (discussed below), the current collector is incorporated as a Ni mesh in the carbon with the metal mesh being closer to the gas-open side. However in the case of the current collector being deposited directly on the TEFLON, the TEFLON surface is preferably modified to promote adhesion between the current collector and the TEFLON surface. Several routes can be utilized to modify the surface of the TEFLON. A commonly used method to modify the TEFLON surface is to etch the surface. Tetra-etch is a commonly used industrial etchant for TEFLON. Tetra-etch is a mixture of sodium naphthalene in ethylene glycol dimethyl ether. The TFE TEFLON molecule is a long chain of carbon atoms to which fluorine atoms are bonded. The etchant strips the fluorine atoms from the chain creating a deficiency of electrons, which are then replaced with water vapor, oxygen, and hydrogen when the TEFLON is exposed to air. The carboxyl, carbonyl and hydroxyl groups formed as a result of etching easily adhere the current collector on the TEFLON surface. Tetra-etch in the as received form is to strong to etch the thin TEFLON layer and should be diluted for etching the TEFLON surface.

Another approach to modify the TEFLON surface is to sputter a thin layer of metal film on the TEFLON surface. Examples of metals that can be sputtered are Au and Cu. In one embodiment, a 40 nm Au layer is sputtered on TEFLON, which enabled the Ag current collector to adhere to the TEFLON. The characteristics of TEFLON were measured after surface modification of TEFLON and the etched TEFLON and TEFLON with a 40 nm thick Au sputtered layer retained their surface area and porosity when compared to the unmodified TEFLON surface.

To deposit a conductive current collector 3602 it is often necessary to anneal the precursor to the conductive metal. Thus, it may be necessary to anneal the TEFLON membrane in the further processing steps to make a thin film battery. Thus, the effect of heat treatment on TEFLON was investigated. Several strips of TEFLON were placed at different temperatures in a furnace for ten minutes. Since the glass transition temperature of TEFLON is 340° C. as measured from TGA/DTA data, the changes in characteristics of TEFLON, if any, were measured at 100° C., 200° C., 250° C. and 300° C. There was a decrease from 7.3 m²/g to 5.9 m²/g in surface area of the TEFLON on heating the as-received. strips for ten minutes in a furnace at 300° C. A decrease in surface area is undesirable as it directly relates to the decrease in gas diffusion through this layer. There was no difference in surface area and porosity at temperatures below 300° C.

An alternative to heating in a furnace is to use rapid thermal processing. Rapid thermal processing (RTP) is a versatile approach for several different processing functions, such as rapid thermal annealing (RTA), rapid thermal cleaning (RTC), and rapid thermal chemical vapor deposition (RTCVD). Rapid thermal systems are capable of increasing temperatures in excess of 200° C./s. A rapid thermal process heats the material to a processing temperature by radiative heating.

TEFLON strips were annealed at 200° C., 250° C., 300° C., and 347° C. respectively for one minute each. Each of the TEFLON strips that were subjected to RTP at the different measurement were then characterized in terms of their surface area and porosity. A decrease in surface area to 5.3 m²/g was observed when the TEFLON strip was subjected to RTP at 347° C. There was, however, no change in the surface area of the TEFLON upon rapid thermal processing of the TEFLON strips below 347° C. Thus, it is possible to subject TEFLON to RTP at higher temperatures than heating in a furnace.

In one example, a silver current collector was deposited on an etched TEFLON membrane using a direct-write method. The silver precursor included silver trifluoroacetate and silver metal nanoparticles. After deposition, the assembly was heated at 250° C. for 10 minutes to form the current collector. The average width of the current collector lines is about 75 μm.

Referring back to FIG. 7, the electrocatalyst 3608 is preferably an oxygen deficient Co—Ni—O metal oxide for secondary batteries and composite $MnO_x/C$ or Pt/C for primary batteries. To form the electrocatalyst layer 3606, the electrocatalyst particles 3608 are dispersed in a hydrophilic matrix 3610 having lower hydrophobicity than the hydrophobic matrix 3614. The carbon conductor layer 3604 is required to provide conductivity between the current collector and electrocatalyst layer 3606. In this layer, the carbon particles 3612 are dispersed in a hydrophobic matrix 3614. The separator 3616 preferably consists of a material that can be applied by a direct write method, however, screen print, doctor blade, or other approaches can also be used.

The hydrophobic matrix 3614 can include certain forms of carbon, fluorocarbon polymers such as TEFLON and other organic species. Hydrophilic layers can include metal oxide based materials such as a carbon electrocatalyst coated with metal oxide active phases. Some types of carbon and some organic polymers derivatized with hydrophilic functional groups (e.g., polyesters, polyethylene oxides, polyethers, polyalcohols and polycarboxylates) can also be used. A preferred hydrophilic polymer is a hydrophilic perfluorohydrocarbon polymer, such as NAFION.

To form the carbon conductor layer 3604 and the electrocatalyst layer 3606 the carbon particles 3612 and electrocatalyst particles 3608, respectively, can be dispersed into liquid vehicles and printed onto each other with controlled thickness. The carbon particles and/or electrocatalyst particles can be polymer modified by coating with TEFLON to form the hydrophobic matrix and the hydrophobicity can be controlled by adjusting the ratio of TEFLON to the particles or by incorporating a hydrophilic polymer.

One advantage of the embodiment illustrated in FIG. 7 is that the overall thickness is preferably not greater than about 100 μm (excluding the separator 3616). This results in several improvements including reduced diffusional resistance in these layers. The thickness of the current collector 3602 is reduced resulting in a smaller volume that corresponds to higher volumetric and gravimetric energy density, in addition to a higher drain rate. The drain rate is higher because once the kinetic limitation of the electrocatalyst is removed by using a more effective catalyst material, the next limitation on the catalytic conversion is the rate at which the species can diffuse between layers. Therefore, in this particular case (using a liquid electrolyte in contrast to a solid electrolyte) not only does the volumetric and gravimetric energy density increase due to a reduced mass and volume, but the diffusing species travel a shorter distance, resulting in a shortertransport time, hence a faster drain rate. This is an advantage over a Li-ion battery for example because even if a printed current collector is used, the diffusing species (Li ions) still diffuse relatively slowly through the metal oxide solid $LiMnO_x$ spinel electrolyte.

Figure 8:
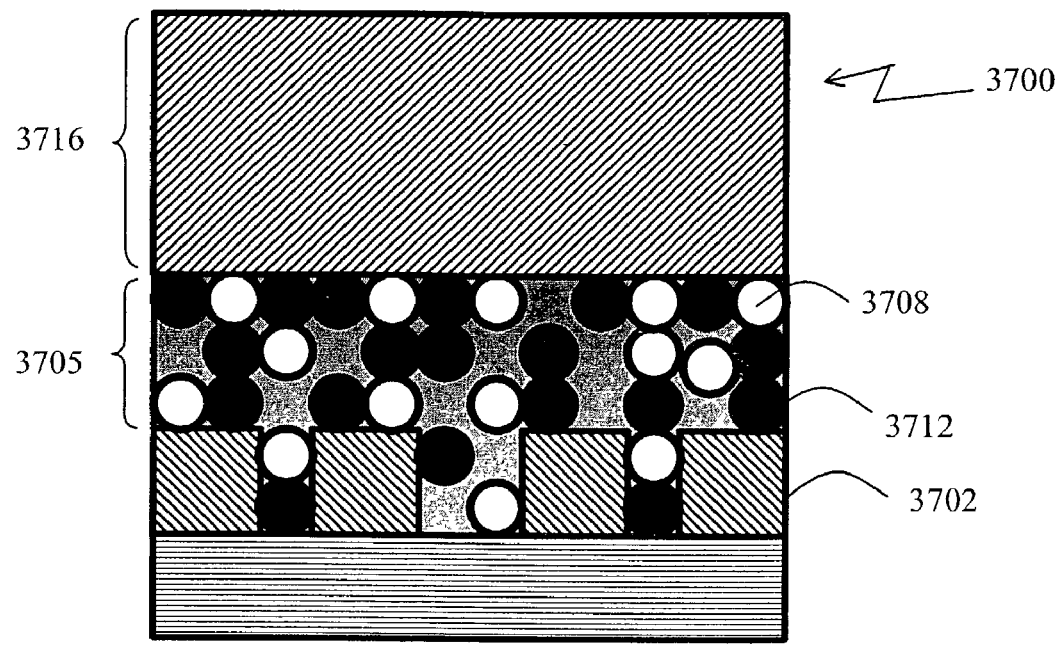
FIG. 8 illustrates an air cathode according to another embodiment of the present invention.

FIG. 8 illustrates an air cathode 3700 according to another embodiment of the present invention including a printed current collector 3702 and a gradient in the electrocatalyst concentration through layer 3705. Layers 3604 and 3606 (FIG. 7) are combined into a single gradient layer 3705 (FIG. 8). The same current collector metals can be used as is discussed above with reference to FIG. 7. The carbon and electrocatalyst layers are combined into a single gradient layer 3705 wherein the portion contacting the current collector 3702 includes a hydrophobic matrix and the portion contacting the separator 3716 includes a hydrophilic matrix, resulting in a significant reduction in electrode thickness. The ratio of hydrophobic matrix to hydrophilic matrix varies through the layer 3705 accordingly. The fabrication of a gradient in composition in the electrocatalyst/conductor layer 3705 requires printing sequential layers with varying compositions (e.g., ratio of TEFLON and/or NAFION to carbon particles) ranging in degree of hydrophobicity, concentration of electrocatalyst particles 3708 and concentration of carbon particles 3712, all of which lead to improvements in performance. Thus, thin layers of different compositions can be printed successively wherein the composition of each layer is systematically varied. This produces a tailored composition gradient and therefore the desired property can be achieved. Alternatively, the composition of the precursor may be continuously varied and the repeating layers leads to a composition gradient.

One advantage is that the overall thickness is further reduced leading to higher energy density. Preferably, the current collector and gradient layer have a total average thickness of not greater than about 50 μm. In addition, the compositional gradient creates a larger 3-phase contact zone, also leading to better performance.

Figure 9:
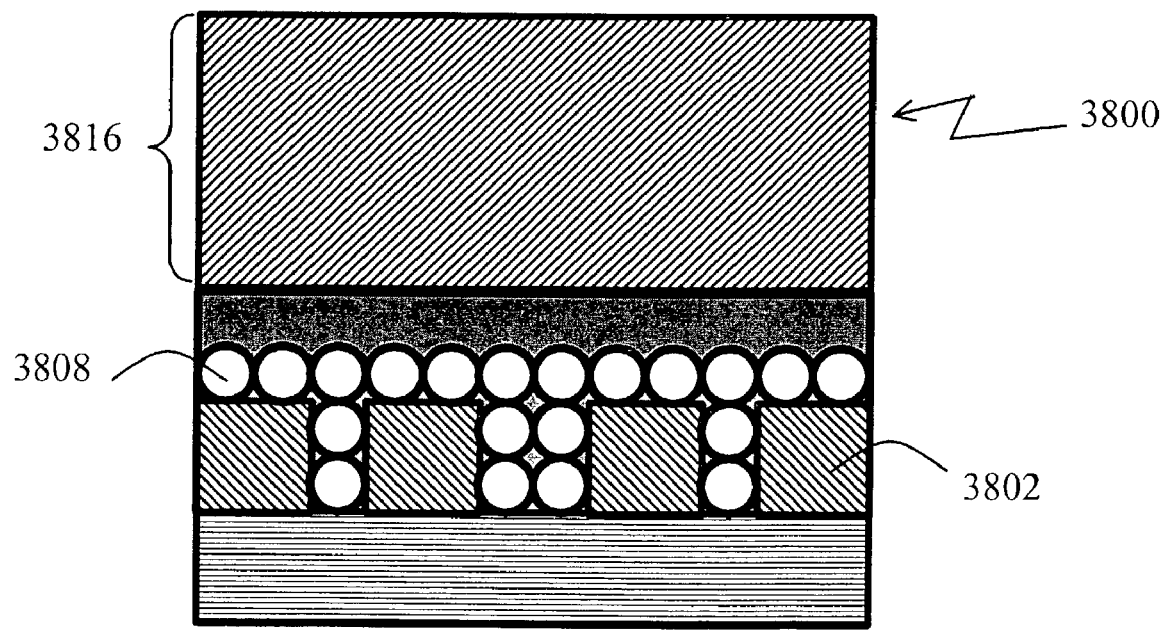
FIG. 9 illustrates an air cathode according to another embodiment of the present invention.

FIG. 9 illustrates another embodiment of an air cathode 3800 according to the present invention including an electrocatalyst particle layer 3808 printed directly over a current collector 3802. The combined functionality of several layers advantageously eliminates the carbon layer and provides an even thinner electrode. The carbon that was required for conductivity (FIGS. 7 and 8) is eliminated due to the intimate contact between the current collector 3802 and the electrocatalyst particles 3808.

Several approaches can be used to deposit the electrocatalyst 3808 on the current collector 3802. The electrocatalyst 3808 can be deposited using a direct-write method or can be formed directly on the current collector 3802 by vapor phase deposition.

The thickness of the electrode (not including the separator 3816) is preferably not greater than about 30 μm, compared to about 400 μm for a conventional structure. Thus, diffusional resistances are reduced resulting in better performance.

Figure 10:
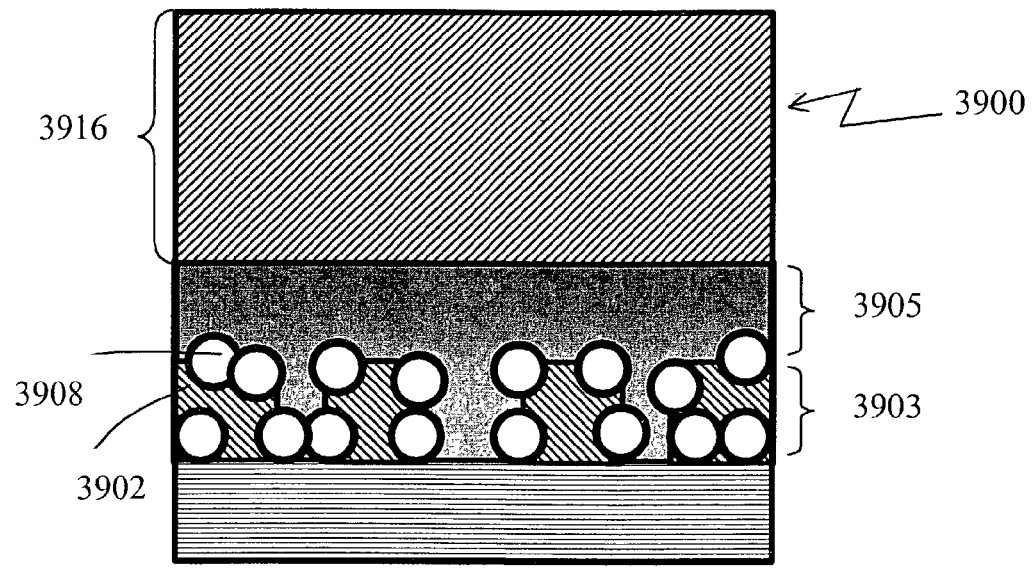
FIG. 10 illustrates an air cathode according to another embodiment of the present invention.

FIG. 10 illustrates an air cathode 3900 including a composite current collector/electrocatalyst 3903 according to another embodiment of the present invention. This structure combines the functions of the current collector and the electrocatalyst into a single porous conductive printed pattern 3903. No diffusion of oxygen is required through the layer 3903.

In this embodiment, the electrocatalyst and current collector are combined into a porous composite structure 3903 with controlled wetting to obtain the 3-phase interface. This is accomplished by combining the pre-formed electrocatalyst particles 3908 with precursors to the porous metal that can include metal particles and metal precursors. Thermal processing at low temperature converts the metal precursor to the metal, joining the metal particles to form a porous layer 3903 containing the electrocatalyst. Layer 3903 can be a metal ceramic composite such as a silver or nickel ink containing electrocatalyst particles such as a $NiCoO_x$. In this case, a lower temperature route compatible with the substrate (e.g., porous fluorocarbon polymer) can be used. Other additives that aid in the decomposition of the silver precursor to form silver such as reducing agents can be included. Silver pastes used in polymer thick film applications may also be useful.

Further, composite particles such as metal/metal oxide particles can be useful for this layer. For example, a metal or metal alloy such as Ag/Pd with embedded perovskite metal oxides (e.g., $MgTiO_3$) can be useful.

In this embodiment, the electrons generated at the surface of the electrocatalyst 3908 are captured directly by the current collector 3902. This leads to better current collection efficiency, as well as a faster drain rate.

Figure 11:
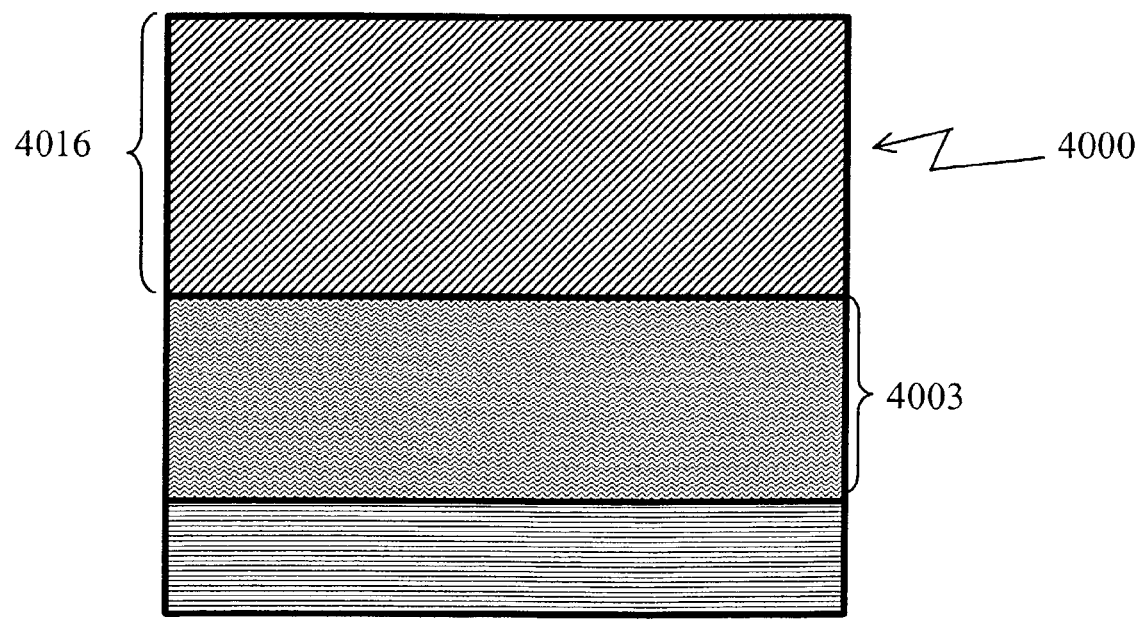
FIG. 11 illustrates an air cathode according to another embodiment of the present invention.

FIG. 11 illustrates an air cathode 4000 according to a further embodiment of the present invention wherein the cathode 4000 includes a porous composite current collector/electrocatalyst 4003. The composite layer 4003 combines the current collector and electrocatalyst in a continuous porous layer 4003 which also includes a hydrophobicity modifier, such as a fluorocarbon polymer. An example is liquid TEFLON, an emulsion containing small TEFLON particles, or various modified fluorocarbon polymers. A TEFLON emulsion can be incorporated by one of the methods such as those described above. Oxygen is able to diffuse through the porous layer, which is about 30 μm thick.

This composite layer approach relies on the mixing of several components including particles of a metal, TEFLON and electrocatalyst with other components. The metal particles have a controlled particle size distribution. This leads to a well-controlled pore size distribution wherein the pore size is defined by the size of the spaces between particles.

Various types of compositional gradients can be fabricated for the composite layer 4003. For example, a porosity gradient can be formed through control of the particle size distribution as a function of location in the layer. A hydrophobicity gradient can be formed by varying the concentration of the TEFLON-type material. The electrocatalyst concentration can also be varied. Further, conductivity can be varied by control of the metal particles and molecular metal precursors.

Vapor infiltration can also be used to form various useful structures such as those discussed above. In this process, a bed of particles is first deposited using a direct write process. The bed is heated and exposed to a reactive vapor that carries out CVD or ALE to deposit metals or metal oxides. This vapor-infiltration method has several potential benefits including enhanced catalytic activity, the ability to fuse particles to each other, the ability to oxidize or reduce certain species, the ability to control site specific reactions, the ability to deposit $MnO_2$, silver, and other metals and metal oxides at low temperatures and the ability to modify the hydrophobicity of materials with suitable silanating or similar agents.

Figure 12:
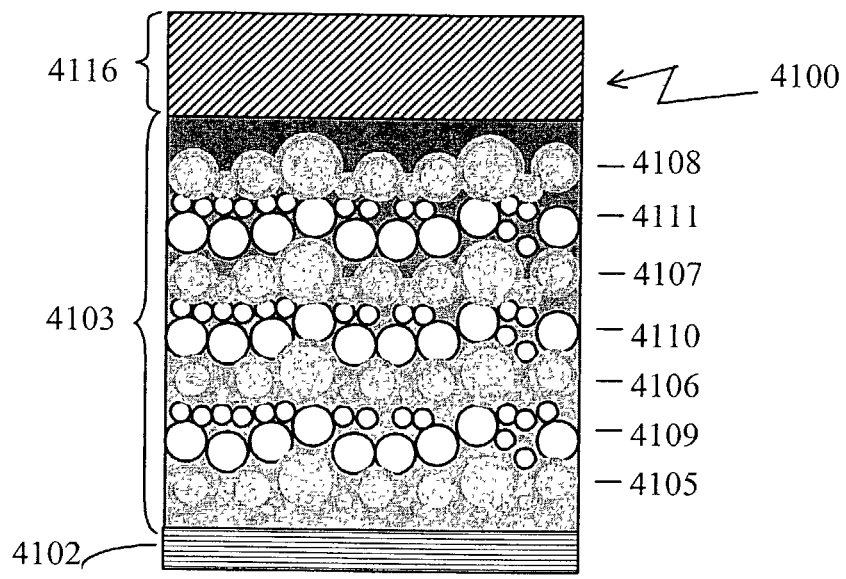
FIG. 12 illustrates an air cathode according to an embodiment of the present invention including a plurality of monolayers constituting the electrode.
Figure 13:
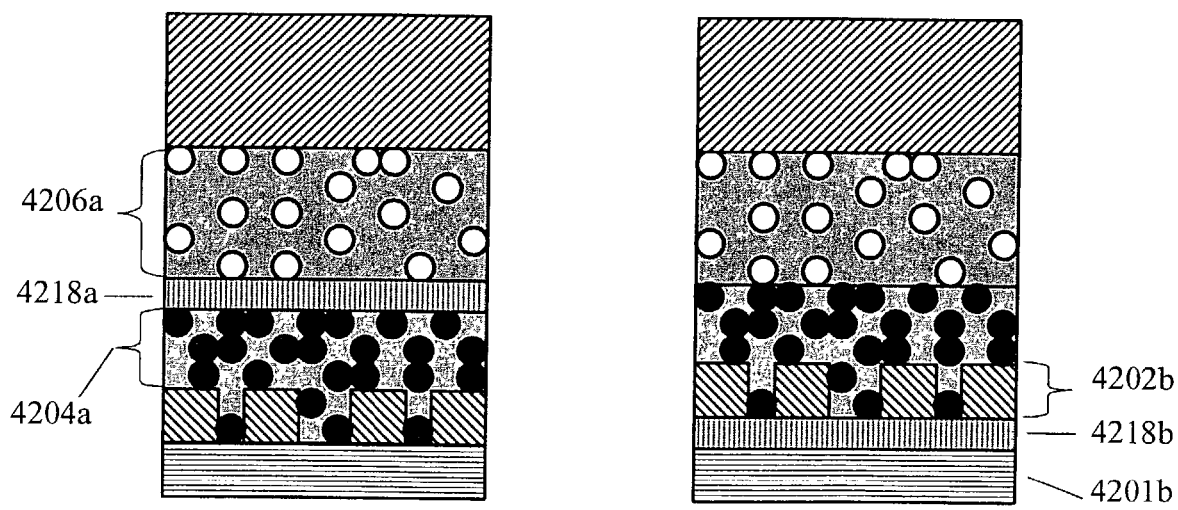
FIG. 13 (a) and (b) illustrate the incorporation of a carbon dioxide reduction layer into an air cathode according to the present invention.

For the construction of 3-dimensional layered devices, alternating "monolayers" of particles can be deposited that will form three-dimensional architectures with considerable performance improvements. This approach will be most beneficial when alternating monolayers of metal particles as the current collector with monolayers of electrocatalyst particles. This 3-dimensional structure leads to performance improvements as a result of the high surface area and intimate contact between conductor and electrocatalyst particles. This design is schematically illustrated in FIG. 12.

In the embodiment illustrated in FIG. 12, the device 4100 can be fabricated as follows. The base 4102 (gas diffusion layer) is coated with a composite layer 4103, preferably using a direct-write method. This can be done with multiple jets/heads in series with different compositions in each to form a quasi-gradient. The layer 4103 includes alternating thin layers of current collector particles (4105, 4106, 4107, 4108) and electrocatalyst particles (4109, 4110 and 4111). The particle layers are dispersed in a hydrophobic matrix near the base 4102 and a hydrophilic matrix near the separator 4116. The hydrophobic/hydrophilic ratio changes accordingly through the thickness of the layer 4103. Then an overcoat of electrolyte composition is applied using similar methods or other technologies. For example, the electrolyte can be an aqueous solution of potassium hydroxide, KOH. It can be deposited as part of the ink formulation throughout the printed layer in which case an additional overcoat may not be necessary. The layers can also be deposited without the electrolyte, which can then be applied as an overcoat afterwards to infiltrate the underlying layers when it can be deposited using a method that can withstand the corrosion of the KOH. A separator layer 4116 is then applied using a direct-write method.

It is expected that when decreasing feature size and layer thickness in the air cathode there will be a point at which further reduction in size will be detrimental to battery performance. It is possible to print layers that are about one particle thick which corresponds to dimensions of about 1 to 2 µm. At these sizes it is possible that certain parameters such as pH, concentration, and electric field gradients may dominate the performance of the device and possibly be detrimental. The layer in which this is likely to have the most significant effect is in the current collector. The line width and pitch can be varied from the extreme of a largely "transparent" grid to a microporous layer that could limit battery performance due to a large IR drop. Calculations indicate that down to a layer thickness and feature size of 20 µm, there is no significant problem of IR drop.

One of the problems associated with batteries that use electrolytes is carbonate formation from $CO_2$. A $CO_2$ reduction layer can be used to alleviate this problem. For example, selective adsorption of $CO_2$ by a high surface area metal oxide such as Group II metal oxide can be used. The molar volume increase on formation of $MCO_3$ from MO on reaction with $CO_2$ is considerable which may result in restricted mass transport of $O_2$ in the cell depending on the porosity and other factors. Therefore, heavy metal oxides are preferred since the expansion in volume decreases with increasing atomic weight of the metal ion. As an alternative, the layer can be used to initiate a catalytic reaction to convert the $CO_2$ to an inert or even useful species. This can have the additional advantage that oxygen is formed which can benefit cell performance. This layer must be placed between the air and the electrocatalyst layer. FIGS. 13(a) and 13(b) illustrate two placements for this layer. In FIG. 13(a) the $CO_2$ reduction layer 4218a is placed between the electrocatalyst layer 4206a and the carbon conductor layer 4204a. In the embodiment illustrated in FIG. 13(b), the $CO_2$ reduction layer 4218b is placed between the base 4201b and the current collector 4202b.

The thin film air cathodes of the present invention and described above are also particularly advantageous for use in the electrodes of rechargeable batteries such as rechargeable zinc-air batteries. A zinc-air battery is schematically illustrated in FIGS. 14(a) and 14(b).

Figure 14:
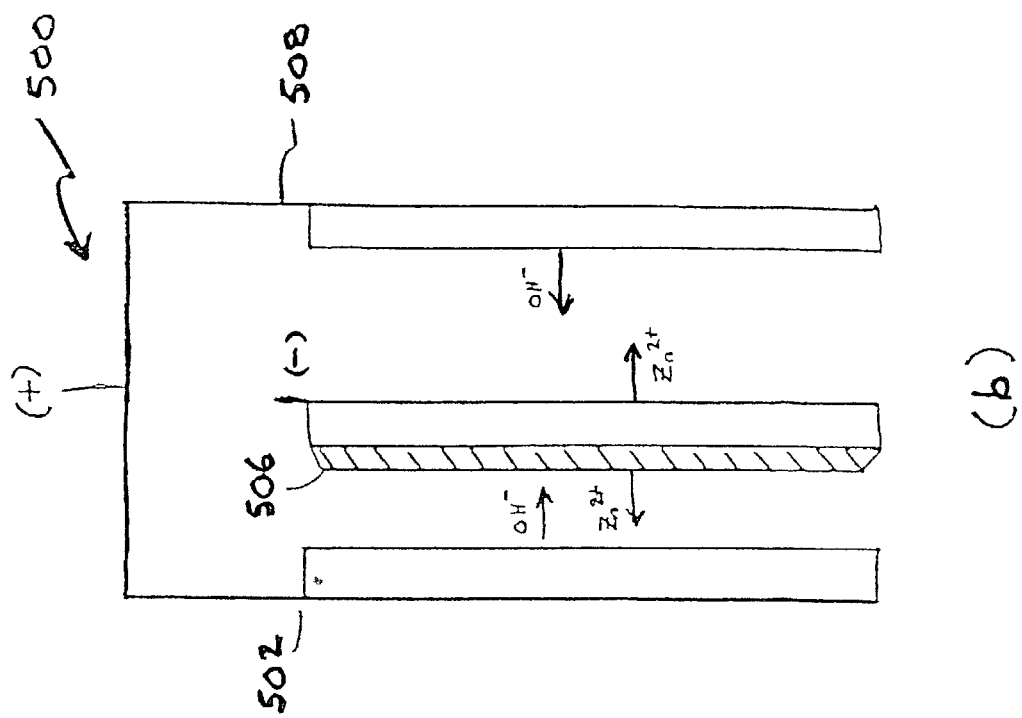
FIG. 14 (a) and (b) illustrate a zinc-air battery according to an embodiment of the present invention.
Figure 14:
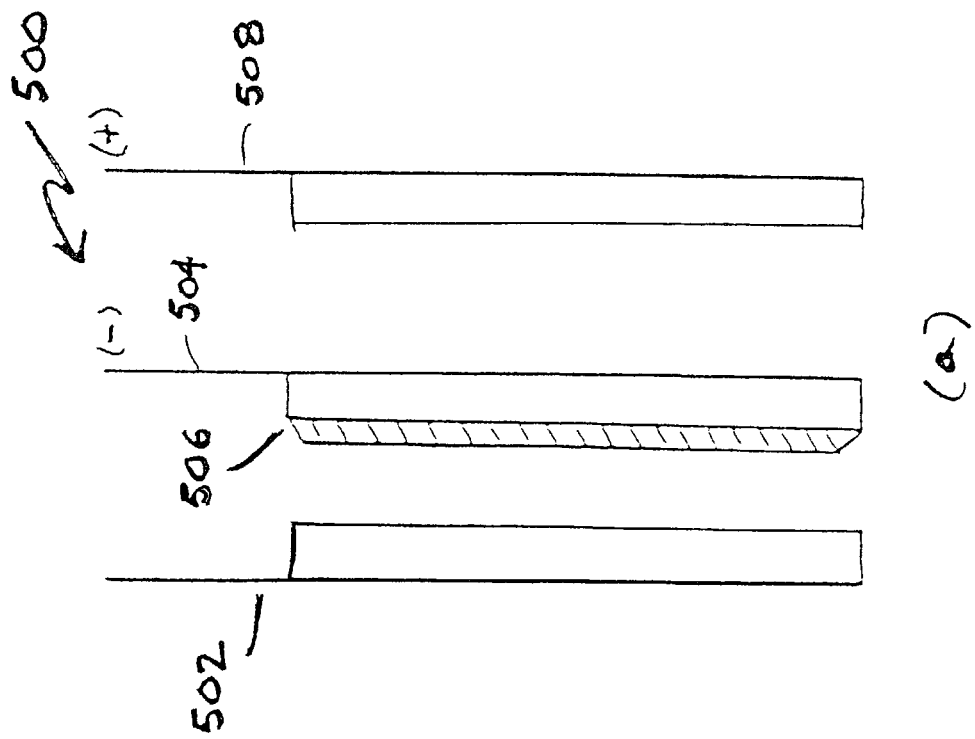

Specifically, FIG. 14(a) illustrates a zinc-air battery 500 in charging mode. The battery 500 includes air electrodes (cathodes) 502 and 508 and a zinc electrode (anode) 504 which includes a layer of zinc 506. The electrodes are typically packaged in a flat container that is open to the air. When the battery cell discharges, the zinc metal 506 is oxidized to $Zn^{2+}$. When all the zinc has been oxidized, the battery 500 is recharged and $Zn^{2+}$ is reduced back to zinc metal 506. The direct-write deposition methods of the present invention can advantageously be used to produce such electrocatalytic devices by depositing the metal-carbon composite powders in discrete patterns, having a thin, dense structure.

The present invention is also directed to a novel battery system that is a hybrid of existing metal hydride and zinc/air technologies, referred to as a metal hydride/air (MH/Air) battery. The properties of different battery systems are illustrated in Table 1.

TABLE I

Characteristics of Battery Systems

| Battery System | Specific Energy (Wh/kg) | Energy Density (Wh/L) | Specific Power (W/kg) | Cycle Life |
|---|---|---|---|---|
| Li-ion | 250 | 200 | 100–200 | 1000 |
| Metal Hydride | 70 | 250 | 70–280 | 500 |
| Zinc/Air | 250 | 200 | 200–450 | 200 |
| Metal Hydride/Air | 320 | 250 | 100–350 | 1000 |

The metal hydride/air battery according to the present invention advantageously combines the advantages of the anode from a metal hydride battery with the air cathode of the present invention. As is illustrated in Table 1, the metal hydride/air battery provides many of the advantages of a zinc/air battery such as high specific energy and specific power, but also has an increased cycle life.

The metal hydride/air battery according to the present invention includes a metal hydride anode and an air cathode, with an alkaline electrolyte disposed between the two electrodes. During discharge, oxygen and water are converted to hydroxyl ions which are transported to the anode where they react with the metal hydride to form electrons which can be routed to produce energy. During recharge, the water is reacted at the metal hydride electrode to create hydroxyl ions which are then reacted at the oxygen electrode to liberate oxygen.

The metal hydride/air batteries of the present invention are particularly useful in miniaturized devices such as GPS (Global Positioning System) transceivers. Each metal hydride/air battery cell can provide approximately 0.9 volts of power and at least four such cells would be utilized in a GPS battery to provide a total voltage of 3.6 volts, which is sufficient for GPS requirements. The battery is thin, lightweight and can be recharged many times. It is estimated that each cell would have a mass of about 4 grams. Although the battery has a slightly lower power density than a zinc air battery, the battery has a much longer useful life. The air cathode which permits recharge can be combined with different anodes to tailor the performance for different applications. Such applications can include, but are not limited to unmanned vehicles, smart cards, GPS transceivers, RF tags, various sensors, immunoassays, telemetry and other portable communications.

Figure 15:
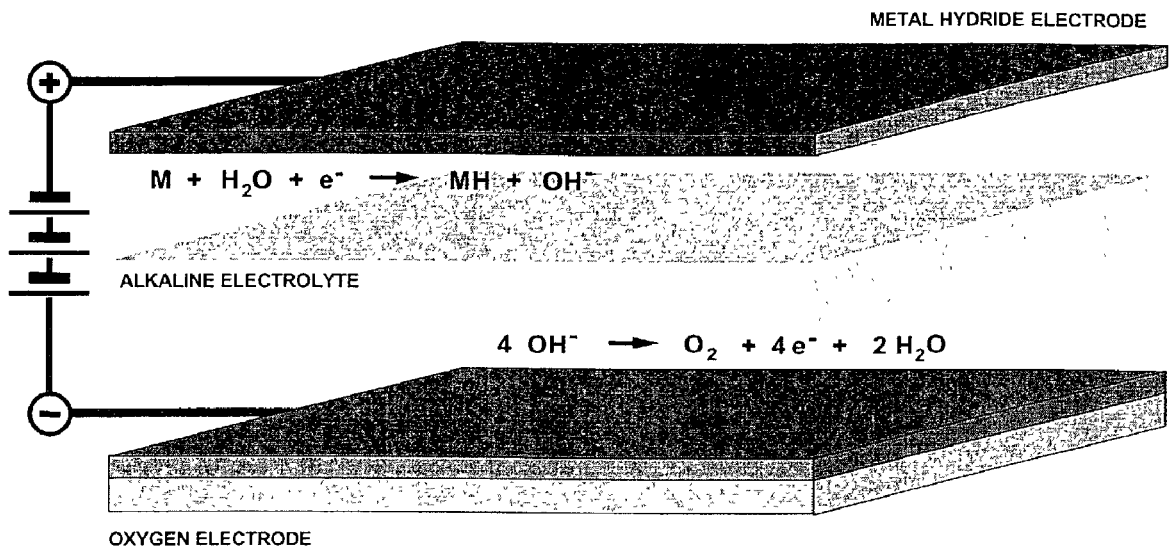
FIG. 15 illustrates a metal/air battery according to an embodiment of the present invention.
Figure 16:
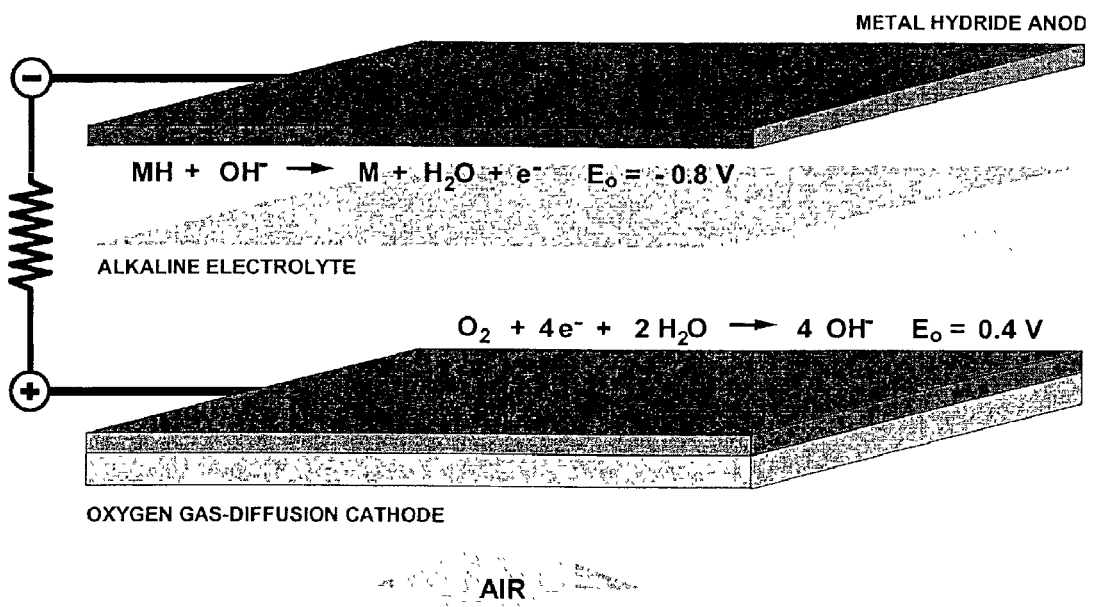
FIG. 16 illustrates a metal/air battery according to an embodiment of the present invention.

FIG. 15 schematically illustrates a metal-air battery in discharge mode. FIG. 16 schematically illustrates a metal air battery in charging mode. Metal-air rechargeable batteries were previously limited by problems with the air electrode. The problems included rechargeability, cycle life and environmental stability.

The direct-write deposition process of the present invention enables high performance battery such as the foregoing to be fabricated. The method is adaptable to different performance requirements, produces thin and light weight layers, is cost effective and efficiently uses the materials. The ability to digitally control the deposition allows simple design changes to be made.

The batteries advantageously provide improved volumetric and gravimetric energy density, increased capacity, increased cycle life, higher discharge rate and a wide temperature range of operation.

The present invention is also applicable to a number of other battery technologies. For example, the methodology can advantageously be applied to the production of prismatic batteries. The methodology of the present invention advantageously enables an increase in the number of recharge cycles, increase in power density, increase in specific power, reduction of layer thickness and reduction of cell thickness thereby resulting in a smaller device.

The electrocatalyst powders and other materials that can be fabricated according to the present invention are also useful in fuel cells. Examples of fuel cells include proton exchange membrane fuel cells (PEMFC) and phosphoric acid fuel cells. A class of fuel cell reactions that is required to be catalyzed is the reaction of a fuel such as hydrogen gas ($H_2$) to form $H^+$ where, in the case of a PEMFC, the $H^+$ is transported through a $H^+$ ion transport membrane to the cathode. In this case, the fuel cell generally operates in acidic media and the cathode reduces $O_2$ to ultimately form water as the final product. Other fuels may also be employed such as methanol, natural gas or other hydrocarbons such as methane. In some of these cases other gases which may poison the reaction or catalytically active sites such as CO are also present. These gases must be removed by the presence of an alternative active composition to that which oxidizes the fuel. As a result, the electrocatalysts aid in the removal or conversion of such species to benign products. In some cases, catalysts are also required to convert the feedstock fuel such as natural gas to a reactant having a higher $H_2$ content. This improves the efficiency of the fuel cell and reduces formation of catalyst poisons. The catalytic compositions of the present invention are also useful to catalyze this reaction.

A PEMFC comprises the following sections: The Fuel Processor or Reformer; the Power Section of Fuel Cell Stack; and the Power Conditioner and Balance of Plant. These components are discussed below.

The fuel processor, or reformer, converts natural gas or other fuels into a hydrogen-rich, low-carbon monoxide gas stream. The composition and performance of the electrocatalyst powders in the PEMFC has a strong influence on the design of this component due to the presence of low concentrations of species in the reformed natural gas that can poison the electrocatalysts, such as CO. The ideal case is to supply pure hydrogen to the PEMFC in which case there is no need for a reformer, but this is unlikely to be the case for the foreseeable future due to a lack of an existing hydrogen distribution infrastructure.

Each fuel cell stack comprises a number of membrane electrode assemblies (MEAs). The MEAs are the regions to which the gases (fuel and air) are delivered and the conversion of chemical to electrical energy takes place, as catalyzed by the electrocatalysts. Each MEA will generate a useful voltage of around 0.6V and the number of MEAs connected in series used in the stack dictates the overall voltage of the system.

Figure 17:
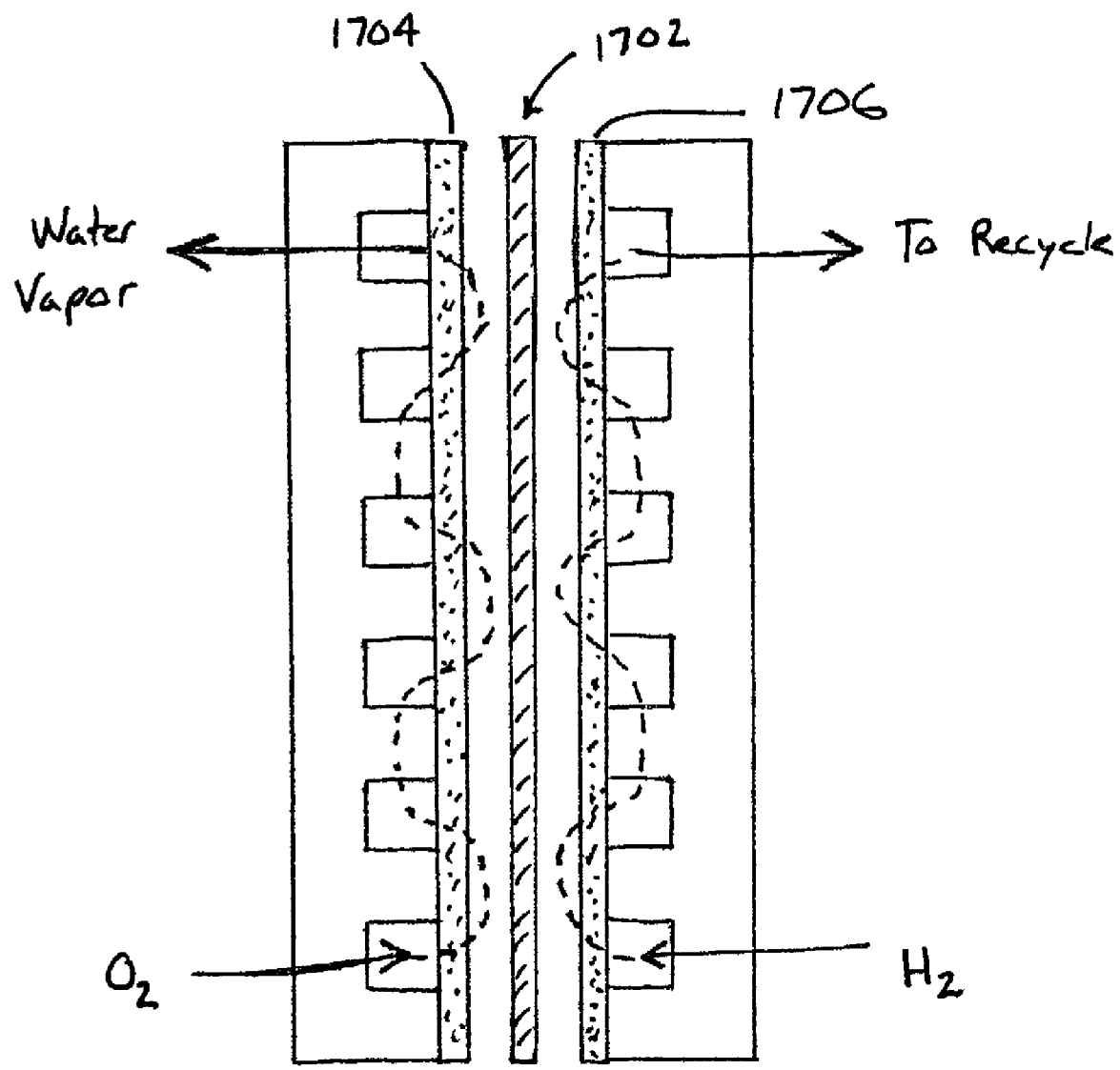
FIG. 17 schematically illustrates a membrane electrode assembly according to an embodiment of the present invention.

A MEA is schematically illustrated in FIG. 17. Each MEA is comprised of a number of components. The proton exchange membrane (PEM) 1702 is a proton conductive electronically insulating membrane that selectively transports protons formed at the anode to the cathode where they react with oxygen ions to form water and electricity. The PEM is typically a sulfonated perfluorohydrocarbon, referred to herein by the trade name NAFION.

The electrodes are comprised mainly of electrocatalyst in which the active catalyst is platinum or platinum group metals, supported on a conductive support such as carbon, generally written PVC. The requirements for the composition of the electrode catalyst are different because a different reaction occurs at each electrode.

Anode: $H_2 \rightarrow 2H^+ + 2e^-$

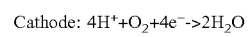
Cathode: $4H^+ + O_2 + 4e^- \rightarrow 2H_2O$

The cathode electrocatalyst 1704 is generally Pt dispersed on carbon. For the case of pure hydrogen, the anode catalyst 1706 is also Pt/C, which simplifies and lowers the cost of the fuel cell. However, due to the unreliability of reformers, which could produce a temporary increase in CO concentration and completely destroy the PVC catalysts, an alloy catalyst is typically used containing ruthenium/platinum alloy on carbon (PtRu/C). As mentioned above, the performance of these materials and their design to accommodate the reformer performance is critical to cost reliability and performance of the fuel cell. The cost and performance of these precious metal-based electrocatalysts is the major contributor to the cost and performance of the fuel cell.

The gas diffusion layer is a layer of porous hydrophobic material, generally carbon-based, which is provided between the gas delivery channels contained within the bipolar plates and the electrodes to evenly distribute the gas over the surface of the electrodes.

In each MEA there is a pair of current collectors usually integrated into the bipolar plates to capture the electrons (i.e., electricity) produced during the conversion of the chemical fuel to electrical power. The bipolar plates are used to mechanically support the MEA and to distribute the gas uniformly over the surface of the gas diffusion and electrode layers.

The Balance of Plant entails the remainder of the fuel cell. Operational modules, electrical and fuel interfaces are all part of this group of standard equipment.

The operation of a PEMFC will be explained in further detail with the focus on the operation of MEA, where the electrical power is generated from the fuel. An understanding of the operational requirements of the materials systems involved is critical for the successful performance and reliability of the fuel cell and provides the rationale for the significant contribution of the materials of the present invention as well as the associated direct-write technologies that are enabled. There is a critical interplay between the need for advanced materials systems and the method by which these materials are deposited to achieve the optimum structure and function in these layers. In many cases there are multiple functions that, in principle, require competing structures. This is the basis of the present invention which enables deposition of high-performance, multi-functional layers through direct-write processes.

Figure 18:
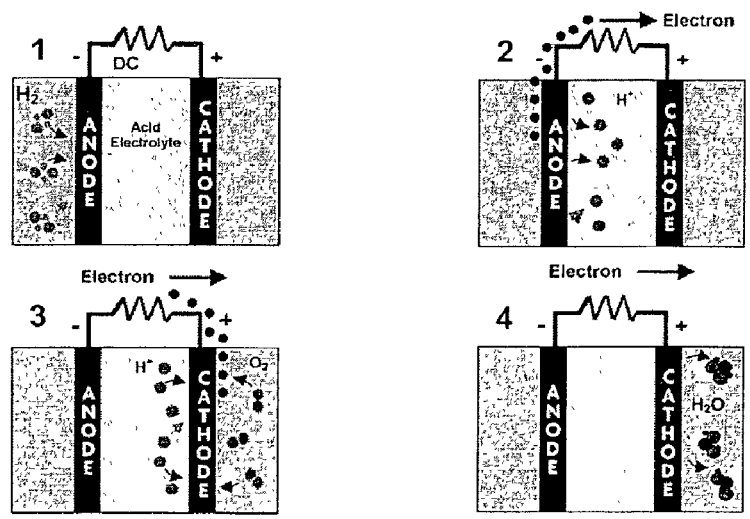
FIG. 18 illustrates a membrane electrode assembly.

The operation of a PEMFC MEA is described by the four stages illustrated in FIG. 18. It should be noted that a fuel cell operates continuously and these stages are identified here for purposes of understanding the process. The cell operates at a steady state at a given load, thus the processes are connected and balanced.

In this case hydrogen is used as the fuel assuming it has either been supplied as the pure fuel or is derived from the reformer uncontaminated. The hydrogen is delivered from its source via the bipolar plates and is distributed over the face of the gas diffusion layer (GDL). The hydrogen diffuses through the gas diffusion layer until it reaches the anode layer. The GDL is a gas permeable layer with the pore structure that facilitates a uniform distribution of gas by passage through its pores, but it does not result in a large pressure drop over the system. The hydrogen gas is generally humidified in order to prevent drying of the anode layer, which would result in a loss of ionic conductivity. Thus, the GDL must be capable of handling water without significantly affecting the gas diffusion capability. Therefore, the GDL is designed to have the necessary materials combination to achieve a balance of hydrophobic and hydrophilic nature with a distribution of pores that are not blocked by varying levels of water.

The anode (and cathode) layer contains a mixture of electrocatalyst (e.g., Pt/C), water and proton conduction polymer and must have a structure that allows for the following attributes: gas diffusion; selective ionic diffusion and conductivity; and selective electronic conductivity. The role of the anode layer is to catalytically oxidize the hydrogen to form hydrogen ions and electrons at the lowest possible temperature. The layer must be designed to be porous to hydrogen gas so that all the catalytically active Pt surfaces are accessible to the hydrogen molecules for maximum efficiency. Once the protons and electrons have been formed, the electrons are selectively removed (i.e., they must not travel through the proton exchange membrane to the cathode) through a conducting network of the carbon electrocatalyst support to the current collectors. Therefore the layer must not be so porous that the carbon particles are not connected. The protons formed at the Pt catalyst must be transported through the remainder of the anode layer to the membrane. This ionic diffusion requires a medium that facilitates this kind of diffusion, the requirements for which are almost completely opposed to optimization of the gaseous diffusion. The ionic proton diffusion requires that the catalytically active sites are also in intimate contact with a liquid or solid network, such as aqueous proton conducting polymer, that transports the protons to the proton exchange membrane. This situation described in the anode (which also applies to the cathode) is well known in electrochemical systems and is commonly referred to as the 3-phase interface. (See FIG. 6) The construction of the 3-phase interface has been a problem for a long time in electrochemical systems in general. The materials systems and deposition methods of the present invention provide the enabling solution to this problem of tailoring the structure and function of the 3-phase interface.

The protons are selectively transported through the proton exchange membrane to the cathode. This is achieved by using a membrane that is electrically insulating (to avoid electron conduction) but which selectively enables proton transport and prevents significant leakage of water. Issues associated with the performance of the PEM include the temperature of its operation and its mechanical strength. Operating the fuel cell at a higher temperature allows for higher current density, but the operating temperature of the fuel cell is limited by the thermal stability of the NAFION PEM. In order to manufacture MEAs in large volume, it will be necessary to use a high speed manufacturing process which is likely to be based on reel-to-reel web drives which will require a PEM of higher mechanical strength than is currently achievable using pure NAFION.

After being selectively transported by the PEM, the protons must now find their way to the catalyst of the cathode where they can react with oxygen ions to form water. This ionic transport requires a facilitating medium analogous to the case of the ionic transport requirements in the anode. Meanwhile, oxygen has been supplied to the cathode with similar requirements to diffuse through the gas diffusion layer to reach the cathode in a uniformly distributed manner. However, in this case, since water is formed at the cathode, the oxygen source (usually air) is supplied dry to facilitate removal of the water that is produced. This is achieved through humidification of the remaining air constituents as they pass through and out of the cathode. The electrons produced at the anode are transported via their workload in the outside environment, back to the cathode where they are distributed by the current collector back to the cathode layer. The conductive carbon particles in the cathode distribute the electrons to the active sites in the electrocatalyst, where the oxygen atoms arrive and are reduced to form oxygen ions ($O^{2-}$). Two protons react with each oxygen ion to form one molecule of water. The design requirements for the cathode are therefore similar to those of the anode in that gas and ion diffusion are required together with electronic conductivity. The cathode must also be able to accommodate the formation and removal of water without adverse effect.

The GDL covering the cathode must now be capable of removing the water produced in the cathode in addition to the delivery of the dry air from which the oxygen selectively reacts in the cathode. This must also be achieved with the appropriate choice of materials, layer structure and layer deposition method as described above for the anode GDL.

Figure 19:
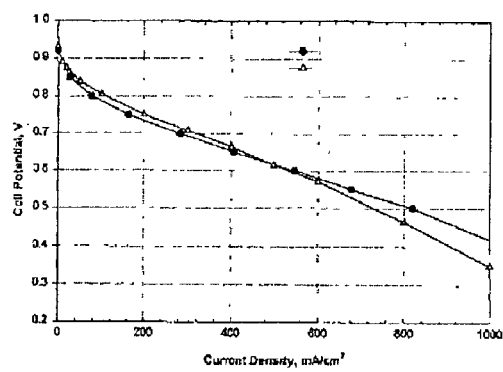
FIG. 19 illustrates a polarization curve.
Figure 19:
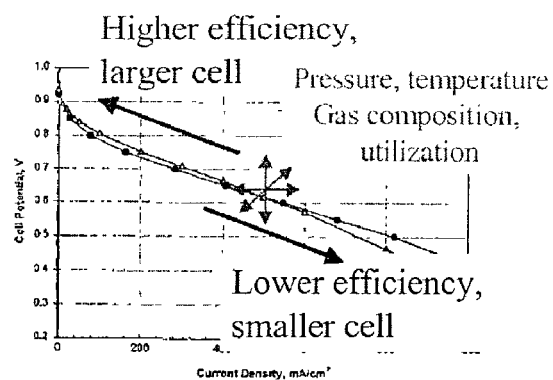

The performance of an MEA is primarily judged by reference to the relationship between MEA potential and current density, often referred to as a polarization curve. An example of a polarization curve is shown in FIG. 19 and a brief explanation of the influence of the MEA design on the nature of the polarization curve follows.

The polarization curve shows the typical shape of the relationship between cell potential and current density. For a given MEA performance (e.g., a specific polarization curve) if better fuel and operating efficiency is required, then it is desirable to move to higher voltage. Operating a PEMFC at higher voltage generally leads to higher efficiency of that cell, but it also requires a larger cell because the power density is lower. This increases capital cost in the construction of the cell but results in a lower operating cost. For a given polarization curve, operating at lower voltage generally leads to lower efficiency, but requires a smaller cell (because the power density is higher) and therefore smaller capital costs, but higher operating costs. It is advantageous to move the vertical position of the curve higher (i.e., achieve higher current density at lower voltage). The vertical position of the curve is strongly influenced by a number of materials and operating factors including platinum loading. More platinum is better, but increasing the amount of platinum significantly contributes to the cost. Other operating parameters include temperature, gas composition and gas utilization, all of which influence the cost and reliability of the PEMFC. The goal in designing an MEA is to maximize the vertical position of the polarization curve (i.e. performance) while minimizing the cost of the materials components, the capital cost and operating costs.

Figure 20:
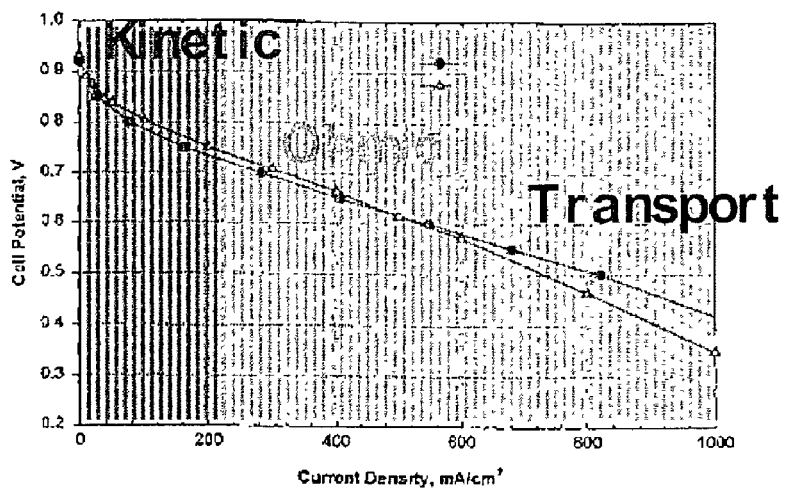
FIG. 20 illustrates a polarization curve.

The connection between the shape of the polarization curve and the structure of an MEA is well understood and can be divided into different regions as indicated in FIG. 20. These regions comprise the kinetic-, ohmic-, and transport-limited regions of operation of the PEMFC MEA.

In the kinetic region, the performance is primarily dictated by the kinetic performance, or reactivity of the catalyst. The more active the catalyst the higher the cell potential at a given current density. The activity of the catalyst is dictated by its structure and number of active sites.

In the ohmic region, the performance is primarily dictated by the transport of ions and electrons. Better performance is therefore dictated by good connection between highly conductive carbons particles for electrical conductivity and a good network of proton conducting polymer connecting the catalytically active sites in the electrocatalyst to the PEM.

In the transport region, the performance is primarily dictated by the diffusion of gaseous species to and from the active site of the electrocatalysis. Better performance is manifest by rapid diffusion through the appropriate pore of the gas from the gas distribution manifold in the bipolar plates through the gas diffusion layer and the electrode.

From this description it is clear that there is a very strong influence of the materials and the structure of the layer comprising these materials on the performance and cost of the PEMFC system.

One of the major goals in this area is to increase the utilization of Pt to have the best performance at the lowest possible Pt loading. This can be achieved in a number of different ways based on both the loading of the Pt on the carbon support and the loading of the carbon supported electrocatalyst in the electrode layer of the MEA. As is described above, there is a subtle trade-off in terms of performance and Pt utilization (hence cost) depending on the conditions of operation of the fuel cell.

Figure 21:
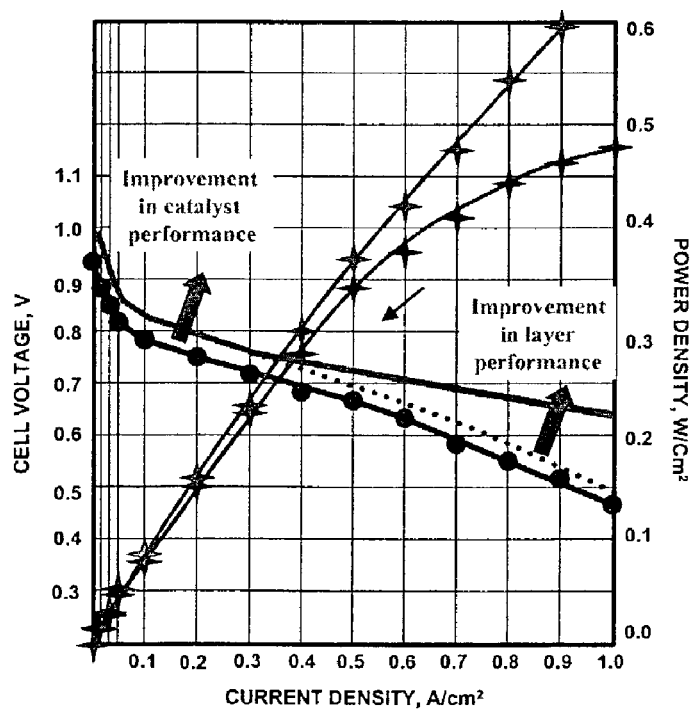
FIG. 21 illustrates a polarization curve.

A purely kinetic improvement derived from the improved utilization of Pt would result in a change, for example, of up to 0.35 A/cm$^2$ Therefore, if the goal is to run the fuel cell under conditions of either current densities lower than 0.35 A/cm2 or voltages higher than 0.75V, the kinetic improvement is sufficient. However for operation under different conditions, i.e., at voltages lower than 0.75V and current densities above 0.35 A/cm$^2$, the kinetic improvement has a less significant impact that an improvement in the layer structure and materials because this is the region dominated by ohmic and transport characteristics. an improvement in the layer structure could lead to a polarization curve shown in FIG. 21 under these conditions. The importance of this improvement is magnified by the power curve also shown in FIG. 21.

Figure 22:
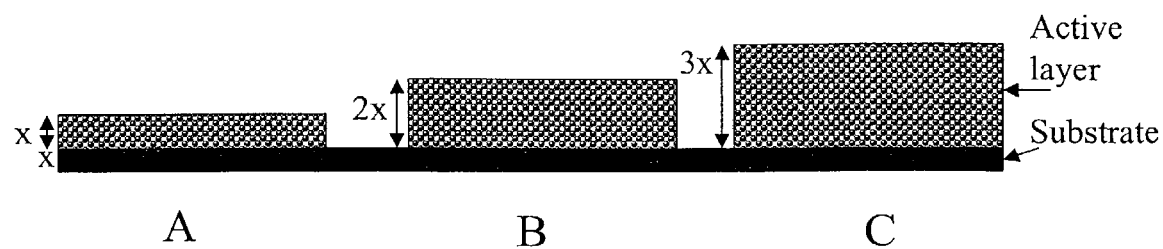
FIG. 22 illustrates active layers of varying thickness.

This background is important for an understanding of the method of optimization of the platinum utilization by varying both the Pt content in the electrocatalyst and the thickness and structure of the electrode layer. This point can be exemplified as follows. FIG. 22 illustrates three layers of active material, A, B and C, which could be an electrocatalyst layer deposited onto a support such as a gas diffusion layer or an ion conducting membrane. If the same loading of Pt on carbon is used, for example 20 wt. % Pt on C then the weight loading of Pt measured in mgpt/cm$^2$ of B would be twice A and C would be equal to 3× the loading of A. The polarization curve measured for each of these three layers may appear quite similar in the kinetic region (i.e., at low current or power density) but are likely to be considerably different in the ohmic and transport limited region even assuming the same structure as a result of the different layer thicknesses. As an alternative approach, the same Pt loading in mgPt/cm$^2$ as described in the last example for layer B could be achieved using 40% Pt on C and a layer half the thickness (i.e., A). Assuming the same Pt utilization for the 40% Pt on C as the 20% Pt on C (i.e., the same kinetic performance of the electrocatalyst), then the performance at higher current and power densities would be expected to be superior for the 40% Pt on C layer (other things being equal). Therefore, it is clearly important to optimize the Pt utilization at the higher Pt mass loading while simultaneously optimizing layer thickness.

Typical electrocatalyst layers can include compositions that range from pure Pt black (e.g., DMFC and electrochemical sensor applications) to very low Pt loadings on carbon such as 1 wt. % Pt on C (e.g., for electrochemical sensors). Typical layer thickness can vary between 1 and 100 micrometers.

Figure 23:
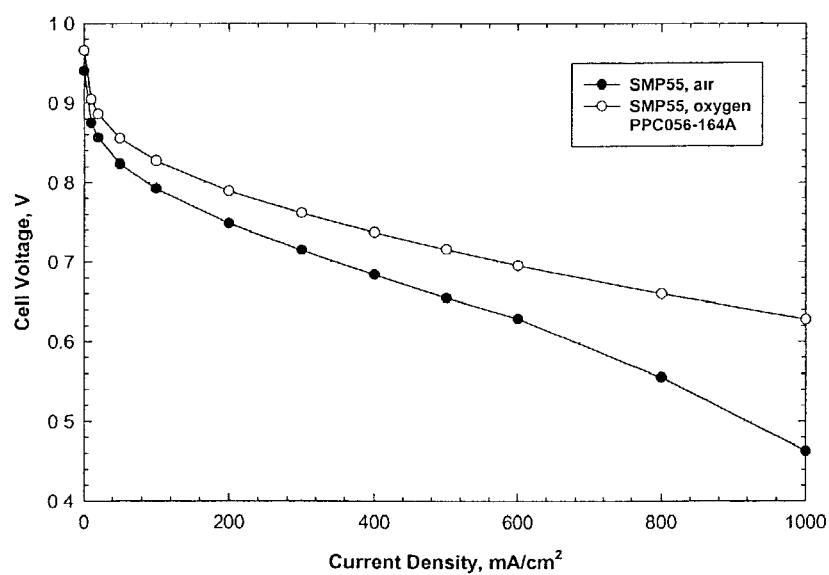
FIG. 23 illustrates a polarization curve.
Figure 24:
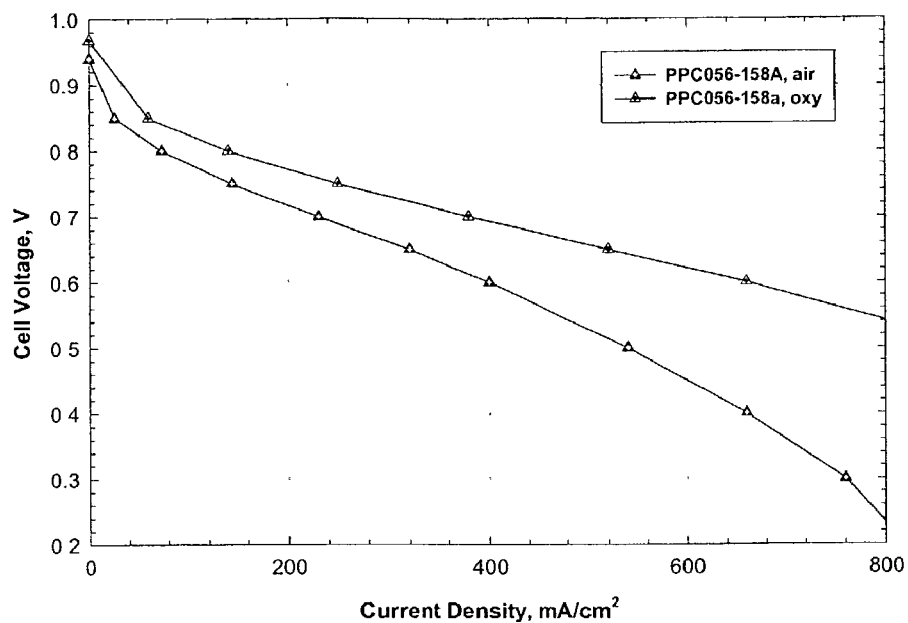
FIG. 24 illustrates a polarization curve.

An example of this trade off is illustrated by comparing FIGS. 23 and 24. In the FIG. 23, the polarization curve is given for a cathode layer comprised of 20 wt. % Pt on carbon with a Pt laydown of 0.2 mgPt/cm$^2$ in the cathode. In FIG. 24, 5 wt. % Pt on carbon was employed with a laydown of 0.1 mgPt/cm$^2$. The latter loading is an extremely low loading to achieve the performance indicated by the polarization curve compared to conventionally manufactured electrocatalysts. These measurements were made at atmospheric pressure gases using $H_2$ and air at 50° C. using a NAFION 112 membrane.

Figure 25:
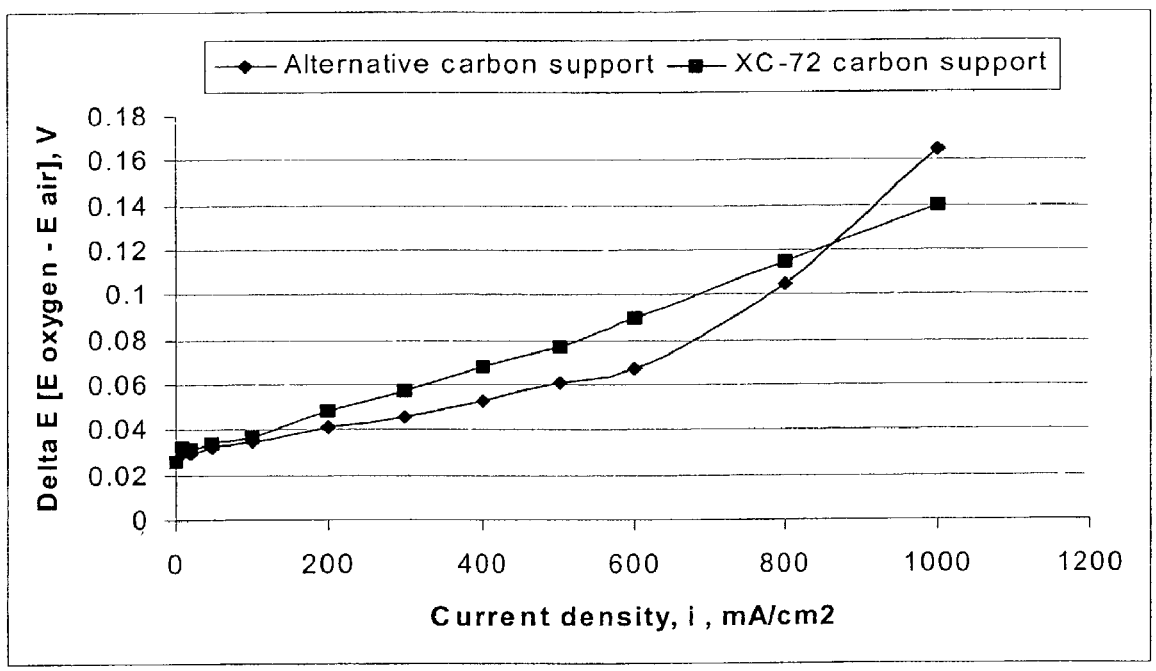
FIG. 25 illustrates a polarization curve.

A related influence on the performance at higher current densities is the pore structure of the carbon that is used to support the Pt. This can have a dramatic affect on the ohmic and transport properties. This aspect of the present invention is illustrated in FIG. 25 which shows the difference between the oxygen and air polarization curves for two catalyst powders with the same Pt loading, same layer thickness and same measurement conditions but with different carbon support material. The improvement in performance is measured by the smaller difference in potential between oxygen and air gas (i.e., a lower number is better). Therefore, as can be seen from the plot, the alternative carbon support, which is SHAWINIGAN BLACK, is better than VULCAN XC-72.

The use of spray methods according to the present invention to produce complex multicomponent, composite particles containing electrocatalyst, carbon, hydrophobic polymer, proton conducting polymer and other components has not been disclosed in the prior art. The present invention relates to the use of spray conversion to produce particles with complex compositions useful for fabrication of MEAs in fuel cell applications.

As is discussed above, MEAs are most often constructed from particulates (electrocatalyst consisting of metal supported on carbon and electrically conducting carbon powders) and suspensions of colloidal (NAFION-containing liquids) and polymeric (PTFE suspensions in various liquids) materials. This current palette of materials that an MEA designer has to choose from is very limited. It would be highly advantageous to have other starting materials that combine these materials in different manners to allow fabrication of MEAs with characteristics that address the problems outlined above.

Figure 26:
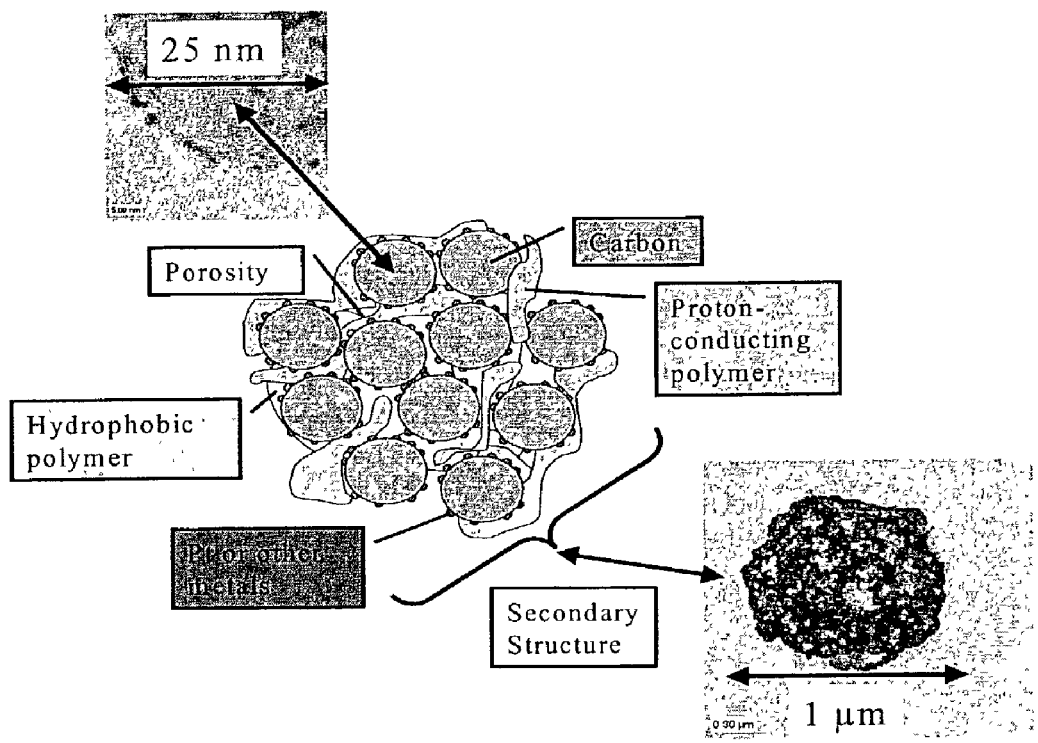
FIG. 26 illustrates a particle structure

FIG. 26 graphically illustrates a particulate composite structure that can be fabricated according to the present invention. The structure includes electrocatalyst particles dispersed in a polymer matrix. The secondary structure of the electrocatalyst particles is micron-sized while the primary carbon support particles are 10s to 100s of nanometers in size and are decorated with clusters of the precious metal. The polymer is dispersed throughout the particle.

Figure 27:
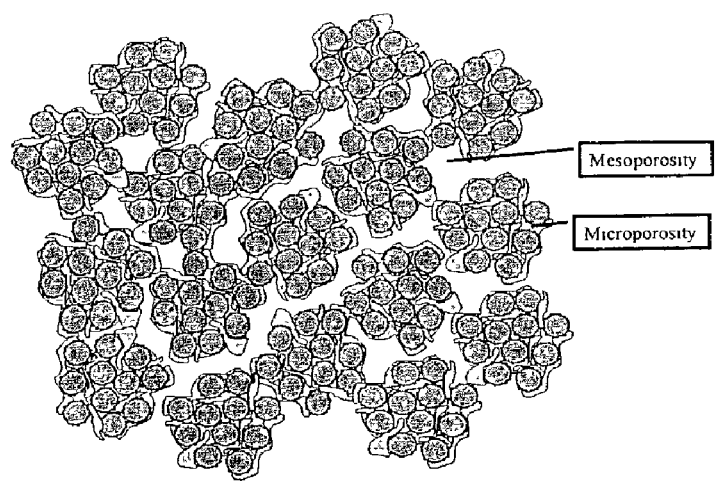
FIG. 27 illustrates a layer structure.

A conceptually ideal electrode layer (cathode) is illustrated in FIG. 27. It is widely accepted that the ideal solution must provide several features including: a connected pathway of conducting carbon particles (the support for the precious metal) from the gas diffusion layer to allow electron transport; a connected pathway of proton conducting polymer (e.g., NAFION) to allow transport of hydrogen ions to electrocatalyst sites; hydrophobic passages to allow water to escape thereby avoiding flooding from water generated at the catalyst sites; electrocatalyst metal exposed to the proton conducting polymer to allow the protons to be readily transported to the reaction sites; sufficiently large pores to allow oxygen gas transport from the gas diffuser to all locations in the electrode; and finer scale porosity in agglomerates of electrocatalyst to allow transport of oxygen over shorter distances to reaction sites. Existing attempts at achieving this ideal situation are hindered by the lack of engineered particles, the limited printing processes dictated by the types of materials available and the types of structures derived from conventional materials. MEAs are currently fabricated from particulates of conducting carbon supporting precious metal compositions such as Pt and Pt alloys. This material must be combined with a variety of other materials through complex MEA fabrication recipes to attempt to form the idealized structure outlined above. However, the characteristics of these particles simply do not allow for straightforward fabrication of the optimum structures.

It would be highly advantageous to be able to use more complex particle structures containing:

Agglomerated Pt/C
PCP-Pt/C (PCP=proton conducting polymer)
PTFE-Pt/C (PTFE=polytetrafluoroethylene polymer)
PCP-PTFE-Pt/C
Pt/C (proton conducting and electrically conducting polymer)

Figure 28:
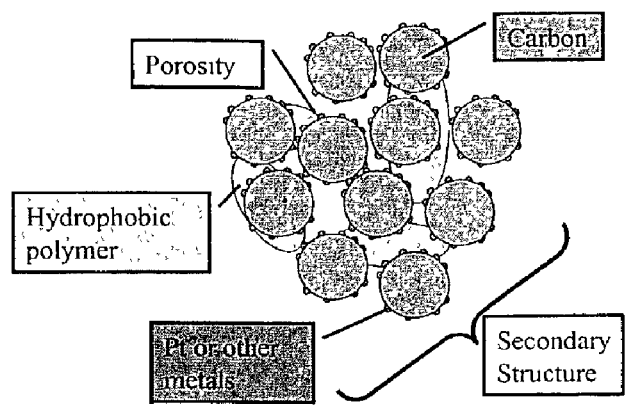
FIG. 28 illustrates a particle structure.
Figure 29:
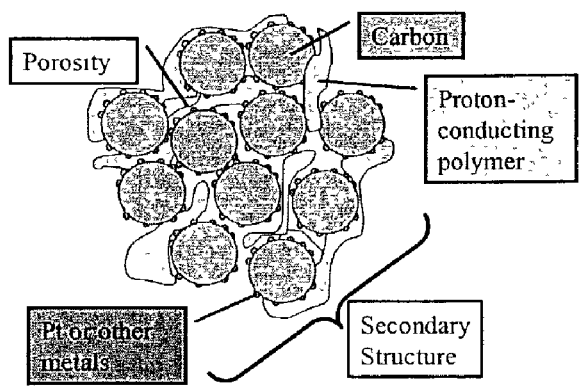
FIG. 29 illustrates a particle structure.
Figure 30:
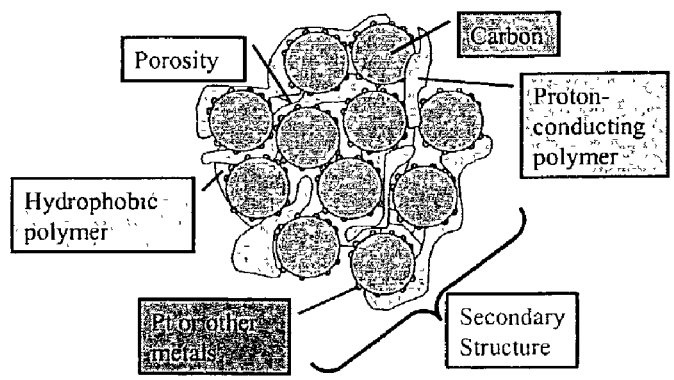
FIG. 30 illustrates a particle structure.

Examples of the foregoing particulate structures are illustrated in FIGS. 28–30. The PTFE-Pt/C (hydrophobic polymer) polymer modified particle offers the following advantages. The hydrophobic material is already incorporated into the powders and does not have to be mixed in later allowing for better control over the uniformity of the hydrophobization. The same advantages described above for the structures with this polymer are also found. The PCP-Pt/C (proton conducting polymer) polymer modified particles offer the following advantages in addition to those described above. The PCP is incorporated into the secondary structure providing intimate contact of reaction sites with the polymer that transports the protons to the reaction sites. The PTFE-PCP-Pt/C polymer modified particles combine the advantages of all the materials described above and offer the possibility of fabrication of an electrode through a single material. Finally the functions of the PCP and PTFE can be combined into one through the use of a polymer that is both a conductor of electrons and protons.

The polymer-modified particles are produced by spray conversion starting with the ingredients for the particles that are dissolved and suspended into a liquid. The liquid is atomized to form droplets that are then thermally processed to form the final particle structures. It is possible to prefabricate high-quality Pt/C particles, suspend them in a liquid along with the other desired components and then to spray process to form the final material.

The present invention is also applicable to the fabrication of supercapacitors. A major constraint on the life of a battery is the peak power requirement where the energy storage in the battery is compromised for a burst of high power. One approach to solve this problem is to provide separate energy storage and power supply units where the battery would handle low power requirements and a supercapacitor could provide short duration peak power pulses.

Supercapacitors are a type of capacitor that store energy within the electrochemical double-layer at the electrode/electrolyte interface. Supercapacitors have much higher power density than conventional batteries and can store much more energy on a weight and volume basis that can also deliver that energy at high discharge rate or for longer time periods than a normal capacitor. If used in combination with a battery they can become a highly efficient energy source where high currents are involved. Some of the advantages that supercapacitors have over the traditional batteries are: they can be charged and discharged almost indefinitely; their recharge rate is high; and they can provide high discharge currents.

Supercapacitors are essentially Electric Double Layer Capacitors (EDLC) and utilize the separation of a charge that occurs when an electrolyte is in contact with a conductor material. Electron accumulation or depletion at the electrode caused by an external power source is counter balanced by the ionic species in the electrolyte. Since the charge separation in these systems is in the order of molecular dimensions, the resultant capacitance per unit area is large. No mass or charge transfer takes place across the interface and hence the benefit of supercapacitors over batteries, that they can deliver millions of cycles and maintain high current drains and cycling efficiency. However a limitation of the double layer capacitors is the low cell voltage, limited to 1 V for aqueous electrolytes and 2.5 V for organic electrolytes. High surface area electrodes result in higher capacitance. Further highly porous electrodes provide larger internal effective surface area. Thus, carbon is a typical material used as the electrode due to its high surface area, low cost and ready availability.

Metal oxides such as $RuO_2$ and $IrO_2$ have been researched as a potential candidate for the electrodes. The cyclic voltamogram of $RuO_2$ is almost rectangular as for a typical capacitor due to a series of redox reactions occurring in this metallic oxide. Specific capacitance as high as 750 F/g has been reported for $RuO_2$ electrodes made at low temperatures. The cost of these electrodes has however been a limiting factor in the rapid development of these electrodes commercially. The electrolyte in the supercapacitors can be an aqueous acid or an organic electrolyte. The advantage of the organic electrolyte is the higher achievable voltage. Although the aqueous electrolyte provides less voltage, it is cheaper and has higher conductance.

The supercapacitor electrodes in accordance with the present invention consist of $RuO_x \cdot nH_2O$ (hydrous ruthenium hydroxide) dispersed on high surface area carbon. The hydrous ruthenium oxide phase in the 50:50 Pt—Ru /Carbon black catalysts is responsible for the methanol electro-oxidation in direct methanol fuel cells and hydrogen oxidation in proton exchange membrane fuel cells using reformate gas as fuel.

The supercapacitor materials can be manufactured as printed layers on a proton conductive polymer membrane (such as NAFION 117) that will act as the electrolyte, the separator and the adhesive layer between the electrodes. Characteristics of the supercapacitor will be tailored to match those of required for the high peak power of the battery. As a result, the supercapacitor will be made suitable for integrating into a hybrid power source device with low volume and high effective power density.

EXAMPLES

The foregoing description and the following examples make reference to a number of materials by use of a trade name for an example of that material. However, the embodiments of the present invention are not limited to the use of such specific materials.

For example, TEFLON (E.I. duPont de Nemours, Wilmington, Del.) refers to a hydrophobic polymer, more specifically a tetrafluoroethylene fluorocarbon polymer. NAFION (E.I. duPont de Nemours, Wilmington, Del.) refers to a hydrophobic and proton-conducting polymer, specifically a sulfurated perfluorohydrocarbon polymer.

The description and examples also make reference to various forms of carbon by reference to trade names. The general properties of these carbon supports are listed in Table 2. SHAWINIGAN BLACK is an acetylene black available from Chevron Chemical Co., Houston, Tex. VULCAN XC-72 is available from Cabot Corp., Alpharetta, Ga., and is available in graphitized form. NORIT SA-3 is an activated carbon also available from Cabot Corp., Alpharetta, Ga. PWA is an activated carbon available from Calgon Carbon Corp., Pittsburgh, Pa. BLACKPEARLS is available from the Cabot Corp., Alpharetta, Ga. and KETJENBLACK is available from Akzo Nobel, Amersfoort, Netherlands.

TABLE 2

Carbon Blacks used as Catalyst Supports

| Carbon Source | Particle Size (micrometers) | BET Surface Area (m$^2$/g) |
| --- | --- | --- |
| SHAWINIGAN BLACK | 0.055 | 80 |
| VULCAN XC-72 | 0.039 | 240 |
| Graphitized VULCAN XC-72 | 0.5* | 100* |
| NORIT SA-3 | 22 | 700 |
| PWA | 22 | 820 |
| BLACKPEARLS | 0.4* | 1400* |
| KETJENBLACK | 0.4* | 1400* |

*These values are approximate.

GRAFO 1300 and GRAFO 1322 are aqueous dispersions containing 20 and 22 wt. % carbon respectively and are available from Fuchs Lubricant, Harvey, Ill. The GRAFO suspensions used the same cellulose-based binder system to aid in the long-term stability of these carbon dispersions. This binder decomposes by about 300° C., and has a long shelf life. GRAFO 1300 is a dispersion of SHAWINIGAN BLACK and GRAFO 1322 is a dispersion of VULCAN XC-72.

These GRAFO dispersions are slightly alkaline, with a pH of about 9. Due to the nature of the binder, it is only stable at pH above 6. This was not a problem when making Pt/C electrocatalysts using Pt(NH$_3$)$_4$(NO$_3$)$_2$ as a platinum precursor, as the dissolved salt has a neutral pH.

1. MnO$_x$/C Supported Electrocatalyst Particles

Two groups of MnO$_x$/C composite electrocatalyst examples were initially prepared according to the present invention. The first group, described in Table 3, was prepared by ultrasonic aerosol generation and heating the aerosol in a hot-wall reactor (tubular furnace). The second group, described in Table 4, was prepared using a spray nozzle to generate an aerosol which was heated in a spray dryer. Air was used for the carrier gas for all examples.

TABLE 3

Experimental Conditions for Ultrasonically Generated Electrocatalysts

| Example Number | Mn precursor | Additional Surfactant (wt. %) | Reactor Temp (° C.) | Mn (wt. %) | Precursor Concentration (wt. %) |
| --- | --- | --- | --- | --- | --- |
| 19A | KMnO4 | None | 400 | 10 | 5 |
| 19B | Mn nitrate | None | 350 | 10 | 5 |
| 20A | KMnO4 | None | 350 | 10 | 5 |
| 20B | KMnO4 | None | 350 | 10 | 5 |
| 23A | KMnO4 | 0.017 | 350 | 10 | 5 |
| 24A | KMnO4 | 0.034 | 350 | 10 | 5 |
| 27A | Mn nitrate | 0.049 | 350 | 10 | 5 |
| 28B | KMnO4 | 0.049 | 300 | 10 | 5 |
| 28D | KMnO4 | 0.049 | 250 | 10 | 5 |
| 28E | KMnO4 | 0.049 | 200 | 10 | 5 |
| 29B | Mn nitrate/ KMnO4 | 0.012 | 350 | 10 | 5 |

TABLE 4

Experimental Conditions for Spray Nozzle Generated Electrocatalysts

| Example Number | Mn precursor | Additional Surfactant (wt. %) | Reactor Temp (° C.) | Mn (wt. %) | Precursor Concentration (wt. %) |
| --- | --- | --- | --- | --- | --- |
| 30A | KMnO4 | 0.078 | 208 | 10 | 5 |
| 30C | KMnO4 | 0.078 | 208 | 10 | 5 |
| 34B | KMnO4 | 0.078 | 208 | 10 | 5 |
| 41A | KMnO4 | 0.083300 | 315 | 10 | 5 |
| 41B | KMnO4 | 0.006700 | 315 | 10 | 5 |
| 41C | KMnO4 | 0.083300 | 315 | 20 | 5 |
| 41D | KMnO4 | 0.083300 | 315 | 10 | 5 |
| 44B | None | 0.000000 | 208 | – | 5 |
| 44C | KMnO4 | 0.001600 | 208 | 5 | 5 |
| 44D | KMnO4 | 0.001600 | 149 | 5 | 5 |
| 44E | KMnO4 | 0.001600 | 149 | 10 | 5 |
| 44F | KMnO4 | 0.001600 | 208 | 10 | 5 |
| 44G | KMnO4 | 0.001600 | 208 | 10 | 5 |
| 47A | None | 0.000000 | 208 | – | 10 |
| 47B | None | 0.000000 | 208 | – | 5 |
| 47C | None | 0.000000 | 208 | – | 2.5 |
| 47D | KMnO4 | 0.000000 | 208 | 10 | 2.5 |
| 47E | KMnO4 | 0.001600 | 208 | 10 | 2.07 |

The carbon precursor for all examples listed in Tables 3 and 4 was GRAFO 1300. The aqueous dispersion also includes an anionic surfactant. Additional amounts of a nonionic surfactant (TRITON X-405, Sigma-Aldrich, St. Louis, Mo.) were added in some of the examples as is indicated in Tables 3 and 4. Triton X-405 is a 70 wt. % solution of polyoxyethylene(40)-isooctylphenylether in water. The GRAFO 1300 was suspended in water and the Mn precursor, previously dissolved in water, was slowly added to the carbon suspension while stirring. The surfactant, added to the carbon suspension prior to the Mn precursor, reduces precipitation when the Mn precursor is added. The reaction temperature for all examples was maintained below about 400° C. since excessive temperatures (e.g., above 600° C.) can burn-off carbon when air is used as the carrier gas.

More specifically, for the spray nozzle generation (Table 4), a batch of MnO$_x$/C powder was prepared in a spray drying apparatus in the following manner. 35.6 kg (78.3 lbs) of carbon paste was added to a batching vessel. 65 kg (143 lbs) of de-ionized water was then added to the carbon paste and mixed thoroughly. 0.13 kg (0.286 lbs) of the nonionic surfactant was added to the mixture and the mixture was stirred for approximately 10 minutes. In a separate vessel, 2.27 kg (5 lbs) of potassium permanganate was dissolved in 65 kg (143 lbs) of de-ionized water. The solution was mixed for 20 minutes to allow the $KMnO_4$ to dissolve. The $KMnO_4$ solution was then slowly added to the carbon paste.

Figure 31:
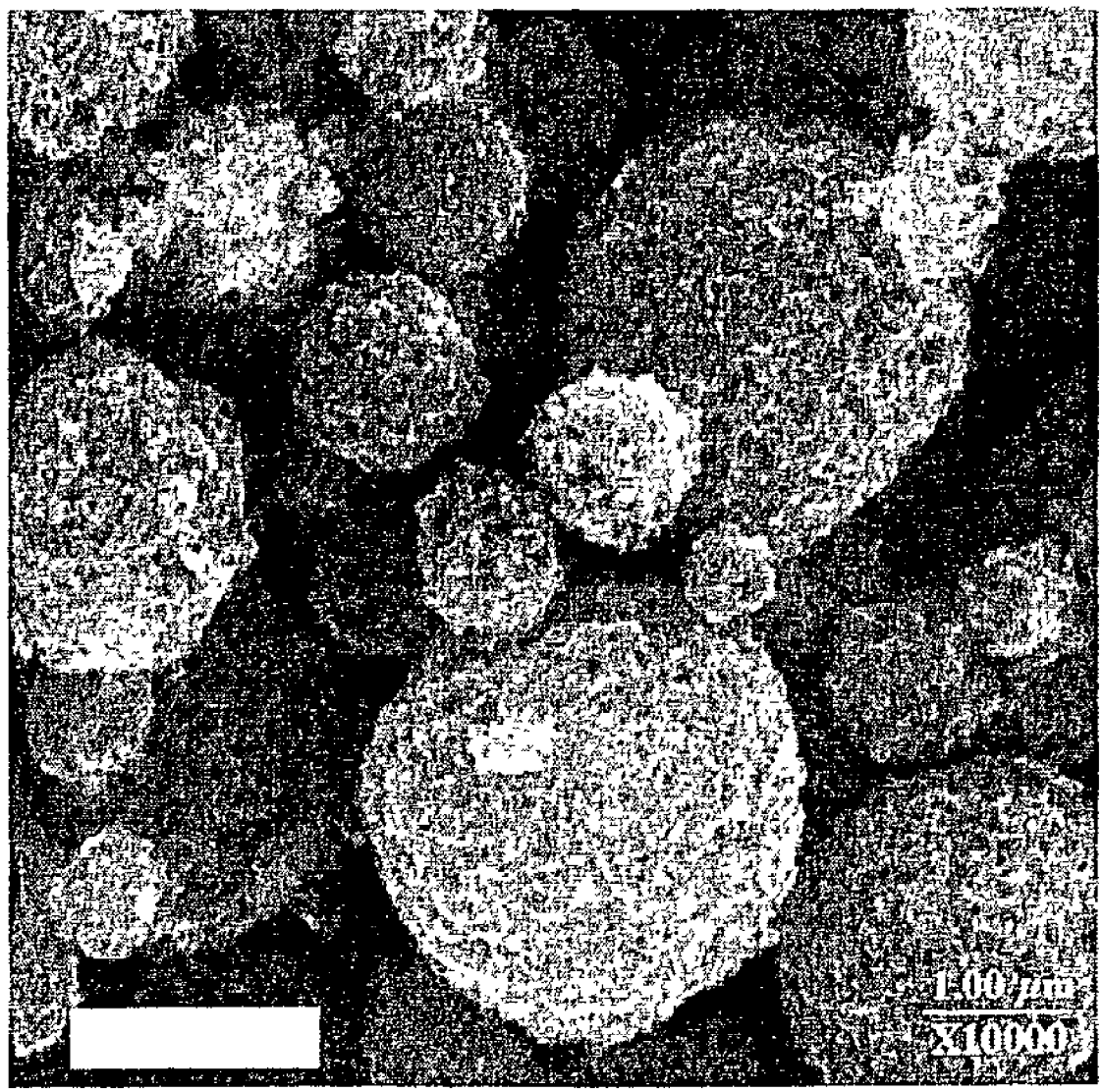
FIG. 31 illustrates an SEM photomicrograph of an ultrasonically generated electrocatalyst powder according to an embodiment of the present invention.

FIG. 31 illustrates a scanning electron microscope (SEM) photomicrograph of Example 23A (Table 3). The particle morphology illustrated in FIG. 31 is typical for the ultrasonically generated samples. The particles have a spherical shape with the particle size varying between about 0.3 µm and 10 µm. The support phase consists of primary carbon particles. Transmission electron microscopy (TEM) indicated that the support phase has a porous structure.

Figure 32:
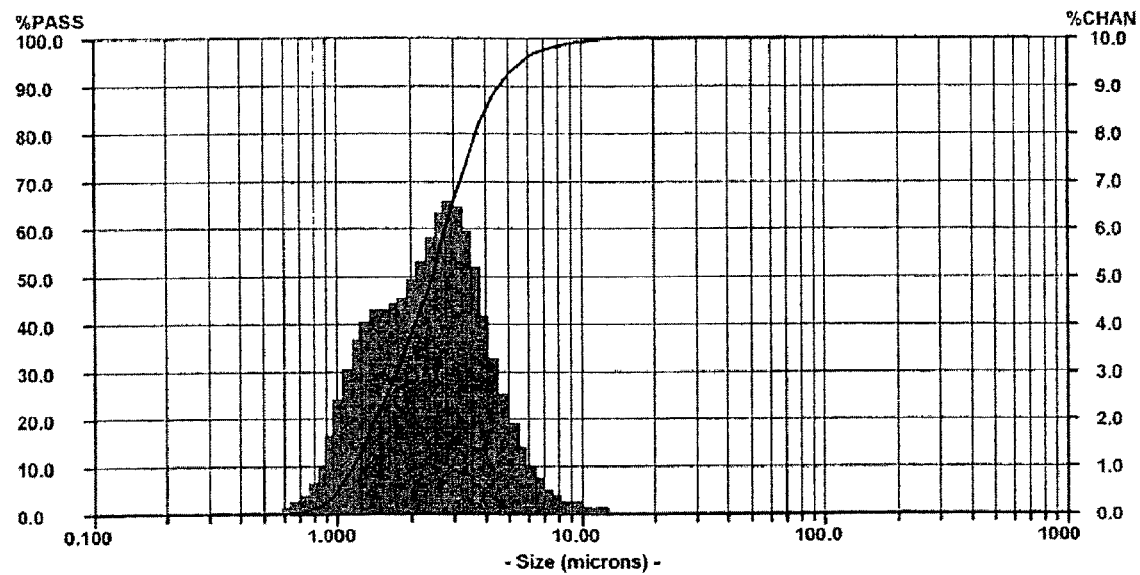
FIG. 32 illustrates the particle size distribution of an ultrasonically generated electrocatalyst powder according to an embodiment of the present invention.
Figure 33:
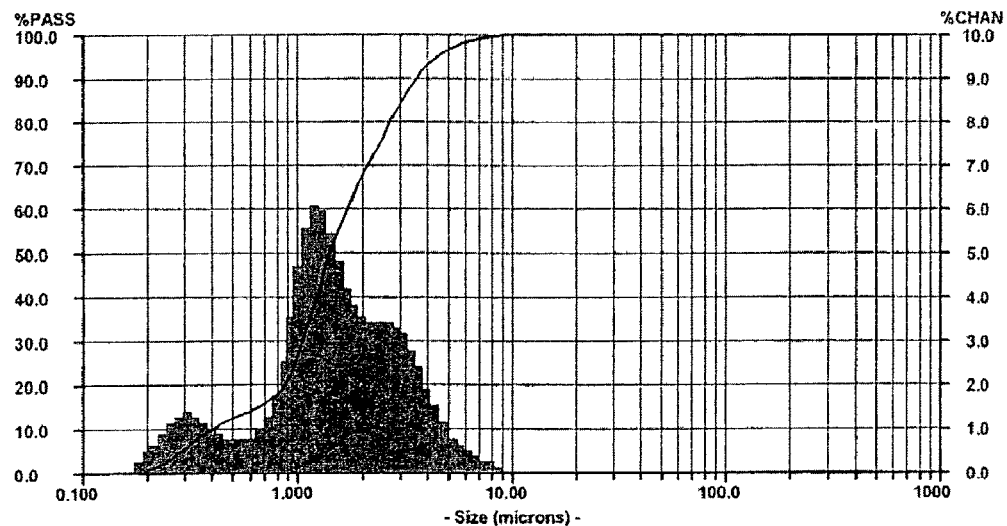
FIG. 33 illustrates the particle size distribution of an ultrasonically generated electrocatalyst powder according to an embodiment of the present invention.

The particles can be partially dissociated to smaller aggregates by mechanical force, such as ultrasound or compressing the particles by rolling into a layer. FIGS. 32 and 33 illustrate the ultrasonically induced dissociation for a typical electrocatalyst powder produced by ultrasonic generation. FIG. 32 illustrates the size distribution before breaking up secondary particles by sonification and FIG. 33 illustrates the same powder after sonification.

Figure 34:
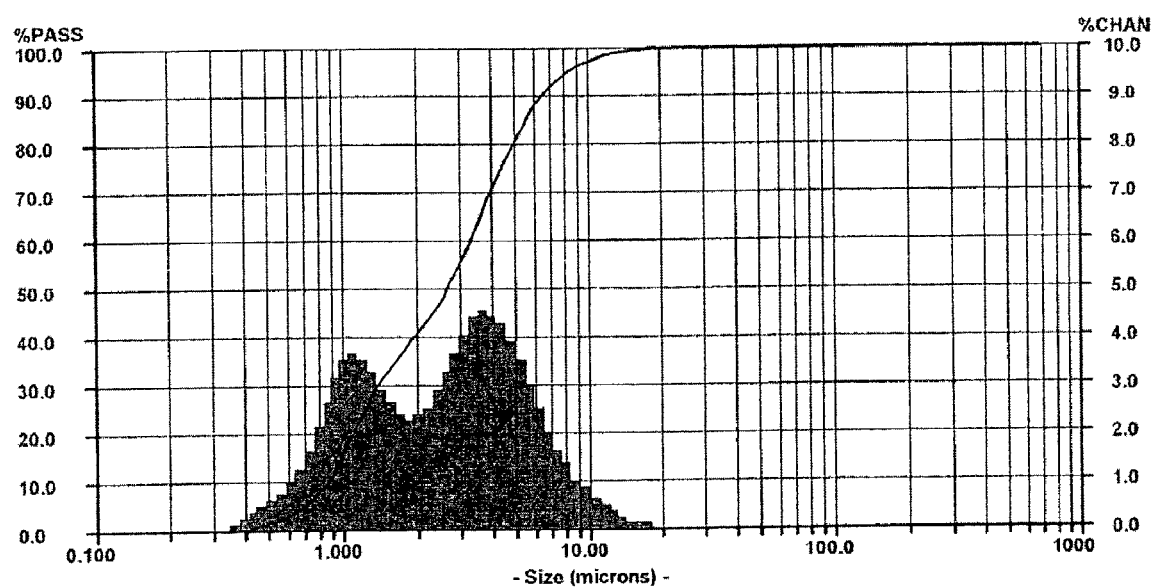
FIG. 34 illustrates the particle size distribution of a spray dried electrocatalyst powder according to an embodiment of the present invention.

FIG. 34 illustrates the size distribution of a spray dried powder. The secondary particles are larger, with diameters up to 20 µm, but the powder has an average particle size of about 5 µm. The differences in the secondary particles are related to the droplet size typical for the two aerosol generation approaches.

BET nitrogen absorption was used to measure the surface area and porosity of the electrocatalyst powders generated ultrasonically and by a spray nozzle. The results are summarized in Table 5. If the ultrasonically generated samples are compared, it is clear that the conversion temperature has an effect on the surface area. Example 19A, converted at 400° C., has a surface area of 93 $m^2/g$, while Example 19B, converted at 350° C. has a surface area of 37 $m^2/g$. However, further reduction in the temperature to 300° C. and 250° C. did not produce a significant decrease in the catalyst surface area.

It also appears that the presence of surfactant has an impact on the surface area. At identical conversion temperatures, the sample, which had additional amounts of surfactant in the precursor solution (Example 29B) has a 40% lower surface area than the same powder with no additional surfactant (Example 19B).

TABLE 5

Surface Area of Electrocatalysts

| Example | Generation Method | BET Surface Area ($m^2/g$) | Average Pore Diameter (nm) |
|---|---|---|---|
| 19A | Ultrasonic | 93 | — |
| 19B | Ultrasonic | 37 | — |
| 28B | Ultrasonic | 19 | — |
| 28D | Ultrasonic | 24 | — |
| 28E | Ultrasonic | 19 | — |
| 29B | Ultrasonic | 25 | — |
| 34B | Ultrasonic | 21 | — |
| 41A | spray nozzle | 21 | — |
| 41B | spray nozzle | 21 | — |
| 41C | spray nozzle | 17 | — |
| 41D | spray nozzle | 22 | — |
| 44C | spray nozzle | 28 | 20 |
| 44D | spray nozzle | 29 | 19 |
| 44E | spray nozzle | 24 | 17 |
| 44F | spray nozzle | 24 | 20 |
| 44G | spray nozzle | 24 | 21 |
| 44H | spray nozzle | 36 | 9 |
| 47A | spray nozzle | 36 | 23 |
| 47B | spray nozzle | 36 | 23 |

TABLE 5-continued

Surface Area of Electrocatalysts

| Example | Generation Method | BET Surface Area ($m^2/g$) | Average Pore Diameter (nm) |
|---|---|---|---|
| 47C | spray nozzle | 33 | 23 |
| 47D | spray nozzle | 24 | 18 |
| 47E | spray nozzle | 25 | 16 |

The pure carbon samples with no surfactant have the highest surface area of about 35 $m^2/g$. The presence of precursors to $MnO_x$ in the solution therefore leads to a reduced surface area and the surface areas for Mn-containing samples are on the order of 20 to 25 $m^2/g$, which is comparable to the surface areas of the ultrasonically generated samples at similar conversion temperatures.

Therefore, the selected aerosol generation method primarily impacts the particle size distribution, while the conversion temperature primarily impacts the surface area of the $MnO_x/C$ particles. However, the effect of conversion temperature on the surface area at temperatures below 300° C. is minimal. No significant changes were observed in the pore size distribution for the catalysts as a function of the preparation conditions. For all spray nozzle generated samples the average pore size was on the order of 20 nanometers, which indicates a secondary carbon support phase with no significant micro-porosity.

XPS analysis was also performed on these $MnO_x/C$ powders. XPS (X-ray Photoelectron Spectroscopy) analysis provides information about the surface composition and Mn oxidation state for the electrocatalysts. Three characteristics of the XPS spectra were analyzed for comparison of samples generated under different conditions:

1) Positions of the binding energy of Mn $2P_{3/2}$ photoelectrons which are indicative of the Mn oxidation state;

2) Relative intensities of Mn $2p_{3/2}$ vs. C 1s photoelectron peaks, directly compared between samples, for an indication of $MnO_x$ dispersion or for model-based calculations of the average particle size of the dispersed $MnO_x$; and 3) Ratios between different binding energies of O 1s photoelectron peaks related to: $O_1$ bonded to the C support, $O_2$ bonded to Mn and $O_3$ bonded in the surfactant used in the precursor formulations.

Two commercial catalysts were evaluated for comparison to the powders of the present invention. Each were standard $MnO_x/C$ powders available from commercial manufacturers and used in zinc-air battery applications. Three standards were also analyzed to identify the Mn oxidation state in the electrocatalysts. ($MnO_2$ powder, $Mn_2O_3$ powder and $KMnO_4$ powder.)

The preparation conditions, recording of the spectra and data processing were identical for all samples. The samples were prepared for XPS analysis by pressing the powder into indium (In) foil (99.9%), previously cleaned in $HNO_3$ to remove C and O impurities at the surface.

The XPS spectra for three control samples ($Mn_2O_3$, $MnO_2$ and $KMnO_4$) and all electrocatalyst powders were recorded on an AXIS HSi (Kratos Analytical) spectrometer, working in $\Delta E$=constant mode at a pass energy of 80 eV, using an aluminum anode (Al $K_\alpha$=1486.7 eV, 225W).The residual pressure in the analysis chamber was $1\times10^{-9}$ Torr. The peak positions were estimated relative to the binding energy of C 1s=284.6 eV. The following XPS peaks, designated by their electron levels, were recorded: Mn 2p, C 1s, O 1s and K 2p. One survey scan was acquired in the 75–1175 eV binding energy range for the control samples and electrocatalyst powders before the high resolution spectra were acquired. The experimental intensities were estimated from the areas of the corresponding peaks, measured on smoothed original peaks. The peak areas of Mn 2p and K 2p peaks include the areas of both $2P_{3/2}$ and $2p_{1/2}$ peaks.

Spectra were obtained for control samples and the results are illustrated in Table 6. The Mn $2P_{3/2}$ peak in the XPS spectra of $KMnO_4$ consists of two peaks and therefore two different oxidation states of Mn are present.

TABLE 6

XPS Data for Control Samples

| Sample | Mn $2p_{3/2}$ (eV) | O 1s (eV) | K $2p_{3/2}$ (eV) | C 1s (eV) |
|---|---|---|---|---|
| $Mn_2O_3$ | 641.6 | 529.6 | — | 284.6 |
| $MnO_2$ | 641.8 | 529.4 | — | 284.6 |
| $KMnO_4$ | 641.5 | 529.8 | 290.8 | 284.6 |
|  | 644.0 |  | 293.0 |  |

The literature data on the Mn $2P_{3/2}$ binding energy show that it depends on the oxidation state of Mn as follows:

Mn (II)—in MnO—640.6 eV

Mn (III)—in $Mn_2O_3$—641.6 eV

Mn (IV)—in $MnO_2$—642.6 eV

An increase of the XPS binding energy with increasing oxidation state of the element is a generally observed trend for a variety of materials. Since the oxidation state of Mn in $Mn_2O_3$ is Mn (III) and in $MnO_2$ is Mn (IV), it is expected that the binding energy for the latter should be higher than for the former compound. However, the experimental data show identical binding energy (within the experimental error) for Mn $2p_{3/2}$ photoelectrons in $Mn_2O_3$ and $MnO_2$ control samples.

However, since $MnO_2$ is a strong oxidizing agent, it is not surprising that the average oxidation state of Mn near the surface is less than Mn (IV). Another possible reason is that X-ray induced reduction takes place for the $MnO_2$ powder under the X-ray beam exposure.

The foregoing XPS results suggest that Mn (III) and Mn (IV) oxidation states cannot be clearly distinguished. Still, a general trend for higher binding energy indicates a higher Mn oxidation state.

Table 7 contains information on the binding energy of the Mn $2P_{3/2}$, O 1s and C 1s for two commercial electrocatalyst samples, samples 1A and 2A.

TABLE 7

XPS Data for Commercial Electrocatalyst Samples

| Sample | Mn 2p $_{3/2}$ peak position (eV) | K 2p $_{3/2}$ peak position (eV) | O 1s peak Position (eV) |
|---|---|---|---|
| 1A* | 642.3 | 292.2 | 529.7-57% |
|  |  |  | 532.1-43% |
| 2A* | 642.4 | 292.7 | 529.8-62% |
|  |  |  | 531.9-35% |
|  |  |  | 534.6-3% |

*Prior Art

The comparison of the Mn $2P_{3/2}$ binding energy, 642.3 eV for Sample 1A and 642.4 eV for Sample 2A does not show any significant difference. This binding energy is 0.7 eV higher than the binding energy of 641.6 eV observed for Mn (III) in the $Mn_2O_3$ control compound. The Mn $2p_{3/2}$ binding energy observed for both commercial electrocatalysts is very close to the position of 642.6 eV, which according to the literature data corresponds to Mn (IV) oxidation state. It is highly probable that X-ray induced reduction effect, observed for the $MnO_2$ control sample, is less expressed or not at all present for the electrocatalyst samples. It can be speculated that the $MnO_2$ species which are highly dispersed and in close contact with the conductive carbon surface are less likely to undergo an X-ray induced reduction than the highly crystalline $MnO_2$ compound.

Therefore, the average Mn oxidation state in the commercial electrocatalysts is between Mn (III) and Mn (IV) and most probably is Mn (IV). The Mn $2P_{3/2}$ binding energy position can be used as a reference for achieving Mn oxidation state favorable for electrocatalytic activity when evaluating the electrocatalysts according to the present invention. The XPS measured Mn oxidation state may be slightly different from the oxidation state in actual conditions.

Table 8 contains a summary of the XPS data for electrocatalyst Examples 19A through 34B (Tables 3 and 4). XPS data for Example 30D (Example 30A further heated to 250° C. in air for 1 hour) and Example 33A (Example 30A further heated to 170° C. in air for 1 hour), are also included.

TABLE 8

XPS Data for Electrocatalyst Samples

| Example | Mn $2p_{3/2}$ peak position (eV) | K $2p_{3/2}$ peak position (eV) | O 1s peak position (eV) |
|---|---|---|---|
| 19A | 642.4 | 292.6 | 529.9-59% |
|  |  |  | 531.3-32% |
|  |  |  | 533.0-9% |
| 19B | 642.0 | 293.0 | 529.8-21% |
|  |  |  | 532.2-79% |
| 23A | 642.3 | 292.8 | 528.9-59% |
|  |  |  | 532.2-41% |
| 28D | 642.3 | 292.8 | 530.0-30% |
|  |  |  | 531.3-26% |
|  |  |  | 532.9-44% |
| 28E | 642.1 | 293.1 | 529.9-22% |
|  |  |  | 531.3-42% |
|  |  |  | 533.1-36% |
| 29B | 641.4 | 292.9 | — |
| 30A | 642.6 | 293.0 | 528.9-21% |
|  |  |  | 532.2-79% |
| 30C | 642.2 | 292.8 | 528.9-21% |
|  |  |  | 532.2-79% |
| 30D | 641.5 | 292.9 | — |
| 33A | 641.3 | 293.0 | — |
| 34B | 642.3 | 293.0 | — |

The Mn $2P_{3/2}$ peak position for the samples obtained with $Mn(NO_3)_2$ as a precursor (Examples 19B and 29B), are lower by 0.4–1.0 eV compared to the commercial electrocatalysts. The Mn $2P_{3/2}$ binding energy for the majority of electrocatalysts, 19A, 23A, 28D, 30A, 30C and 34B is similar to the position for the commercial samples. This result indicates that the Mn oxidation state in these samples is Mn (IV), while the Mn oxidation state in Examples 19B and 29B is closer to Mn (III), because the binding energy value is similar to that for the $Mn_2O_3$ control sample. Since Examples 19B and 29B originate from precursor formulations containing $Mn(NO_3)_2$ as opposed to $KMnO_4$, it is clearthat different precursor formulations result in different $MnO_x$ surface species in the electrocatalysts, and therefore different catalytic activity. An average oxidation state close to Mn (IV) is likely most beneficial for the electrocatalytic activity of the samples as is discussed with the electrocatalytic activity data hereinbelow.

For Examples 30D and 33A, there is a shift of about 1.0 eV to a lower Mn $2p_{3/2}$ binding energy compared to their corresponding counterpart before the heat treatment (Example 30A). This is an indication that the post heat treatment leads to a reduction of Mn (IV) to Mn (III) oxidation state and therefore may be undesirable.

The O 1s spectra for Example 19A is characteristic of examples where the conversion of the precursor is complete. Therefore, the ratio of the different O 1s photoelectron peaks for each sample can be used to estimate the ratio of $MnO_x$ crystallite surface and the carbon support surface which is not covered by $MnO_x$ crystallites. Only 9% of the O 1s peak intensity can be related to the presence of oxygen from surfactant which was not reacted during the spray conversion. For the other limiting case, Example 19B, the O 1s peak at 532.2 eV, which accounts for about 80% of the O 1s peak intensity, corresponds to O in $NO_3$ species and its presence indicates non-complete conversion of the precursor. Example 19B demonstrates significantly lower electrocatalytic activity compared to Example 19A, as is discussed below.

The only difference in the preparation conditions between Examples 19A, 28D and 28E is the spray conversion temperature. Comparing the O 1s region, it is clear that while for Example 19A (400° C.) there is no significant O 1s peak associated with the presence of a surfactant, for Examples 28D (250° C.) and 28E (200° C.) that peak (533.2 eV) accounts for 30–40% of the O 1s intensity.

Therefore, the spray conversion temperature influences the presence of surfactant in the catalyst powders. Since the remaining surfactant is deposited either on top of the active $MnO_x$ species or on the carbon surface, it could potentially influence the catalytic activity of the samples. Therefore, in order to minimize eventual negative effect of the surfactant, either higher conversion temperatures should be used or the presence of surfactant in the spray solution should be minimized.

The XPS data also contain information on the dispersion of the $MnO_x$ species on the carbon support surface. This information is indirectly included in the relative intensities of I (Mn 2p)/I (C 1s). In order to extract the information on the dispersion, several other parameters are needed for the electrocatalysts such as the bulk composition of the samples, the BET surface area and the theoretically calculated relative intensities for monolayer distribution.

Table 9 contains information about the bulk composition of the samples analyzed both by Atomic Absorption Spectroscopy (MS) and X-ray Fluorescence (XRF). XRF data generally show higher values for the Mn and K compared to the AAS data. The results suggest that the electrocatalyst powders of the present invention have higher molar concentration of both Mn and K than the commercial samples. Absolute values for the weight percent concentration by MS for the electrocatalysts of the present invention closely match the expected values, based on the composition of the precursor solution.

TABLE 9

AAS/XRF Data for the Bulk Composition

| Sample Or Example | Mn (wt. %) | K (wt. %) | Mn/C at. ratio ×10² | K/C at. Ratio ×10² |
|---|---|---|---|---|
| 1A* | 1.78/2.80 | 0.90/1.47 | 0.40/0.64 | 0.28/0.48 |
| 2A* | 6.00/9.54 | 2.67/3.87 | 1.44/2.32 | 0.90/1.37 |
| 19A | 9.04/14.8 | 7.94/12.2 | 2.38/4.43 | 2.93/5.13 |
| 19B | 9.06/14.9 | 2.48/3.70 | 2.24/4.00 | 0.86/1.40 |

*Prior Art

Table 10 contains data on the BET surface area, the theoretically calculated values for I (Mn 2p)/I (C 1s) relative intensities if the $MnO_x$ species were to be distributed as a monolayer and the I (Mn 2p)/I (C 1s) experimentally measured values.

Commercial Sample 2A includes a high-surface area activated carbon. All of the electrocatalyst powders of the present invention have an order of magnitude lower surface area, formed after the primary high surface area carbon support forms the secondary carbon support structures as described above. The high-surface area activated carbon support (Samples 1A and 2A) possess a significant degree of internal microporosity, while the spray converted secondary support formed in accordance with the foregoing examples has primarily mesoporosity.

TABLE 10

XPS Modeling Data for $MnO_x$ Particle Size Estimation

| Sample/ Example | I (Mn 2p)/ I (C 1s) (Experimental) | I (Mn 2p)/ I (C 1s) (monolayer) | Surface area (m²/g) | Estimated particle size (nm) | Voltage (V) at discharge current of 300 mA/cm² |
|---|---|---|---|---|---|
| 1A* | 0.378 | 0.205 | 121 | Non-homogeneous | — |
| 2A* | 2.803 | 0.340 | 713 | Non-homogeneous distribution | 0.82 |
| 23A | 1.188 | 1.754 | 93 | 2 | 1.02 |
| 30A | 0.863 | 6.651 | 24 | 15 | 0.91 |
| 30C | 1.090 | 6.651 | 25 | 12 | 0.95 |
| 30D | 0.688 | 6.650 | 30 | 40 | 0.76 |

*Prior Art

The information for the estimated average $MnO_x$ particle size is extracted by a comparison between the theoretical and experimental values for I (Mn 2p)/I (C 1 s) relative intensities. The changes in XPS relative intensities and the comparison of the experimental data to the theoretical ones is based on the method of Kerkhof and Moulijn (F. P. J. M. Kerkhof and J. A. Moulijn, J. Phys. Chem. 83, (1979) 1612). This approach as previously applied to dispersed catalysts (P. Atanasova and T. Halachev, Applied Catalysis A: General 108 (1994) 123; P. Atanasova et al., Applied Catalysis A: General 161 (1997) 105) provides reliable information about the distribution of the active components on a dispersed support. When the experimental value for I (Mn 2p)/I (C 1s) relative intensities is close to but lower than theoretical, an estimate of the particle size is possible through this XPS model. When the experimental value for I (Mn 2p)/l (C 1s) relative intensities is higher than theoretical, no exact estimate of the particle size is possible through this XPS model. However, this is an indication for a non-homogeneous distribution of $MnO_x$ species preferentially on the external surface area of the carbon support.

For Samples 1A and 2A, the experimental values for the I (Mn 2p)/I (C 1s) relative intensities are significantly higher than theoretical. Therefore, the total surface area of the carbon support is not effectively utilized and the $MnO_x$ active species are localized mainly on the external surface area of the carbon support. The result is not surprising since the activated carbon surface area includes a significant degree of microporosity. During the wet processing used to form such powders, this porosity is not accessible for adsorption of precursors from the liquid phase due to wetting characteristics.

In contrast, the experimental values for the I (Mn 2p)/I (C 1s) relative intensities for the electrocatalysts of the present invention are lower than theoretical and from the deviation an average $MnO_x$ particle size was estimated for each sample, as is detailed in Table 10. The estimated average particle size varies from 2 nanometers for Example 23A to 40 nanometers for Example 30D. The result for Example 23A indicates uniform deposition of the active species throughout the carbon support surface area and only a few monolayers of $MnO_x$ surface species. It is apparent that the dispersion varies depending on the preparation conditions, the relevant parameters being the type of spray generation and the spray conversion temperature. However, the XPS modeling data demonstrate uniform deposition throughout the carbon support surface area.

Table 10 also includes information on the electrocatalytic testing. The voltage attained by an electrode prepared with the electrocatalysts of the present invention in half-cell experiments at a discharge current of 300 $mA/cm^2$ was chosen as a parameter for comparison of the electrocatalytic activity of the catalysts.

Figure 35:
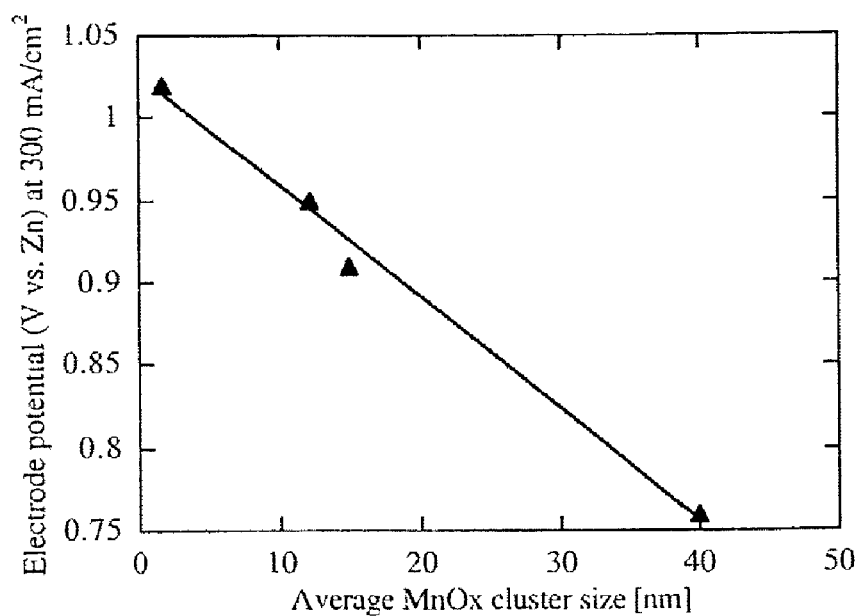
FIG. 35 illustrates the dependence of electrocatalytic activity on $MnO_x$ cluster size for an electrocatalyst powder according to an embodiment of the present invention.

FIG. 35 illustrates the correlation between the electrocatalytic activity and XPS estimated average particle size from the data in Table 10. There is a linear correlation between the electrocatalytic performance of the catalysts and the average $MnO_x$ crystallite size. It is important to note that all catalysts compared in FIG. 35 (except Example 30D) have identical Mn $2p_{3/2}$ binding energy, indicating an identical Mn oxidation state. Based on the XPS model, no estimation of the $MnO_x$ cluster size was possible for the commercial catalysts since they had a non-homogeneous distribution wherein $MnO_x$ was preferentially deposited on the outer support surface. However, if the electrocatalytic performance for the Sample 2A catalyst is compared to the data in FIG. 35, the corresponding $MnO_x$ size for this electrocatalyst is about 30 nanometers.

The combined information on the Mn oxidation state and $MnO_x$ dispersion derived from the XPS analysis is a valuable source for clarifying the $MnO_x/C$ electrocatalyst structure and for predicting the electrocatalyst performance. Achieving a Mn oxidation state that is optimal for the electrocatalytic performance is probably the most critical requirement. However, forming the active species in a highly dispersed form is also important. The higher the dispersion, the higher the number of active centers exposed to the electrochemical reagents and catalyzing the reaction.

In order to confirm the XPS estimated average crystallite size, several other analytical techniques were used. An X-Ray Diffraction (XRD) spectrum of a control sample prepared by ultrasonic generation at 300° C. with $KMnO_4$ as a precursor to $MnO_x$ showed no indication of any crystalline structures. In general, this result indicates that either no such species are formed or that their concentration and/or size are too small to be detected by XRD. Typically, for dispersed oxides, the XRD detection limit is about a 40 to 50 nanometer crystallite size. For $Mn(NO_3)_2$ based catalyst (conversion temperature of 300° C.) an indication of some crystalline structures was observed. However, the features were too weak for identification and, as XPS data suggested, this could be related to the presence of non-converted $Mn(NO_3)_2$ in the catalysts.

A further increase in the conversion temperature produced more pronounced XRD peaks, the positions of which were related to the formation of crystalline $Mn_3O_4$ or $Mn_2O_3$. In general, this indicates that if the conversion temperature is too high (at otherwise identical residence time), the diffusion and agglomeration of the converted $MnO_x$ species leads to the formation of large crystallites that are XRD detectable. Once such low-dispersion structures are formed, no significant electrocatalytic activity is expected. Therefore, only a proper combination of several spray generation parameters such as the method of generation, the precursor composition and the temperature of conversion ensures proper kinetics of the conversion and diffusion of the active surface species that are optimal for the electrocatalytic performance.

The benefit of the XPS derived dispersion data relates to information averaged over a large number of catalyst particles. TEM, which gives a high magnification image of the catalyst morphology, was used to confirm the data collected by XPS. For Example 23A, small 1 to 2 nanometer size amorphous $MnO_x$ species were observed on the primary carbon particle surface (d=30 nm). Energy Dispersive Spectroscopy (EDS) performed on the particle confirmed that the surface species are Mn containing and that these species are uniformly distributed throughout the particle.

TEM images of Sample 2A showed areas of higher contrast attributed to the $MnO_x$ particles deposited mainly on the external surface area of the carbon support. Higher magnification images showed that these $MnO_x$ species are 20 to 40 nanometers in size, they are crystalline and reside on the outside surface area of the carbon support. Therefore, the TEM observations confirm the XPS derived data on the $MnO_x$ dispersion and deposition uniformity. Observations by TEM for Sample 1A yielded similar results.

TEM observations of Example 30D, which is a post heat-treated sample corresponding to Example 30A, were also made. As described in Table 10, the XPS estimated particle size for Example 30A is approximately 10 to 15 nanometers, while for Example 30D it is approximately 40 nanometers. The TEM images indicated that in some areas of the carbon support, the $MnO_x$ clusters are highly dispersed while in other areas large crystallites of about 50 nanometers in size are formed. The larger clusters consist of $MnO_x$ crystallites which are about 10 to 15 nanometers in size.

This TEM observation is in excellent correlation with the XPS estimated average particle size of 40 nanometers. In addition, these results point to a very important detail of the structure of the electrocatalysts of the present invention—elevated temperature post treatment of the catalysts may lead to diffusion of $MnO_x$ crystallites, formation of large crystallites and significant decrease in the dispersion of the active phase. In combination with the change in the Mn oxidation state, observed by XPS, this is a clear explanation of why the electrocatalytic activity of a post heat-treated sample is significantly lower compared to the original spray converted counterpart.

The influence on the electrocatalytic activity of the spray conversion temperature, presence of surfactant, precursor concentration and additives was systematically analyzed for Examples 41A through 47E. Based on the previous XPS findings the samples were characterized by the binding energy positions for Mn as an indication for the Mn oxidation state and the I (Mn)/I (C) relative intensities as a measure for the dispersion of the $MnO_x$ species. The relative intensities and type of O 1s XPS peaks were analyzed in relation to the presence of surfactant and its influence on the electrocatalytic activity.

Figure 36:
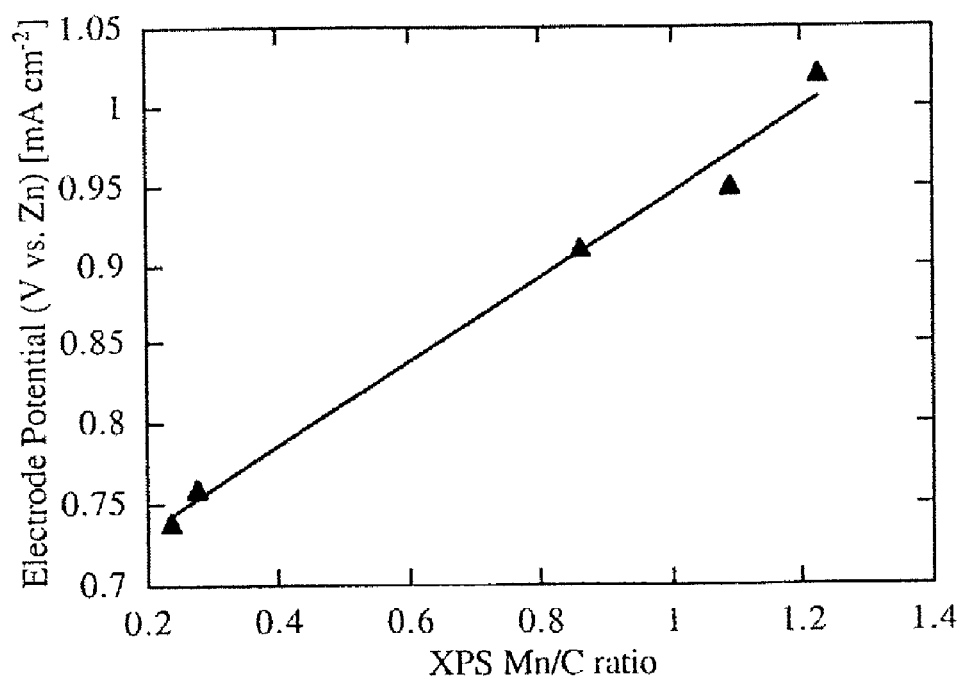
FIG. 36 illustrates the dependence of electrocatalytic activity on the relative intensity of XPS peaks for an electrocatalyst powder according to the present invention.

FIG. 36 illustrates the relationship between the electrocatalytic activity and the XPS relative intensities for Examples 19A through 30D. This dependence was used as a baseline for the further analysis of the influence of different spray conversion parameters on the electrocatalytic activity. For all spray nozzle generated samples, the BET surface areas are comparable and would not significantly influence the XPS model calculations of the average $MnO_x$ cluster size. Therefore, a comparison of the XPS I (Mn)/I (C) relative intensities is an adequate measure of the dispersion of the active species. As can be seen from FIG. 36, the higher I (Mn)/I (C) relative intensities, the higher the electrocatalytic performance of the samples, if other characteristics of the catalyst (surface area and Mn oxidation state) are identical.

The Mn $2P_{3/2}$ binding energy for most of the samples is identical to the previously analyzed electrocatalysts (642.3±0.1 eV), which indicates a Mn (IV) oxidation state. Only for Examples 41C to 44C does the binding energy deviate significantly from the above position and is 641.8±0.1 eV. Therefore, in the latter samples, the Mn oxidation state is lower and most likely a mixture of Mn (IV) and Mn (III) oxidation states.

Examples 41 A through 41 D illustrate the influence of variable amounts of surfactant in the spray solution, variation in the weight percent of Mn as well as the spray conversion temperature as compared to Examples 30A and 30C. A comparison between Examples 30C and 41A leads to the conclusion that a higher conversion temperature is not necessarily beneficial for the catalyst morphology and performance. Both the $MnO_x$ dispersion and the electrocatalytic activity are lower for Example 41A, which was made at a higher conversion temperature with all other parameters being kept constant.

It appears that the lower the amount of added surfactant, the better the dispersity and electrocatalytic performance (compare Example 41A to Example 41B). Doubling the Mn concentration does not lead to any improvement in the electrocatalytic performance. In contrast, it is the lowest in the series of spray nozzle generated samples. This result indicates that the surface coverage at 10 weight percent Mn and about 25 $m^2/g$ support surface area has the adequate balance of well-dispersed $MnO_x$ species and non-covered carbon surface area. Further increase in the Mn concentration, even if it ensures higher concentration of $MnO_x$ centers, does not improve the electrocatalytic performance.

The preparation conditions for Examples 41A and 41D are identical, except that for Example 41D a reduced flow in the spray reactor was employed. It appears that both the dispersion and the electrocatalytic activity are improved for Example 41D. This effect is significant (over 30%) for the dispersion and moderate for the electrocatalytic activity. It should be noted that the longer residence time leads to a lower oxidation state of Mn similar to the post heat-treated Example 30D. The higher residence time at elevated temperatures may lead to an undesirable reduction of the $MnO_x$ surface species.

TABLE 11

XPS Data for Examples 41A to 47E

| Example | Spray conversion temperature (° C.) | Mn (wt. %) | Precursor Concentration (wt. %) | Mn $2P_{3/2}$ binding energy (eV) | I (Mn 2p)/ I (C 1s) (Experimental) | Voltage [V] at discharge current of 300 $mA/cm^2$ |
|---|---|---|---|---|---|---|
| 41A | 315 | 10 | 5 | 642.2 | 0.71 | 0.91 |
| 41B | 315 | 10 | 5 | 642.0 | 0.83 | 0.97 |
| 41C | 315 | 20 | 5 | 641.9 | 1.39 | 0.85 |
| 41D | 315 | 10 | 5 | 641.8 | 1.03 | 0.96 |
| 44C | 208 | 5 | 5 | 641.7 | 0.33 | 0.99 |
| 44D | 149 | 5 | 5 | 642.3 | 0.46 | 0.92 |
| 44E | 149 | 10 | 5 | 642.3 | 1.03 | 1.01 |
| 44F | 208 | 10 | 5 | 642.3 | 0.76 | 0.95 |
| 44G | 208 | 10 | 5 | 642.2 | 0.86 | 1.00 |
| 47D | 208 | 10 | 2.5 | 642.4 | 0.78 | 0.95 |
| 47E | 208 | 10 | 2.1 | 642.2 | 0.86 | 0.97 |

Comparison between Examples 44C and 44D, both with 5 weight percent Mn concentration, shows that decreasing the conversion temperature from 208° C. to 149° C. produced a better dispersion of the active species but not necessarily better catalytic activity (Table 11). This observation is confirmed for 10 weight percent Mn catalysts, Example 44E (149° C.) and Example 44G (208° C.). The two examples have significantly different dispersion, the one for Example 44E being 30% higher, but identical electrocatalytic performance. An explanation for this deviation of the correlation higher dispersion-higher activity can be found in the O 1s XPS spectra.

It is clear from this XPS data that the higher concentration of $KMnO_4$ in the precursor solution for Example 44E had an oxidizing effect on the surfactant present in the solution. The relative intensity of the O 1s peak related to the surfactant (533.2 eV) for Example 44E is much lower compared to Example 44D. Thus, even though the conversion temperature is rather low (149° C.), the burnout of the surfactant is quite effective. Apparently, if the surfactant is still present at the catalyst surface, it blocks active centers and even though the $MnO_x$ dispersion is reasonable, the activity is lower than for Example 44D. Further comparison with the O 1s XPS spectra for Example 47D shows that if the added surfactant is completely eliminated, the O 1s peak related to the surfactant is further decreased in intensity.

Lowering the surfactant concentration in the precursor solution has a negative effect on the $MnO_x$ cluster dispersion (compare Example 30C and Example 47D). However, the benefit of less surfactant, which if present acts as a catalyst poison, outweighs the lower dispersion and the resulting catalytic activity is identical. Therefore, the amount of high molecular weight surfactants should be minimized in the precursor suspensions.

Example 44E prepared with spray nozzle generation has identically high performance to the ultrasonically generated Example 23A. Example 44 E was prepared at the lowest conversion temperature of 149° C, with minimal addition of surfactant, 10 weight percent Mn and 5 weight percent solution concentration. Most likely these particular conditions (along with others such as residence time) ensure good kinetic conditions for the formation and distribution of the $MnO_x$ active species on the carbon support.

A higher surface area carbon support compared to the carbon support used for the previous spray conversion examples (surface area of 254 $m^2/g$) will provide higher support surface area available for the $MnO_x$ absorption. The surface area reduction after the spray conversion observed for the previous carbon support was on the order of about 10 times. Because of that reduction of the surface area, higher loading of $MnO_x$ was not beneficial for the electrocatalytic activity because of the lack of sufficient surface area to ensure high dispersion of the additional amounts of $MnO_x$. Therefore, carbon supports with higher starting surface area and different types of porosity were chosen to test their applicability for producing electrocatalysts with higher $MnO_x$ loading and high dispersion of the active $MnO_x$ species.

This resulted in the electrocatalyst examples listed in Table 12. KETJENBLACK samples were considerably more viscous and thus were diluted with water to reduce the carbon concentration to 2 weight percent. BLACKPEARLS samples were less viscous and were diluted with water to yield 4 weight percent carbon. In the samples with Mn/C ratios higher than 10%, $KMnO_4$ was added, being initially dissolved in the water used for sample dilution. All the samples were processed while varying the inlet temperature and $KMnO_4$ content.

TABLE 12

High Surface Area Carbon Electrocatalyst Examples

| Example | Carbon Black Source | Mn (wt. %) | Inlet T (° C.) | Weight (g) | Recovery (%) |
|---|---|---|---|---|---|
| 35A | KETJENBLACK | 10 | 208 | 400 | 82 |
| 35B | KETJENBLACK | 10 | 315 | 440 | 88 |
| 36A | KETJENBLACK | 15 | 208 | 530 | 94 |
| 36B | KETJENBLACK | 15 | 315 | 510 | 92 |
| 37A | KETJENBLACK | 20 | 208 | 600 | 93 |
| 37B | KETJENBLACK | 20 | 315 | 660 | 94 |
| 38A | BLACKPEARLS | 10 | 208 | 490 | 98 |
| 38B | BLACKPEARLS | 10 | 315 | 500 | 99 |
| 39A | BLACKPEARLS | 15 | 208 | 570 | 97 |
| 39B | BLACKPEARLS | 15 | 315 | 570 | 98 |
| 40A | BLACKPEARLS | 20 | 208 | 610 | 96 |
| 40B | BLACKPEARLS | 20 | 315 | 630 | 98 |

Examples were processed in a co-current spray dryer in the order listed in Table 12. The carrier gas pressure was 80 psi and the carbon suspension was delivered to the spray nozzle at a rate of 150 to 250 ml/min.

Figure 37:
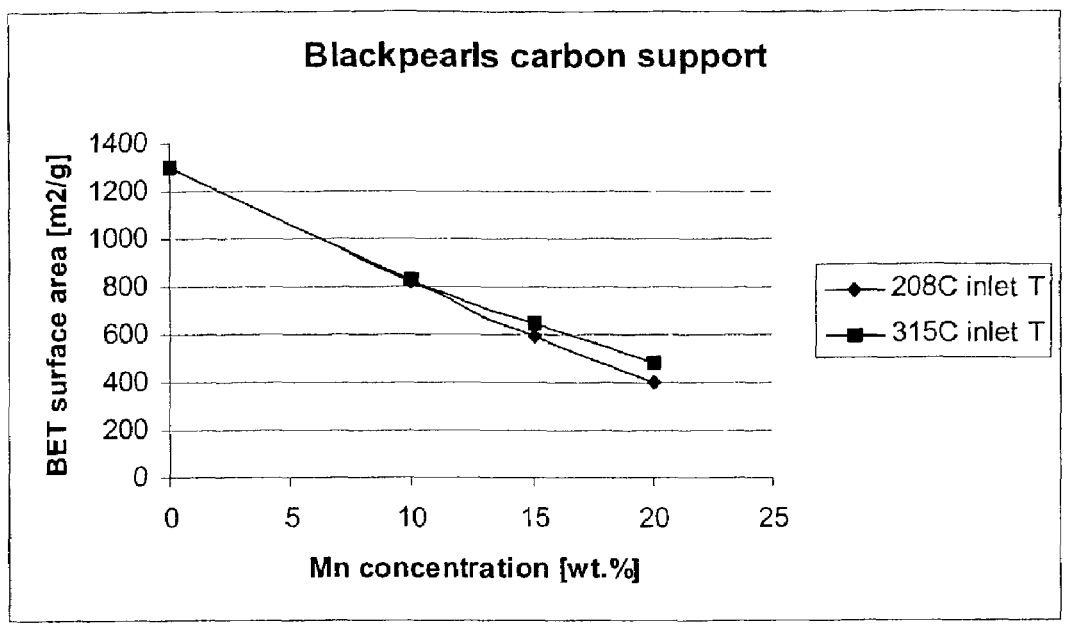
FIG. 37 illustrates the effect of increasing manganese concentration on surface area for a high surface area electrocatalyst powder according to an embodiment of the present invention.
Figure 38:
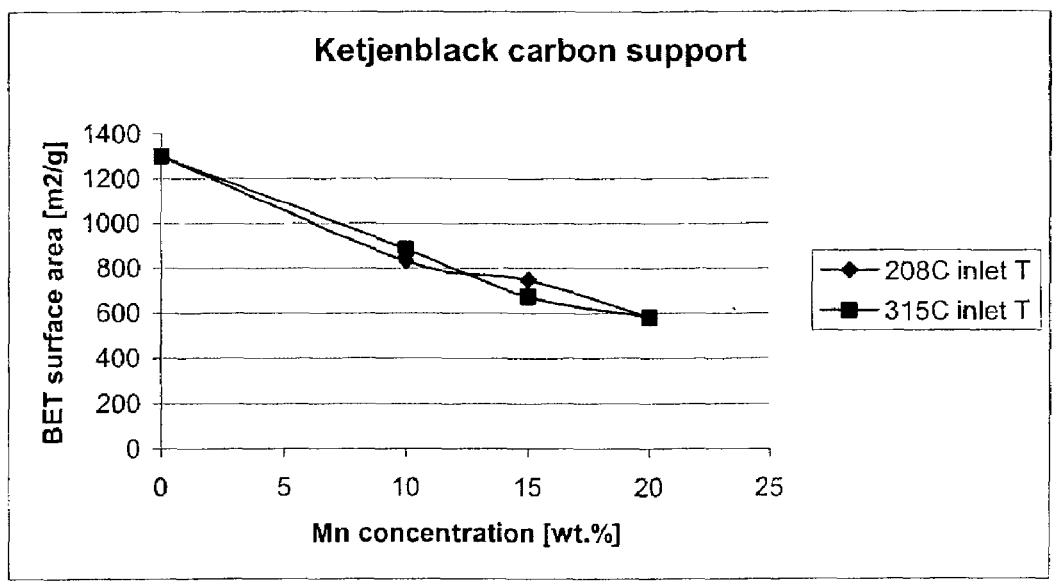
FIG. 38 illustrates the effect of increasing manganese concentration on surface area for a high surface area electrocatalyst powder according to an embodiment of the present invention.

$MnO_x$ was successfully dispersed over both high-surface area carbon materials resulting in high surface area electrocatalytic powder. FIGS. 37 and 38 illustrate the dependencies of the surface area on the amount of Mn deposited on the carbon. Catalysts based on both types of carbon support can be obtained with BET surface areas from 850 to 600 $m^2/g$ when the Mn concentration is varied from 10 to 20 weight percent. The conversion temperature does not affect the surface area significantly. In all cases there is an apparent linearity in the dependencies that can be interpreted in terms of even distribution of the $MnO_x$ on the carbon carrier surface, resulting in additive blocking and agglomeration effects.

Table 13 contains the XPS data for the examples listed in Table 12.

TABLE 13

XPS Data for Samples Based on High-Surface Area Carbon Blacks

| Example | Spray drier inlet temperature ° C. | Mn (wt. %) | Mn $2p_{3/2}$ binding energy (eV) | I (Mn 2p)/ I (C 1s) Experimental |
|---|---|---|---|---|
| 35A | 208 | 10 | l. r.* | 0.052 |
| 35B | 315 | 10 | 641.6 | 0.143 |
| 36A | 208 | 15 | 642.8 | 0.229 |
| 36B | 315 | 15 | 644.1 | 0.257 |
| 37A | 208 | 20 | l. r.* | 0.061 |
| 37B | 315 | 20 | 643.2 | 0.330 |
| 38A | 208 | 10 | 644.5 | 0.052 |
| 38 | 315 | 10 | l. r.* | 0.000 |
| 39A | 208 | 15 | 643.1 | 0.269 |
| 39B | 315 | 15 | 642.6 | 0.141 |
| 40A | 208 | 20 | n.a. | n.a. |
| 40B | 315 | 20 | 642.2 | 0.244 |

*l. r.—low resolution

Figure 39:
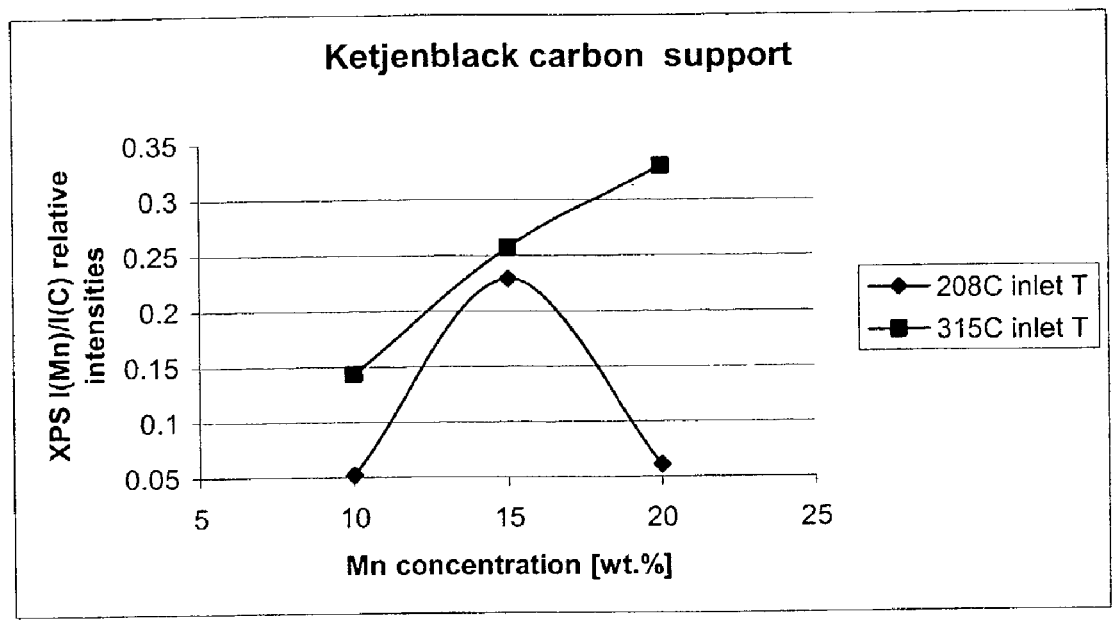
FIG. 39 illustrates the effect of manganese concentration on the dispersion of the active species on a high surface area electrocatalyst powder according to the present invention.
Figure 40:
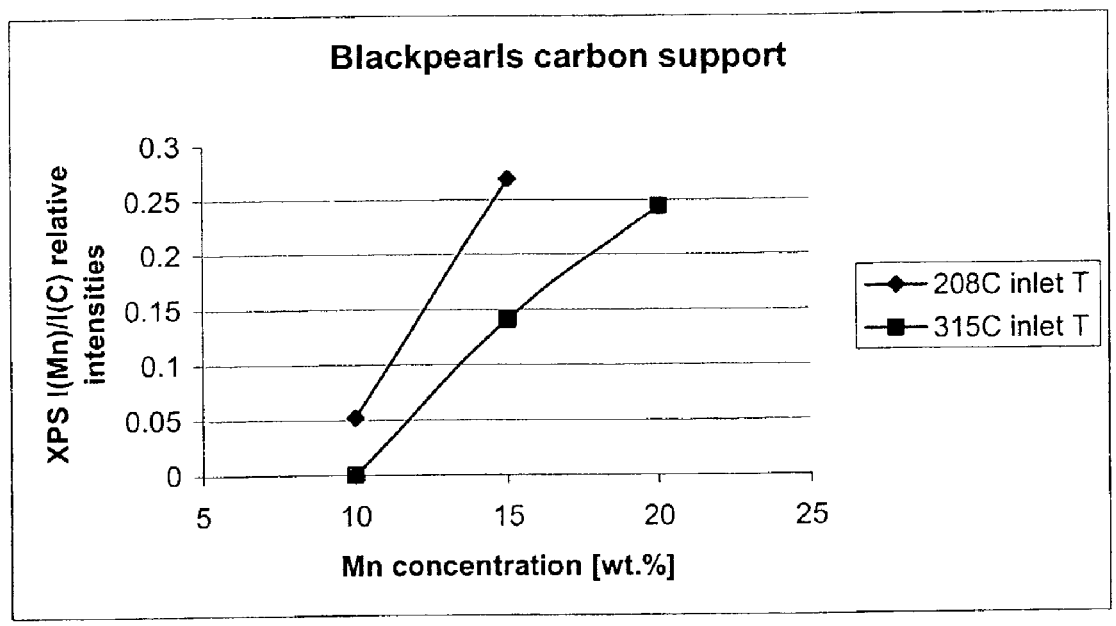
FIG. 40 illustrates the effect of manganese concentration on the dispersion of the active species on a high surface area electrocatalyst powder according to the present invention.

FIGS. 39 and 40 compare the dispersion of the $MnO_x$ species (followed by the changes in the XPS I (Mn)/I (C) relative intensities) as a function of the Mn loading and spray drier inlet temperature for KETJENBLACK (FIG. 39) and BLACKPEARLS (FIG. 40) supports. Since the sample surface area also changes as a function of the active species loading and the conversion inlet temperature, an accurate comparison of the dispersion requires application of the Kerkhof and Moulijn XPS model. However, for initial evaluation of the catalyst morphology and active phase distribution, the XPS I (Mn)/I (C) relative intensities will be used.

For both catalyst supports an inlet temperature of 315° C. produces samples with a linear increase of the XPS I (Mn)/I (C) relative intensities vs. Mn content. For an inlet temperature of 208° C., the results are very different for the two types of samples. While for the KETJENBLACK support the XPS values for an inlet temperature of 208° C. are lower than for 315° C., whereas for the BLACKPEARLS support they are significantly higher.

These results indicate that carbon support chemistry and morphology play a significant role in the formation of the active species and their distribution. In support of this statement are the XPS data for the Mn $2p_{3/2}$ binding energy positions (Table 12). Only for very few samples such as Examples 40B, 39B, and 36A is the binding energy similar to that of Mn (IV) oxidation state. For Example 35B it is closer to the Mn (III) oxidation state, while for all other samples it has significantly higher values. These higher values could be due either to the presence of non-converted precursor or the presence of converted $MnO_x$ species with higher than Mn (IV) oxidation state.

Two additional groups of $MnO_x/C$ electrocatalysts were prepared utilizing a spray dryer. The samples illustrated in Table 14 were spray dried using a co-current spray dryer and the samples illustrated in Table 15 were generated using a mixed flow spray dryer. Typically, the outlet temperature for the co-current spray dryer is limited to about 200° C. and this is the maximum temperature that the particles are exposed to. In the mixed flow spray dryer, the particles have a higher residence time and experience increasingly higher temperatures as they travel against the inlet gas stream (the inlet temperature is significantly higher compared to the outlet temperature). The utilization of the two different spray dryer configurations allowed for a comparison of the effect of the time/temperature history on the characteristics and the electrochemical performance of the $MnO_x/C$ electrocatalysts.

As is illustrated by Table 14, a number of different carbon supports were used for producing $MnO_x/C$ electrocatalysts for oxygen reduction. The different carbon supports offer different advantages in the performance and application of these electrocatalysts in particular applications, varying from hearing aid batteries to batteries for high power applications such as in portable devices. Every one of the carbon supports used has a different initial surface area ranging from 80 $m^2/g$ for SHAWINIGAN BLACK to 1400 $m^2/g$ for BLACKPEARLS and KETJENBLACK. In addition, the primary carbon particle size of these supports in the suspensions used for spray drying were significantly different: 55 nm for SHAWINIGAN BLACK, 400 nm for BLACKPEARLS and KETJENBLACK and 22 microns for NORIT SA-3 and PWA.

The ability to generate electrocatalysts based on all these various morphology supports demonstrates the flexibility of the spray drying generation method for handling large variety of supports and the versatility of the method for catalyst preparation.

TABLE 15

Electrocatalysts Spray Dried in a Mixed Flow Spray Dryer

| Sample | Composition | Carbon Support | Inlet Temperature (° F.) | Production rate (g/hr) | Surface Area ($m^2/g$) |
|---|---|---|---|---|---|
| 135A | 10% $MnO_2$ | PWA | 400 | 276 | 300 |
| 135B | 5% $MnO_2$ | PWA | 400 | 645 | 386 |
| 135C | 10% $MnO_2$ | PWA | 375 | 639 | 455 |
| 136A | 5% $MnO_2$ | PWA | 375 | 501 | 490 |
| 136B | 10% $MnO_2$ | PWA | 350 | 675 | 400 |
| 136C | 5% $MnO_2$ | PWA | 350 | 780 | 380 |
| 137A | 10% $MnO_2$ | PWA | 300 | 648 | 380 |
| 137B | 5% $MnO_2$ | PWA | 300 | 324 | 370 |
| 161A | 10% $MnO_2$ | PWA | 375 | — | 220 |
| 161B | 10% $MnO_2$ | PWA | 300 | — | 300 |

Electrochemical evaluation of the $MnO_x/C$ electrocatalysts was also performed. Electrodes were comprised of 20 $mg/cm^2$ of catalyst using a gas diffusion layer consisting of

TABLE 14

Electrocatalysts Spray Dried in a Co-current Spray Dryer

| Sample | Mn (wt. %) | CARBON SUPPORT | Inlet Temperature, (° F.) | Production Rate, (g/hr) |
|---|---|---|---|---|
| 105A | 10% Mn, 1% Ag | SHAWINIGAN BLACK | 400 | 590 |
| 103B | 10% Mn | SHAWINIGAN BLACK | 400 | 560 |
| 104A | 10% Mn | SHAWINIGAN BLACK | 600 | 700 |
| 103A | 5% Mn | SHAWINIGAN BLACK | 400 | 570 |
| 103C | 5% Mn | SHAWINIGAN BLACK | 600 | 680 |
| 104B | 15% Mn | SHAWINIGAN BLACK | 600 | 560 |
| 104C | 20% Mn | SHAWINIGAN BLACK | 600 | 648 |
| 106A | 10% Mn, 1% Ag | GRAPHITIZED VULCAN | 400 | 300 |
| 106B | 10% Mn, 1% Ag | GRAPHITIZED VULCAN | 600 | 260 |
| 105B | 10% Mn | GRAPHITIZED VULCAN | 400 | 225 |
| 105C | 10% Mn | GRAPHITIZED VULCAN | 600 | 195 |
| 108A | 10% Mn, 1% Ag | NORIT | 400 | 900 |
| 108B | 10% Mn, 1% Ag | NORIT | 600 | 600 |
| 106C | 10% Mn | NORIT | 400 | 200 |
| 114C | 10% Mn | PWA | 600 | 517 |
| 107B | 10% Mn, 1% Ag | PWA | 400 | 975 |
| 107C | 10% Mn, 1% Ag | PWA | 600 | 200 |
| 107A | 10% Mn | PWA | 400 | 700 |
| 115A | 10% Mn | PWA | 600 | 210 |
| 19A | 10% Mn | PWA | 400 | — |

50 mg/cm² XC-35. A nickel mesh current collector was used with a 7 N KOH electrolyte and air at atmospheric pressure and room temperature.

Figure 41:
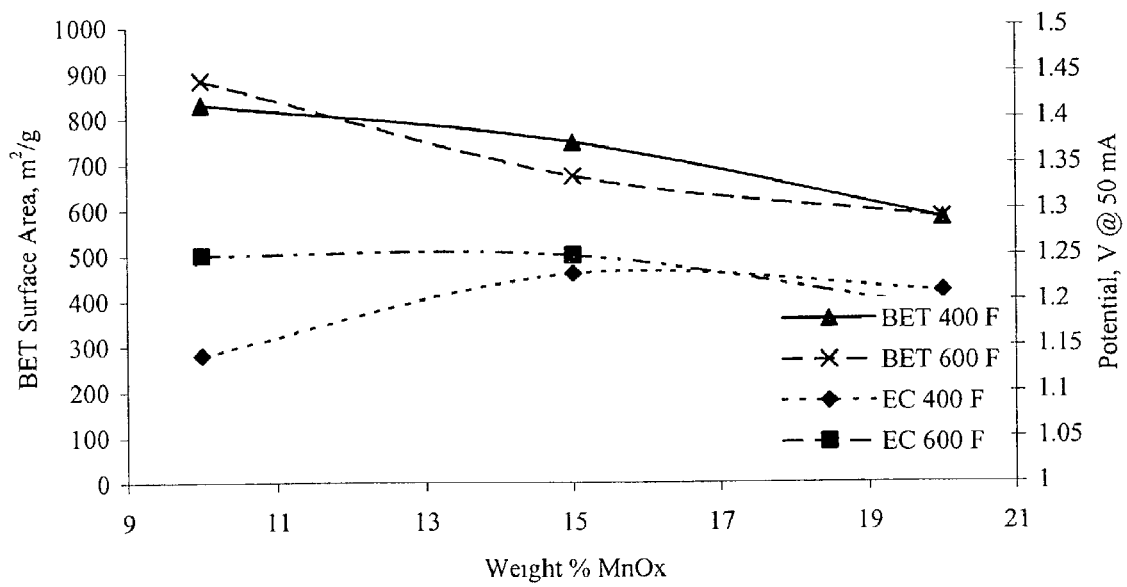
FIG. 41 illustrates the effect of $MnO_x$ loading an electrocatalyst particle.
Figure 42:
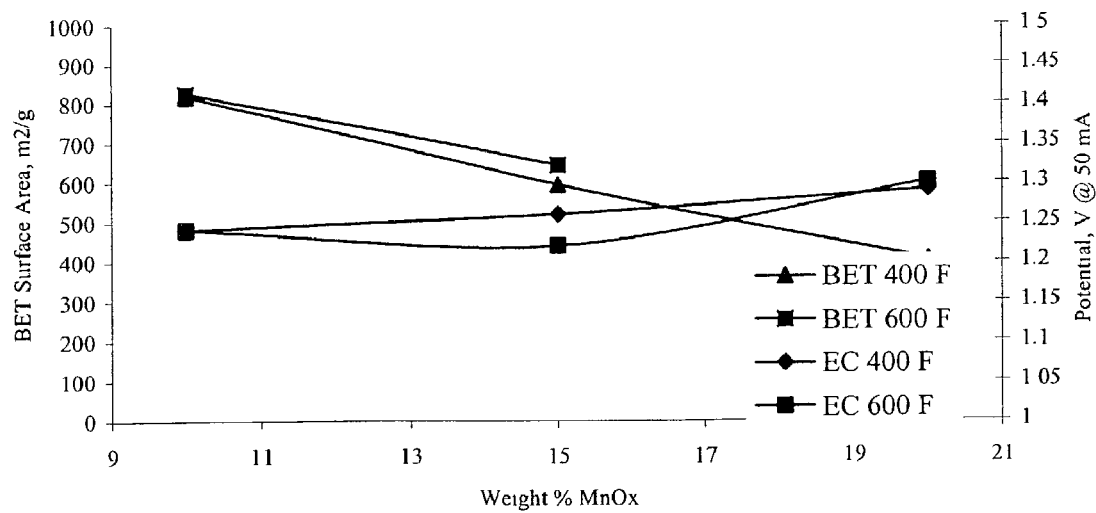
FIG. 42 illustrates the effect of $MnO_x$ loading an electrocatalyst particle.

FIGS. 41 and 42 illustrate that the electrochemical activity of these carbons is unchanged (within experimental error) as the BET surface area decreases. This can be attributed to the electrochemical reactions not taking advantage of the internal porosity because the internal porosity is either blocked by the larger agglomerates of $MnO_x$ or the internal porosity has not been accessed by the $MnO_x$ species to start with. Further, these parameters show little temperature dependence, if any. It is important to realize the catalyst surface area will influence diffusion limitations, but the specific surface area of active species should have a larger impact on catalytic performance.

Figure 43:
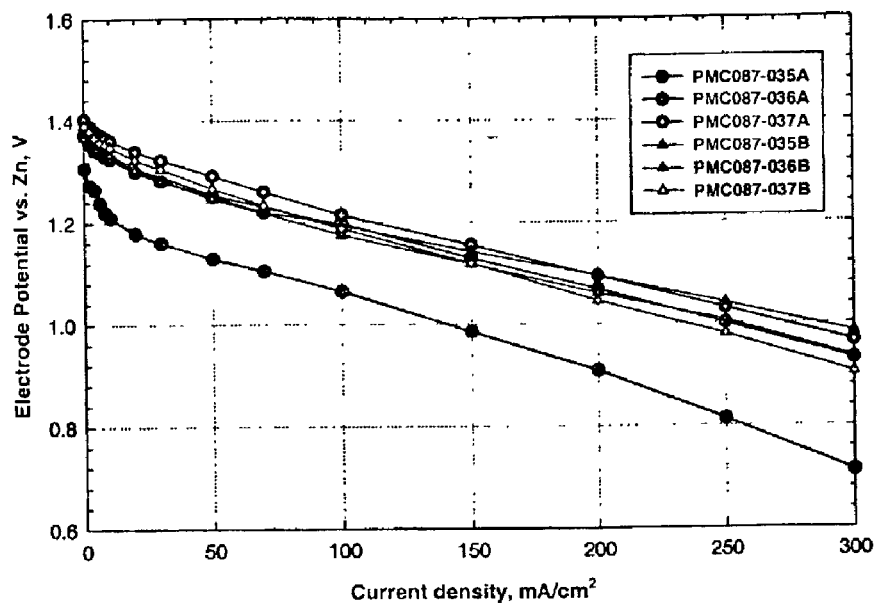
FIG. 43 illustrates the properties of a membrane electrode assembly according to the present invention.
Figure 44:
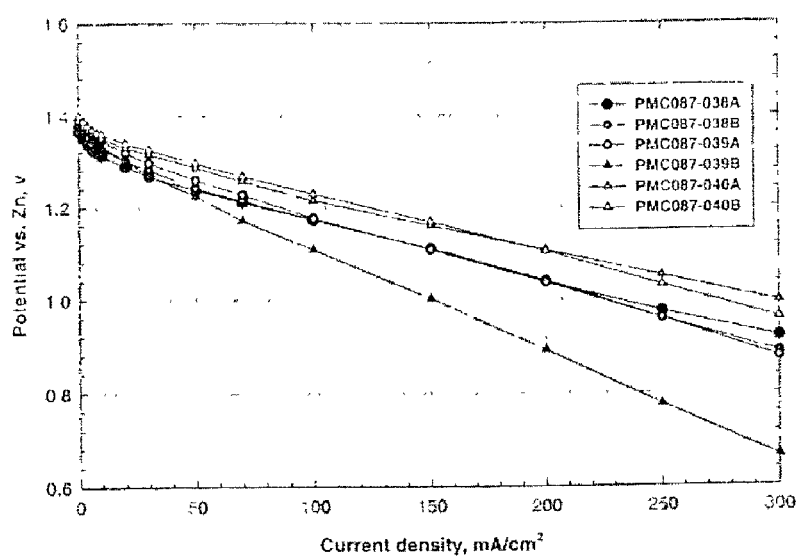
FIG. 44 illustrates the properties of a membrane electrode assembly according to the present invention.
Figure 45:
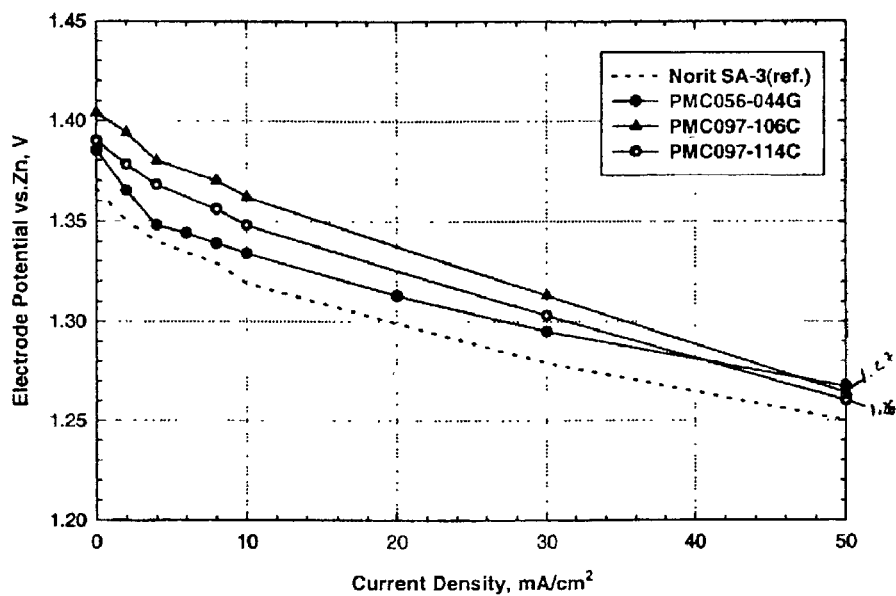
FIG. 45 illustrates the properties of a membrane electrode assembly according to the present invention.

The results of this electrochemical testing are plotted in FIG. 43 for electrocatalysts on KETJENBLACK carbon support, in FIG. 44 for electrocatalysts on BLACKPEARLS carbon support and in FIG. 45 for selected samples on SHAWINIGAN BLACK, NORIT and PWA carbon supports. The results show that, depending on the concentration of the active species and the type of support, otherwise identical spray drying conditions produce samples with different electrochemical activity. The best electrochemical performance from the series of samples on a KETJENBLACK support is sample 37A in the low current range and sample 35B in the high current range (FIG. 43). The best electrochemical performance from the series of samples on a BLACKPEARLS carbon support is sample 40B in the low current range and sample 40A in the high current range. The data illustrated in FIG. 45 demonstrate that electrocatalysts supported on NORIT carbon and PWA carbon have higher electrochemical activity compared to those supported on SHAWINIGAN BLACK, most likely due to the higher surface area of the former supports.

Figure 46:
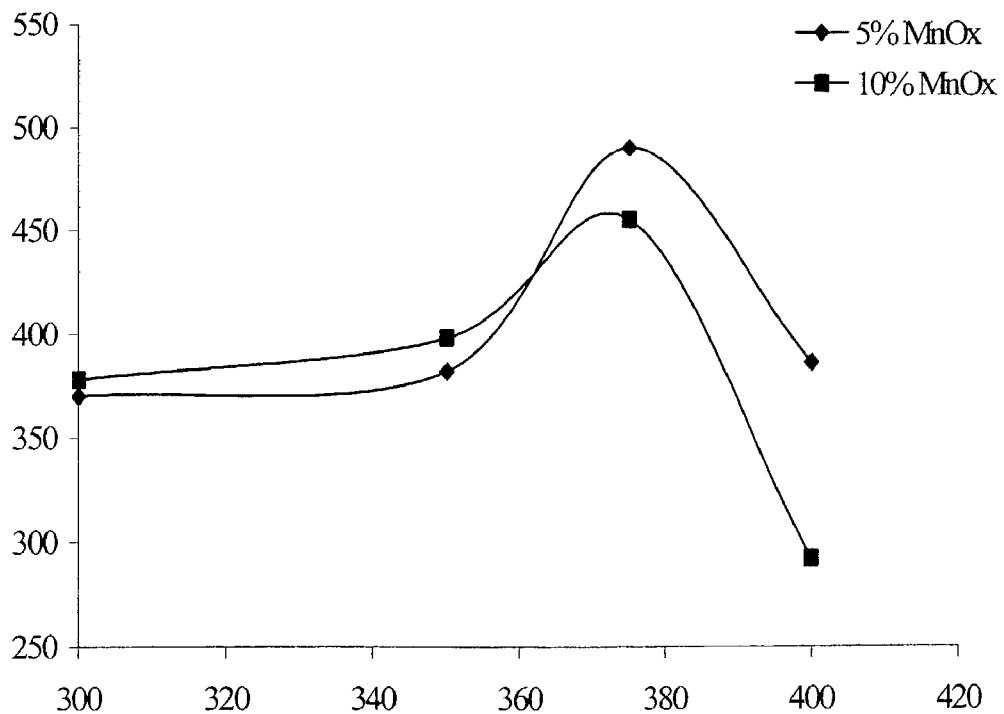
FIG. 46 illustrates the effect of a reactor temperature on surface area.

The focus of the experiments on the mixed flow spray dryer (Table 15) was on the preparation of $MnO_x$/C electrocatalysts on a PWA carbon support. The plot of the surface area of the $MnO_x$/PWA catalysts prepared on the mixed flow spray dryer in FIG. 46 show that beyond a critical temperature, the surface area reaches a maximum then drops off. Catalysts at both $MnO_x$ loading have similar surface areas until the maximum is reached at 375° F. Once the critical temperature of 375° F. is passed, both loadings experience a significant loss of surface area. The surface area loss for the 10 wt. % $MnO_x$ catalyst is greater, probably because the agglomeration of surface species is proportional to the concentration. The increased metal oxide on the surface becomes less dispersed and forms large agglomerates blocking internal porosity.

Many factors influence the electrochemical activity of the supported $MnO_x$ catalysts. The spray conversion conditions, surfactants, carbon support, and precursor concentration all have an impact on the electrocatalyst performance.

Figure 47:
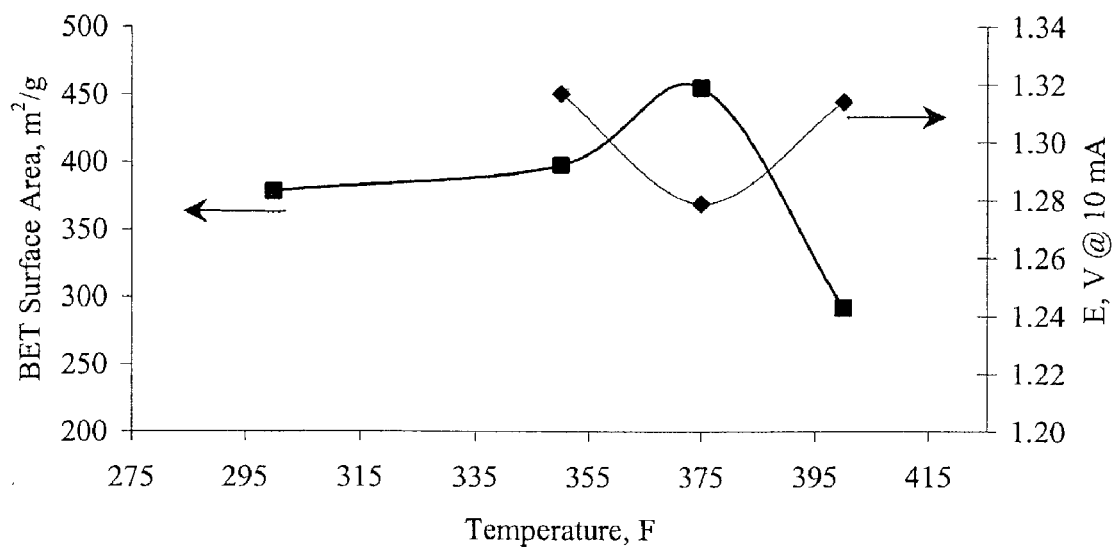
FIG. 47 illustrates the effect of a reactor temperature on surface area.

As seen with previous $MnO_x$ catalysts, there is no direct relationship between the surface area of the catalyst and electrochemical activity. As is illustrated in FIG. 47, the variation in potential at 10 mA is not significant. As the surface area decreases by 150 m²/g with increasing temperature, the potential at 10 mA sees a difference of only 30 mV. These results suggest that there are more contributing factors that need to be taken into consideration. It is also important to note that since there is no significant dependence of the electrochemical activity on the catalyst surface area, the catalyst with different surface area and different pore size distributions may offer different advantages in order to minimize diffusion limitations in a working device.

Figure 48:
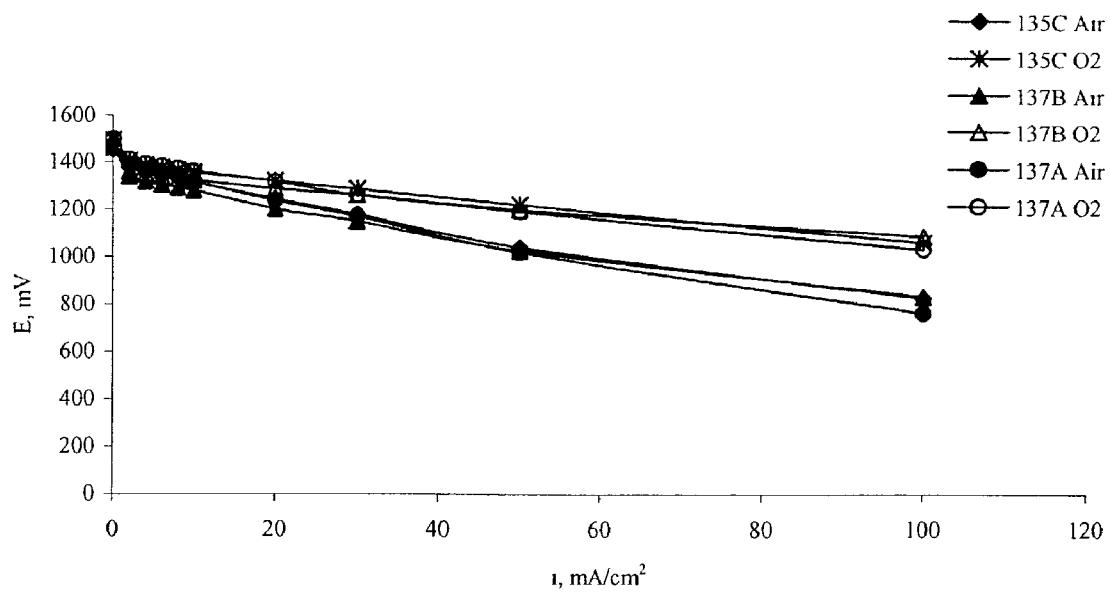
FIG. 48 illustrates the properties of a membrane electrode assembly according to the present invention.
Figure 49:
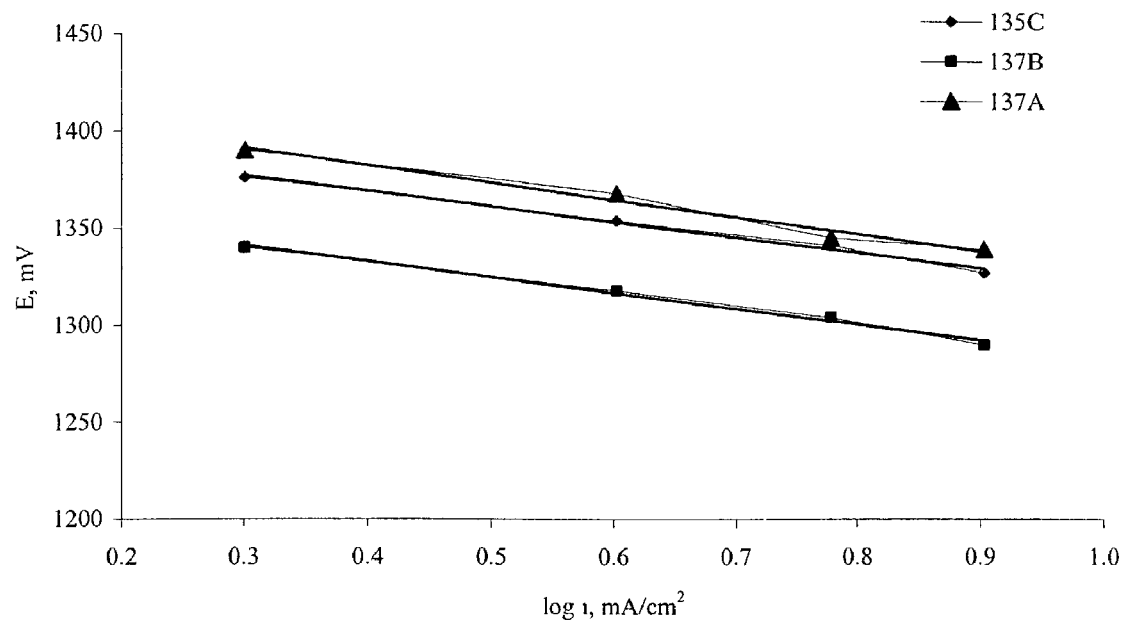
FIG. 49 illustrates the properties of a membrane electrode assembly according to the present invention.

The data shown in FIGS. 48 and 49 illustrate the subtle differences between the electrochemical performance of the samples. The comparison of the performance under air vs. pure oxygen provides information concerning the characteristics of diffusion and transport of gaseous and ionic species in the electrode. The smaller the difference between the oxygen and air plots compared to an external standard material, the better the diffusional and transport performance of the layer at a given loading of material. Therefore there is a strong interplay between the layer thickness and the loading of the metal oxide species on the surface of the carbon support. A large number of active sites is important to obtain the maximum kinetic performance (as illustrated by the Tafel plots in FIG. 49). However, given an electrocatalyst powder with an optimum number of active sites per unit mass of electrocatalyst, adding more electrocatalyst to increase the total number of active sites (which will increase the layer thickness) can be detrimental to the performance of the layer under conditions where the performance is limited by ohmic, ionic and/or gaseous transport at higher current densities.

Figure 50:
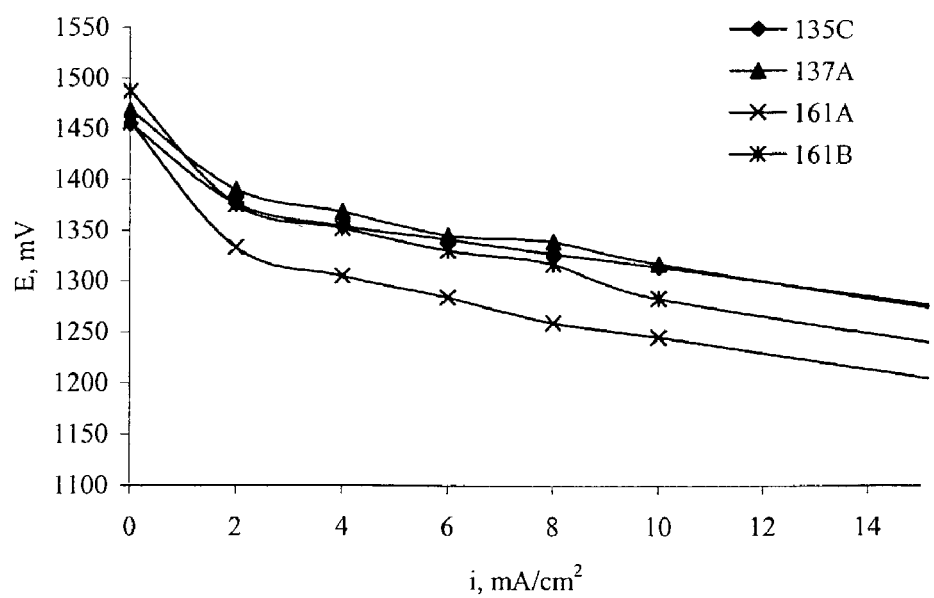
FIG. 50 illustrates the properties of a membrane electrode assembly according to the present invention.
Figure 51:
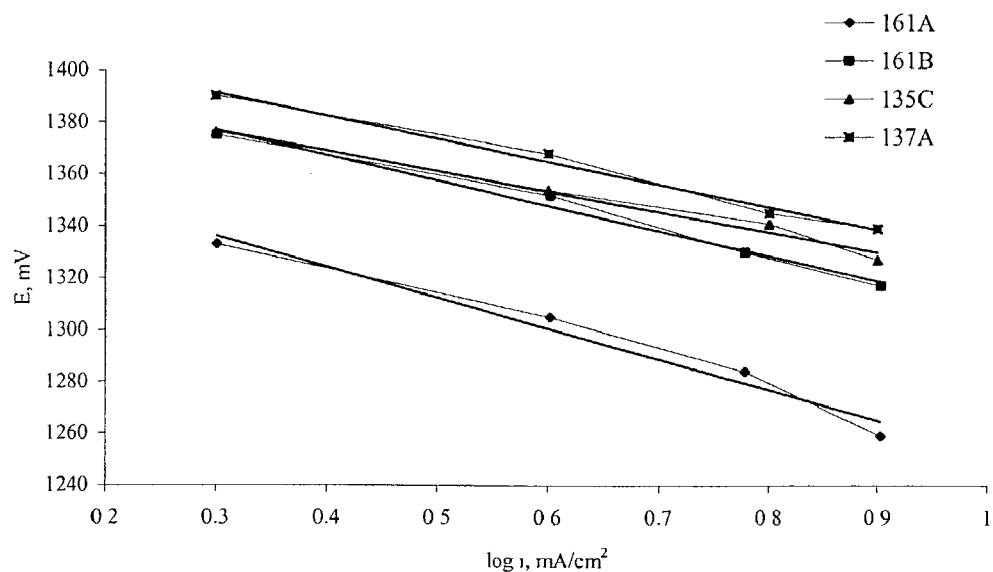
FIG. 51 illustrates the properties of a membrane electrode assembly according to the present invention.

Based on these data, catalyst samples 135C and 137A were chosen to be scaled-up to 4 kg pilot-scale batches for preliminary testing in Zinc-air hearing aid batteries. FIG. 50 and FIG. 51 compare the electrochemical activity of the pilot-scale batches to the initial sample runs. The electrochemical activity of sample 161A (scale-up for sample 135C.) was not reproduced as well as sample 161B (scale up for sample 137A). The surface areas for these two catalysts may be responsible. As seen on several accounts, the surface area is not directly related to electrochemical activity, but may be an indication of an underlying problem. The surface area of catalyst sample 161A is a factor of two smaller than the experimental batch, a much larger difference than previously experienced. The particle size distributions of the pilot-scale batches show the particles are almost twice the size of samples 135C and 137A. Further investigation revealed the airflow of the two fluid nozzle was reduced by approximately 10%. This is the most probable explanation, as the greater shearing force from a higher velocity gas in the two-fluid nozzle results in the generation of smaller droplets.

In the case of a gas diffusion electrode for a metal-air battery or fuel cell, the active layer is responsible for the catalytic reaction of the gases, which in turn determines the performance of the power device. The active layer is in close proximity to the hydrophobic layer. The hydrophobic layer helps the transport of the gases to the catalytic sites and at the same time prevents the electrolyte from "weeping" out of the device while preventing external humidity from creating an imbalance in the power device. The hydrophobicity can be controlled in the power device structure with a single hydrophobic layer or by a gradient of hydrophobic layers. The active layer in most cases consists of a mixture of the catalyst and a hydrophobic component such as TEFLON or TEFLON treated carbon blacks. The hydrophobic layer can be replaced with a component that helps to transport the species required in the catalytic reactions. For example, in a PEM fuel cell the active layer can be the catalyst along with NAFION. The active layer acts as a transition between the hydrophobic layer and the electrolyte. The most important issues involved in depositing the active layer are to retain the activity of the catalyst in the active layer, have an optimum composition of hydrophobic/transport assisting and catalytic components and prepare a formulation that is in the right media/form to be deposited. The thickness of this layer, access of gases to catalytic sites, controlled hydrophobicity will dictate the performance of the power device.

The deposition technique for the active layer depends on the structure and morphology of the catalyst particles and the hydrophobic component. For particle sizes smaller than about 25 micrometers in size, syringe dispensing is more appropriate while for particles greater than about 25 micrometers in size, techniques such as screen printing, or coating with wire-cators may be more appropriate. The deposition method further governs the composition of the formulations. For example, isoproponal is not suitable for syringe dispensing due to its low viscosity and high vapor pressure.

An example of a formulation for syringe dispensing was made as follows. A metal oxide catalyst was mixed with TEFLON powder in a 5:1 weight ratio and then dispersed in alpha-terpineol. The active layer was composed of 20 to 40 weight percent solids. Similarly, a formulation was made for screen printing comprised of a metal oxide supported on carbon and mixed with TEFLON treated blacks dispersed in iso-proponal. The solid loading of this formulation was varied from 10 to 40 weight percent.

The thickness of a layer can be controlled by the solids loading of the active material in the ink formulation and the writing speed during deposition. The gradient in layer composition can be controlled by the composition of the ink, the writing speed and the number of sub-layers deposited.

While the kinetics of the electrode are controlled by the utilization, dispersion and composition of the catalyst, the ohmic and transport limitations of the electrodes of a power device arise mainly due to the thickness of the layers, the composition of the layers and the porosity of the layers. The thickness of the layers can be controlled by changing weight loadings of the powders in the layer and by changing the deposition method. The deposition method and the composition of the layer will in turn determine the porosity of the layer and the accessibility of the catalytic layers. The printing of these materials also provides the advantage of printing active layer loadings from as small as 2 mg/cm$^2$ of active layer to as high as 20 mg/cm$^2$. This range of active layer loadings will have a dramatic effect in the different regimes of performance.

The energy densities that are obtained by the power device depend on the volume of the different layers in the power device and hence the thickness of the various layers. The thinner the layers, the higher the volumetric densities that are obtained from the power device. Some examples of thin layers printed for a metal-air battery are given below.

The formulation of an ink containing electrocatalyst powders and other hydrophobic powders to control transport processes was produced and deposited with the goal of producing a thin layer of this material on the surface of a printed silver current collector. The underlying current collector was observed around the edges of the deposited active layer. The edge view revealed the characteristic morphology of the particles and the thickness of the layer was about one particle thick.

As a result of this ability to rapidly determine the optimum structure-performance relationship, a complete gas electrode can be constructed according to the present invention. This gas diffusion electrode is comprised of a porous gas diffusion layer on which has been printed a silver current collector. The current collector has dimensions of 40 micron lines, 15 microns in height with 300 micron spacing. The active layer deposited onto the current collector/gas diffusion layer is comprised of materials that catalyze the chemical conversion of the gas and materials to control the hydrophobicity of this layer. This layer is about 30 microns thick.

Figure 52:
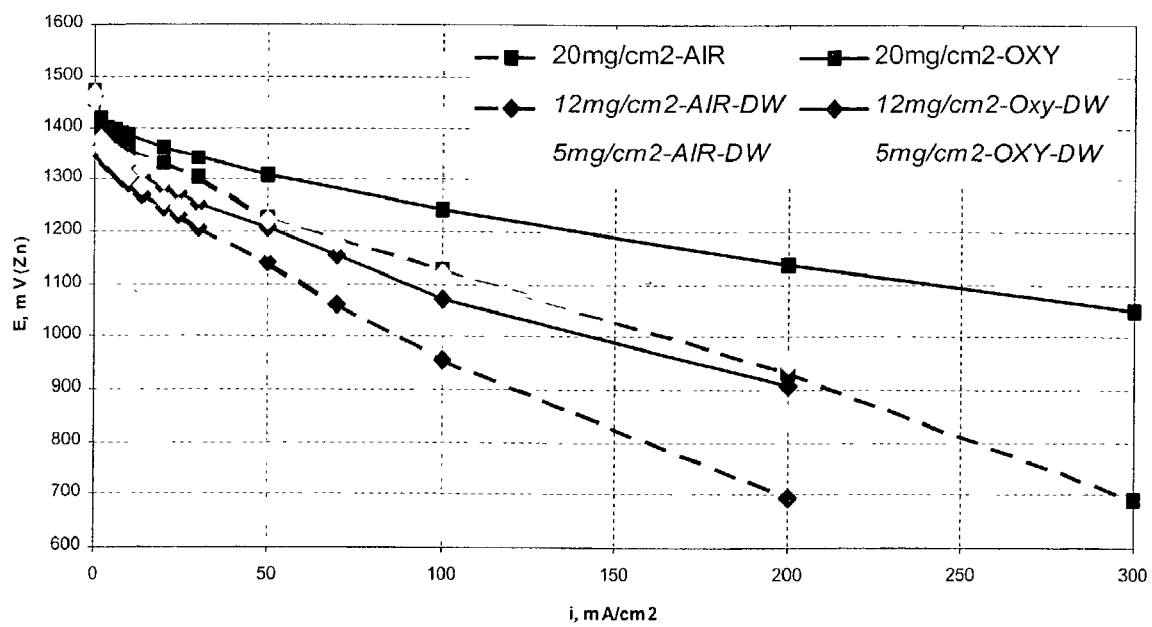
FIG. 52 illustrates the properties of a membrane electrode assembly according to the present invention.

The electrochemical performance attributes of direct write layers can be quantified in terms of the polarization curves. For the case of an air electrode under alkaline conditions, the polarization curves for a variety of different layers using the same materials are shown in FIG. 52. The solid lines are the polarization data measured in oxygen, while the dotted lines are the polarization data measured in air. The structure represented by the active layer loading of 20 mg/cm$^2$ was deposited by conventional methods using a technique that could not deposit a lower mass loading (thinner) layer. The other active layers were deposited using direct write syringe dispensing with a series of different mass loadings. The different direct write mass loadings of 5 and 12 mg/cm$^2$ in air have similar performance to each other and lower performance than the 20 mg/cm$^2$ layer deposited conventionally. This might be expected based on the lower mass of active material present. However, in air, the 5 mg/cm$^2$ direct-write layer has only slightly lower performance in air compared to a conventionally deposited layer with 4 times more material because the layer structure has improved transport and catalyst utilization characteristics. Thus, in air—the practically useful gas—the performance of these two layers is comparable. The difference between the electrochemical performance in oxygen vs. air (effectively an oxygen concentration dependence measurement) reveals information on the diffusion characteristics of the layer.

As these examples illustrate, the electrochemical activity data for the series of MnO$_x$/C catalysts shows that depending on the type of spray dryer employed, the specific catalysts loading and carbon support used for the electrocatalyst preparation, different conditions are necessary to achieve the optimal electrocatalyst performance. This is due to the different temperature-time history the electrocatalyst particles experience and therefore the different dispersion and type of active species formed during processing. The results from the scale up experiment for MnO$_x$/PWA samples imply that careful control over the spray processing parameters is necessary to ensure repeatability of the electrochemical performance since differences in the conditions cause changes in the active surface species formed. This is especially true when a higher conversion temperature is employed.

2. NiCoO$_x$ Bifunctional Electrocatalysts

Bifunctional catalysts for oxygen reduction/evolution are complex electrochemical catalyst systems. These electrocatalysts must possess at least two different types of catalytic active centers, based on the fact that oxygen evolution and oxygen electro-reduction are both irreversible reactions. Among several possible chemistries, the mixed oxide system NiO:CoO (1:2) was selected for evaluation. This is one of the least sophisticated bifunctional electrocatalyst, yet demonstrates exceptional activity and sufficient cycle life.

The cycle life of a bifunctional catalyst will be limited by the destruction of the carbon support during oxygen evolution (cell charging), the so called "electrochemical burning" of carbon. Graphitic carbons are more resistant to the electrochemical oxidation during oxygen evolution than amorphous carbons. NiO:CoO composite electrocatalysts are typically obtained by a conventional precipitation on activated carbon. A catalyst made by this method was used for comparison to the present invention.

Examples to illustrate the present invention relating to self-supported bifunctional catalysts were prepared. The performance of these catalysts was evaluated in terms of their catalytic activity and cycling of the electrodes. The traditional method of preparing the gas diffusion electrodes is by binding the catalyst layer with acetylene black. In the following examples, the electrodes were prepared without any carbon. The carbon was replaced as a binder with a TEFLON powder.

The following example catalysts were prepared by using an ultrasonic aerosol generator. The precursor solutions used to produce the catalysts were $Ni(NO_3)_2.6H_2O$ (nickel nitrate) and $Co(NO_3)_2.6H_2O$ (cobalt nitrate) such that the NiO:CoO ratio is 1:2.

The catalysts on a carbon support were prepared using the nickel and cobalt precursors with a GRAFO 1300 dispersion. To prepare 10 to 20 wt. % NiO—CoO on carbon, solutions of GRAFO 1300 were diluted with water and mixed with nickel and cobalt oxide precursors such that the solutions were 5 wt. % in solids. These precursor solutions were processed at 300° C. or 400° C. to form supported catalyst particles.

were prepared from the catalyst samples using a conventional dry-powder press technology. The electrode consisted of a gas diffusion layer and the active layer. The gas diffusion layer consisted of 50 mg/cm² of TEFLON treated black pressed at 300 kg/cm² and 300° C. in a die slot of 10 cm². The active layer consisted of a 10 mg/cm² mixture of bifunctional electrocatalyst and TEFLON treated carbon in a 3:1 ratio. The gas diffusion layer and the active layer were pressed on the Ni mesh at 300 kg/cm² at elevated temperatures. The electrochemical measurement involved initial polarization behavior of the bifunctional electrodes. The tests were conducted at room temperature in 31 wt. % aqueous KOH solution. A zinc wire placed close to the working surface of the air electrode was used as the Zn/ZnO reference electrode.

Table 16 summarizes the catalysts produced using the spray pyrolysis technique. Table 16 lists the different catalyst samples with their surface areas, particle size ($d_{90}$) and the peaks matched by the XRD technique.

TABLE 16

Summary of the NiO-CoO Catalysts

| Sample | Composition | Temp (° C.)/ Flow (lpm) | Surface Area (m²/g) | XRD peaks | PSD $d_{90}$ (μm) |
|---|---|---|---|---|---|
| 056064A | 10% $NiCoO_x$/Carbon | 300/5 | 27.0 | $NiCo_2O_4$ | 2 |
| 087064B | 20% $NiCoO_x$/Carbon | 300/5 | 42.0 | $NiCo_2O_4$ | 2 |
| 056066B | $NiCoO_x$ | 400/5 | 3.0 | $NiCo_2O_4$ | 11.4 |
| 056067A | 20% $NiCoO_x$/Carbon | 300/5 | 31.0 | $NiCo_2O_4$ | 3.0 |
| 056067B | 20% $NiCoO_x$/Carbon | 400/5 | 36.0 | $NiCo_2O_4$ | 2.7 |
| 105006A | $NiCoO_x$ | 400/5 | 4.9 | $NiCo_2O_4$ | 11.6 |
| 105006B | $NiCoO_x$ | 500/5 | 9.7 | $NiCo_2O_4$ | 7.5 |
| 105006C | $NiCoO_x$ | 600/5 | 10.7 | $NiCo_2O_4$, NiO | 4.0 |
| 109022A | $NiCoO_x$ | 500/5 | 24.2 | $NiCo_2O_4$ | — |
| 109022B | $NiCoO_x$ | 600/5 | 11.5 | $NiCo_2O_4$ | — |
| 109028A | $NiCoO_x$ | 600/45 | 29.3 | $NiCo_2O_4$ | 4.8 |
| 109035A | 1% $Ag/NiCoO_x$ | 800/45 | 7.0 | $NiCo_2O_4$, Ag, $CoNiO_2$ | 5.2 |
| 109031A | 10% $Ag/NiCoO_x$ | 800/45 | 6.5 | $NiCo_2O_4$, Ag, $CoNiO_2$ | 4.7 |
| 109032A | 50% $Ag/NiCoO_x$ | 800/45 | 2.9 | $NiCo_2O_4$, Ag, $CoNiO_2$ | 5.5 |
| 109033A | 80% $Ag/NiCoO_x$ | 800/45 | 2.4 | $NiCo_2O_4$, Ag | 3.4 |
| 056107A | NiCoOx | 600/45 | 28.8 | $NiCo_2O_4$ | 5.4 |
| 056108A | $NiCoO_x$ | 675/45 | 17.8 | $NiCo_2O_4$ | 5.3 |
| 056109A | $NiCoO_x$ | 750/45 | 11.9 | $NiCo_2O_4$ | 5.5 |
| 056110A | $NiCoO_x$ | 600/20 | 23.6 | $NiCo_2O_4$, NiO | 4.9 |

The self-supported catalysts used the same nickel and cobalt precursors diluted with de-ionized water. These solutions were then ultrasonically generated using transducers and processed at temperatures ranging from 400° C. to 600° C.

A silver phase (Ag) was introduced into some of the catalyst particles to improve the conductivity of the catalyst. Silver is also known to act as a promoter in catalyst formulations. The silver content in the catalyst formulations varied from 1 to 80% by weight.

Figure 53:
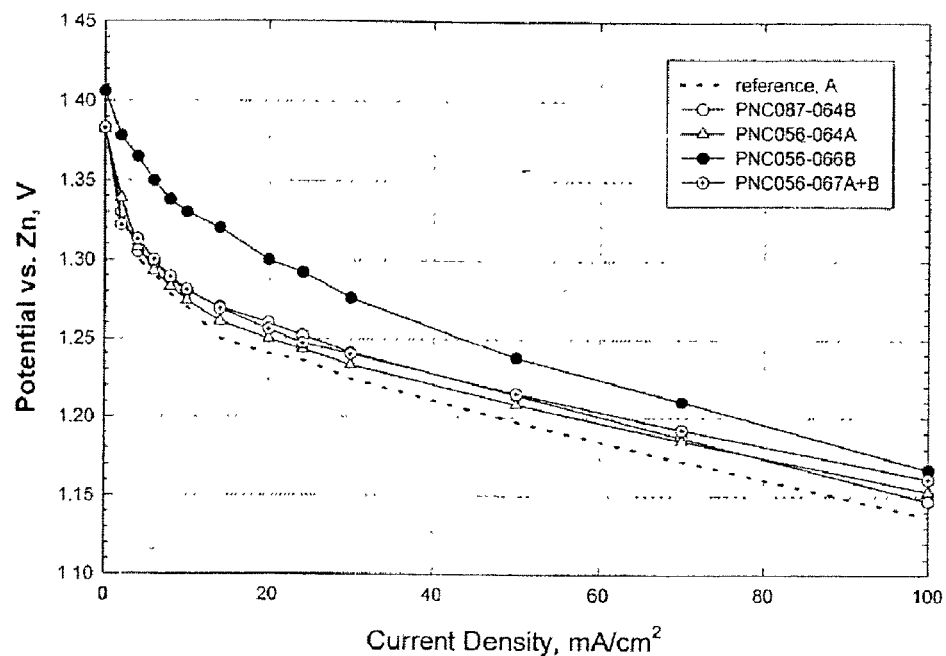
FIG. 53 illustrates the properties of a membrane electrode assembly according to the present invention.
Figure 54:
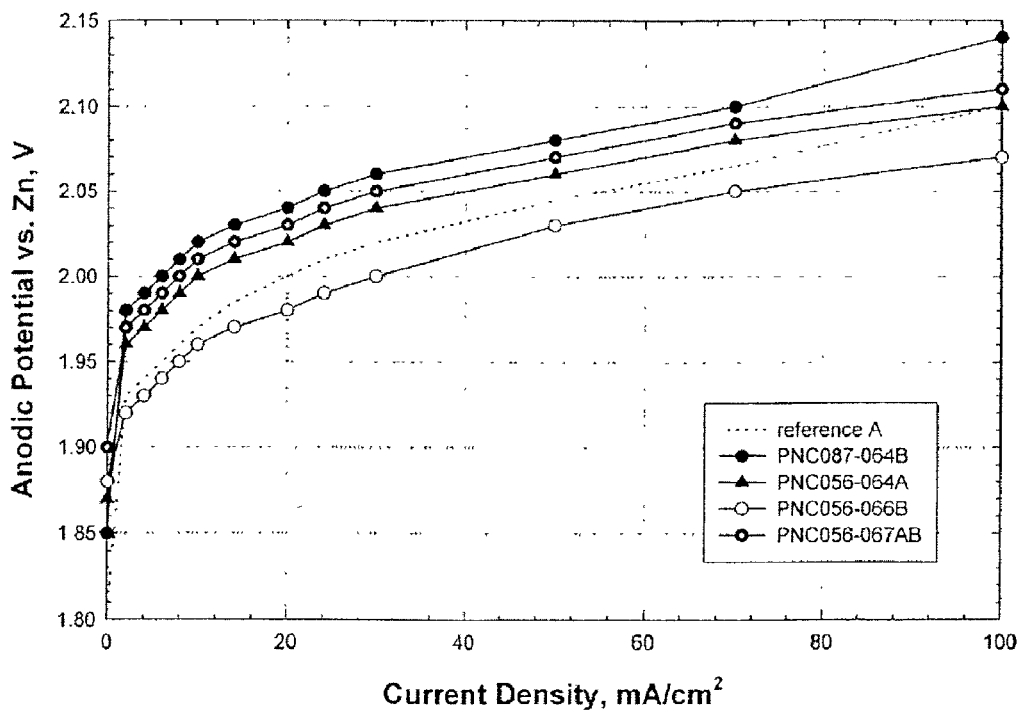
FIG. 54 illustrates the properties of a membrane electrode assembly according to the present invention.

Electrochemical evaluation of the NiO:CoO bifunctional electrocatalysts included initial polarization curves in alkaline electrolyte for screening and incorporation into a functioning laboratory test cell with a MH anode to actually implement a MH-air system and to test cycle life. Electrodes Samples 056064A, 087064B, 056067A and 056067B were all catalysts supported on carbon. Sample 056066A was a self-supported catalyst prepared on the same unit. Electrodes were prepared with the self-supported bifunctional catalyst, electrocatalysts supported on carbon black and a standard catalyst made by a traditional precipitation procedure. FIG. 53 shows the polarization curves of the electrodes tested. A dashed line shows the polarization curve of the electrode made with the traditional prior art catalyst. It can be seen that the self-supported electrocatalyst prepared according to the present invention demonstrates the most advantageous performance in oxygen reduction. The superiority of the same electrocatalyst is even more pronounced in the reaction of oxygen evolution, as illustrated in FIG. 54. In this case, the NiO:CoO electrocatalyst of the present invention allows evolution of the molecular oxygen at the lowest anodic potential.

Figure 55:
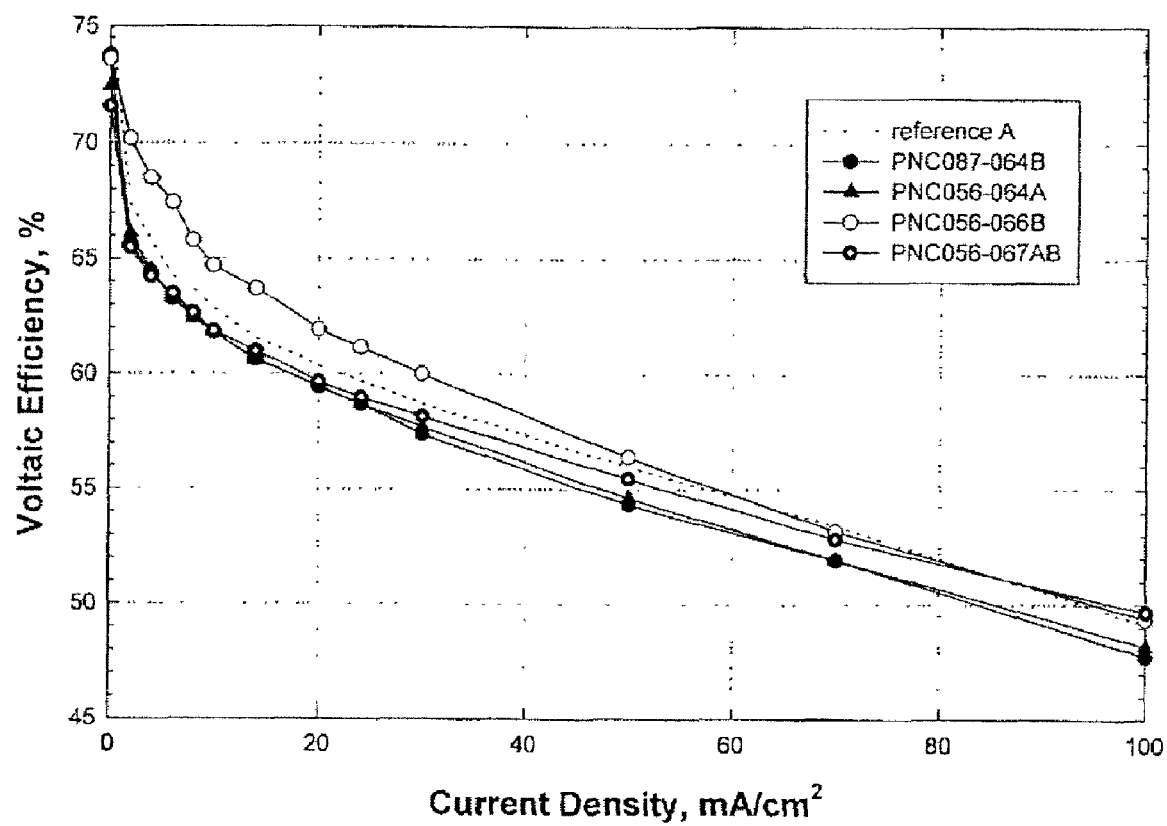
FIG. 55 illustrates the properties of a membrane electrode assembly according to the present invention.

Re-calculation of the results, in terms of ratios of the cathodic/anodic voltages at a given current density (expressed as a percentage) is shown in FIG. 55. FIG. 55 presents the voltaic efficiency of the oxygen bifunctional electrodes which is directly associated with energy losses during the charge/discharge cycles of a cell.

Due to the superior performance of the NiO:CoO electrocatalyst of the present invention in both reactions, oxygen reduction and oxygen evolution, voltaic efficiency of the electrode made with this catalyst is the highest: between 65% and 62% within the expected range of operating current densities of 10 to 20 mA/cm$^2$. This is very promising, as voltaic efficiencies above 55% are considered practical, and in commercial battery systems they usually do not exceed 60%.

Based on this screening of half-cell polarization results, further experiments with the dispersed unsupported bifunctional electrocatalyst in a laboratory MH-air cell were carried out.

Samples 105006A through 105006C were made on a lab-scale unit at increasing temperatures. The surface area of the catalysts increased by increasing the spray drying temperature of the catalysts. XRD spectra of these catalyst samples indicated the presence of a different phase, namely the NiO phase in the catalyst 105006C made at 600° C.

Figure 56:
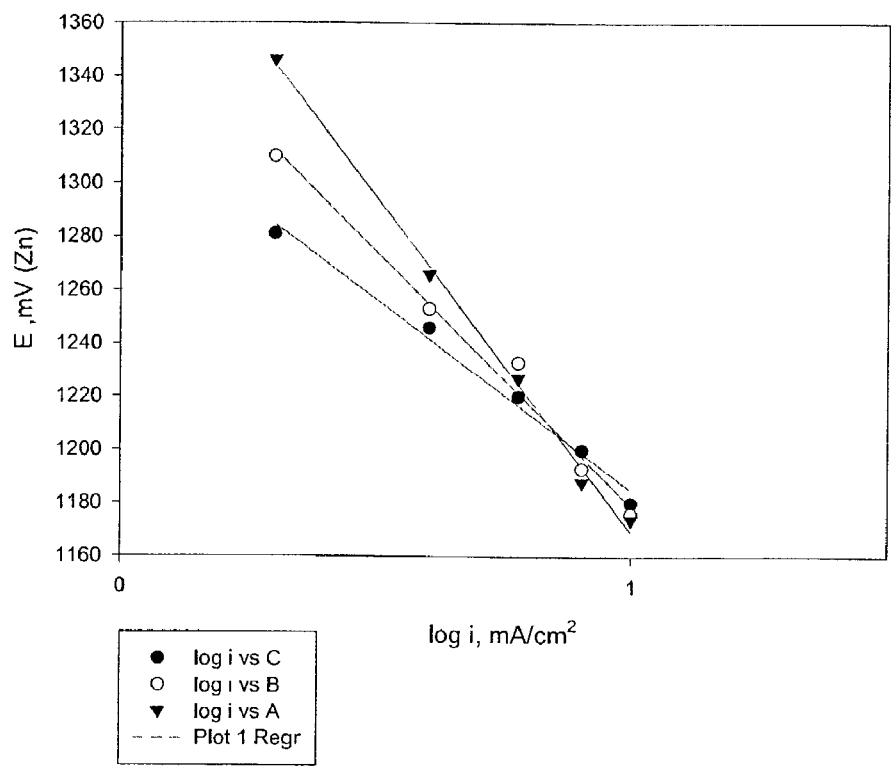
FIG. 56 illustrates the properties of a membrane electrode assembly according to the present invention.

Electrodes were made from the catalysts as described above and polarization curves measured. The Tafel plot was plotted for the three catalysts. The Tafel plot is a graph of the Delta E in mV vs. the log of the current density in mA/cm$^2$. Delta E is the difference in the potential of the electrode as measured in air and in oxygen. As can be seen from the Tafel plot in FIG. 56, the slope of the plot for sample 105006C is the least compared to the other two catalyst slopes which indicates that this is a better catalyst. It is not clear, however, if the lower slope of the catalyst 105006C is due to the higher surface area or due to the presence of the new phase NiO.

The better performance of 105006B compared to 105006A can be explained by the higher surface area of the 105006B catalyst.

As discussed above, some Ag was incorporated in the catalysts 109033A to 109035A. The Ag content was varied from 1 wt. % to 80 wt. % and the precursor solutions were spray dried at 800° C. The SEM pictures of these different catalysts with Ag did not show any differences in the structure of these catalysts. The BET surface area of the catalyst particles, however, did drop drastically from 29 m$^2$/g for no Ag (109028A) to about 2m$^2$/g for 80 wt. % Ag (109033A). XPS evaluation showed the ratio of the Ni:Co in the catalyst 109028A as 35:65. The ratio of Ni:Co:Ag in catalyst 109031 A and 109032A was detected to be 35:61:4 and 45:52:3 respectively by XPS.

Figure 57:
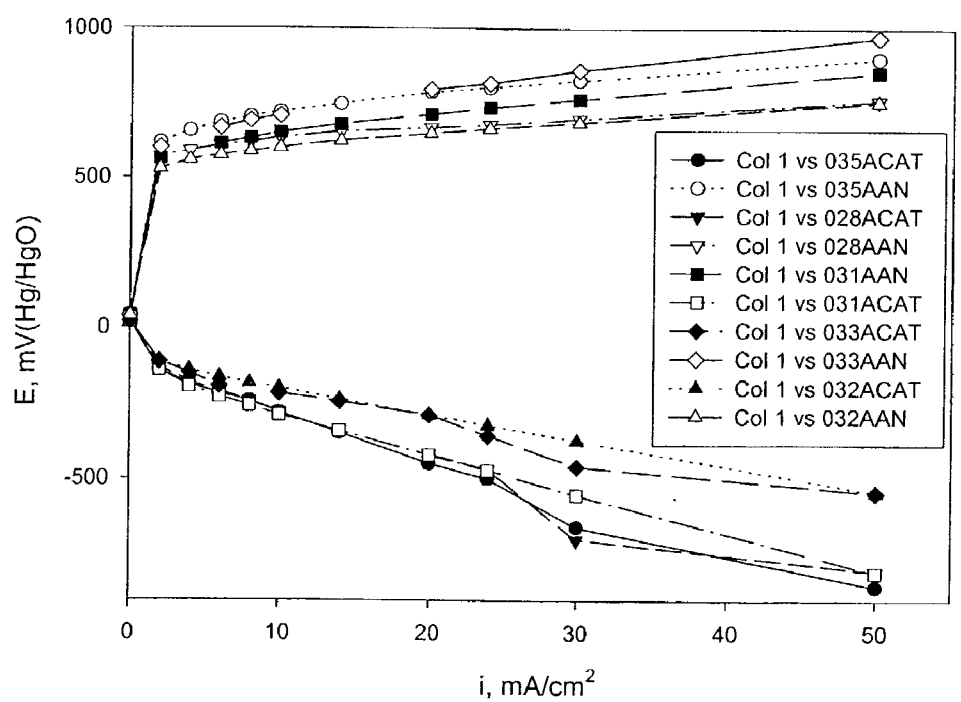
FIG. 57 illustrates a polarization curve illustrates the properties of a membrane electrode assembly according to the present invention.

The polarization curve of these Ag doped catalysts is shown in FIG. 57. Catalyst 109032A performs the best electrochemically, but all the polarization curves for the catalysts seem to be close together and it is difficult to say conclusively if the Ag phase makes any difference in performance of the bifunctional catalysts. However the electrodes for these Ag doped catalysts were prepared using the same amounts of catalyst. Thus, there may be insufficient active sites for the oxygen reduction and evolution.

Figure 58:
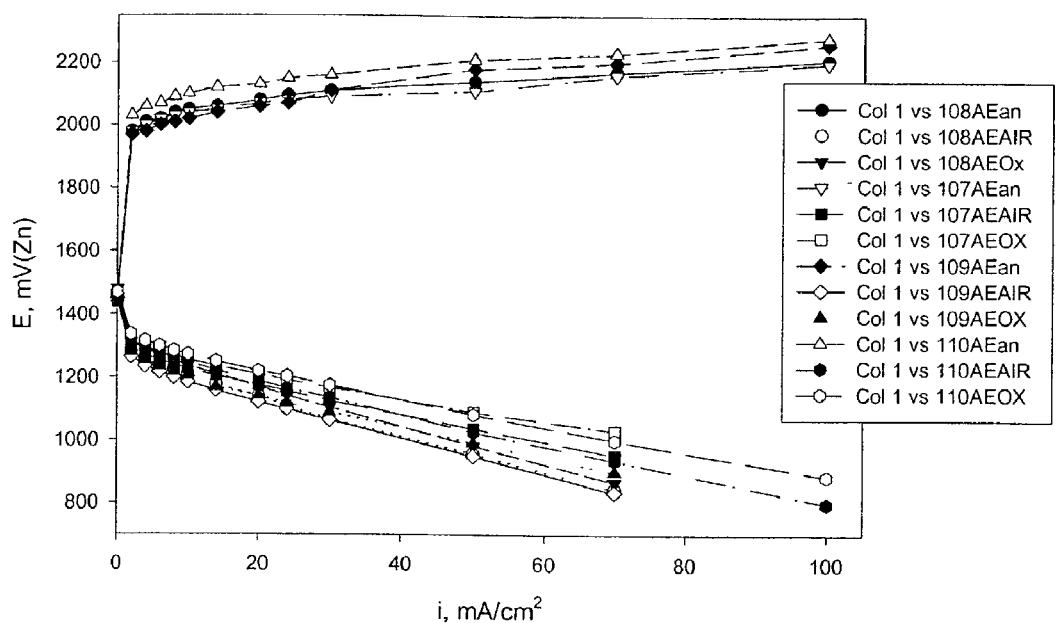
FIG. 58 illustrates the properties of a membrane electrode assembly according to the present invention.

Catalyst samples 056107A, 056108A and 056109A were produced on a larger production unit at varying temperatures, keeping the composition of the precursor solution constant and the flow rate of the carrier gas (air) constant. With increasing run temperature from 056107A to 056109A, the surface area of the particles as measured by the nitrogen adsorption method decreases. The electrochemical performance also decreases in the direction of decreasing surface area as shown in FIG. 58. Higher surface area implies a higher exposure of catalytic sites and hence better performance of the catalyst.

Figure 59:
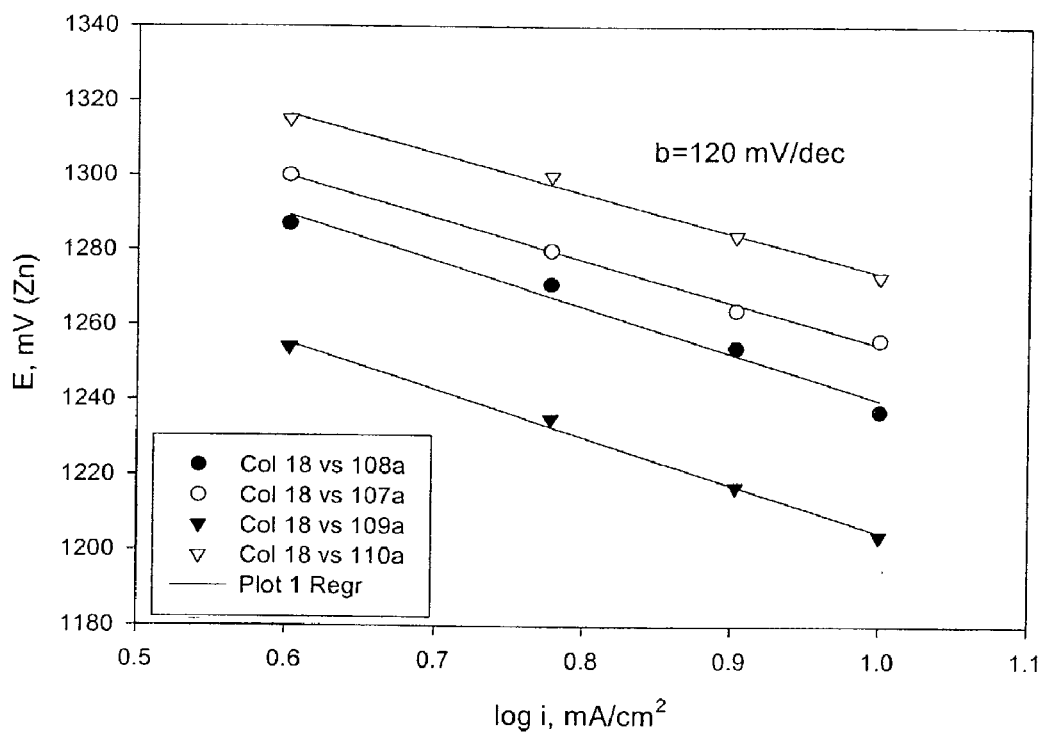
FIG. 59 illustrates the properties of a membrane electrode assembly according to the present invention.

From the Tafel plot of the electrodes shown in FIG. 59, catalyst 056110A shows the best electrochemical performance. Catalyst sample 056110A was produced at the same temperature as 056107A, but at 25 μm lower carrier gas flow. The surface area of catalyst 056110A was close to that of 056107A, however the performance of this catalyst is better. Since the flow rate of the run to make 056110A was half that of 056107A, the catalyst particles made at the lower flow rate experienced higher residence times. The longer residence times may result in the catalyst being more crystalline or having a different crystalline phase as compared to 056107A.

To investigate this issue, the XRD plots of these two catalysts were compared to determine if there was a difference in crystallinity. From the XRD spectra of the catalyst 056110A, the nickel oxide (NiO) phase was present. The NiO phase does not exist in the XRD spectra of catalyst 056107A. 105006C was the best catalyst due to the presence of the nickel oxide crystalline phase. Thus, catalyst 56110A was selected as the best self-supported bifunctional catalyst for all further electrochemical testing.

As is discussed above, one of the main issues limiting the cycling of the gas electrodes is the burning of the carbon components. Self-supported catalyst with good catalytic performance is the first step towards removing carbon from the electrodes. The traditional method of preparing the gas diffusion electrodes is by binding the catalyst layer with acetylene black. An experiment was performed to see how that affects the performance of the half-cell. In the first case the binding of the active phase was achieved by adding TEFLON treated (35 wt. %) acetylene black, indicated by AB35T. In the second electrode the binding of the active layer was performed by mixing in pure TEFLON powder, indicated as PTFE. In both cases the same electrocatalyst was used namely sample 056110A with the only difference being that the second electrode was carbon free.

Figure 60:
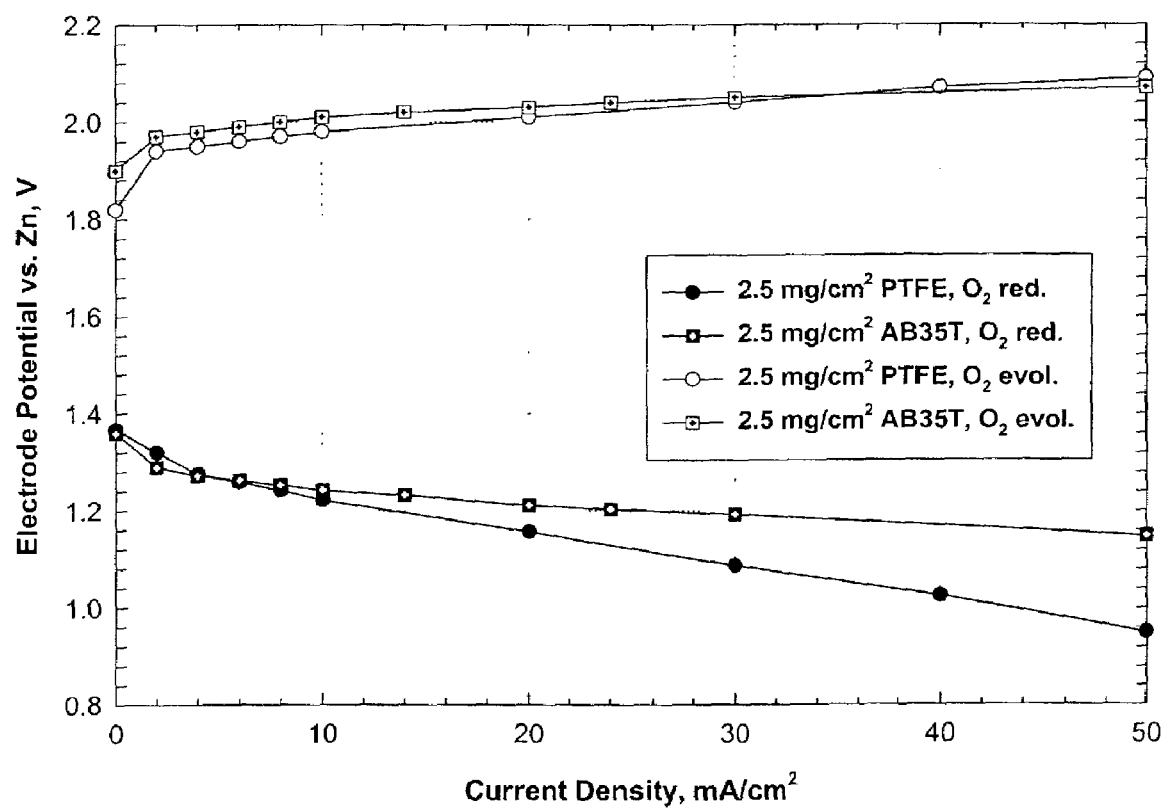
FIG. 60 illustrates the properties of a membrane electrode assembly according to the present invention.
Figure 61:
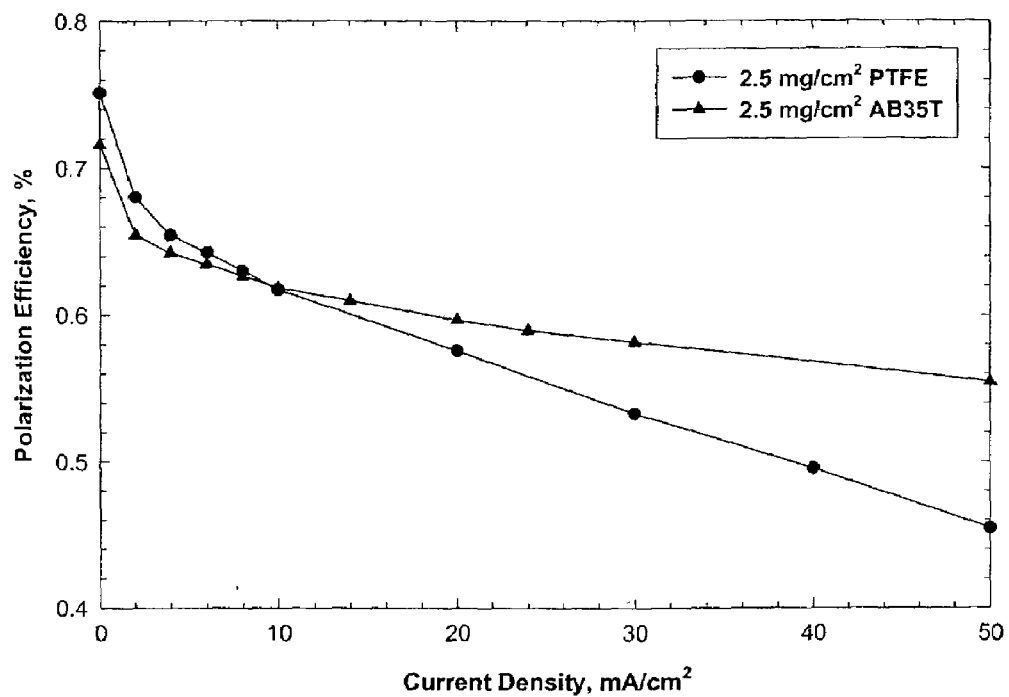
FIG. 61 illustrates the properties of a membrane electrode assembly according to the present invention.

FIG. 60 is the polarization curve for oxygen reduction and evolution of the two electrodes. As can be seen in FIG. 60 there are significant gas transport limitations in the oxygen reduction region at current densities higher than 20 mA/cm$^2$ for PTFE as a binder in the active layer. The oxygen evolution is not significantly affected by the variation in the binder. The voltaic efficiency derived from the previous polarization data confirms that the gas diffusion limitations for the PTFE electrode lead to lower efficiencies compared to the AB35T electrode illustrated in FIG. 60.

Regardless of the diffusion insufficiencies of the PTFE type oxygen electrodes, they were selected for cycling life tests. Cycling of the electrode in a half-cell with 10 mA/cm$^2$ charge/discharge current indicated that after 30–35 cycles the system deteriorates. This process can be reversed after replacement of the electrolyte. Dark brown coloring of the spent electrolyte was observed and analysis of the spent electrolyte showed the presence of carbon. The partial oxidation of the carbon material used in the gas diffusion layer results in this contamination of the electrolyte.

The electrode was further cycled at 5 mA/cm$^2$ charge/discharge current. The effect of the carbon contamination in the electrolyte is less pronounced as the electrolyte was not changed for a larger number of cycles. Reducing the current density helps increase cycle life of the electrode.

Figure 62:
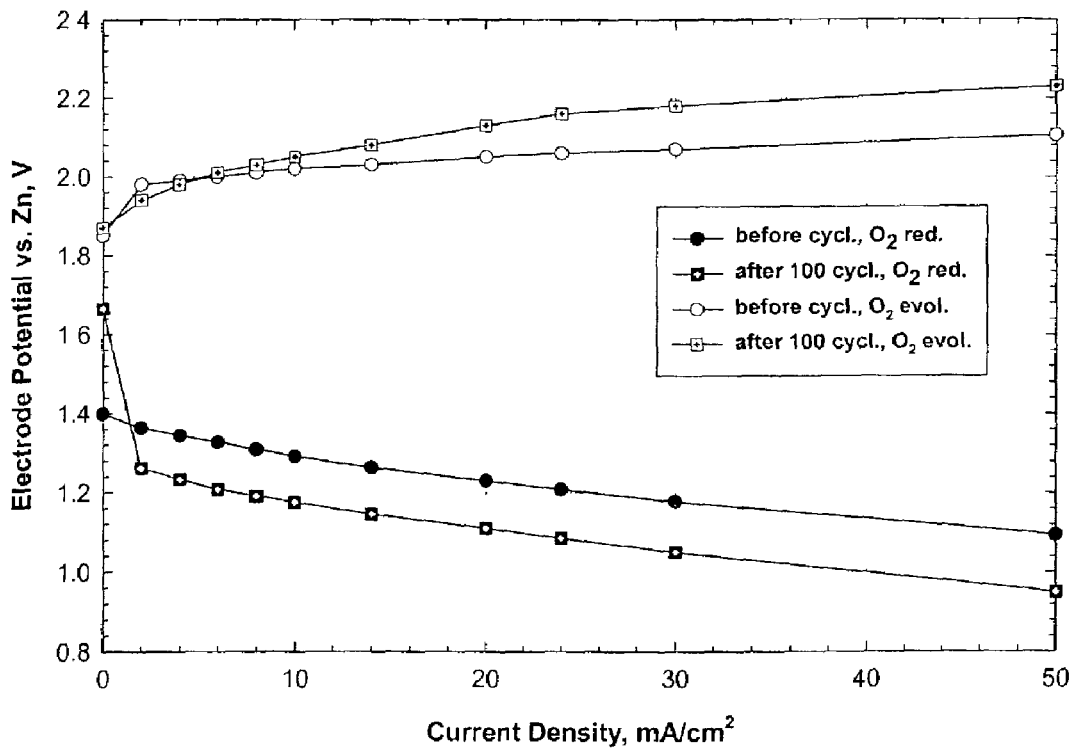
FIG. 62 illustrates the properties of a membrane electrode assembly according to the present invention.

The effect of electrode deterioration during cycling was further studied by means of polarization curves for oxygen reduction and evolution obtained with freshly prepared electrode and with the same electrode after 100 cycles. It can be seen from FIG. 62 that after cycling, an overall decrease in the catalytic activity both for oxygen evolution and reduction is detected.

Figure 63:
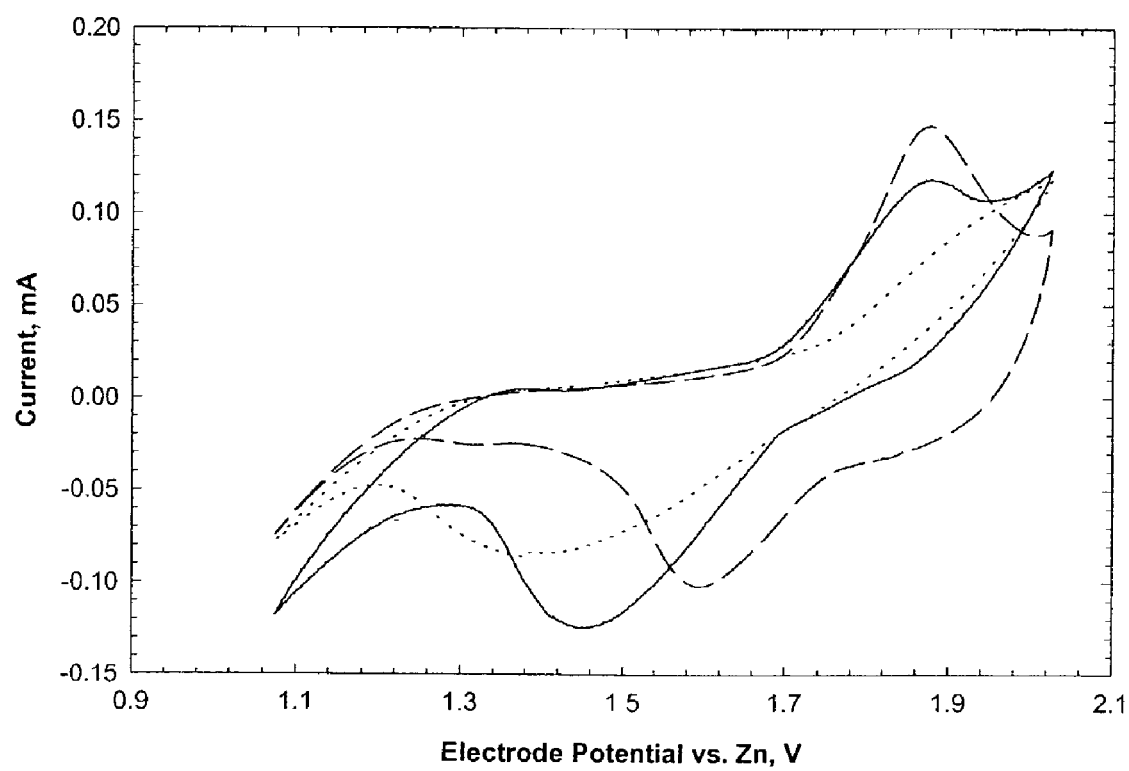
FIG. 63 illustrates the properties of a membrane electrode assembly according to the present invention.

A cyclic voltametry study was conducted to evaluate the reasons for the overall activity decrease detected by steady-state polarization measurements. FIG. 63 presents cyclic voltamograms for the electrode before cycling (dashed line); after 100 cycles in used electrolyte (dotted line); and the same electrode after 100 cycles in fresh electrolyte The peaks on the voltamograms correspond to reduction/oxidation transition in oxygen vacancies in the catalyst material. They are related to the catalytic activity for oxygen reduction and evolution. Obvious passivation effect is observed in the old electrolyte. This effect is partially compensated (reversed) by changing the electrolyte.

It is hypothesized that the partial oxidation of the carbon from the gas-diffusion layer leads to formation of brown colored products. They are being adsorbed on the catalyst surface within the active layer, thus passivating the catalysts. The adsorption is partially reversible, so the change of the electrolyte removes some of the material blocking the catalyst.

The foregoing examples demonstrate that self-supported nickel cobalt oxide catalyst can be produced using the spray processing technology of the present invention. The catalysts demonstrate good catalytic activity. High surface areas and the presence of the nickel cobalt mixed oxide phase results in superior catalytic performance. Short cycling lifetime of the bifunctional air electrode is caused by the corrosion of the electrode during oxygen evolution. In view of the fact that the gas-diffusion layer is under oxidative erosion, it is a possibility to replace the carbon material with a carbon more resistant to oxidation. TEFLON treated acetylene black (35 wt. %) used for the gas-diffusion layer may be replaced with a TEFLON treated graphite powder since high crystallinity graphite is more resistant to oxidation than carbon blacks. Another modification may be to completely eliminate carbon from the electrode by using a different gas diffusion layer such as a pure TEFLON sheet.

3. Metal-Carbon Supported Electrocatalyst Particles

Further examples in accordance with the present invention were prepared and are described in Table 17. The powder batch examples were prepared by ultrasonic generation and the aerosol was heated in a tubular furnace reactor. All of the examples were prepared using GRAFO 1300. The corresponding amount of Pt precursor was dissolved and added to the carbon suspension to form the precursor. Table 17 describes the type of Pt precursor used, the carrier gas, the conversion temperature and targeted Pt nominal concentration in the final catalyst.

TABLE 17

Conditions for Ultrasonically Generated Pt/C Powder

| Example | Pt precursor | Pt (wt. %) | Furnace temperature (° C.) | Carrier gas |
|---------|--------------|-----------|---------------------------|-------------|
| P27B | $Pt(NH_3)_4(NO_3)_2$ | 20 | 400 | Air |
| P31B | $Pt(NH_3)_4(NO_3)_2$ | 20 | 700 | Air |
| P31C | $Pt(NH_3)_4(NO_3)_2$ | 20 | 500 | Air |
| P32A | $Pt(NH_3)_4(NO_3)_2$ | 20 | 300 | Air |
| P32B | $Pt(NH_3)_4(NO_3)_2$ | 20 | 200 | Air |
| P33B | $Pt(NH_3)_4(NO_3)_2$ | 20 | 200 | $N_2$ |
| P33C | $Pt(NH_3)_4(NO_3)_2$ | 20 | 300 | $N_2$ |
| P36A | $Pt(NH_3)_4(NO_3)_2$ | 20 | 300 | $N_2$ |
| P36B | $Pt(NH_3)_4(NO_3)_2$ | 20 | 300 | $N_2$ |
| P36C | $Pt(NH_3)_4(NO_3)_2$ | 20 | 500 | $N_2$ |
| P37A | $Pt(NH_3)_4(NO_3)_2$ | 20 | 500 | $N_2$ |
| P37B | $Pt(NH_3)_4(NO_3)_2$ | 20 | 500 | $N_2$ |
| P37C | $Pt(NH_3)_4(NO_3)_2$ | 20 | 700 | $N_2$ |
| P37D | $Pt(NH_3)_4(NO_3)_2$ | 20 | 700 | $N_2$ |
| P37E | $Pt(NH_3)_4(NO_3)_2$ | 20 | 700 | $N_2$ |
| P38A | $Pt(NH_3)_4(NO_3)_2$ | 20 | 500 | $N_2$ |
| P38B | $Pt(NH_3)_4(NO_3)_2$ | 20 | 500 | Air |
| P39A | $Pt(NH_3)_4(NO_3)_2$ | 20 | 400 | Air |
| P39B | $H_2Pt(OH)_6$ | 10 | 400 | Air |
| P40C | $H_2Pt(OH)_6$ | 10 | 300 | Air |

TEM analysis indicated that the secondary carbon particles are substantially spherical with the particle size varying between 1 and 2 μm. The secondary particles (support phase) consist of primary carbon particles of about 30 nanometer diameter and various sizes of Pt particles and particle clusters dispersed thereon. The secondary electrocatalyst particles have a highly porous structure.

Figure 64:
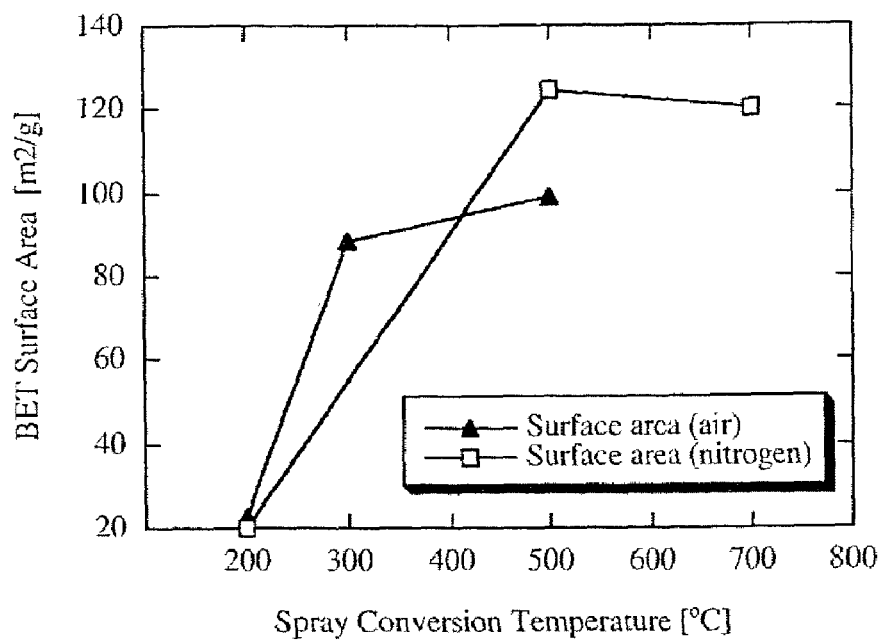
FIG. 64 illustrates surface area as a function of spray conversion temperature.

The BET nitrogen absorption method was used to analyze the surface area of the ultrasonically generated Pt/C catalyst powders according to the present invention. The results are summarized in FIG. 64. Both the conversion temperature and the carrier gas composition had an effect on the catalyst surface area. When air is used as a carrier gas, the surface area is higher at a conversion temperature of 300° C. (89 m²/g) compared to 200° C. (22 m²/g). However, a further increase of the conversion temperature to 400° C. did not lead to significant change in the surface area. In contrast, when nitrogen is used as carrier gas, the catalyst surface area increases to 125 m²/g at 500° C. and a further increase of the conversion temperature to 700° C. also decreases the surface area.

Analysis of the changes in the surface area as a function of the spray conversion temperature and carrier gas composition led to the following conclusions:
  when air is used as a carrier gas, spray conversion temperatures above 300° C. are not significantly beneficial for increasing the surface area;
  when nitrogen is used as a carrier gas, the powder surface area is generally higher compared to powders generated with air as a carrier gas;
  if nitrogen is used as a carrier gas, a conversion temperature of 500° C. is advantageous for producing a high surface area powder; and
  the surface area after spray conversion is at least three times lower than the surface area of the original carbon support.

XPS analysis was performed on the samples to provide information about the Pt oxidation state and dispersion in the catalysts. Three main characteristics of the XPS spectra were analyzed allowing comparison between the samples generated at different conditions: the positions of the binding energy of Pt $4f_{7/2}$ photoelectrons which indicates the Pt oxidation state; the relative intensities of Pt 4f vs. C 1s photoelectron peaks which indicates the level of Pt dispersion; and the appearance of N 1s photoelectron peak and its relative intensity vs. C 1s peak which indicate the level of impurities and the degree of conversion of the platinum precursor.

All preparation conditions, recording of the spectra and data processing were identical for all samples. The samples were prepared for XPS analysis by pressing them into indium foil (99.9%) which was previously cleaned in $HNO_3$ to remove impurities at the surface.

The XPS spectra for all of the catalysts were recorded on an AXIS HSi (Kratos Analytical) spectrometer, working in $\Delta E$=constant mode at a pass energy of 80 eV, using a monochromated aluminum anode (Al $K_a$=1486.7 eV, 225 W). The residual pressure in the analysis chamber was $1\times10^{-9}$ Torr (1 Torr=133.3 Pa). The peak positions were estimated relative to the binding energy of C 1s=284.6 eV. The following XPS peaks, designated by their electron levels, were recorded: Pt 4f, C 1s, O 1s and N 1s. One survey scan was acquired in the 75 to 1175 eV binding energy range before the high resolution spectra were acquired. The experimental intensities were estimated from the areas of the corresponding peaks, measured on smoothed original peaks. The area of the Pt 4f peak includes the areas of both $Pt\ 4f_{7/2}$ and $4f_{5/2}$ peaks. The results are listed in Table 18.

As listed in Table 18, a $Pt\ 4f_{7/2}$ binding energy of 71.2 eV was measured for the prior art catalyst (Sample P3A). The measured values for the Pt 4f binding energies, peak hwhm (half width at half maximum) and peak intensities closely match the theoretical and model XPS handbook values of Pt 4f peaks for Pt (0) oxidation state, i.e., for Pt metal. These values were further used for curve fitting of the Pt 4f peaks for the catalysts according to the present invention.

TABLE 18

XPS Data for Pt/C Powders

| Example | $Pt\ 4f_{7/2}$ peak position (eV) | I (Pt 4f)/I (C 1s) (relative intensities) | I (N 1s)/I (C 1s) (relative intensities) |
| --- | --- | --- | --- |
| P3A* | 71.2 | 0.682 | 0.028 (1.5 at. %) |
| P27B | 71.2 (80%) 72.5 (20%) | 0.305 | 0.000 |
| P31C | 71.4 | 0.481 | 0.020 (1.0 at. %) |
| P32A | 72.1 (80%) 73.2 (20%) | 0.398 | 0.000 |
| P32B | 73.4 | 0.352 | 0.149 (5.6 at. %) |
| P33B | 73.3 | 0.406 | 0.165 (7.0 at. %) |
| P37C | 71.8 | 0.489 | 0.009 (0.4 at. %) |
| P38A | 71.6 | 0.525 | 0.000 |
| P39A | 71.7 | 0.327 | 0.000 |
| P39B | 71.6 | 0.234 | 0.022 (1.1 at. %) |
| P40C | 71.9 | 0.327 | 0.025 (1.3 at. %) |

*Prior Art

Table 18 also contains information regarding the I (Pt 4f)/I (C 1s) relative intensities, which can be used to measure the dispersion of the Pt clusters on the carbon support. Since almost all of the catalysts of the examples contain an identical amount of Pt as Example P3A (20 wt. % Pt), the relative intensities I (Pt 4f)/I (C 1s) can be used for direct comparison of their Pt dispersion relative to the one for the commercial catalyst. This is mostly accurate for the catalysts of the present invention that have comparable surface area to the commercial catalyst, e.g., those prepared at spray conversion temperatures of 300° C. and above in nitrogen and at 400° C. and above in air.

Table 18 also lists the relative intensities I (N 1s)/I (C 1s) and the surface concentration of nitrogen in atomic percent for all catalysts analyzed by XPS. Example P3A (prior art) contains small impurities of nitrogen, which could indicate the use of nitrogen-containing reagents in the preparation of the catalyst or the presence of a nitrogen-containing surfactant.

As can be seen from the Pt 4f spectrum for Example P27B, the curve fit for the Pt 4f peaks cannot be accomplished using only the doublet related to Pt(0) oxidation state. A second doublet of Pt 4f peaks is needed with binding energy of 72.5 eV for the $Pt\ 4f_{7/2}$ peak. This $Pt\ 4f_{7/2}$ binding energy can be related to Pt (II) oxidation state indicating that the conversion of the Pt precursor to Pt metal is not complete in Example P27B. The relative intensity of the second doublet related to Pt (II) oxidation state accounts for approximately 20 % of the total Pt 4f peak area and therefore up to 20 % of the Pt in the Example P27B is not converted to Pt (0) oxidation state, indicating that spray conversion in air at 400° C. does not completely reduce the Pt precursor to Pt(0) and does not produce good dispersion of Pt clusters on the carbon support. The value of the relative intensity I (Pt 4f)/I (C 1s) for Example P27B is more than two times lower compared to the one for the commercial catalyst. No nitrogen impurities, however, were detected for Example P27B.

It should be noted that for Pt-based fuel cell catalysts, supported on carbon, highly dispersed Pt metal clusters are required for achieving high catalytic activity. Therefore, achieving high dispersion of Pt in the Pt (0) state can be used as criteria for the prediction of catalytic performance of the fuel cell catalysts.

In order to find optimal spray conversion conditions for achieving complete Pt reduction and high dispersion, the changes in these characteristics as a function of the spray conversion temperature and the carrier gas composition were analyzed. In general, a shift in the position of the $Pt\ 4f_{7/2}$ peak towards higher than 71.2 eV binding energies was considered an indication of a non-complete reduction to Pt metal. Simultaneously, a relative intensity I (Pt 4f)/I (C 1s) lower than the commercial sample is indicative of lower Pt cluster dispersion, corresponding to higher average size of Pt clusters. For Example P38A, the XPS analysis was repeated in order to estimate the accuracy of the measurements. A comparison between the two analyses shows excellent reproducibility for the XPS peak positions and less than 2% difference in the XPS relative intensities.

Figure 65:
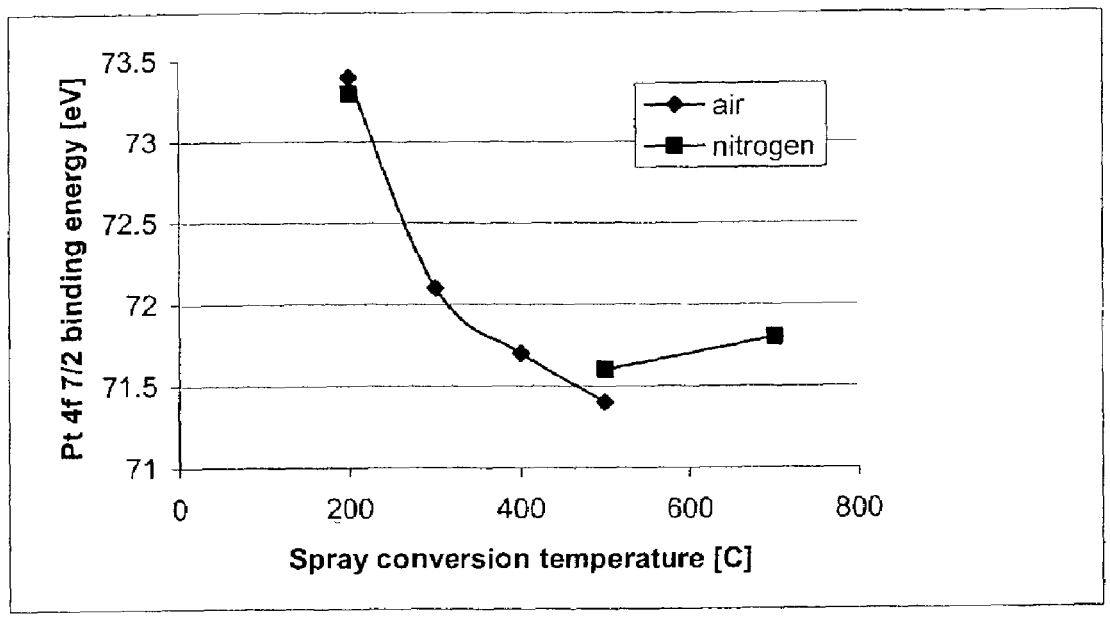
FIG. 65 binding energy as a function of surface area.

FIG. 65 illustrates the dependence of the $Pt\ 4f_{7/2}$ binding energy position for the catalysts (formed from $Pt(NH_3)_4(NO_3)_2$ precursor) as a function of the spray conversion temperature and the carrier gas composition. A conversion temperature of at least 500° C. is necessary with air as a carrier gas to achieve a reasonably high degree of conversion to the Pt (0) oxidation state. There are no significant differences observed when nitrogen is used as a carrier gas. An increase of the conversion temperature to 700° C. does not lead to improved results. Therefore, when $Pt(NH_3)_4(NO_3)_2$ precursor is used in the formulations, a temperature of at least about 500° C. seems adequate for achieving complete conversion of the precursor and formation of Pt metal species.

In support of that conclusion are the high-resolution XPS spectra which were measured for Example P32B and Example P33B. Both catalysts were made at a conversion temperature of 200° C., Example P32B with air as a carrier gas and Example P33B with nitrogen as a carrier gas. In addition to the peaks at 73.2 eV for Pt(II) oxidation state, e.g., partially converted precursor, another Pt 4f peak doublet appears with Pt $4f_{7/2}$ binding energy of approximately 75.6 eV which is very close to the value for the Pt (IV) oxidation state. In the N 1s region peaks at 404.2 eV and 406.5 eV are observed and related to $NO_2$ and $NO_3$ species, which confirms the conclusion for non-complete precursor conversion. This non-complete conversion results in a concentration of nitrogen in these catalysts of up to 7 atomic percent.

An increase in the conversion temperature to 300° C. (Example P32A) leads to a significant decrease of the nitrogen impurities. However, even though the precursor conversion is more complete, approximately 20% of the Pt in the Pt(ll) oxidation state.

Figure 66:
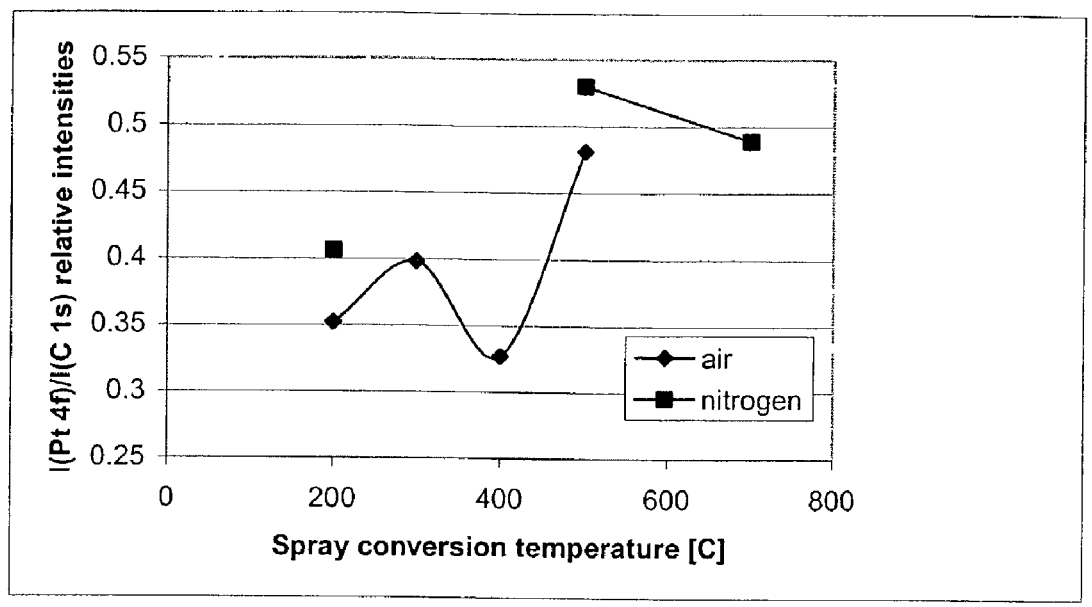
FIG. 66 illustrates relative XPS intensity as a function of conversion temperature.

As mentioned above, the dispersion of the Pt clusters is of significant importance for achieving high catalytic activity. FIG. 66 illustrates the dependence of the relative intensities I (Pt 4f)/I (C 1s) as a function of spray processing temperature. In general, at identical spray processing temperatures, the catalysts made with nitrogen as a carrier gas show higher relative intensities I (Pt 4f)/I (C 1s) and therefore have better dispersion of Pt on the support surface. An increase of the spray processing temperature up to 500° C. leads to improved Pt dispersion for both air and nitrogen as the carrier gases. Increasing the spray processing temperature to 700° C. is not beneficial for the Pt dispersion. The highest I (Pt 4f)/I (C 1s) relative intensity value is observed for Example P38A, which was prepared at 500° C. processing temperature in nitrogen. The relative intensity I (Pt 4f)/I (C 1s) of 0.525 for Example P38A is still lower than the one measured for Sample P3A, which suggests lower dispersion. However, no nitrogen impurities are detected for Example P38A, while about 1.5 atomic percent impurities were detected for Sample P3A.

Two of the samples listed in Table 18 were synthesized with a different Pt precursor ($H_2Pt(OH)_6$), with only 10 weight percent Pt. The XPS data for Examples P39B and P40C illustrate that a reaction temperature of at least 400° C in air is necessary for achieving the Pt (0) oxidation state from this precursor. The Pt has higher dispersion for Example P4° C, which was prepared at 300° C. compared to Example P39B, prepared at 400° C. This result is in contrast with the XPS data for samples based on $Pt(NH_3)_4(NO_3)_2$ precursor, for which higher conversion temperatures led to better Pt dispersion. This result suggests that $H_2Pt(OH)_6$ precursor converts at lower temperatures compared to $Pt(NH_3)_4(NO_3)_2$, and undesirable diffusion and agglomeration of Pt clusters occurs at higher conversion temperatures.

XPS analysis of the electrocatalyst powders provides information regarding important characteristics of the catalysts such as Pt oxidation state and dispersion, which influence the catalytic activity of the powders. However, other characteristics of the catalysts such as Pt cluster size distribution may have significant impact on the catalytic activity as well.

TEM data indicated that the overall cluster size distribution for Example P38A, which was spray converted at 500° C. in nitrogen, is significantly better compared to Example P31C, which was spray converted at 500° C. in air. This observation is in agreement with the XPS data for Pt dispersion and confirms that carrier gas has influence on the catalyst formation and Pt dispersion in particular.

Samples of the Pt/C electrocatalysts were evaluated in PEM fuel cells and the results of the electrochemical characterization were compared to two commercially available electrocatalysts. The examples which were electrochemically characterized are Examples P37C, P38A, P39A and P39B.

Gas diffusion cathodes were fabricated by the catalyst ink method. The Pt/C catalyst was dispersed in a NAFION/alcohol/water solution to give a stable ink suspension. Specifically, 1 g of the electrocatalyst was mixed in 2 ml i-propanol (after being wetted with a small amount of water to avoid pyrogenic effects), and suspended in 10 ml of stock NAFION solution (5 wt. % of polymer in water/i-propanol mix). This ink yields a Catalyst/NAFION ratio of 2:1, which is to remain during the electrode preparation in order to incorporate the electrocatalyst particles into the NAFION polymer electrolyte membrane.

The gas diffusion electrode is prepared by brush application of a suspension of SHAWINIGAN BLACK and TEFLON emulsion (DuPont) to give a 35 to 40 weight percent TEFLON/carbon ratio onto a carbon cloth. The gas-diffusion electrode, soaked with the TEFLON/carbon suspension, is heat treated at 300° C. to 350° C. for 1 hour. This temperature range is near the glass-transition point of the TEFLON material.

The Pt/Carbon electrocatalyst ink is applied on the impregnated cloth by a brush when the electrode is mounted on a hot plate at 90 to 100° C. The electrode is then treated at 155° C. in air for 20 to 30 minutes, which is close to the melting point of NAFION material. The catalyst loading is determined from the electrode weight.

The platinum loading of the cathodes was 0.20±0.01 mg/cm$^2$ which is considered low by industrial standards for oxygen electrocatalysts. All hydrogen electrodes (anodes) were loaded with 0.05 mg/cm$^2$ of platinum using a 10% Pt/C commercial catalyst.

Membrane electrodes assemblies (MEAs) were fabricated by hot pressing electrodes symmetrically (catalyst side facing the membrane) onto both sides of a NAFION 112 (CG Processing, Inc.) PEM at 200° C., to allow melting of the membrane and the NAFION material from the catalytic layers. The performance evaluation of MEAs was carried out in test cell with a working area of 50 cm$^2$ between ribbed graphite plates and copper end plates at 50° C. and an atmospheric pressure of humidified reactant gases.

Figure 67:
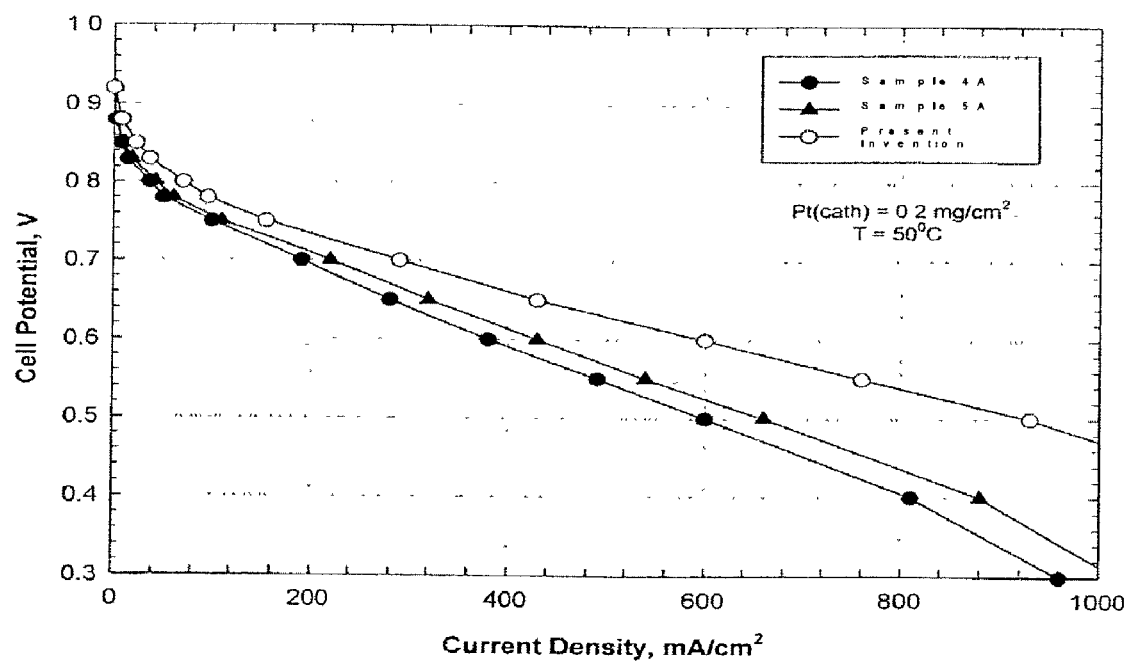
FIG. 67 illustrates the properties of a membrane electrode assembly according to the present invention.

FIG. 67 illustrates a comparison of voltamograms (cell potential vs. current density plots) for MEAs comprising different commercial catalysts (Samples P4A and P5A) and a catalyst according to the present invention, prepared and measured under identical conditions. The results were obtained with electrocatalysts containing 20 weight percent platinum on an identical carbon black support. It is evident from these curves that the electrocatalyst of the present invention demonstrates superior performance in the MEA. Numerical expression of this superiority can be derived from the current density corresponding to a cell potential of 0.6 V. Both prior art electrocatalysts provide about 400 mA/cm$^2$ while the electrocatalyst of the present invention provides 600 mA/cm$^2$, a 50% improvement of MEA performance at a cell potential of 0.6 V.

FIG. 67 illustrates that the electrode fabricated with the electrocatalyst of the present invention demonstrates overall higher current densities within the entire investigated range of potentials. At the same time, the polarization curve is characterized by lower dependence of the current on the potential (lower negative slope of the curve in its "linear" portion), which indicates lower ohmic resistance of the catalytic layer. The dependence of the potential on current density remains practically linear even at high current densities, indicating that there is no expression of any diffusion limitations in the investigated current density range.

Figure 68:
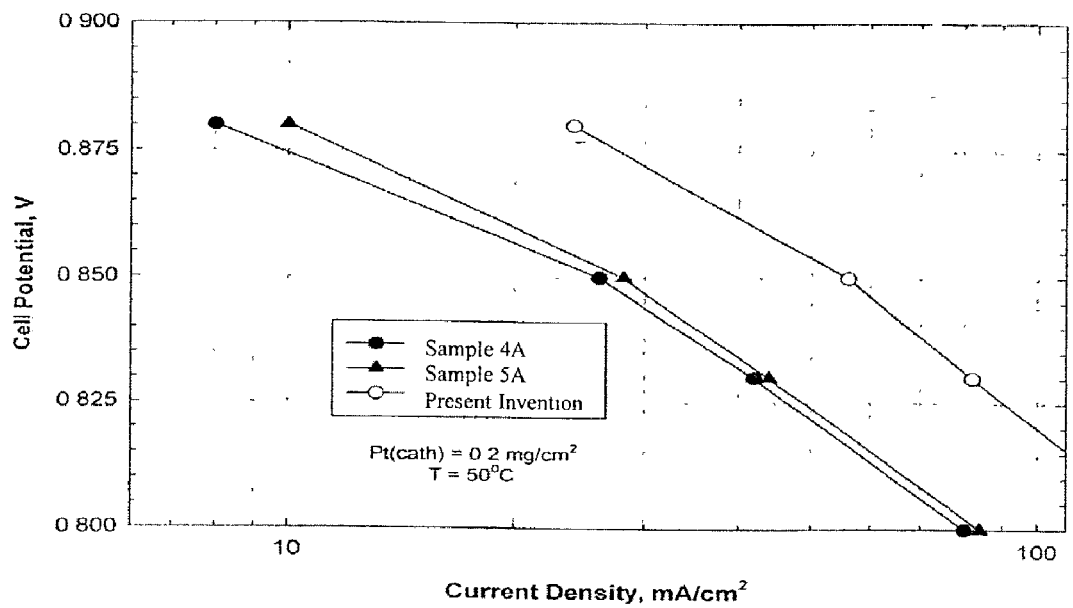
FIG. 68 illustrates the properties of a membrane electrode assembly according to the present invention.

FIG. 68 is a Tafel plot of the data from the low current density region of FIG. 67. A Tafel plot is a semi-logarithmic data representation used to establish the mechanism of the reaction (from the negative slope of the linearized dependencies) and to reveal the catalytic effects expressed as the position of the intercepts on the current density axis. The off-gas from the reactor, or a portion thereof, can advantageously be recycled to conserve gas quantities. The recycled gas can be treated to remove unwanted components and fresh $H_2$. FIG. 68 illustrates that the advantageous performance of the catalyst generally revealed in FIG. 67 is due to higher catalytic activity. All three curves are linear (in semi-logarithmic coordinates) with the same negative slope, suggesting a uniform mechanism of oxygen reduction. The curve corresponding to the electrocatalyst of the present invention, however, is shifted toward higher current densities with a positive difference in the current density axis cutoff of approximately 30 mA/cm$^2$. Both prior art samples demonstrate practically identical catalytic activity.

The improvement in catalytic activity of the electrocatalyst of the present invention when compared to the prior art samples can be explained by the platinum cluster size and its distribution on the carbon surface. SEM microphotographs of the electrocatalysts of the present invention compared to the prior art electrocatalyst show that the catalyst of the present invention possesses a significant amount of smaller size platinum clusters (1–2 nm) compared to the prior art samples. This results in an increased platinum utilization and a larger reaction interface in the active layer of the oxygen electrode.

Figure 69:
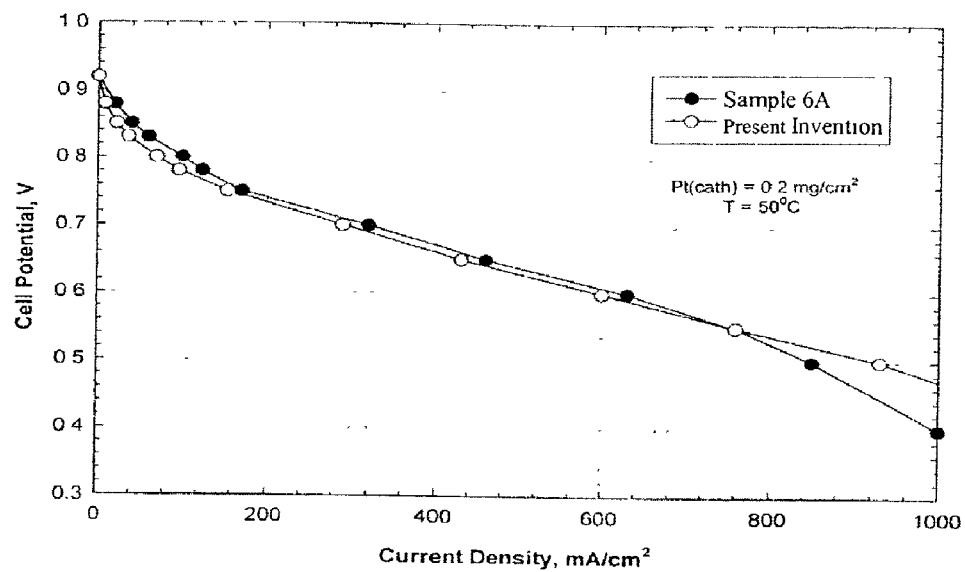
FIG. 69 illustrates the properties of a membrane electrode assembly according to the present invention.

FIG. 69 is a comparison of the polarization curves obtained with a Pt/C catalyst of the present invention (20 weight percent Pt) with the best performing research sample known to the present inventors, a Pt—Co—Cr/C composite electrocatalyst (Sample P6A). This catalyst is applied to the electrode surface to give identical loading, measured as Pt metal per cm$^2$. Due to the amount of Pt in the electrocatalyst of the present invention, the electrode is loaded with 3-times less catalyst than the Sample P6A. The polarization curves of both electrodes practically coincide demonstrating unique matching of the performance of an advanced tri-metal composite catalyst by the simpler Pt electrocatalyst of the present invention.

Figure 70:
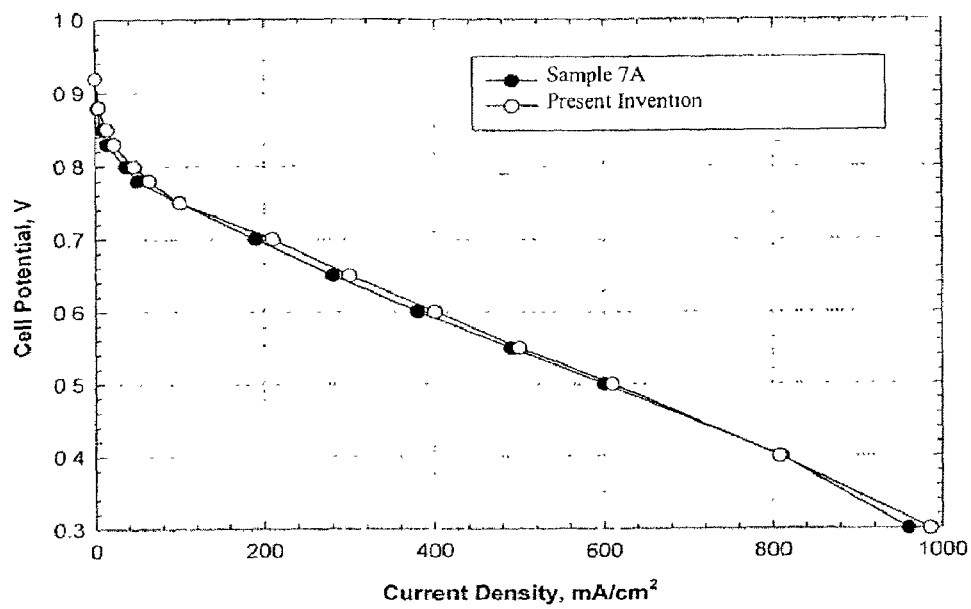
FIG. 70 illustrates the properties of a membrane electrode assembly according to the present invention.

FIG. 70 compares the polarization curve obtained with another prior art electrocatalyst (Sample P7A) with an example of the present invention with the same Pt content. The curves are obtained with different Pt loadings of 0.21 mg/cm$^2$ for Sample P7A and 0.11 mg/cm$^2$ for the electrocatalyst of the present invention. Coinciding curves are observed when the Pt loading of the electrocatalyst of the present invention is about half of the amount of the commercial catalyst. This clearly indicates a significant commercial advantage of the present invention: the PVCarbon catalyst meets the same performance achieved with half of the amount of the catalyst material, thus significantly reducing the amount of Pt used with no loss in performance.

Figure 71:
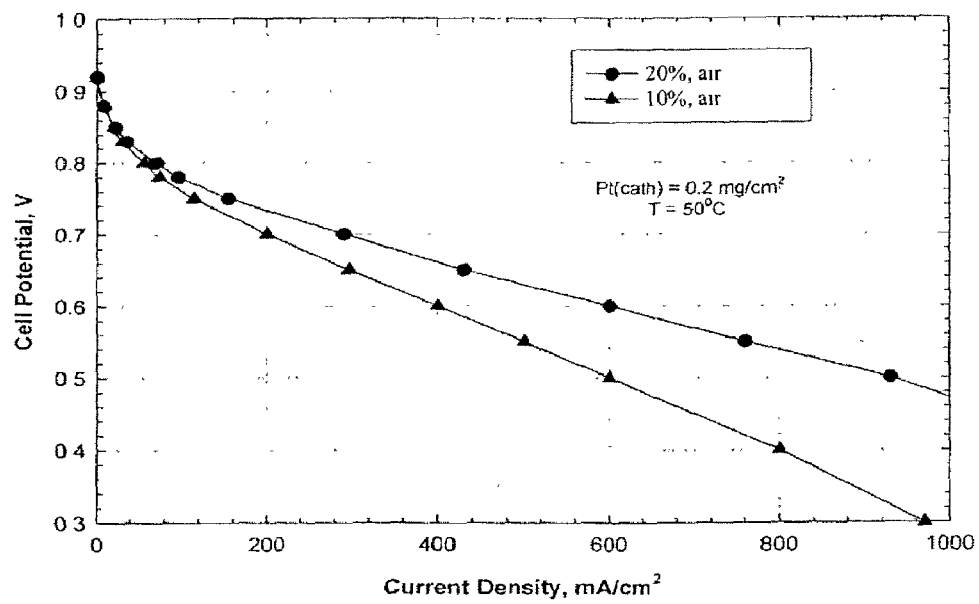
FIG. 71 illustrates the properties of a membrane electrode assembly according to the present invention.

FIG. 71 illustrates the performance of two examples of the present invention with different Pt content when ambient air is used to feed the oxygen gas diffusion electrode in the cell. As expected, the electrocatalyst with the lower Pt content (10% Pt/Carbon) provides lower current densities compared to the one with higher metal content (20% Pt/Carbon). It should be noted, however, that the curves are obtained with electrodes that have been prepared with identical total amount of Pt. Thus, the lower Pt content sample has been applied in an amount doubling the use of the catalyst. Reduction of the electrochemical performances however, is still to the level of those obtained with the prior art electrocatalysts (compare FIG. 71 and FIG. 67). The 10% Pt/Carbon sample curve, of the present invention overlaps with the 20% Pt/Carbon prior art samples.

Figure 72:
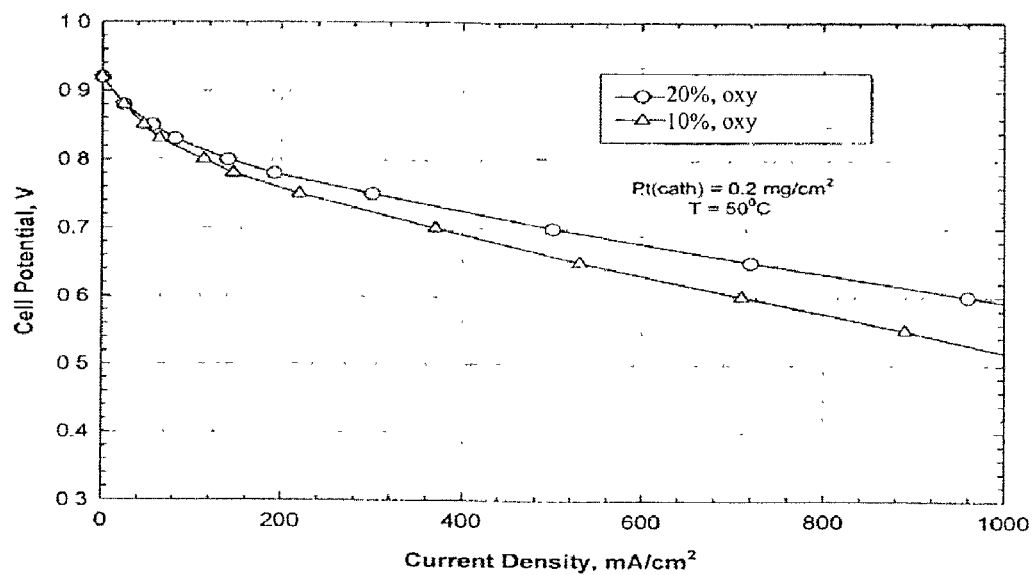
FIG. 72 illustrates the properties of a membrane electrode assembly according to the present invention.
Figure 73:
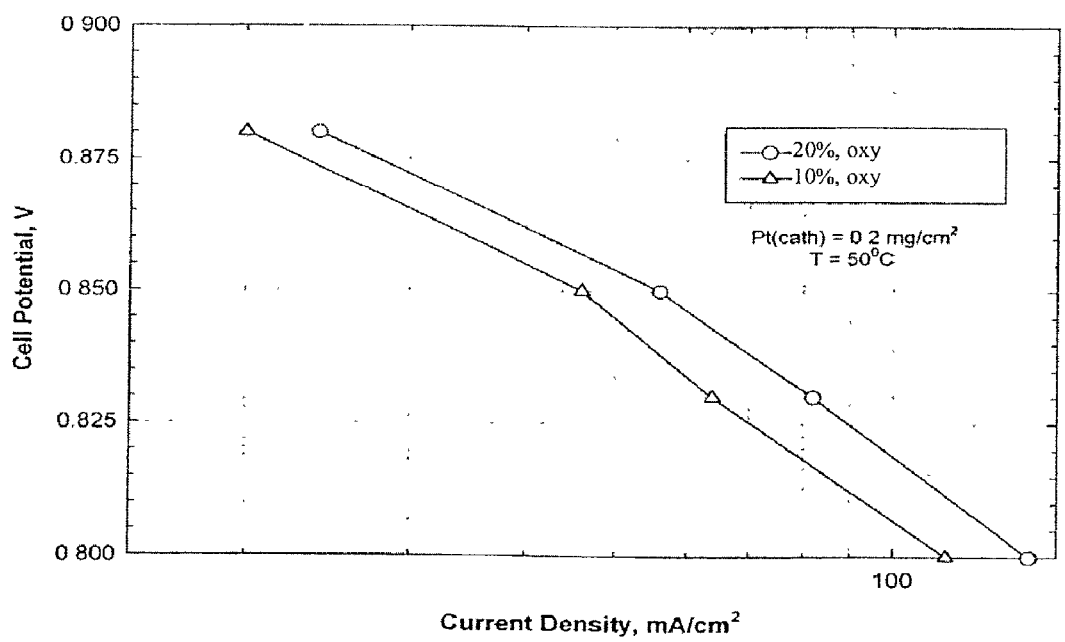
FIG. 73 illustrates the properties of a membrane electrode assembly according to the present invention.

FIG. 72 is obtained with the same MEA as FIG. 71 and illustrates the performance of the electrocatalysts of the present invention with different Pt content when pure oxygen is used to feed the oxygen gas diffusion electrode in the cell. Flowing pure oxygen through the electrode largely eliminates the mass transport limitations, especially those associated with macro-diffusion processes. The curve obtained from the electrocatalysts with lower Pt content (10% Pt/Carbon) is shifted to approximate the one obtained from the catalyst with higher metal content (20% Pt/Carbon). Thus, FIG. 72 demonstrates that lower performance of the 10% sample (as illustrated in FIG. 71) is associated with the thickness of the catalytic layer formed when double the amount of material is used. This is confirmed by the Tafel plot of the data at low current densities (where the catalytic performance is not masked by the transport processes) as illustrated in FIG. 73.

The purpose of the following additional examples is to identify the optimum set of structural parameters that give the most active electrocatalyst for the oxygen reduction reaction at the air cathode of a Proton Exchange Membrane Fuel Cell (PEMFC.). The activity of the electrocatalyst is dependant on the oxidation state and dispersion of the platinum, which will be influenced by the spray conversion process conditions, carrier gas, precursor salt, and type of the carbon support.

The evaluation of PVC electrocatalysts was accomplished by a variety of techniques such as nitrogen adsorption (BET), XRD, TEM, XPS, CO chemisorption, as well as electrochemical evaluation.

A number of examples were prepared as follows: 104AO2 was a sample comprised of 10 wt % Pt on SHAWINIGAN BLACK with Pt crystallites of 6.3 nm and a Pt loading of 1.43 mgpt/cm$^2$; 156AO2 was a sample comprised of 20 wt % Pt on SHAWINIGAN BLACK with Pt crystallites of 5.2 nm and a Pt loading of 2.66 mgPt/cm$^2$; 158BO2 was a sample comprised of 10 wt % Pt on VULCAN XC-72 with Pt crystallites of 4.6 nm and a Pt loading of 1.23 mgPt/cm$^2$; and 142AO2 was a sample comprised of 20 wt % Pt on VULCAN XC-72 with Pt crystallites of 11.4 nm and a Pt loading of 2.95 mg Pt/cm$^2$.

The examples were tested in an alkaline electrolyte and a Tafel plot was obtained. Some general conclusions can be drawn. SHAWINIGAN BLACK appears to have better performance that VULCAN XC-72. A smaller crystallite size performs better than a larger crystallite size (as determined by x-ray diffraction). A lower Pt content powder at a lower loading is as good or better than a higher Pt content powder at a higher loading.

The purity of the dispersed phase on the carbon surface is also important in determining the electrocatalytic performance of powder. Typical solution precipitation processes that are used to produce precious metal-based carbon supported electrocatalysts use sulfur containing reagents or surfactants. Since sulfur is a poison to the catalytic activity of Pt, any trace amounts of residual sulfur can lead to a significant reduction in performance. The materials produced by the process described herein do not require the use of ligands, complexing agents or surfactants that contain elements that poison the activity of the final catalyst. As a result, the process described herein results in materials with a high purity level.

10 weight percent and 20 weight percent platinum on carbon commercial catalysts were analyzed for comparison with catalysts of the present invention. The fuel cell catalysts of the present invention were prepared by one of four routes. Chronologically, they are ultrasonic transducer (single and multiple), spray dryer, ultrasonic spray nozzle and post-processing.

All samples were prepared in similar fashion regardless of the processing system used. The carbon dispersion was first diluted with water while shear mixing, and then the dissolved metal salt was slowly added. The precursor dispersion was sheared for 10 minutes following the addition of the metal salt to insure a homogeneous suspension.

Samples listed in Table 19 were prepared via ultrasonic transducers, samples listed in Table 20 were produced using an ultrasonic spray nozzle, and samples listed in Table 21 on a spray dryer.

TABLE 19

Samples Generated Using Ultrasonic Transducers

| Sample | Composition (wt. %) | Carbon Support | Pt Precursor | Furnace Temperature (° C.) | Surface Area (m$^2$/g) |
|---|---|---|---|---|---|
| PTC087071A | 20% Pt | GRAFO 1300 | Pt(NH$_3$)$_4$(NO$_3$)$_2$ | 500 | 90 |
| PPC097001A | 20% Pt | GRAFO 1300 | H$_2$Pt(OH)$_6$ | 450 | 80 |
| PPC056071A | 20% Pt | GRAFO 1300 | H$_2$Pt(OH)$_6$ | 350 | 62 |
| PPC056071B | 20% Pt | GRAFO 1300 | H$_2$Pt(OH)$_6$ | 250 | 42 |
| PPC056072A | 20% Pt | GRAFO 1300 | H$_2$Pt(OH)$_6$ | 300 | 44.9 |
| PPC056072B | 20% Pt | GRAFO 1300 | H$_2$Pt(OH)$_6$ | 400 | 66 |
| PPC097120A | 50% Pt | GRAFO 1300 | Pt(NH$_3$)$_4$(NO$_3$)$_2$ | 500 | — |
| PPC097120B | 60% Pt | GRAFO 1300 | Pt(NH$_3$)$_4$(NO$_3$)$_2$ | 500 | 12.9 |
| PPC093088A | 20% Pt | GRAFO 1300 | Pt(NH$_3$)$_4$(NO$_3$)$_2$ | 500 | — |
| PPC093088B | 20% Pt | GRAFO 1300 | Pt(NH$_3$)$_4$(NO$_3$)$_2$ | 550 | — |
| PPC093089A | 20% Pt | GRAFO 1300 | Pt(NH$_3$)$_4$(NO$_3$)$_2$ | 600 | — |
| PPC093090A | 20% Pt | GRAFO 1300 | Pt(NH$_3$)$_4$(NO$_3$)$_2$ | 650 | — |

TABLE 20

Electrocatalysts Produced with an Ultrasonic Spray Nozzle

| Sample | Composition (wt. %) | Carbon Support | Pt Precursor | Furnace Temperature (° C.) | Surface Area (m$^2$/g) |
|---|---|---|---|---|---|
| PPC093101A | 20% Pt | GRAFO 1300 | Pt(NH$_3$)$_4$(NO$_3$)$_2$ | 550 | 52 |
| PPC093101B | 20% Pt | GRAFO 1300 | Pt(NH$_3$)$_4$(NO$_3$)$_2$ | 600 | — |
| PPC093101C | 20% Pt | GRAFO 1300 | Pt(NH$_3$)$_4$(NO$_3$)$_2$ | 625 | — |
| PPC093102A | 20% Pt | GRAFO 1300 | Pt(NH$_3$)$_4$(NO$_3$)$_2$ | 650 | 60 |
| PPC093102B | 20% Pt | GRAFO 1300 | Pt(NH$_3$)$_4$(NO$_3$)$_2$ | 700 | — |
| PPC093102C | 20% Pt | GRAFO 1300 | Pt(NH$_3$)$_4$(NO$_3$)$_2$ | 675 | — |
| PPC093101A | 20% Pt | GRAFO 1300 | Pt(NH$_3$)$_4$(NO$_3$)$_2$ | 550 | — |
| PPC093101B | 20% Pt | GRAFO 1300 | Pt(NH$_3$)$_4$(NO$_3$)$_2$ | 600 | — |
| PPC093101C | 20% Pt | GRAFO 1300 | Pt(NH$_3$)$_4$(NO$_3$)$_2$ | 625 | — |
| PPC093104A | 20% Pt, 10% susp. | GRAFO 1300 | Pt(NH$_3$)$_4$(NO$_3$)$_2$ | 550 | — |
| PPC093104B | 20% Pt, 10% susp. | GRAFO 1300 | Pt(NH$_3$)$_4$(NO$_3$)$_2$ | 600 | — |
| PPC093104C | 20% Pt, 10% susp. | GRAFO 1300 | Pt(NH$_3$)$_4$(NO$_3$)$_2$ | 650 | — |
| PPC093104D | 20% Pt, 10% susp. | GRAFO 1300 | Pt(NH$_3$)$_4$(NO$_3$)$_2$ | 700 | — |
| PPC093109A | 20% Pt | GRAFO 1300 | Pt(NH$_3$)$_4$(NO$_3$)$_2$ | 500 | — |
| PPC093109B | 20% Pt | GRAFO 1300 | Pt(NH$_3$)$_4$(NO$_3$)$_2$ | 600 | — |
| PPC056087A | 20% Pt | GRAFO 1300 | Pt(NH$_3$)$_4$(NO$_3$)$_2$ | 500 | 48 |
| PPC056091A | 20% Pt | GRAFO 1300 | Pt(NH$_3$)$_4$(NO$_3$)$_2$ | 425 | 52 |
| PPC056092A | 20% Pt | GRAFO 1300 | Pt(NH$_3$)$_4$(NO$_3$)$_2$ | 450 | 52 |
| PPC056093A | 20% Pt | GRAFO 1300 | Pt(NH$_3$)$_4$(NO$_3$)$_2$ | 475 | 49 |
| PPC056094A | 20% Pt | GRAFO 1300 | Pt(NH$_3$)$_4$(NO$_3$)$_2$ | 400/500/400 | — |
| PPC056095A | 20% Pt | GRAFO 1300 | Pt(NH$_3$)$_4$(NO$_3$)$_2$ | 400/450/500 | — |
| PPC056096A | 20% Pt | GRAFO 1300 | Pt(NH$_3$)$_4$(NO$_3$)$_2$ | 500 | 50 |
| PPC056097A | 60% Pt | GRAFO 1300 | Pt(NH$_3$)$_4$(NO$_3$)$_2$ | 500 | 31 |
| PPC056099A | 10% Pt | GRAFO 1300 | Pt(NH$_3$)$_4$(NO$_3$)$_2$ | 500 | — |
| PPC056100A | 20% Pt | GRAFO 1300 | Pt(NH$_3$)$_4$(NO$_3$)$_2$ | 500 | — |
| PPC056101A | 40% Pt | GRAFO 1300 | Pt(NH$_3$)$_4$(NO$_3$)$_2$ | 500 | 38 |

TABLE 20-continued

Electrocatalysts Produced with an Ultrasonic Spray Nozzle

| Sample | Composition (wt. %) | Carbon Support | Pt Precursor | Furnace Temperature (° C.) | Surface Area (m$^2$/g) |
|---|---|---|---|---|---|
| PPC056102A | 60% Pt | GRAFO 1300 | Pt(NH$_3$)$_4$(NO$_3$)$_2$ | 500 | 30 |
| PPC056103A | 5% Pt | GRAFO 1300 | Pt(NH$_3$)$_4$(NO$_3$)$_2$ | 500 | 56 |
| PPC056104A | 10% Pt | GRAFO 1300 | Pt(NH$_3$)$_4$(NO$_3$)$_2$ | 500 | 52 |
| PPC056105A | 20% Pt | GRAFO 1300 | Pt(NH$_3$)$_4$(NO$_3$)$_2$ | 500 | 49 |
| PPC056106A | 30% Pt | GRAFO 1300 | Pt(NH$_3$)$_4$(NO$_3$)$_2$ | 500 | 44 |
| PPC056111A | 20% Pt | GRAFO 1300 | Pt(NH$_3$)$_4$(NO$_3$)$_2$ | 400 | 45 |
| PPC056112A | 20% Pt | GRAFO 1300 | Pt(NH$_3$)$_4$(NO$_3$)$_2$ | 425 | 44 |
| PPC056113A | 20% Pt | GRAFO 1300 | Pt(NH$_3$)$_4$(NO$_3$)$_2$ | 450 | 48 |
| PP0056114A | 20% Pt | GRAFO 1300 | Pt(NH$_3$)$_4$(NO$_3$)$_2$ | 475 | 47 |
| PPC056115A | 20% Pt | GRAFO 1300 | Pt(NH$_3$)$_4$(NO$_3$)$_2$ | 350 | — |
| PPC056126A | 20% Pt | GRAFO 1322 | Pt(NH$_3$)$_4$(NO$_3$)$_2$ | 500 | — |
| PPC056140A | 20% Pt | GRAFO 1300 | H$_2$PtCl$_6$ | 500 | — |
| PPC056141A | 20% Pt | GRAFO 1300 | H$_2$PtCl$_6$ | 500 | 47 |
| PPC056142A | 20% Pt | GRAFO 1300 | H$_2$PtCl$_6$ | 350 | 47 |
| PPC056143A | 20% Pt | GRAFO 1322 | H$_2$PtCl$_6$ | 500 | 35 |
| PPC056146A | 20% Pt | GRAFO 1322 | Pt(NH$_3$)$_4$(NO$_3$)$_2$ | 300 | — |
| PPC056153A | 20% Pt | GRAFO 1300 | Pt(NH$_3$)$_4$(NO$_3$)$_2$ | 500 | 52 |
| PPC056154A | 20% Pt | GRAFO 1300 | Pt(NH$_3$)$_4$(NO$_3$)$_2$ | 500 | 48 |
| PPC056155A | 20% Pt | GRAFO 1300 | Pt(NH$_3$)$_4$(NO$_3$)$_2$ | 500 | 52 |
| PPC056156A | 20% Pt | GRAFO 1300 | Pt(NH$_3$)$_4$(NO$_3$)$_2$ | 500 | 53 |

TABLE 21

Catalysts Produced on a Spray Dryer

| Sample | Composition wt. % | Carbon Support | Pt Precursor | Inlet/Outlet Temperature (° C.) | Surface Area (m$^2$/g) |
|---|---|---|---|---|---|
| PPC097108C | 20% Pt | GRAFO 1300 | Pt(NH$_3$)$_4$(NO$_3$)$_2$ | 600 F | — |
| PPC056138A | 20% Pt | GRAFO 1300 | Pt(NH$_3$)$_4$(NO$_3$)$_2$ | 646 F | — |
| PPC056138B | 20% Pt | GRAFO 1322 | Pt(NH$_3$)$_4$(NO$_3$)$_2$ | 639 F | 32 |
| PPC056138C | 20% Pt | GRAFO 1322 | Pt(NH$_3$)$_4$(NO$_3$)$_2$ | 552 F | 26 |
| PPC056139A | 20% Pt | GRAFO 1300 | Pt(NH$_3$)$_4$(NO$_3$)$_2$ | 538 F | 18 |
| PPC056157A | 20% Pt | GRAFO 1322 | Pt(NH$_3$)$_4$(NO$_3$)$_2$ | 482/244 | 70 |
| PPC056157B | 20% Pt | GRAFO 1322 | Pt(NH$_3$)$_4$(NO$_3$)$_2$ | 427/227 | — |
| PPC056157C | 20% Pt | GRAFO 1300 | Pt(NH$_3$)$_4$(NO$_3$)$_2$ | 482/249 | 38 |
| PPC056157D | 20% Pt | GRAFO 1300 | Pt(NH$_3$)$_4$(NO$_3$)$_2$ | 427/227 | — |
| PPC056158A | 5% Pt | GRAFO 1322 | Pt(NH$_3$)$_4$(NO$_3$)$_2$ | 518/274 | 125 |
| PPC056158B | 10% Pt | GRAFO 1322 | Pt(NH$_3$)$_4$(NO$_3$)$_2$ | 517/265 | 108 |
| PPC056158C | 40% Pt | GRAFO 1322 | Pt(NH$_3$)$_4$(NO$_3$)$_2$ | 521/279 | 64 |
| PPC056159A | 5% Pt | GRAFO 1300 | Pt(NH$_3$)$_4$(NO$_3$)$_2$ | 513/274 | 66 |
| PPC056159B | 10% Pt | GRAFO 1300 | Pt(NH$_3$)$_4$(NO$_3$)$_2$ | 515/274 | 53 |
| PPC056159C | 40% Pt | GRAFO 1300 | Pt(NH$_3$)$_4$(NO$_3$)$_2$ | 514/282 | 40 |
| PPC056163C | 20% Pt | GRAFO 1300 | Pt(NH$_3$)$_4$(NO$_3$)$_2$ | 526/282 | 46 |
| PPC056164A | 20% Pt, 10% susp | GRAFO 1300 | Pt(NH$_3$)$_4$(NO$_3$)$_2$ | 524/287 | 48 |
| PPC056164C | 20% Pt | GRAFO 1322 | Pt(NH$_3$)$_4$(NO$_3$)$_2$ | 524/287 | 104 |
| PPC056165A | 20% Pt, 10% solids | GRAFO 1322 | Pt(NH$_3$)$_4$(NO$_3$)$_2$ | 524/282 | 104 |
| PPC056166C | 20% Pt | GRAFO 1322 | H$_2$PtCl$_6$ | 523/284 | — |
| PPC056167A | 20% Pt | GRAFO 1300 | H$_2$PtCl$_6$ | 523/283 | — |

Figure 74:
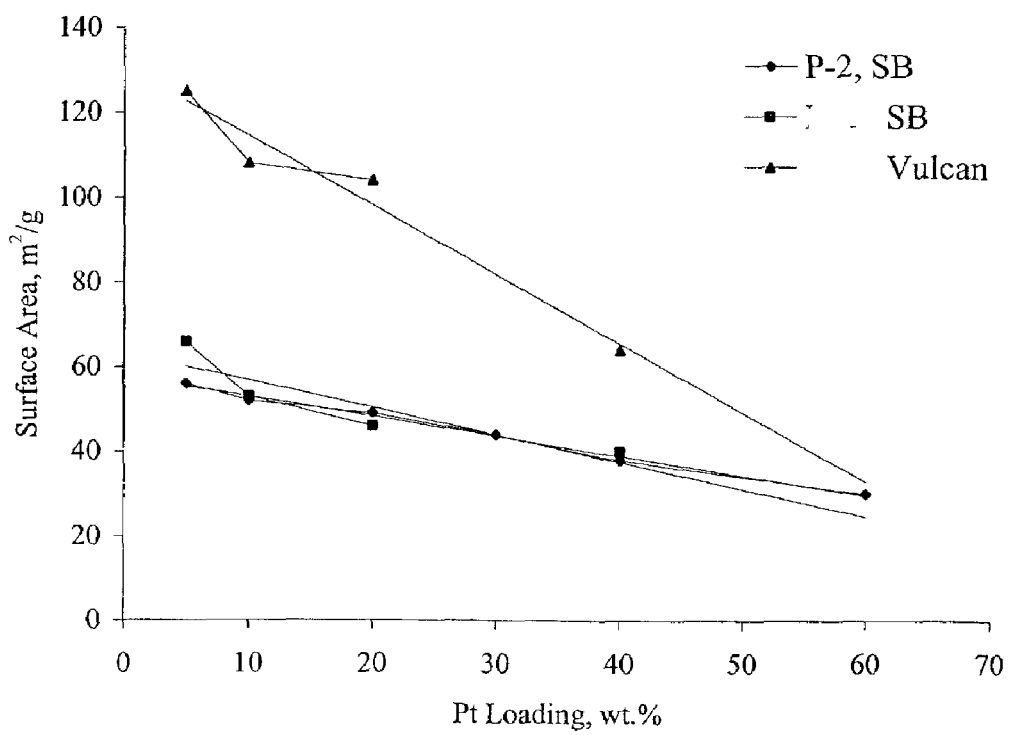
FIG. 74 illustrates surface area as a function of platinum loading.

FIG. 74 illustrates the inverse relationship between the platinum loading and surface area. Since the surface area is normalized per gram of catalyst and the loading of the Pt increases (the density of Pt is significantly higher compared to that of the carbon support) this result is expected. It is important to note, however, that the changes in the surface area of the catalysts generated by ultrasonic spray nozzle and on the spray dryer are almost identical if the same carbon support is used (SHAWINIGAN BLACK). For a higher surface area support such as VULCAN XC-72, the effect is even more strongly expressed due to the lower density of the carbon support.

Figure 75:
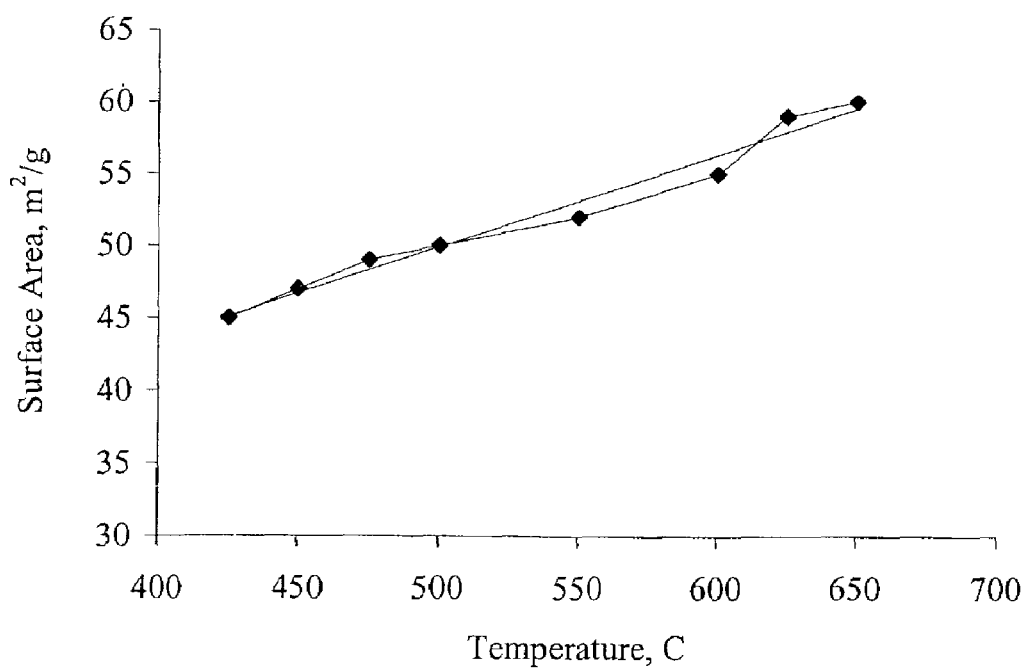
FIG. 75 illustrates surface area as a function of temperature.

The spray conversion temperature must be high enough to convert the platinum, but not so high that the carbon burns. FIG. 75 illustrates that the surface area of the powder increases as the temperature is increased. Although this may suggest using the highest temperature possible, the loss due to the burning of carbon at elevated temperatures must also be considered.

It is generally accepted that increased dispersion of the Pt metal clusters on the carbon support will result in increased catalytic activity. The degree of metal dispersion on the surface is influenced by the metal salt used, the metal loading (weight percent of metal), and the surface area of the carbon support. It stands to reason that increasing the amount of metal on the carbon surface will result in larger metal crystallites, thus a lower dispersion and reduced metal surface area that is exposed. The carbon used will also influence the process temperature. It is believed that a higher surface area results in a lower decomposition temperature. An example is illustrated by comparing the processing of SHAWINIGAN BLACK vs. VULCAN XC-72. When 20 wt. % platinum was run on both SHAWINIGAN BLACK and VULCAN XC-72 at 210° C., increased conversion was seen for the higher-surface area VULCAN XC-72 than for the lower-surface area SHAWINIGAN BLACK. This may suggest the ability to further lower the conversion temperature by using a carbon with an even higher surface area, such as about 800 m²/g. It may also be advantageous to use a mixture of carbon supports having different surface areas. This may be catalytically advantageous, for if the higher surface area carbon converts at a lower temperature, it may act as a catalyst for the conversion of the lower-surface area carbon.

Powder x-ray diffraction (XRD) spectroscopy was used as a rapid pre-screening method to monitor the conversion of the precursor salts to their active metal states. The manufacturing processes were optimized using the XRD as immediate feedback for process condition refinements. XRD is much less labor-intensive than electrochemical testing and TEM, thus once the powders were determined via XRD to be have potential as catalysts, they were subjected to electrochemical testing. This allowed for rapid optimization of processing conditions.

The presence of the platinum peaks indicated by XRD in sample PPC056156A indicates the platinum precursor is converted to platinum metal.

XRD patterns of GRAFO 1300, platinum precursor $Pt(NH_3)_4(NO_3)_2$, and a mixture of GRAFO 1300 and $Pt(NH_3)_4(NO_3)_2$ dried at room temperature were also obtained. This series shows that when mixed, the diffraction patterns of the starting materials (GRAFO 1300 and $Pt(NH_3)_4(NO_3)_2$) are not merely additive. The interaction between the two compounds gives rise to a completely new diffraction pattern-for the dried precursor dispersion. The diffraction pattern that is seen for the precursor dispersion dried at room temperature is identical to that of catalyst powder that has been processed at elevated temperature, but not high enough to convert the platinum precursor. The platinum in sample PPC056093A has not been converted to platinum metal, as the characteristic platinum peaks are absent.

The x-ray diffraction patterns were also used to estimate the average size (S) of the platinum crystallites in the powder samples via the Scherrer and Warren equations respectively:

$$S = \frac{0.9\lambda}{B\cos\theta_{max}}$$

$$B^2 = B_M^2 - B_S^2$$

Where $\lambda$ is the X-ray wavelength (1.54056 Å for Cu), B is the line broadening in radians, $\theta_{max}$ is the Bragg angle. $B_M$ is the measured peak width in radians at half height (FWHM), and $B_S$ is the corresponding FWHM of a peak of KCl used as a standard. For all measurements, the FWHM of the Pt <111> peak at a 2-theta of about 39° was used.

The size of the crystallites is inversely proportional to the dispersion of the platinum on the carbon support. Generally, a highly dispersed metal should result in highercatalytic activity. Therefore, the platinum crystallite size was used as an estimate for the dispersion of platinum on the carbon support. Care must be taken when interpreting these results. For catalysts that have a sharp XRD peak, indicating large crystallites, further inspection with TEM revealed there were also many finely dispersed crystallites. The more intense signal of the larger crystallites masked the weaker broad signal from the finely dispersed crystallites that were also present.

Figure 76:
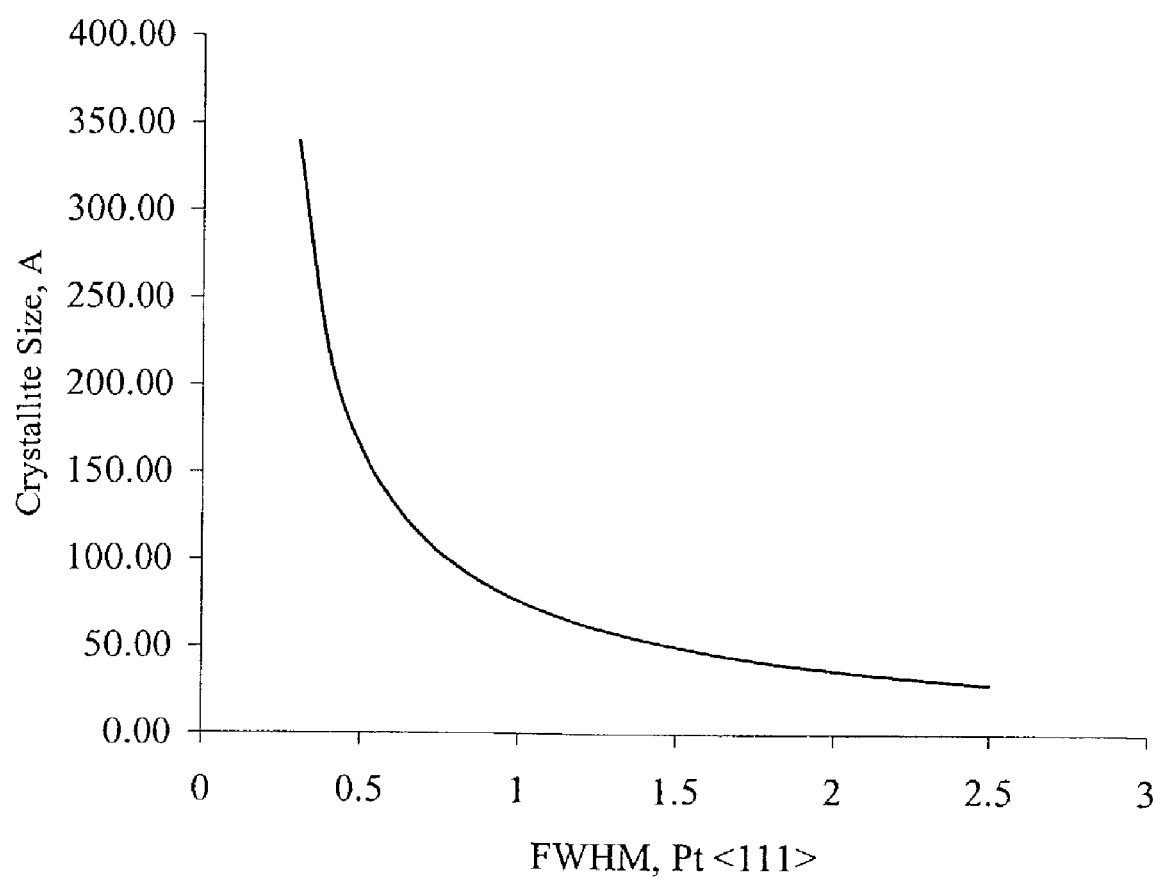
FIG. 76 illustrates crystallite size for platinum as measured by FWHM of an XRD pattern.

FIG. 76 illustrates the relationship between the platinum crystallite size and the Pt <111> FWHM. This theoretical plot was derived from the Scherrer and Warren equations, using a range of FWHM values from 0.3 to 2.5. As shown, the crystallite size is inversely proportional to the FWHM.

Figure 77:
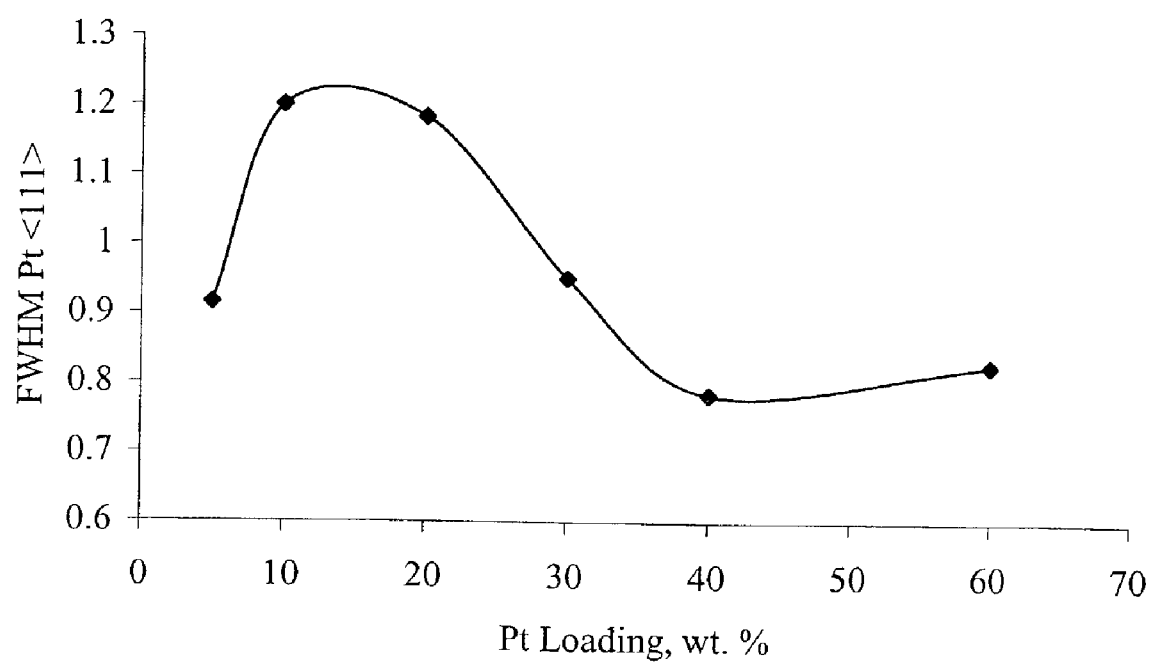
FIG. 77 illustrates FWHM as a function of platinum loading.

FIG. 77 illustrates the dependency of peak broadening with respect to platinum loading on SHAWINIGAN BLACK. The plot depicts a maximum broadening at 10 to 20 weight percent platinum, indicating optimal crystallite size.

Initial elemental analysis showed increased platinum content over that which was formulated. This prompted an investigation of processing the catalysts under nitrogen to reduce the possibility of burning carbon at these high processing temperatures. The adaptation of the systems to use nitrogen carrier gas was accomplished by attaching a gas line from a liquid nitrogen tank in place of the air line. This allowed use of nitrogen as both carrier and quench gases to prevent the catalyst from coming into contact with air while it was exposed to elevated temperatures.

Throughout these experiments, air proved to have superior structural results. The electrochemical data emphasized this point, therefore the use of nitrogen as carrier gas was abandoned. The superior performance of catalysts generated in air is most likely due to the presence of oxygen, which aids in the decomposition of the platinum precursor ligands, carbon dispersion binders, and surfactants. When nitrogen was used, the catalyst surface was most likely poisoned with these organics that were unable to decompose. It was later discovered that the carbon burning was minimal and the error was introduced via the erroneously reported concentration of the carbon dispersion.

Figure 78:
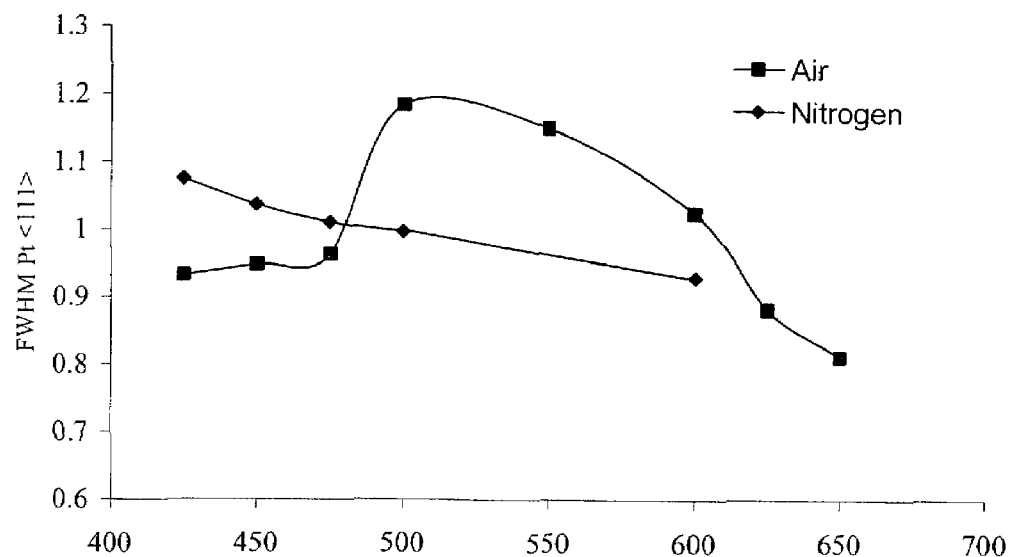
FIG. 78 illustrates FWHM as a function of conversion temperature.

In FIG. 78, the x-ray diffraction peak of Pt <111> FWHM was plotted against furnace temperature for catalysts made under both air and nitrogen. The FWHM parameter was used to estimate the dispersion of the Pt crystallites, the higher the FWHM the higher the dispersion of Pt species on the carbon support surface. For temperatures in the region of 500° C. to 600° C., the use of air as both carrier and quench gases resulted in larger FWHM values than those for nitrogen, therefore a better Pt dispersion was achieved using air as a carrier and quench gas.

Figure 79:
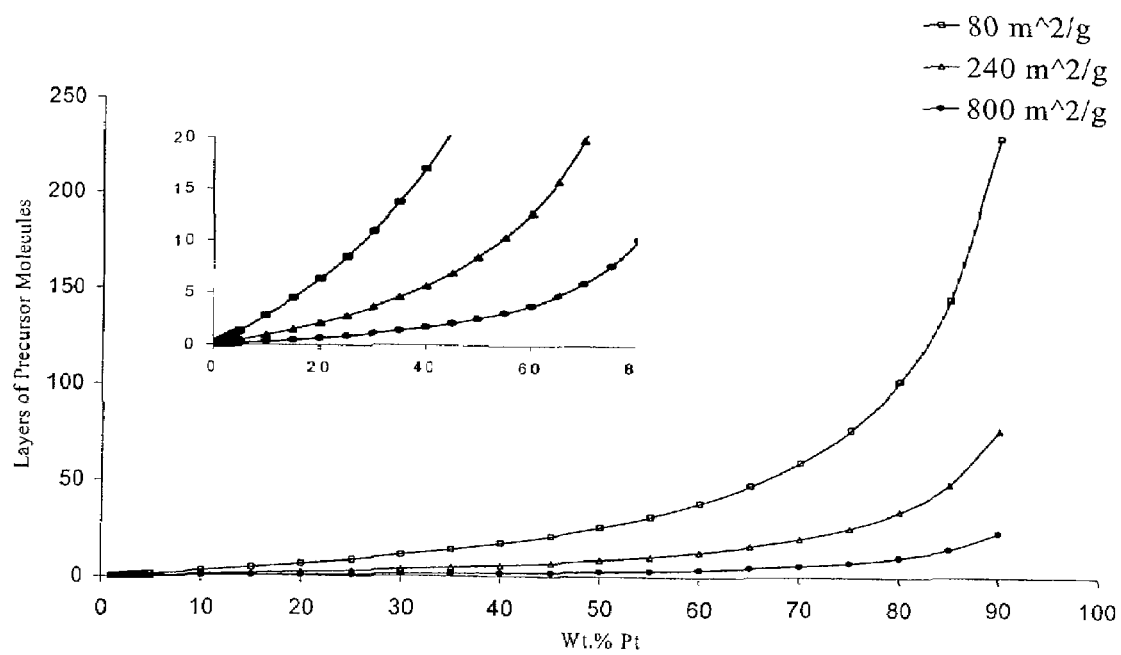
FIG. 79 illustrates a TEM photomicrograph of an electrocatalyst powder according to an embodiment of the present invention.

An illustration of the relationship between the amount of precursor and support surface area is shown in FIG. 79. For this model, the area of $Pt(NH_3)_4(NO_3)_2$ was compared to the surface area of a given carbon support. The calculation was carried out based on the weight percent of platinum against three carbon supports of increasing surface area. The surface areas of the carbon supports used were 80, 240, and 800

$m^2/g$, and the area of one $Pt(NH_3)_4(NO_3)_2$ molecule was estimated to be 2.25 nm2. If the total area covered by the $Pt(NH_3)_4(NO_3)_2$ is equal to that of the carbon, it should result in a monolayer of precursor molecules on the carbon surface. This will not result in a platinum monolayer, as the Pt precursor ligands are responsible for a significant portion of the precursor molecule's area. Therefore, individual Pt atoms or small clusters of platinum atoms that are well spaced should form. Additional $Pt(NH_3)_4(NO_3)_2$ molecules result in multiple layers, which increases the probability of larger agglomerates of metal. Following this thought, if the metal loading is high enough, the entire carbon surface could become coated, resulting in a catalyst with lower activity than that of one with small metal crystallites, as the metal surface area will be lower.

The inset in FIG. 79 shows that for 20 wt. % platinum, the number of layers increases from 0.64 to 2.12 to 6.36 as the carbon surface area decreases from 800 to 240 to 80 $m^2/g$. This suggests that not all platinum loadings are optimal for a given carbon surface area. Further, each carbon may have an ideal window of metal loadings, allowing tailoring of the Pt/C catalyst to loading requirements. This point becomes more pronounced as the metal loading is increased. Although it is impossible to predict at what point the metal loading becomes so large that the entire particle is covered, to avoid this possibility the carbon should be chosen so the number of layers is minimized, combined with experimental results.

The temperature limits of conventional spray dryers resulted in a need for an alternate route for converting the platinum precursor. After drying the powder at processing temperatures below that required for platinum reduction, the powders were subjected to an additional treatment step. The samples were placed in a pre-heated furnace for 5 or 10 minutes with varying atmospheric compositions. The atmosphere in the furnace was either air, hydrogen, nitrogen, or ratios of the latter two. Table 22 summarizes the results of the post-processing experiments.

Initial experiments in air showed that there exists a small window where the balance between temperature and time is critical. If the catalyst was exposed to too high of a temperature or too low of a temperature for too long, the platinum agglomerated to a significant extent. This agglomeration was exaggerated in the presence of hydrogen. Comparison of samples PPC113121A and PPC11386B shows the reducing power of hydrogen. Sample PPC113086B was post-treated at 250° C. and did not convert in air, but when the same powder was run as PPC113121A in hydrogen at 150° C., not only did the platinum convert, but the crystallite size was the largest observed. This was due in part to the presence of a mobile platinum species formed at elevated temperatures in the presence of hydrogen. This migratory species made narrowing-down post-treatment conditions difficult. At the time of the discovery of this species in the literature, the post-treatment was abandoned once it was realized the spray dryer, in conjunction with reducing agents, would solve the platinum conversion problems.

The estimation of the Pt crystallite size listed in Table 22 was based on the XRD data, more specifically the FWHM of the Pt <111> XRD peak and calculations of the crystallite size based on comparison with a standard.

TABLE 22

Post-Processing Treatment Conditions

| Sample | Temperature | Conversion | Crystallite Size (Å) | Atmosphere |
|---|---|---|---|---|
| PPC113086A | 300 | yes | 134.070 | Air |
| PPC113086B | 250 | no | — | Air |
| PPC113086C | 275 | yes | 136.030 | Air |
| PPC113087A | 250 | yes | 79.230 | Air |
| PPC113087B | 275 | yes | 87.240 | Air |
| PPC113087C | 300 | — | — | Air |
| PPC113088A | 250 | no | — | Air |
| PPC113088B | 275 | yes | 77.130 | Air |
| PPC113088C | 300 | yes | 113.370 | Air |
| PPC113089A | 300 | yes | 165.620 | Air |
| PPC113090A | 250 | no | — | Air |
| PPC113090B | 250 | yes | 71.210 | Air |
| PPC113090C | 250 | yes | 85.520 | Air |
| PPC113092A | 250 | no | — | Air |
| PPC113092B | 275 | yes | 121.880 | Air |
| PPC113092C | 300 | yes | 124.450 | Air |
| PPC113093A | 250 | no | — | Forming Gas |
| PPC113093B | 250 | partial | — | Forming Gas |
| PPC113093C | 250 | yes | 181.220 | Forming Gas |
| PPC113094A | 200 | no | — | Forming Gas |
| PPC113094B | 225 | partial | — | Forming Gas |
| PPC113100A | 250 | burned | — | Air |
| PPC113100B | 250 | no | — | Air |
| PPC113100C | 275 | partial | — | Air |
| PPC113114A | 250 | yes | 282.31 | $H_2$ |
| PPC113117A | 100 | no | — | Air |
| PPC113117B | 200 | yes | 197.84 | $H_2/N_2$ |
| PPC113121A | 150 | yes | 212.72 | $H_2/N_2$ |
| PPC113121B | 25 | no | — | $H_2/N_2$ |
| PPC113133A | 150 | no | 45.45 | Air |
| PPC113133B | 200 | yes | 83.07 | Air |
| PPC113135A | 200 | mostly | 74.12 | Air |
| PPC113135B | 250 | no | 48.93 | Air |
| PPC113135C | 250 | yes | 83.46 | Air |
| PPC113135D | 275 | partial | 60.71 | Air |

Prior art methods of platinum catalyst preparation employ a platinum chloride precursor due to its low cost. The majority of platinum catalysts fabricated in accordance with the present invention have used $Pt(NH_3)_4(NO_3)_2$ (platinum amine) to avoid possible system corrosion common to chloride use. The chlorides are also acidic when in solution, coagulating the binders in the carbon dispersions. Coagulation of the binders results in an unstable dispersion, and settling occurs within an hour. For this reason, the amine has been the precursor salt most commonly used.

However, using the chloride precursor, the conversion temperature is lowered from about 400° C. to under 350° C. This became a key point once a spray dryer was enlisted to attempt platinum catalyst production.

An alternative to post-processing is the use of reduction agents. If conventional spray dryers are unable to reach the temperatures required for the reduction of platinum, then additives can be used to allow for the reduction to occur at lower temperatures. This method keeps the drying/calcinations to one step, eliminating some of the problems associated with post-processing. Table 23 lists the experimental conditions and reduction agents used in the generation of platinum electrocatalysts.

TABLE 23

Experimental Conditions Exploring Reduction Agents

| Sample | Composition (wt. %) | Carbon Support | Precursor | Temp. (° C.) | Conversion |
|---|---|---|---|---|---|
| PPC097109B | 20% Pt, 1 eq HCOOH | GRAFO 1300 | Amine | 600 F. | no |
| PPC097109A | 20% Pt, 1 eq HCOOH | GRAFO 1300 | Amine | 400 F. | no |
| PPC097110A | 20% Pt, 4 eq HCOOH | GRAFO 1300 | Amine | 600 F. | no |
| PPC097109C | 20% Pt, 4 eq HCOOH | GRAFO 1300 | Amine | 400 F. | no |
| PPC113013B | 20% Pt, KBH4 | GRAFO 1300 | Chloride | 600 F. | — |
| PPC113013C | 20% Pt, Urea | GRAFO 1300 | Chloride | 400 F. | — |
| PPC056098A | 20% Pt, KBH4 | GRAFO 1300 | Amine | 200 | — |
| PPC056116A | 20% Pt, 10% EtOH | GRAFO 1300 | amine | 350 | mostly |
| PPC056117A | 20% Pt, excess NaOOCH | GRAFO 1300 | amine | 350 | mostly |
| PPC056118A | 20% Pt, 10% EtOH | GRAFO 1300 | amine | 400 | small peaks |
| PPC056119A | 20% Pt, 10% MeOH | GRAFO 1300 | amine | 350 | mostly |
| PPC056120A | 20% Pt, 10% HCOOH | GRAFO 1300 | amine | 350 | mostly |
| PPC056121A | 20% Pt, 10% MeOH | GRAFO 1300 | amine | 300 | partial |
| PPC056122A | 20% Pt, 10% MeOH, 10% HCOOH | GRAFO 1300 | amine | 300 | partial |
| PPC056141A | 20% Pt, 10% EtOH | GRAFO 1300 | Chloride | 500 | conv. |
| PPC056144A | 20% Pt, 10% EtOH | GRAFO 1322 | Chloride | 225 | small peaks |
| PPC056145A | 20% Pt, 10% EtOH | GRAFO 1300 | Chloride | 225 | mostly |
| PPC056147A | 20% Pt, Ethylene Glycol | GRAFO 1322 | amine | 300 | partial |
| PPC056148A | 20% Pt, Ethylene Glycol, PVP (10k) | GRAFO 1322 | amine | 300 | partial |
| PPC056149A | 20% Pt, Ethylene Glycol | GRAFO 1300 | amine | 300 | partial |
| PPC056150A | 20% Pt, Ethylene Glycol, PVP (10k) | GRAFO 1300 | amine | 300 | partial |
| PPC056151A | 20% Pt, Ethylene Glycol | GRAFO 1300 | Chloride | 300 | — |
| PPC056152A | 20% Pt, Ethylene Glycol, PVP (10k) | GRAFO 1300 | Chloride | 300 | conv. |
| PPC056164B | 20% Pt, 10% EtOH | GRAFO 1300 | amine | 521/289 | — |

The results of Table 23 suggest an alcohol, such as ethanol or methanol, reduces the conversion temperature of platinum by about 150° C., while retaining well-dispersed crystallites.

Thermal gravimetric analysis (TGA) was performed using a Linseis (Model L81). The TGA was used for total metals determination, sample preparation for atomic absorption (AA) measurements, and moisture content. During a TGA run, the carbon is burned off leaving only the metal, making an ideal starting point for AA analysis. The amount of water in the catalyst is determined from the mass loss at around 100° C. This is especially important in analyzing catalysts converted at low temperature.

Atomic absorption spectroscopy was used to quantify the amount of metal in the catalysts on a Perkin-Elmer AAnalyst 300. The catalyst was first heated with the TGA to remove the carbon support. The metal nugget remaining was then dissolved with aqua regia (3:1 HCl:HNO$_3$). The resulting solution was diluted as necessary to keep the concentration within the linear range of the instrument.

TABLE 24

Summary of Atomic Absorption Results

| Sample | Wt. % Pt Calculated | Method 1 | Method 2 | % Mass remaining after TGA |
|---|---|---|---|---|
| PPC056103A | 5 | 5.7 | — | — |
| PPC056104A | 10 | 6.0 | 9.0 | 27.0 (C left on filter) |
| PPC056105A | 20 | 13.9 | 16.4 | 36.8 (C left on filter) |
| PPC056096A | 20 | 13.8* | 18.8 | 32.4 (C left on filter) |
| PPC056106A | 30 | 21.5 | 25.1 | 25.8 (no C left on filter) |
| PPC056106A | 40 | 33.8 | — | — |
| PPC056102A | 60 | 74.3 | — | 53.6 (C left on filter) |
| PPC056156A | 20 | — | 16.8 | 44.0 (C left on filter) |
| PPC056158A | 5 | — | 7.2 | 7.2 (no C left on filter) |

As seen in Table 24, there was carbon contamination of the sample after it was heated to 1300° C. This did not seem reasonable, as carbon should be burned off at 500° C. It was determined that the available oxygen in the sample chamber was consumed by about 5 mg of sample, leaving the remaining sample oxygen-starved and unable to burn.

Figure 80:
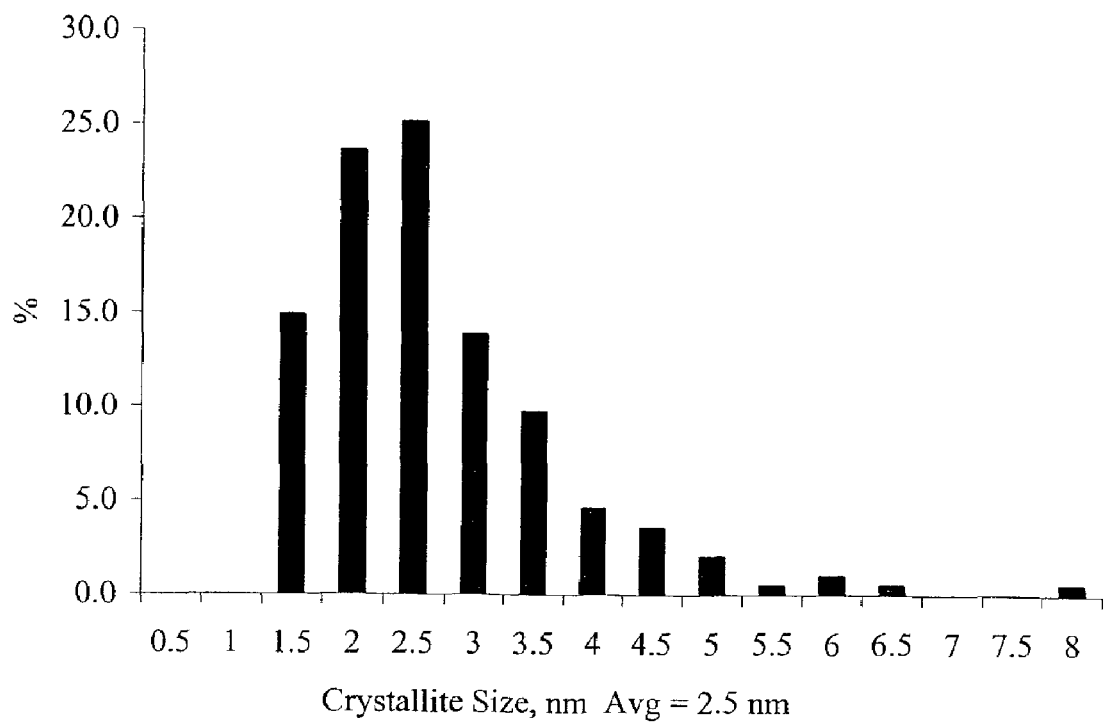
FIG. 80 illustrates average crystallite size of a Pt/C electrocatalyst.
Figure 81:
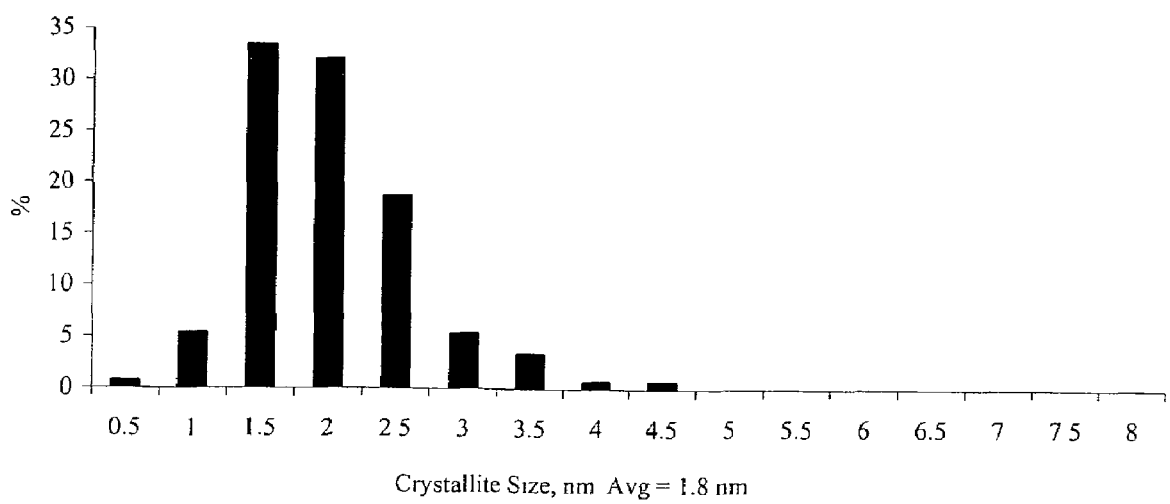
FIG. 81 illustrates average crystallite size of a Pt/C electrocatalyst.
Figure 82:
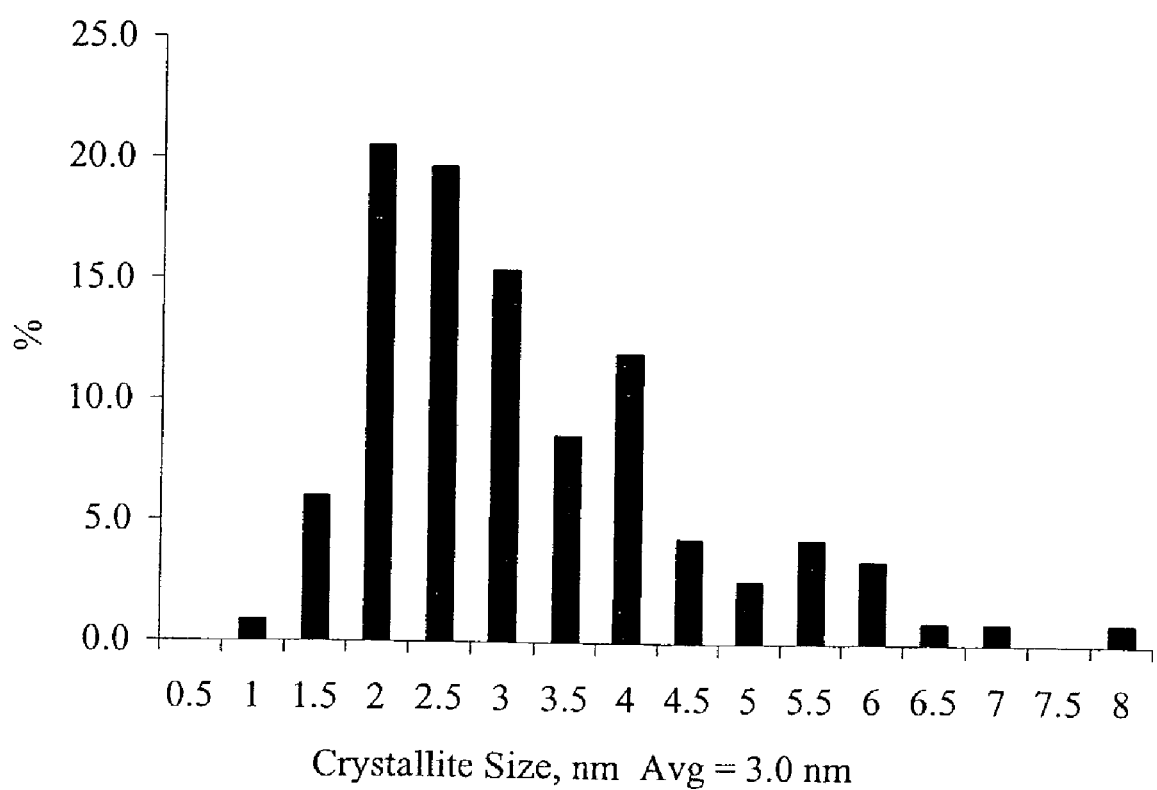
FIG. 82 illustrates average crystallite size of a Pt/C electrocatalyst.

Transmission electron microscopy (TEM) was used to measure the size of the platinum crystallites and visually inspect their dispersion. Crystallites were measured and counted to produce the distributions in FIGS. 80, 81 and 82. This approach is a rough estimate of crystallite size, as the assumption is that the crystallites at the edges of the secondary particles that can be seen are representative. Further, it is difficult to include very large particles, as the difference between what is a large particle and overlap is not always apparent.

Comparison of PPC056158B and PPC056159B illustrates the contribution of a higher surface area carbon support. The crystallites in sample PPC056158B (SHAWINIGAN BLACK) are almost half as large compared to those in PPC056159B (VULCAN XC-72). The surface area of VULCAN XC-72 is a factor of 3 greater than that of SHAWINIGAN BLACK, and the average crystallite size is about two thirds.

These distributions illustrate the dependence of the dispersion of the platinum on the carbon support. As previously mentioned, it is anticipated that a carbon support of higher surface area should yield a catalyst with greater dispersion for a given platinum loading. This is readily seen in the Figures. The surface area of VULCAN XC-72 is 240 m$^2$/g, while SHAWINIGAN BLACK is 80 m$^2$/g. Sample PPC056159B is 10 wt. % platinum on SHAWINIGAN BLACK, while PPC056158B is 10 wt. % on VULCAN XC-72. The distribution for PPC056158B (average crystallite size 1.8 nm) is significantly narrower than that of PPC056159B (average crystallite size 3.0 nm). This 60% difference in crystallite size supports the claim that no identical metal loadings will be optimal for every carbon support.

Hydrogen-air cells were made of a NAFION 112 membrane with a working area of 50 cm² and 0.2 mg/cm² platinum loading on the cathode side of the membrane with atmospheric pressure gases.

The overall performance of the MEA is given as the PRF, which is the current density at a potential of 0.7 V. The results in Table 25 support the argument for maximizing the platinum dispersion. The electrochemical performance of catalysts formulated with platinum chloride is considerably lower than that of those with platinum amine. The difference in the crystallite size estimated via XRD is about fourtimes lower for the amine-based catalyst than for that of the chloride. These results suggest a better dispersion is required if platinum chloride is to be used as a precursor.

needed for SHAWINIGAN BLACK than VULCAN XC-72, but whether the mechanism is surface area-dependent or due to the structural differences between the carbons is not readily evident.

The comparison of the Pt cluster size distribution between the Pt/C electrocatalysts of the present invention and prior art 10 wt. % and 20 wt. % Pt/VULCAN XC-72 was derived from TEM data. The data show that for an identical carbon support, VULCAN XC-72 and 10 wt. % Pt concentration, an average Pt crystallite size of $d_{av}$=2.5 nm is observed for the prior art sample, while $d_{av}$=1.8 nm was determined for the electrocatalyst of the present invention. This result shows that at identical Pt concentration and when the same support is used, the spray generation method of the present invention produces electrocatalysts with higher Pt dispersion.

The superior characteristics of the 20 wt. % electrocatalyst of the present invention vs. that of the prior art elec-

TABLE 25

Electrochemical Evaluation of Pt/C Electrocatalysts in PEMFC

| Sample | Composition (wt %) | Carbon Support | Precursor | Process Temp. (° C.) | EC Activity, (mA/cm²) |
|---|---|---|---|---|---|
| PPC093109A | 20% Pt | GRAFO 1300 | Amine | 500 | 110, 38 alk |
| PPC093109B | 20% Pt | GRAFO 1300 | Amine | 600 | 35 alk 0.6 V |
| PPC056087A | 20% Pt | GRAFO 1300 | Amine | 500 | 210 |
| PPC056093A | 20% Pt | GRAFO 1300 | Amine | 475 | not active |
| PPC056096A | 20% Pt | GRAFO 1300 | Amine | 500 | 190 |
| PPC056101A | 40% Pt | GRAFO 1300 | Amine | 500 | 280 |
| PPC056104A | 10% Pt | GRAFO 1300 | amine | 500 | 120 |
| PPC056105A | 20% Pt | GRAFO 1300 | amine | 500 | 230 |
| PPC056106A | 30% Pt | GRAFO 1300 | amine | 500 | 120 |
| PPC056142A | 20% Pt | GRAFO 1300 | Chloride | 350 | 10 |
| PPC056143A | 20% Pt | GRAFO 1322 | Chloride | 500 | 180/190 |
| PPC056144A | 20% Pt, 10% EtOH | GRAFO 1322 | Chloride | 225 | 75 |
| PPC056156A | 20% Pt | GRAFO 1300 | amine | 500 | 240 |
| PPC056157A | 20% Pt | GRAFO 1322 | amine | 482/244 | 240 |
| PPC056157C | 20% Pt | GRAFO 1300 | amine | 482/249 | 110 |
| PPC056158B | 10% Pt | GRAFO 1322 | amine | 517/265 | 180 |
| PPC056159B | 10% Pt | GRAFO 1300 | amine | 515/274 | 240 |
| PPC056163C | 20% Pt | GRAFO 1300 | amine | 526/282 | 120 |
| PPC056164C | 20% Pt | GRAFO 1322 | amine | 524/287 | 260 |

Since MEA preparation is labor-intensive, some of the catalysts in Table 25 were tested as alkaline cathodes as an approach to rapid screening. The results are not directly comparable to those obtained from MEAs, however it is believed that the relative activity is useful in ranking catalytic activity.

Comparison of PPC056163C (SHAWI NIGAN BLACK) and PPC056164C (VULCAN XC-72), made at the same spray dryer conditions again illustrates the contribution of the support to the conversion temperature. Therefore, a higher surface area carbon support should be used in combination with spray dryer processing conditions.

Sample PPC056156A is also SHAWINIGAN BLACK-supported platinum, but the electrochemical activity is at a much more reasonable value. In comparing PPC056159B and PPC056163C, it appears the spray dryer processing temperature might be at the lower limit for platinum conversion. At 10 wt. % platinum, the conversion is successful and the electrochemical activity is very good, but for 20 wt. % platinum, the electrochemical activity is quite low, indicating the platinum is not in the same state.

Figure 83:
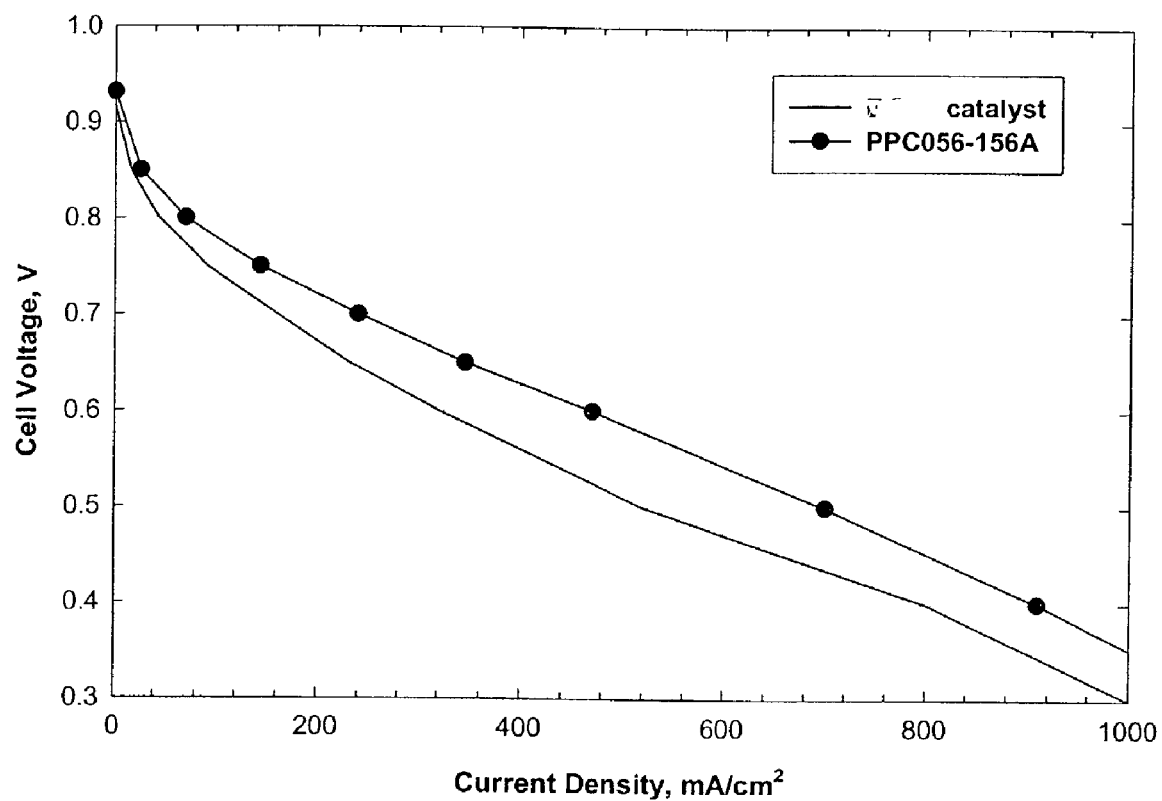
FIG. 83 illustrates the performance of an electrocatalyst in accordance with an embodiment of the present invention.

It can be concluded that the particles are exposed to a lower temperature in the spray dryer than in hot wall reactors. This finding suggests higher temperatures are trocatalyst is demonstrated in FIG. 83. The electrocatalyst of the present invention shows approximately 50% improvement over the prior art electrocatalysts at identical Pt loading. It should be noted that the electrocatalyst of the present invention in the above comparison was made with SHAWINIGAN BLACK support compared to the VULCAN XC-72 used for the prior art electrocatalyst. The SHAWINIGAN BLACK support has significantly lower surface area and therefore it is harder to achieve high Pt dispersion on this support vs. the VULCAN XC-72 which has a much higher surface area.

Figure 84:
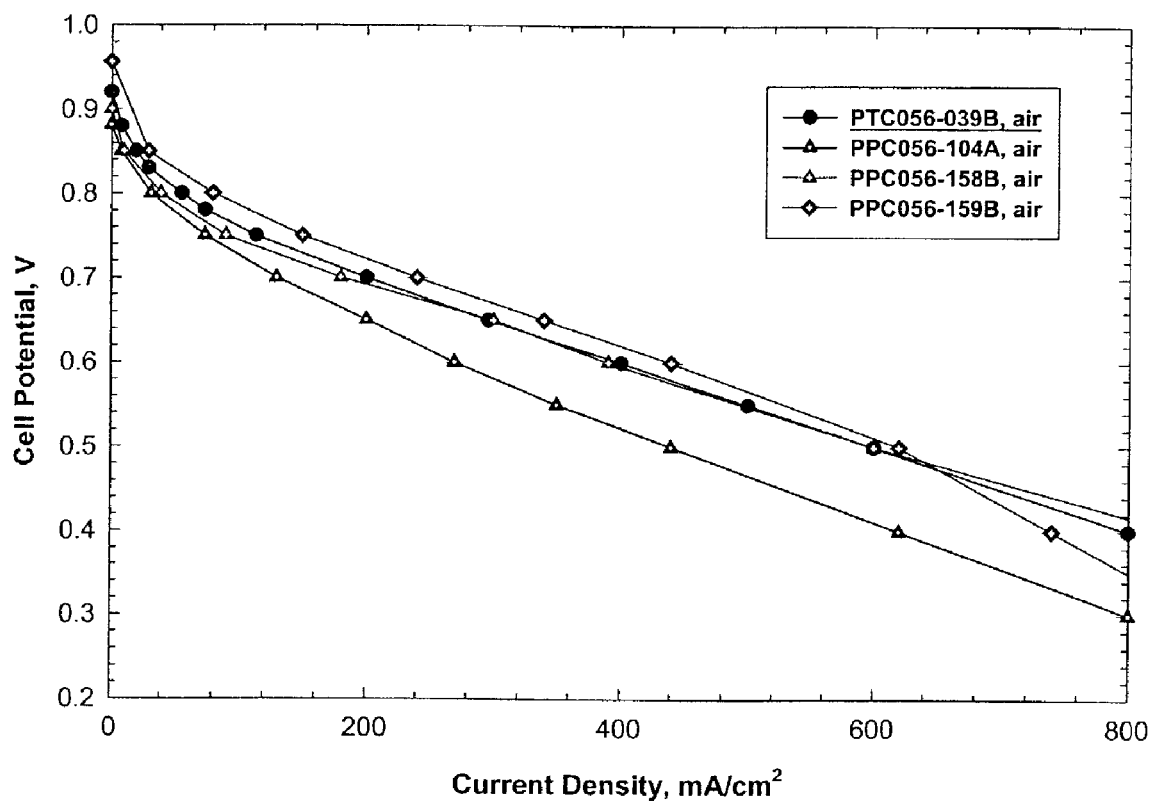
FIG. 84 illustrates the performance of membrane electrode assemblies in accordance with an embodiment of the present invention.
Figure 85:
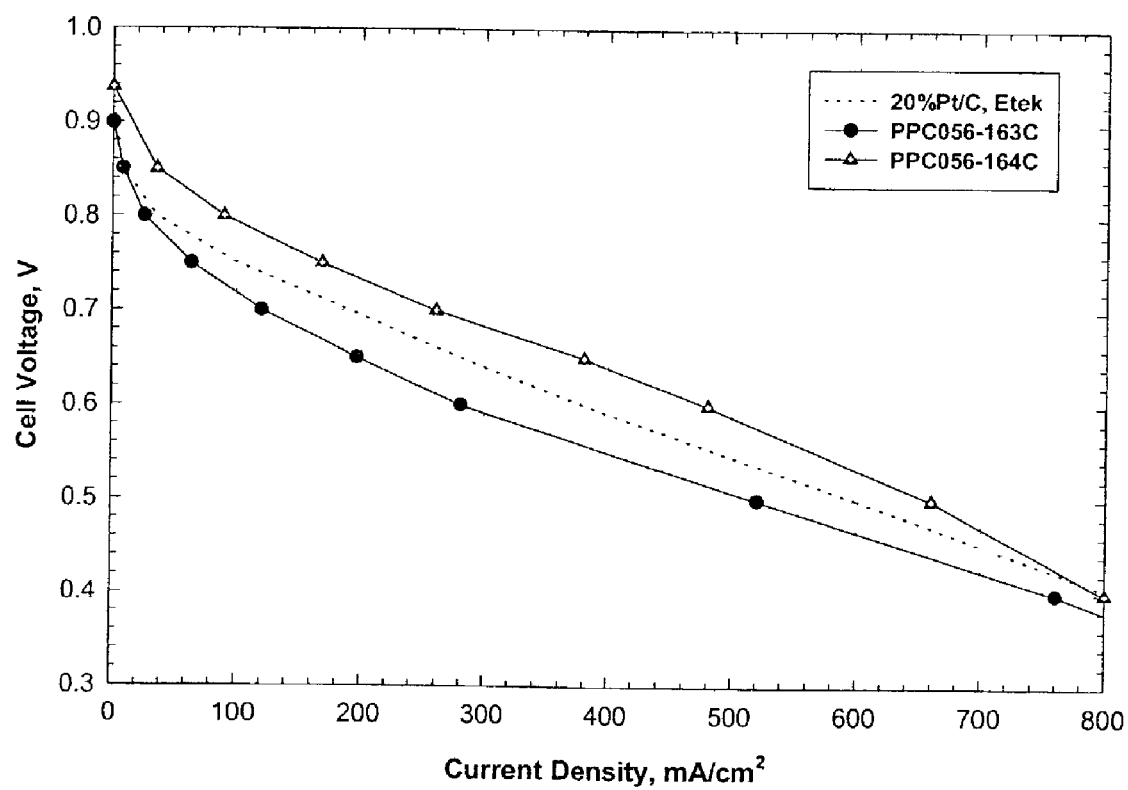
FIG. 85 illustrates the performance of membrane electrode assemblies in accordance with an embodiment of the present invention.

The results of the electrochemical testing shown in FIG. 84 for the recent 10 weight percent spray dryer scale up samples (both on VULCAN XC-72 and SHAWINIGAN BLACK supports) closely match the superior performance of the ultrasonically generated laboratory scale samples. The results of the electrochemical testing shown in FIG. 85 for the recent 20 wt. % spray dryer scale up samples, the sample prepared on VULCAN XC-72 demonstrates superior performance (about 40% better) compared to the 20 wt. % prior art commercial sample.

These Pt/C electrocatalysts were then used to produce laboratory prototype MEAs for comparison to the existing commercial MEAs. The MEAs were tested by an independent laboratory overseen by a fuel cell manufacturer. The goal was to construct MEAs with performance that meets the performance of about 600 mA/cm² at 0.6V with the lowest Pt loading possible. The low Pt loading provides the longer-term avenue to commercialization since the Pt loadings of the current commercial MEAs are too high for long-term commercialization.

Figure 86:
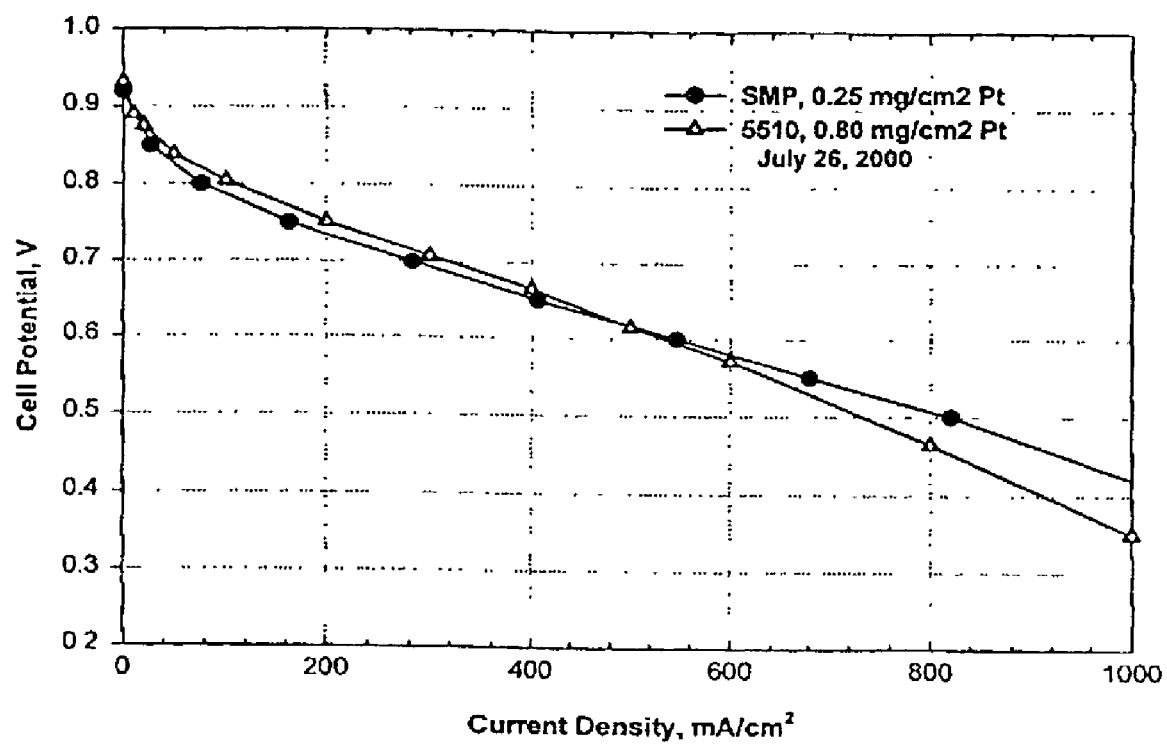
FIG. 86 illustrates the performance of membrane electrode assemblies in accordance with an embodiment of the present invention.

A comparison of the performance of a MEA comprising 20 wt. % Pt/C catalyst at a total loading of 0.25 mgPt/cm² compared to the prior art MEA with a total Pt loading of 0.8 mgPt/cm² is shown in FIG. 86. This plot illustrates the similar performance of the 2 MEAs, under conditions where the MEA containing the electrocatalyst of the present invention contains over 3 times less Pt.

To illustrate that this result is not confined to a particular sample or Pt dispersion, another polarization curve was generated in which the application has a different set of performance specifications. In this case a 60 wt. % Pt/C sample was prepared which was tested in an MEA against pure Pt black (i.e. 100% Pt). The lower Pt content electrocatalyst of the present invention had comparable performance at low current densities and higher performance at higher current densities.

Figure 87:
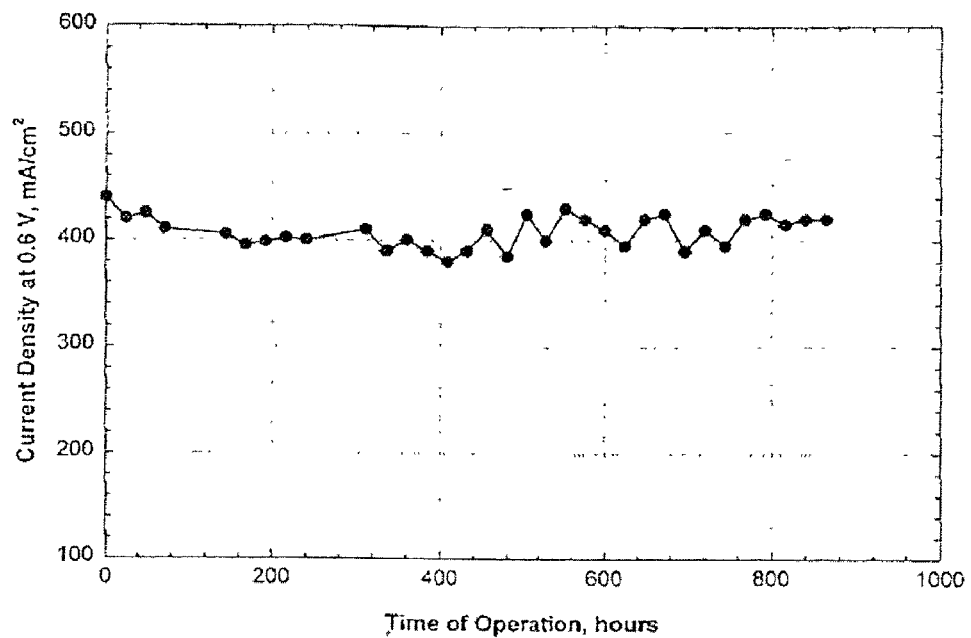
FIG. 87 illustrates the performance of membrane electrode assemblies in accordance with an embodiment of the present invention.
Figure 88:
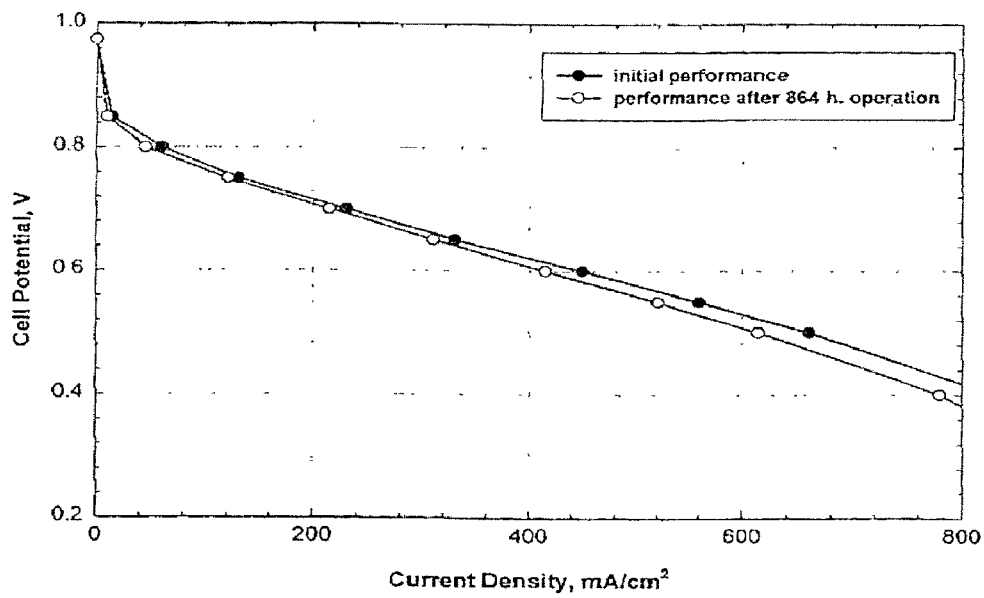
FIG. 88 illustrates the performance of membrane electrode assemblies in accordance with an embodiment of the present invention.

An additional aspect important in the commercial applications of these materials is the timescale over which the performance is maintained. This can be measured by recording either the voltage at constant current or the current at constant voltage. FIGS. 87 and 88 provide some information on the variation of the current density at constant voltage under the conditions indicated.

Thus, MEAs constructed using the electrocatalyst of present invention have demonstrated equal performance with 0.25 mgPt/cm² as compared to prior art MEAs with 0.8 mgPt/cm².

Pt—Ru/C and Pt—Pd—Ru/C Electrocatalysts for PEMFC Anodes

The goal of the following structural and compositional characterization of binary and ternary catalysts is to identify the processing conditions that yield catalysts with the best electrochemical activity. A PEMFC anode catalyst must possess CO tolerance in addition to electrocatalytic activity for the hydrogen oxidation reaction. An important aspect of this characterization is to determine the degree of alloying between the metals. The most important analysis information is obtained from XRD, TEM, and electrochemical evaluation.

Table 26 lists the binary Pt—Ru/C catalysts fabricated, and Table 27 lists the ternary Pt—Pd—Ru/C catalysts that were fabricated.

TABLE 26

Experimental Conditions for Preparation of Pt-Ru/C Electrocatalysts

| Sample | Composition (wt. %) | Carbon Support | Precursor | Temperature (° C.) |
|---|---|---|---|---|
| PPR056073A | 20 wt. % Pt/Ru 1:1 | GRAFO 1300 | amine/nitrosyl | 500 |
| PPR056074A | 20 wt. % Pt/Ru 1:1 | GRAFO 1300 | amine/nitrosyl | 500 |
| PPR056076A | 20 wt. % Pt/Ru 1:1 | GRAFO 1300 | amine/nitrosyl | 400 |
| PPR056077A | 20 wt. % Pt/Ru 1:1 | GRAFO 1300 | hydroxide/nitrosyl | 400 |
| PPR056077E | 20 wt. % Pt/Ru 1:1 | GRAFO 1300 | hydroxide/nitrosyl | 250 |
| PPR097110B | 20% Pt/Ru, 1:1 | GRAFO 1301 | amine/nitrosyl | 600 F |
| PPR097111A | 20% Pt/Ru, 1 eq HCOOH | GRAFO 1306 | amine/nitrosyl | 600 F |
| PPR097110C | 20% Pt/Ru, 1 eq HCOOH | GRAFO 1307 | amine/nitrosyl | 400 F |
| PPR097111C | 20% Pt/Ru, 4 eq HCOOH | GRAFO 1308 | amine/nitrosyl | 600 F |
| PPR097111B | 20% Pt/Ru, 4 eq HCOOH | GRAFO 1309 | amine/nitrosyl | 400 F |
| PPR097126A | 60% Pt/Ru, 1:1 | GRAFO 1300 | amine/nitrosyl | 500 |
| PPR093104E | 20% Pt/Ru, 1:1 | GRAFO 1300 | amine/nitrosyl | 550 |
| PPC093105A | 20% Pt/Ru, 1:1, NaBH4 | GRAFO 1300 | amine/nitrosyl | 400 |
| PPC093105B | 20% Pt/Ru, 1:1, NaBH4 | GRAFO 1300 | amine/nitrosyl | 350 |
| PPR113014A | 20% Pt/Ru, 1:1 | GRAFO 1300 | Chloride | 400 F |
| PPR113014B | 20% Pt/Ru, 1:1 | GRAFO 1300 | Chloride | 400 F |
| PPR113014C | 20% Pt/Ru, 1:1 | GRAFO 1300 | Chloride | 400 F |
| PPR113015A | 20% Pt/Ru, 1:1, KBH4 | GRAFO 1300 | Chloride | 400 F |
| PPR113015B | 20% Pt/Ru, 1:1, Urea | GRAFO 1300 | Chloride | 400 F |
| PPR093109C | 20% Pt/Ru, 1:1 | GRAFO 1300 | Amine/nitrate | 600 |
| PPR093109D | 20% Pt/Ru, 1:1 | GRAFO 1300 | Amine/nitrate | 500 |
| PPR056088A | 20% Pt/Ru, 1:1 | GRAFO 1300 | Amine/nitrate | 500 |

TABLE 27

Experimental Conditions for Preparation of Pt/Ru/Pd Electrocatalysts

| Sample | Composition (wt. %) | Carbon Support | Precursor | Temperature (° C.) |
|---|---|---|---|---|
| PPC113015C | 20% Pt/Pd/Ru, 30:30:40 | GRAFO 1300 | Chloride | 400 F |
| PPC113016A | 20% Pt/Pd/Ru, 30:30:40 | GRAFO 1300 | Chloride | 400 F |
| PPC113017A | 20% Pt/Pd/Ru, 40:40:20 | GRAFO 1300 | Chloride | 400 F |
| PPC113017B | 20% Pt/Pd/Ru, 40:40:20 | GRAFO 1300 | Chloride | 400 F |
| PPC113016B | 20% Pt/Pd/Ru, 30:30:40, KBH4 | GRAFO 1300 | Chloride | 400 F |
| PPC113017C | 20% Pt/Pd/Ru, 40:40:20, KBH4 | GRAFO 1300 | Chloride | 400 F |
| PPC113016C | 20% Pt/Pd/Ru, 30:30:40, Urea | GRAFO 1300 | Chloride | 400 F |

TABLE 27-continued

Experimental Conditions for Preparation of Pt/Ru/Pd Electrocatalysts

| Sample | Composition (wt. %) | Carbon Support | Precursor | Temperature (° C.) |
|---|---|---|---|---|
| PPC113018A | 20% Pt/Pd/Ru, 40:40:20, Urea | GRAFO 1300 | Chloride | 400 F |
| PPP093105C | 20% Pt/Pd/Ru, 30:30:40 | GRAFO 1300 | amine/nitrate | 500 |
| PPP093105D | 20% Pt/Pd/Ru, 30:30:40 | GRAFO 1300 | amine/nitrate | 550 |
| PPP093105E | 20% Pt/Pd/Ru, 30:30:40 | GRAFO 1300 | amine/nitrate | 600 |
| PPP093105F | 20% Pt/Pd/Ru, 30:30:40 | GRAFO 1300 | amine/nitrate | 650 |
| PPP093105G | 20% Pt/Pd/Ru, 30:30:40 | GRAFO 1300 | amine/nitrate | 700 |
| PPP093106A | 20% Pt/Pd/Ru, 40:40:20 | GRAFO 1300 | amine/nitrate | 500 |
| PPP093106B | 20% Pt/Pd/Ru, 40:40:20 | GRAFO 1300 | amine/nitrate | 550 |
| PPP093106C | 20% Pt/Pd/Ru, 40:40:20 | GRAFO 1300 | amine/nitrate | 600 |
| PPP093106D | 20% Pt/Pd/Ru, 40:40:20 | GRAFO 1300 | amine/nitrate | 650 |
| PPP093106E | 20% Pt/Pd/Ru, 40:40:20 | GRAFO 1300 | amine/nitrate | 700 |
| PPP093107A | 20% Pt/Pd/Ru, 40:40:20 | GRAFO 1300 | amine/nitrate | 400 |
| PPP093107B | 20% Pt/Pd/Ru, 40:40:20 | GRAFO 1300 | amine/nitrate | 500 |
| PPP093109E | 20% Pt/Pd/Ru, 30:30:40 | GRAFO 1300 | amine/nitrate | 500 |
| PPP093109F | 20% Pt/Pd/Ru, 30:30:40 | GRAFO 1300 | amine/nitrate | 600 |
| PPP093109G | 20% Pt/Pd/Ru, 40:40:20 | GRAFO 1300 | amine/nitrate | 600 |
| PPP093109H | 20% Pt/Pd/Ru, 40:40:20 | GRAFO 1300 | amine/nitrate | 500 |
| PPP056089A | 20% Pt/Pd/Ru, 30:30:40 | GRAFO 1300 | amine/nitrate | 500 |
| PPP056090A | 20% Pt/Pd/Ru, 40:40:20 | GRAFO 1300 | amine/nitrate | 500 |

XRD spectra showed a peak corresponding to Pt—Ru and indicating alloying of the metals.

Analysis for palladium is similar to analysis for platinum, since both are soluble in aqua regia. Elemental analysis for ruthenium-containing catalysts is not as simple. Following carbon removal with the TGA, the sample has two possible routes for analysis. The sample can be assayed for platinum (and palladium, if present) using the simple aqua regia dissolution, then the ruthenium content can be determined by difference. More accurately, the sample can be subjected to sodium fusion by heating with sodium peroxide, followed by leaching with aqua regia. The resulting solution can then be analyzed by atomic absorption.

The relative electrochemical activity of the Pt—Ru/C and Pt—Ru—Pd/C catalysts of the present invention was tested. The catalysts were pressed into electrodes and evaluated as 20 mg/cm² active layers with a gas diffusion layer of 50 mg/cm² XC-35 in 7 N KOH.

TABLE 28

Electrochemical Evaluation Data of Pt-Ru/C and Pt-Ru-Pd/C Catalysts

| Sample | Composition | Temperature, (° C.) | PRF in 7N KOH |
|---|---|---|---|
| PPR093109C | PtRu | 600 | 25 |
| PPR093109D | PtRu | 500 | 18 |
| PPP093109E | PtPdRu | 500 | 35 |
| PPP093109F | PtPdRu | 600 | 30 |

As illustrated in Table 28, the addition of palladium significantly increased the electrochemical activity of the catalyst. A similar catalyst, PPC093106A, was made into an MEA and tested with reformate. The result of the reformate test is illustrated by the polarization curve in FIG. 89.

Figure 89:
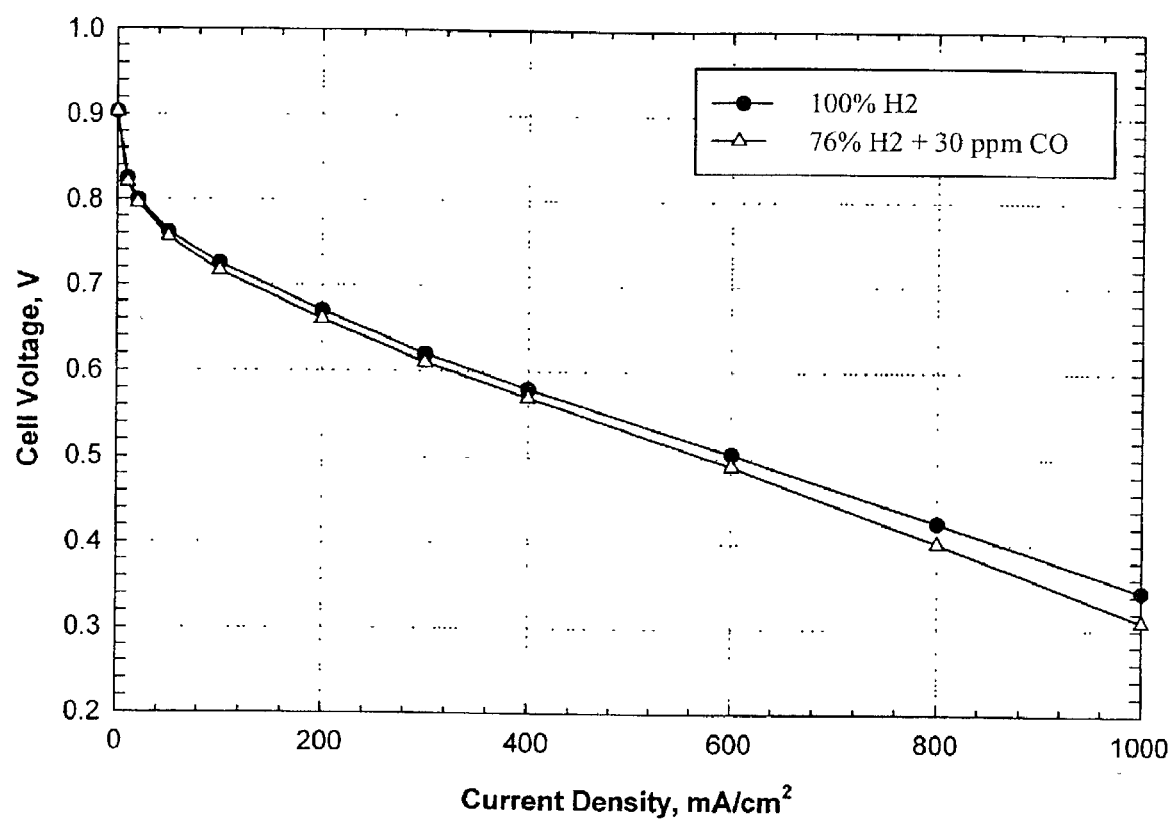
FIG. 89 illustrates the performance of membrane electrode assemblies in accordance with an embodiment of the present invention.

FIG. 89 compares the electrochemical activity of PPC093106A in both pure hydrogen and reformate. The excellent CO tolerance of this catalyst can be seen from the nearly overlapping polarization curves. This Pt—Pd—Ru catalyst performs almost as well on reformate as it does on pure hydrogen.

Excellent performance in the presence of small concentrations of CO and low concentrations of hydrogen was therefore demonstrated using Pt—Ru/C and Pt—Ru—Pd/C electrocatalysts.

Polymer-Modified Particles

The gas diffusion layer (GDL) in any power device should allow maximum gas permeability combined with impermeability to aqueous solutions. There are various methods to obtain a gas diffusion layer. Depending on the application this layer can be a continuous fluorocarbon polymer membrane, a composite material such as hydrophobized carbon black or a hydrophobized metal oxide. The hydrophobic layer needs to be deposited with the right structure to form a layer that has the optimum size channels and hydrophobic pores to allow transport of the active species while preventing the electrolyte from weeping out. Further, the hydrophobic pores need to prevent the ambient water vapor from entering the power device. The control on the hydrophobicity of the hydrophobic layer can be achieved by varying the ratio of the support and the hydrophobic component and/or by depositing a gradient of hydrophobic layers. Table 29 summarizes the hydrophobized powder composites (polymer-modified carbon) manufactured in accordance with the present invention.

Dispersions of various carbons such as SHAWINIGAN BLACK and PWA were shear mixed in different ratios varying from 5 to 60% by weight of the fluorocarbon polymer. The dispersions were then spray dried at different temperatures as shown in Table 29. Dispersions of metal oxides such as $SiO_2$, $Al_2O_3$ and $TiO_2$ were prepared using surfactants.

The fluorocarbon polymer dispersions were shear mixed at lower power with the metal oxide dispersions to prevent foaming in the presence of the surfactants. The dispersions were then spray dried.

The surface area and pore volume of the final powders was determined by a nitrogen adsorption-desorption technique. The surface area of the final composite is determined by the surface area of the hydrophobized carbon or metal oxide.

TABLE 29

Polymer-modified Powder Composites

| Substrate | Temp. (° F.) | TEFLON (wt. %) | S.A. ($m^2/g$) | Pore vol ($cm^3/g$) | Avg Pore D (nm) |
|---|---|---|---|---|---|
| SHAWINIGAN BLACK | 400 | 5 | 33 | 0.1384 | 16.8 |
| SHAWINIGAN BLACK | 600 | 5 | 30.3 | 0.1361 | 18 |
| SHAWINIGAN BLACK | 400 | 35 | 28.5 | 0.11 | 15.4 |
| SHAWINIGAN BLACK | 600 | 35 | 27 | 0.1294 | 19.2 |
| Silica | 600 | 60 | 81 | 0.614 | 30.3 |
| SHAWINIGAN BLACK | 640 | 50 | 31.6 | 0.0843 | 10.6 |
| SHAWINIGAN BLACK | 610 | 50 | 23 | 0.11 | 18.9 |
| SHAWINIGAN BLACK | 640 | 35 | 101 | 0.13 | 5 |
| SHAWINIGAN BLACK | 600 | 35 | | | |
| PWA | 615 | 50 | 226 | 0.17 | 3 |
| PWA | 600 | 50 | | | |
| PWA | 630 | 35 | 352 | 0.22 | 2.5 |
| PWA | 600 | 35 | | | |
| $Al_2O_3$ | 600 | 50 | | | |
| $Al_2O_3$ | 600 | 35 | | | |
| $TiO_2$ | 600 | 50 | | | |
| $TiO_2$ | 600 | 35 | | | |
| $TiO_2$(Hydrophobic) | 600 | 50 | 19.9 | 0.0747 | 14.9 |
| $TiO_2$(Hydrophobic) | 600 | 35 | | | |

The polymer-modified carbon composites were then post-treated at 300° C. for 15 minutes to burn any surfactants or binders that were present, as these surfactants can affect the performance of the gas diffusion layer. The polymer-modified carbon was pressed into a gas diffusion layer with $MnO_x/C$ catalyst and measured electrochemically. Similarly, polymer-modified carbon blacks from other sources were pressed with the same catalyst to compare electrochemical performance of polymer-modified carbon blacks in accordance with the present invention.

Figure 90:
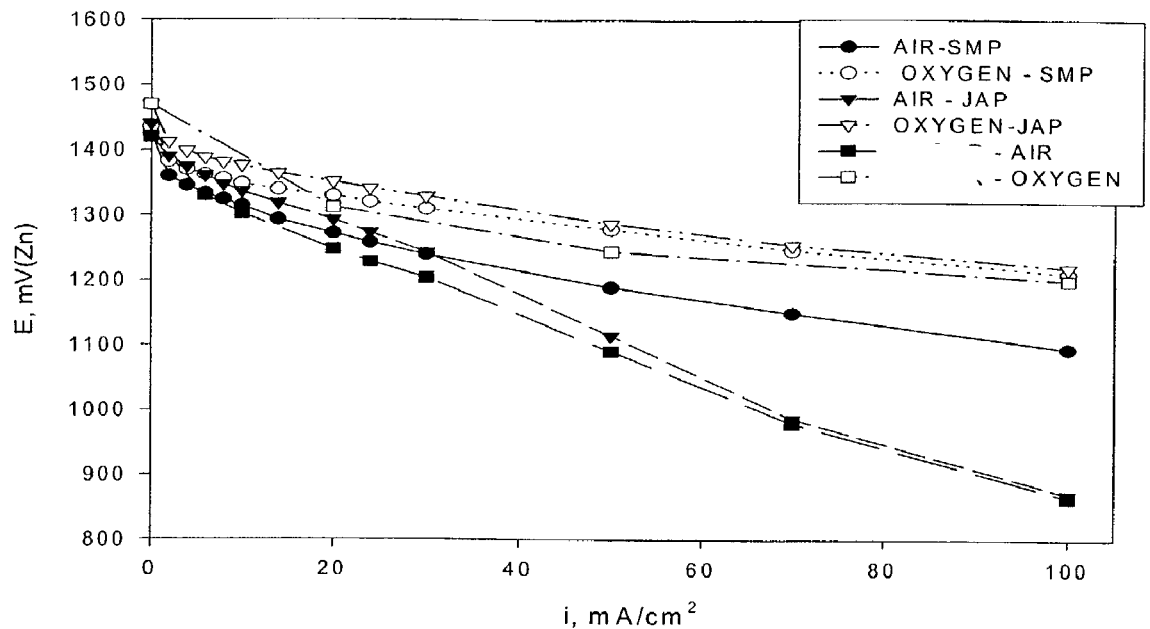
FIG. 90 illustrates the performance of membrane electrode assemblies in accordance with an embodiment of the present invention.
Figure 91:
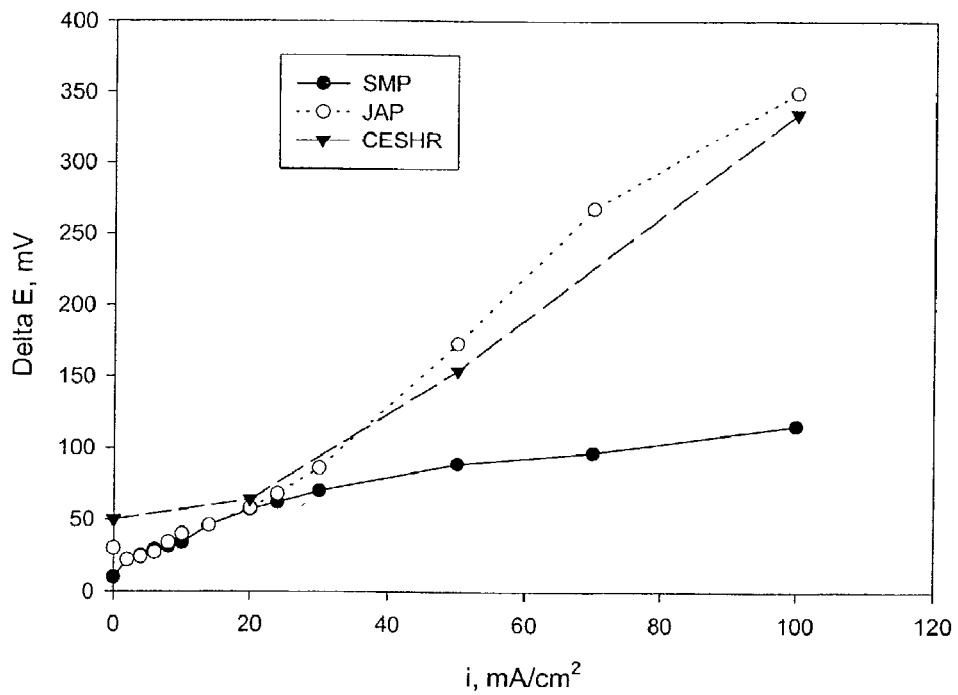
FIG. 91 illustrates the performance of membrane electrode assemblies in accordance with an embodiment of the present invention.

FIG. 90 is a polarization curve plotted for polymer-modified carbon blacks prepared from different sources. As can be seen from the polarization curve, polymer-modified carbons according to the present invention perform better in oxygen and in air, especially at a current density of 100 $mA/cm^2$, where transport and diffusion limitations become predominant. This is further obvious from FIG. 91, which is a Delta E plot of the performance difference in air vs. in oxygen. The difference in oxygen vs. air is very small for the polymer-modified carbon of the present invention, which proves that the gas diffusion layer prepared with the polymer-modified carbon of the present invention is better in performance.

Printing these materials thinner with methods such as syringe dispensing and screen printing can further decrease the thickness of the gas diffusion layers. Formulations of polymer-modified carbons were prepared in alpha-terpeniol and in isoproponal for depositing thin layers, which should further increase performance in the transport and diffusion regimes of a polarization curve.

The "TEFLONIZED" blacks are hydrophobized using a fluorocarbon polymer (TEFLON) sprayed with carbon. Similar composites can be made for different applications such as to facilitate transport of species to the catalytic sites. The polymer dispersed on the support can be selected for a particular application. For example, polymer-modified NAFION carbons were prepared to facilitate the transport of protons to the NAFION membrane. NAFION solution was mixed with different carbon dispersions of SHAWINIGAN BLACK and VULCAN XC-72 and spray dried at 400° F. Table 30 is a summary of these polymer-modified materials.

TABLE 30

Polymer-Modified Composite Powders

| Product # PNF | Composition (wt. %) NAFION | Carbon Support | SA ($M^2/g$) | Pore Vol ($cm^3/g$) | Avg pore (D nm) | PSD d90 microns |
|---|---|---|---|---|---|---|
| 056129B | 15 | VULCAN XC-32 | 71.36 | 0.262 | 14.7 | 19 |
| 056129C | 10 | VULCAN XC-32 | 76.8 | 0.284 | 14.8 | 0.7 |
| 056130A | 5 | VULCAN XC-32 | 86.43 | 0.334 | 15.46 | 0.8 |
| 056130C | 15 | SHAW. BLACK | 36.97 | 0.171 | 18.51 | 1.2 |
| 056131A | 10 | SHAW. BLACK | 36.96 | 0.167 | 18.06 | 1.2 |
| 056131B | 5 | SHAW. BLACK | 37.8 | 0.174 | 18.4 | 1.5 |

Figure 92:
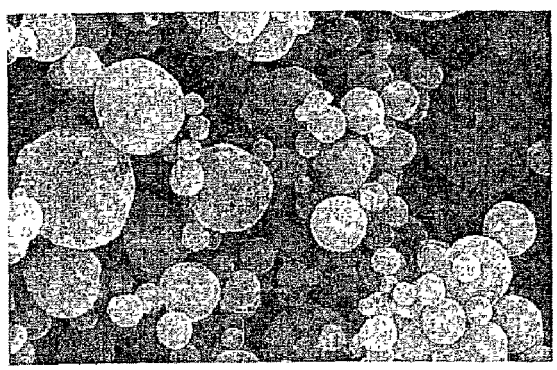
FIG. 92 is an SEM photomicrograph of polymer-modified particles according to the present invention.
Figure 93:
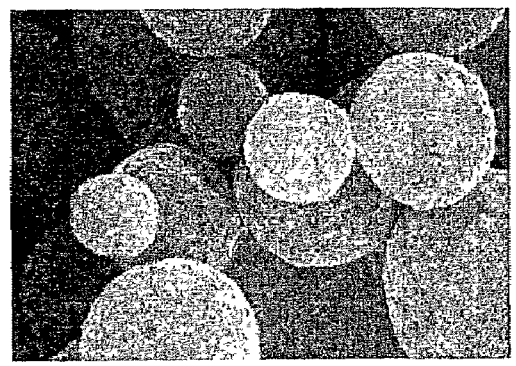
FIG. 93 is an SEM photomicrograph of polymer-modified particles according to the present invention.

FIGS. 92 and 93 illustrate SEM photmicrographs of a polymer-modified carbon in accordance with the present invention, particularly SHAWINIGAN BLACK modified with 5 wt. % NAFION.

What is claimed is:

1. A membrane electrode assembly adapted for use in a fuel cell, comprising at least an anode, a cathode and a polymer membrane separating said anode and cathode, wherein at least one of said anode and cathode comprises composite electrocatalyst particles having an active species dispersed on a support phase wherein said electrocatalyst particles are substantially spherical and wherein the volume average particle size of said electrocatalyst particles is not greater than about 100 μm.

2. A membrane electrode assembly as recited in claim 1, wherein said electrocatalyst particles have a volume average particle size of not greater than about 20 μm.

3. A membrane electrode assembly as recited in claim 1, wherein said composite electrocatalyst particles comprise a support phase of primary carbon particles and an active species phase dispersed on said primary carbon particles.

4. A membrane electrode assembly as recited in claim 1, wherein said electrocatalyst particles are dispersed in an electrocatalyst layer having an average thickness of not greater than about 50 μm.

5. A membrane electrode assembly as recited in claim 1, wherein said polymer membrane is a proton exchange membrane.

6. A membrane electrode assembly adapted for use in a fuel cell, comprising at least an anode, a cathode and a polymer membrane separating said anode and said cathode, wherein at least one of said anode and said cathode comprises an electrocatalyst layer and said electrocatalyst layer comprises substantially spherical electrocatalyst particles.

7. A membrane electrode assembly as recited in claim 6, wherein said electrocatalyst particles have a volume average particle size of not greater than about 20 μm.

8. A membrane electrode assembly as recited in claim 6, wherein said electrocatalyst particles have a volume average particle size of not greater than about 10 μm.

9. A membrane electrode assembly as recited in claim 6, wherein at least about 5 volume percent of said electrocatalyst layer comprises said spherical electrocatalyst particles.

10. A membrane electrode assembly as recited in claim 6, wherein at least about 10 volume percent of said electrocatalyst layer comprises said spherical electrocatalyst particles.

11. A membrane electrode assembly as recited in claim 6, wherein at least about 20 volume percent of said electrocatalyst layer comprises said spherical electrocatalyst particles.

12. A membrane electrode assembly as recited in claim 6, wherein said electrocatalyst particles are composite electrocatalyst particles comprising an active species phase dispersed on a support phase.

13. A membrane electrode assembly as recited in claim 6, wherein said electrocatalyst particles are composite particles comprising a platinum-containing metal dispersed on a carbon support.

14. A membrane electrode assembly as recited in claim 6, wherein said polymer membrane is a proton exchange membrane.

15. A membrane electrode assembly, comprising at least an anode, a cathode and a membrane separating said anode and cathode, wherein at least one of said anode and cathode comprises composite electrocatalyst particles having an active species dispersed on a support phase wherein said particles are substantially spherical, wherein the volume average particle size of said particles is not greater than about 100 μm and wherein said composite electrocatalyst particles comprise a support phase of primary carbon particles and an active species phase dispersed on said primary carbon particles.

16. A membrane eiectrode assembly as recited in claim 15, wherein said membrane is a polymer membrane.

17. A membrane electrode assembly as recited in claim 16, wherein said polymer membrane is a proton exchange membrane.

* * * * *

UNITED STATES PATENT AND TRADEMARK OFFICE
CERTIFICATE OF CORRECTION

PATENT NO. : 7,211,345 B2
APPLICATION NO. : 10/213001
DATED : May 1, 2005
INVENTOR(S) : Hampden-Smith et al.

It is certified that error appears in the above-identified patent and that said Letters Patent is hereby corrected as shown below:

Column 22
Line 31, delete "precursorwill" and insert therefor --precursor will--.

Column 23
Lines 28-29, delete "precursorfor" and insert therefor --precursor for--.

Column 24
Line 8, delete "otherfunctional" and insert therefor --other functional--.
Line 40, delete "Pittburgh" and insert therefor --Pittsburgh--.

Column 26
Lines 22-23, delete "precursorto" and insert therefor --precursor to--.

Column 29
Lines 11-12, delete "forextended" and insert therefor --for extended--.

Column 33
Line 47, delete "lasertransfer" and insert therefor --laser transfer--;
Line 48, delete "lasertransfer" and insert therefor --laser transfer--.

Column 38
Line 67, delete "shortertransport" and insert therefor --shorter transport--.

Column 51
Line 26, delete "Pittburgh" and insert therefor --Pittsburgh--.

Column 56
Line 65, delete "clearthat" and insert therefor --clear that--.

Column 65
Line 21, delete "closerto" and insert therefor --closer to--.

Column 69
Line 12, delete "isoproponal" and insert therefor --isopropanol--;
Line 22, delete "iso-proponal" and insert therefor --iso-propanol--.

Column 70
Line 10, delete "dofted" and insert therefor --dotted--.

UNITED STATES PATENT AND TRADEMARK OFFICE
CERTIFICATE OF CORRECTION

PATENT NO. : 7,211,345 B2
APPLICATION NO. : 10/213001
DATED : May 1, 2005
INVENTOR(S) : Hampden-Smith et al.

It is certified that error appears in the above-identified patent and that said Letters Patent is hereby corrected as shown below:

Column 88
Line 3, delete "highercatalytic" and insert therefor --higher catalytic--.

Column 93
Line 14, delete "fourtimes" and insert therefor --four times--.

Column 100
Line 30, delete "alpha-terpeniol" and insert therefor --alpha-terpineol--;
Line 31, delete "isoproponal" and insert therefor --isopropanol--.

Column 101
Line 1, delete "photmicrographs" and insert therefor --photomicrographs--.

Column 102
Line 34, delete "eiectrode" and insert therefor --electrode--.

Signed and Sealed this

Nineteenth Day of June, 2007

JON W. DUDAS
*Director of the United States Patent and Trademark Office*

UNITED STATES PATENT AND TRADEMARK OFFICE
CERTIFICATE OF CORRECTION

PATENT NO. : 7,211,345 B2
APPLICATION NO. : 10/213001
DATED : May 1, 2007
INVENTOR(S) : Hampden-Smith et al.

It is certified that error appears in the above-identified patent and that said Letters Patent is hereby corrected as shown below:

Column 22
Line 31, delete "precursorwill" and insert therefor --precursor will--.

Column 23
Lines 28-29, delete "precursorfor" and insert therefor --precursor for--.

Column 24
Line 8, delete "otherfunctional" and insert therefor --other functional--.
Line 40, delete "Pittburgh" and insert therefor --Pittsburgh--.

Column 26
Lines 22-23, delete "precursorto" and insert therefor --precursor to--.

Column 29
Lines 11-12, delete "forextended" and insert therefor --for extended--.

Column 33
Line 47, delete "lasertransfer" and insert therefor --laser transfer--;
Line 48, delete "lasertransfer" and insert therefor --laser transfer--.

Column 38
Line 67, delete "shortertransport" and insert therefor --shorter transport--.

Column 51
Line 26, delete "Pittburgh" and insert therefor --Pittsburgh--.

Column 56
Line 65, delete "clearthat" and insert therefor --clear that--.

Column 65
Line 21, delete "closerto" and insert therefor --closer to--.

Column 69
Line 12, delete "isoproponal" and insert therefor --isopropanol--;
Line 22, delete "iso-proponal" and insert therefor --iso-propanol--.

Column 70
Line 10, delete "dofted" and insert therefor --dotted--.

UNITED STATES PATENT AND TRADEMARK OFFICE
CERTIFICATE OF CORRECTION

PATENT NO.         : 7,211,345 B2
APPLICATION NO. : 10/213001
DATED              : May 1, 2007
INVENTOR(S)        : Hampden-Smith et al.

It is certified that error appears in the above-identified patent and that said Letters Patent is hereby corrected as shown below:

<u>Column 88</u>
Line 3, delete "highercatalytic" and insert therefor --higher catalytic--.

<u>Column 93</u>
Line 14, delete "fourtimes" and insert therefor --four times--.

<u>Column 100</u>
Line 30, delete "alpha-terpeniol" and insert therefor --alpha-terpineol--;
Line 31, delete "isoproponal" and insert therefor --isopropanol--.

<u>Column 101</u>
Line 1, delete "photmicrographs" and insert therefor --photomicrographs--.

<u>Column 102</u>
Line 34, delete "eiectrode" and insert therefor --electrode--.

This certificate supersedes Certificate of Correction issued June 19, 2007.

Signed and Sealed this

Tenth Day of July, 2007

JON W. DUDAS
*Director of the United States Patent and Trademark Office*